United States Patent
Fujii et al.

(10) Patent No.: US 12,317,612 B2
(45) Date of Patent: May 27, 2025

(54) SEMICONDUCTOR APPARATUS AND METHOD FOR MANUFACTURING THE SAME

(71) Applicant: SONY SEMICONDUCTOR SOLUTIONS CORPORATION, Kanagawa (JP)

(72) Inventors: Nobutoshi Fujii, Kanagawa (JP); Koichi Sejima, Kanagawa (JP); Koichiro Saga, Kanagawa (JP); Shinichi Miyake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 553 days.

(21) Appl. No.: 17/620,253

(22) PCT Filed: Jun. 26, 2020

(86) PCT No.: PCT/JP2020/025147
§ 371 (c)(1),
(2) Date: Dec. 17, 2021

(87) PCT Pub. No.: WO2020/262584
PCT Pub. Date: Dec. 30, 2020

(65) Prior Publication Data
US 2022/0367558 A1    Nov. 17, 2022

(30) Foreign Application Priority Data
Jun. 26, 2019    (JP) .................................. 2019-119169

(51) Int. Cl.
*H10D 89/10*    (2025.01)
*H01L 21/31*    (2006.01)
(Continued)

(52) U.S. Cl.
CPC ............ *H10F 39/011* (2025.01); *H01L 21/31* (2013.01); *H01L 21/768* (2013.01); *H10F 39/18* (2025.01);
(Continued)

(58) Field of Classification Search
CPC ............. H01L 27/146; H01L 27/14603; H01L 27/14609; H01L 27/14612;
(Continued)

(56) References Cited

U.S. PATENT DOCUMENTS 5,952,724 A    9/1999  Horiba
9,620,548 B1   4/2017  Wang et al.
(Continued)

FOREIGN PATENT DOCUMENTS

JP    H02-054554    2/1990
JP    H08-008208    1/1996
(Continued)

OTHER PUBLICATIONS

Datta et al., "Impact of Contact and Local Interconnect Scaling on Logic Performance," 2014 Symposium on VLSI Technology Digest of Technical Papers, Jun. 9, 2014, 2 pages.
(Continued)

*Primary Examiner* — Eduardo A Rodela
(74) *Attorney, Agent, or Firm* — Sheridan Ross PC

(57) ABSTRACT

An apparatus and method enabling a reduction in a resistance of a conductive path electrically connecting an upper substrate and a lower substrate. The apparatus includes a first semiconductor layer with element formation regions disposed adjacent to one another via element isolation regions, each of the element formation regions having a first active element, contact regions on an element isolation region side of a front layer portion of the element formation regions, conductive pads connected to the contact regions
(Continued)

and extending across the element isolation region, a first insulating layer, a second semiconductor layer on the first insulating layer and having a second active element, a second insulating layer covering the second semiconductor layer, and conductive plugs extending from the second insulating layer to the conductive pad, the conductive plugs including a material identical to a material of the conductive pad and formed integrally with the conductive pad.

6 Claims, 92 Drawing Sheets

(51) Int. Cl.
    *H01L 21/768*     (2006.01)
    *H10D 89/60*     (2025.01)
    *H10F 39/00*     (2025.01)
    *H10F 39/18*     (2025.01)

(52) U.S. Cl.
    CPC ....... *H10F 39/8037* (2025.01); *H10F 39/805* (2025.01); *H10F 39/807* (2025.01); *H10F 39/811* (2025.01)

(58) Field of Classification Search
    CPC ......... H01L 27/14638; H01L 27/14683; H01L 21/31; H01L 21/768; H01L 27/1463; H01L 27/14636; H01L 27/14643; H10D 89/10; H10D 89/60
    See application file for complete search history.

(56) References Cited

U.S. PATENT DOCUMENTS

| | | | |
|---|---|---|---|
| 10,468,439 B2* | 11/2019 | Ikeda | H01L 27/14641 |
| 10,608,034 B2* | 3/2020 | Endo | H01L 27/14687 |
| 10,950,650 B2* | 3/2021 | Ihara | H01L 27/14643 |
| 11,437,420 B2* | 9/2022 | Hung | H01L 27/1464 |
| 11,502,117 B2* | 11/2022 | Ha | H01L 27/1463 |
| 2002/0024093 A1 | 2/2002 | Ahn et al. | |
| 2007/0018075 A1 | 1/2007 | Cazaux et al. | |
| 2016/0086984 A1* | 3/2016 | Wang | H01L 27/14689 257/292 |
| 2017/0125473 A1 | 5/2017 | Wang et al. | |
| 2017/0200763 A1 | 7/2017 | Wang et al. | |
| 2017/0207259 A1 | 7/2017 | Yun | |
| 2018/0090534 A1 | 3/2018 | Kim | |
| 2018/0190694 A1 | 7/2018 | Ihara | |

FOREIGN PATENT DOCUMENTS

| | | |
|---|---|---|
| JP | H10-012726 | 1/1998 |
| JP | 2002-100685 | 4/2002 |
| JP | 2014-099582 | 5/2014 |
| JP | 2015-032687 | 2/2015 |
| JP | 2016-219788 | 12/2016 |

OTHER PUBLICATIONS

International Search Report prepared by the Japan Patent Office on Sep. 15, 2020, for International Application No. PCT/JP2020/025147, 6 pgs.

* cited by examiner

FIG.47
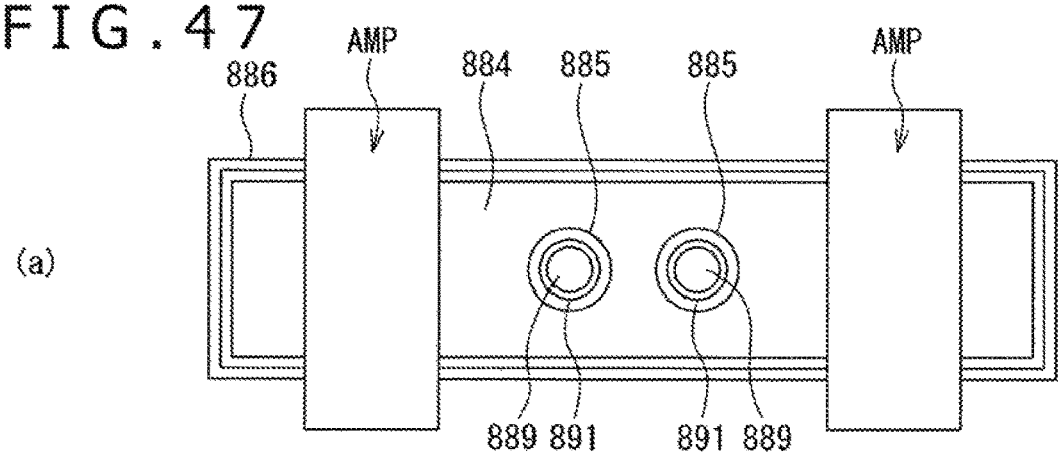
(a)
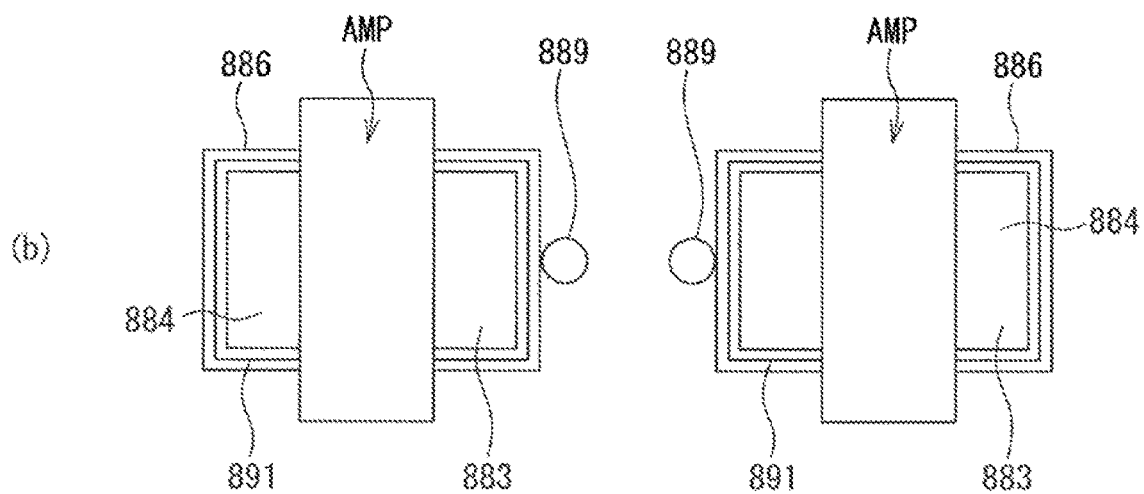
(b)
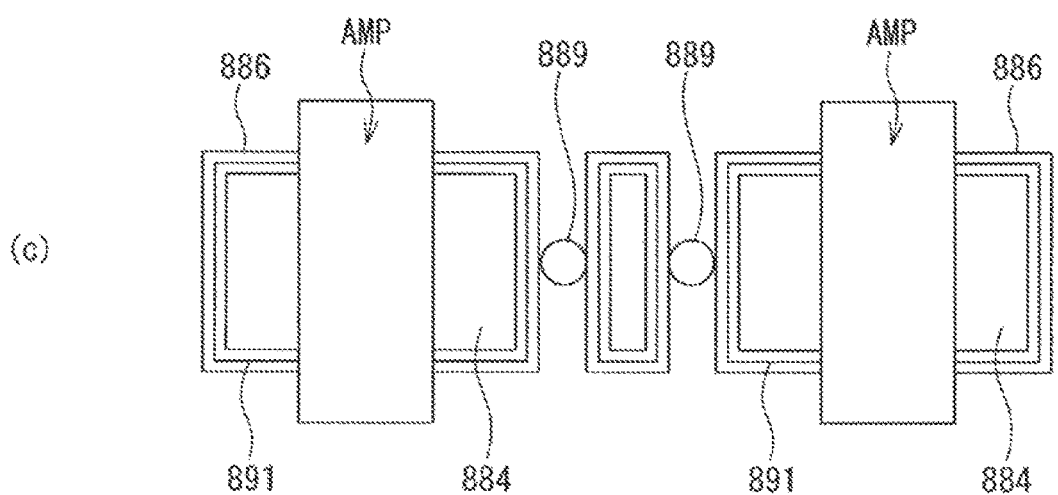
(c)

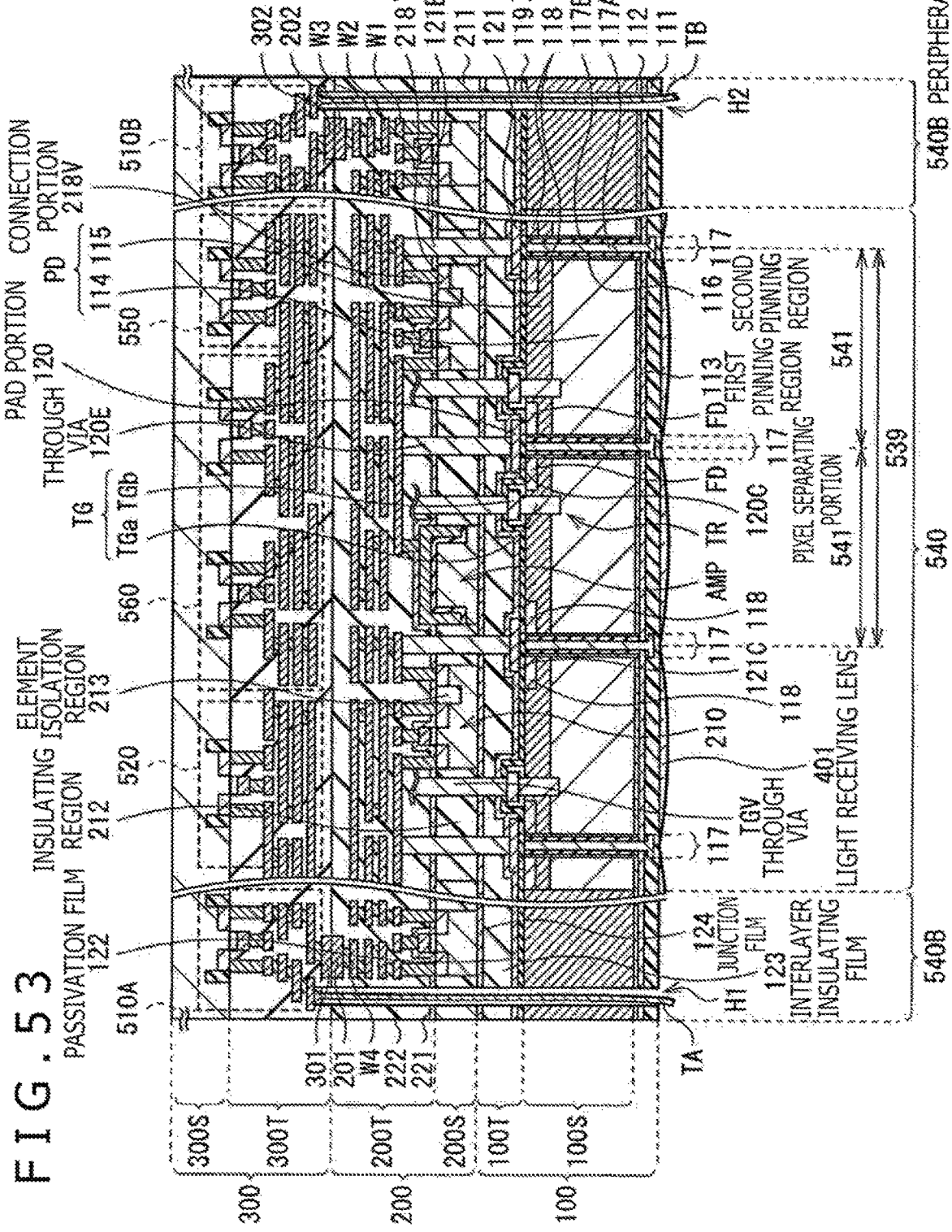

SEMICONDUCTOR APPARATUS AND METHOD FOR MANUFACTURING THE SAME

CROSS REFERENCE TO RELATED APPLICATIONS

This application is a national stage application under 35 U.S.C. 371 and claims the benefit of PCT Application No. PCT/JP2020/025147 having an international filing date of 26 Jun. 2020, which designated the United States, which PCT application claimed the benefit of Japanese Patent Application No. 2019-119169 filed 26 Jun. 2019, the entire disclosures of each of which are incorporated herein by reference.

TECHNICAL FIELD

A technology according to the present disclosure (present technology) relates to a semiconductor apparatus and a method for manufacturing the semiconductor apparatus.

BACKGROUND ART

Conventionally, there has been known a method in which a plurality of substrates on which elements such as transistors are formed are stacked to increase an element density in a vertical direction (see PTL 1). This method is characterized in that not only is one plane used but also the number of elements is increased to two, three, and so on each time a substrate is stacked. In a case of being used for elements with limited areas, the method enables an increase in the number of elements and allows configuration of a complicated circuit within a reduced area.

In an image sensor, a pixel size is fixed, and the area of an element formed for each pixel is limited to the pixel size. This prevents the size of the element from being freely changed, and an increase in the number of elements for a complicated circuit is limited. Thus, for devices such as image sensors which have a limited element area, an increase in element area on the basis of the stacked structure of a plurality of substrates is a very beneficial method.

CITATION LIST

Patent Literature

[PTL 1]
Japanese Patent Laid-open No. 2014-99582

SUMMARY

Technical Problem

For the stacked structure of a plurality of substrates, there has been a desire to reduce a resistance value for conductive paths electrically connecting vertically stacked substrates.

An object of the present technology is to provide a semiconductor apparatus that can reduce the resistance value for the conductive paths electrically connecting the vertically stacked substrates, and a method for manufacturing the semiconductor apparatus.

A semiconductor apparatus according to an aspect of the present technique includes a first semiconductor layer including a plurality of element formation regions disposed adjacent to one another via element isolation regions, each of the plurality of element formation regions being provided with a first active element, contact regions each provided on a side of the element isolation region of a front layer portion of each of the plurality of element formation regions, conductive pads connected to the contact regions of the respective plurality of element formation regions, the conductive pad extending across the element isolation region, a first insulating layer covering the first semiconductor layer and the conductive pads, a second semiconductor layer disposed on the first insulating layer and provided with a second active element, a second insulating layer covering the second semiconductor layer, and conductive plugs each embedded in a connection hole extending from the second insulating layer to the conductive pad, the conductive plug including a material that is identical to a material of the conductive pad and is formed integrally with the conductive pad.

A method for manufacturing a semiconductor apparatus according to another aspect of the present technique includes the steps of forming, in a first semiconductor layer, a plurality of element formation regions delimited by element isolation regions, forming contact regions each on a side of the element isolation region of a front layer portion of each of the plurality of element formation regions adjacent to one another via the element isolation regions, forming pad cores, via an etching stopper film, on the contact regions of the respective plurality of element formation regions, the pad core extending across the element isolation regions, forming a first active element in each of the plurality of element formation regions, forming a first insulating layer covering the first semiconductor layer and the pad cores, disposing a second semiconductor layer on the first insulating layer, executing a step including thermal treatment to form a second active element in the second semiconductor layer, forming a second insulating layer covering the second semiconductor layer, forming connection holes each extending from the second insulating layer to the pad core, removing the pad core and the etching stopper film through the connection hole to form a space portion communicating with the connection hole, and embedding a conductive material into the space portion and the connection hole to form a conductive pad connected to the contact regions and a conductive plug integrated with the conductive pad.

BRIEF DESCRIPTION OF DRAWINGS

FIG. 47 depicts diagrams each illustrating a modified example of the sixth embodiment.

FIG. 53 is a schematic cross-sectional view illustrating an example of a specific configuration of an imaging apparatus depicted in FIG. 50.

FIG. 84 is a schematic plan view illustrating another example of a pixel isolation portion depicted in FIG. 54A and the like.

DESCRIPTION OF EMBODIMENTS

First to tenth embodiments of the present technology will be described below with reference to the drawings. In the description of the drawings referred to in the description below, identical or similar components are assigned identical or similar reference signs. However, it should be noted that the drawings are schematic and that a relation between the thickness and planar dimensions, the ratio of the thicknesses of layers, and the like are different from real states. Consequently, specific thicknesses and dimensions should be recognized taking the description below into account. Additionally, needless to say, the drawings include portions differing in the relation among the dimensions and the ratio of the dimensions. Note that effects described herein are only illustrative and not restrictive and that any other effect may be produced.

First Embodiment

<Configuration of Sold-State Imaging Apparatus>

Figure 1:
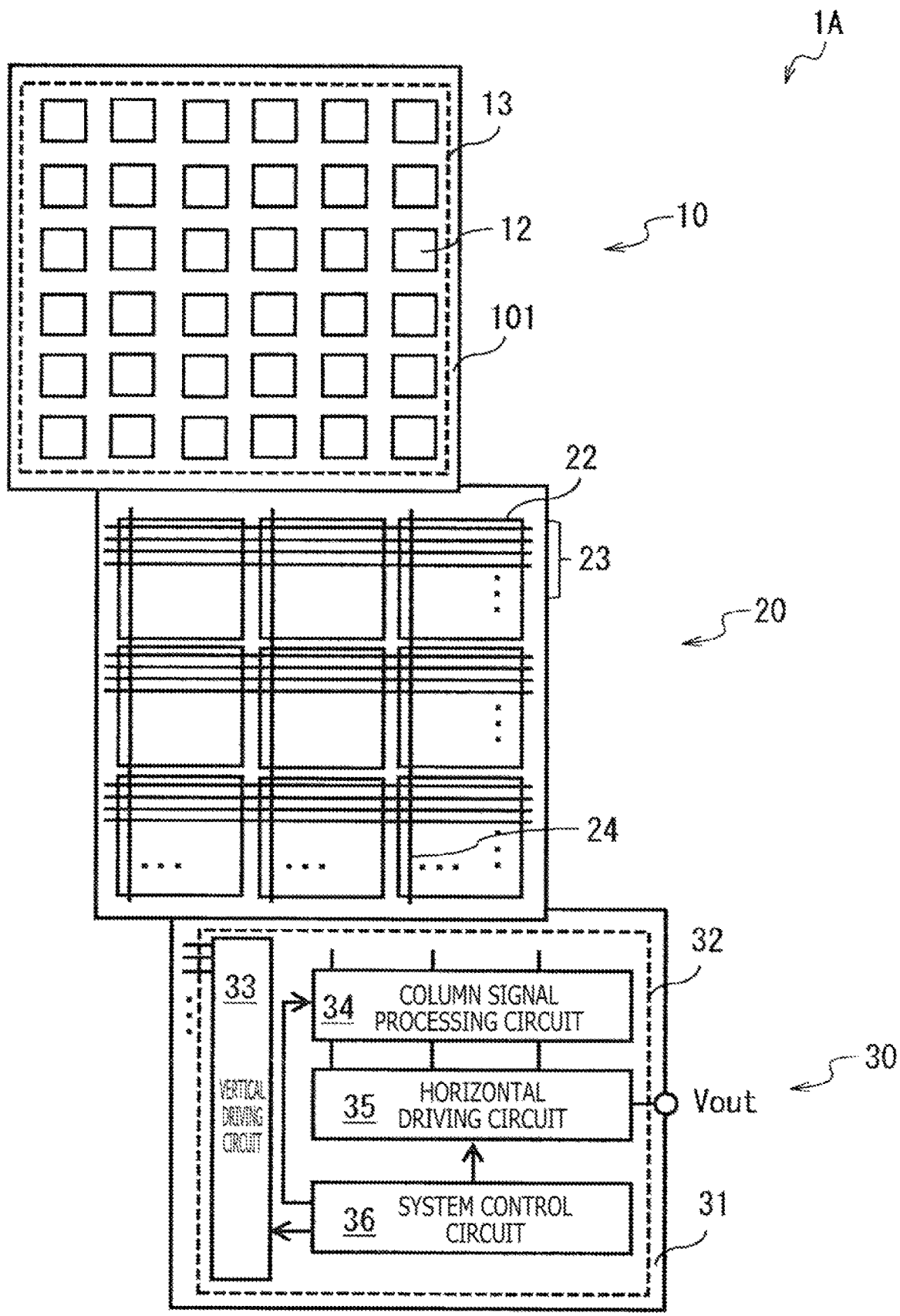
FIG. 1 is a schematic diagram generally depicting a solid-state imaging apparatus according to a first embodiment of the present technology.

As an example of a solid-state imaging apparatus according to a first embodiment of the present technology, a back-illuminated CMOS image sensor (solid-state imaging apparatus) will be described. As depicted in FIG. 1, a solid-state imaging apparatus 1A according to the first embodiment of the present technology includes a first substrate portion (first floor portion) 10, a second substrate portion (second floor portion) 20, and a third substrate portion (third floor portion) 30. The solid-state imaging apparatus 1A has a three-dimensional structure in which the first substrate portion 10, the second substrate portion 20, and the third substrate portion 30 are stacked in this order.

The first substrate portion 10 includes a plurality of sensor pixels 12 that perform photoelectric conversion on a semiconductor layer 701. The plurality of sensor pixels 12 are provided in a matrix in a pixel region 13 of the first substrate portion 10. The second substrate portion 20 includes readout circuits 22 that are each provided for four sensor pixels 12 and that output pixel signals based on charge output from the sensor pixels 12. The second substrate portion 20 includes a plurality of pixel driving lines 23 extending in a row direction and a plurality of vertical signal lines 24 extending in a column direction. Note that the third substrate portion 30 may be referred to as a bottom substrate.

The third substrate portion 30 includes a logic circuit 32 processing pixel signals. The logic circuit 32 includes, for example, a vertical driving circuit 33, a column signal processing circuit 34, a horizontal driving circuit 35, and a system control circuit 36. The logic circuit 32 (specifically, the horizontal driving circuit 35) outputs an output voltage Vout to the outside for each of the sensor pixels 12. The logic circuit 32 may include, for example, a low-resistance region including silicide by a salicide (Self Aligned Silicide) process with CoSi$_2$, NiSi, or the like, on a surface of an impurity diffusion region (semiconductor region) in contact with a source electrode and a drain electrode.

The vertical driving circuit 33, for example, sequentially selects the plurality of sensor pixels 12 in units of rows. The column signal processing circuit 34 executes, for example, correlated double sampling (CDS) processing on pixel signals output from the sensor pixels 12 in the row selected by the vertical driving circuit 33. The column signal processing circuit 34, for example, executes CDS processing to extract the signal level of the pixel signal to hold pixel data corresponding to the amount of light received by each sensor pixel 12. The horizontal driving circuit 35, for example, sequentially outputs, to the outside, pixel data held by the column signal processing circuit 34. The system control circuit 36, for example, controls driving of blocks (the vertical driving circuit 33, the column signal processing circuit 34, and the horizontal driving circuit 35) in the logic circuit 32.

Figure 2:
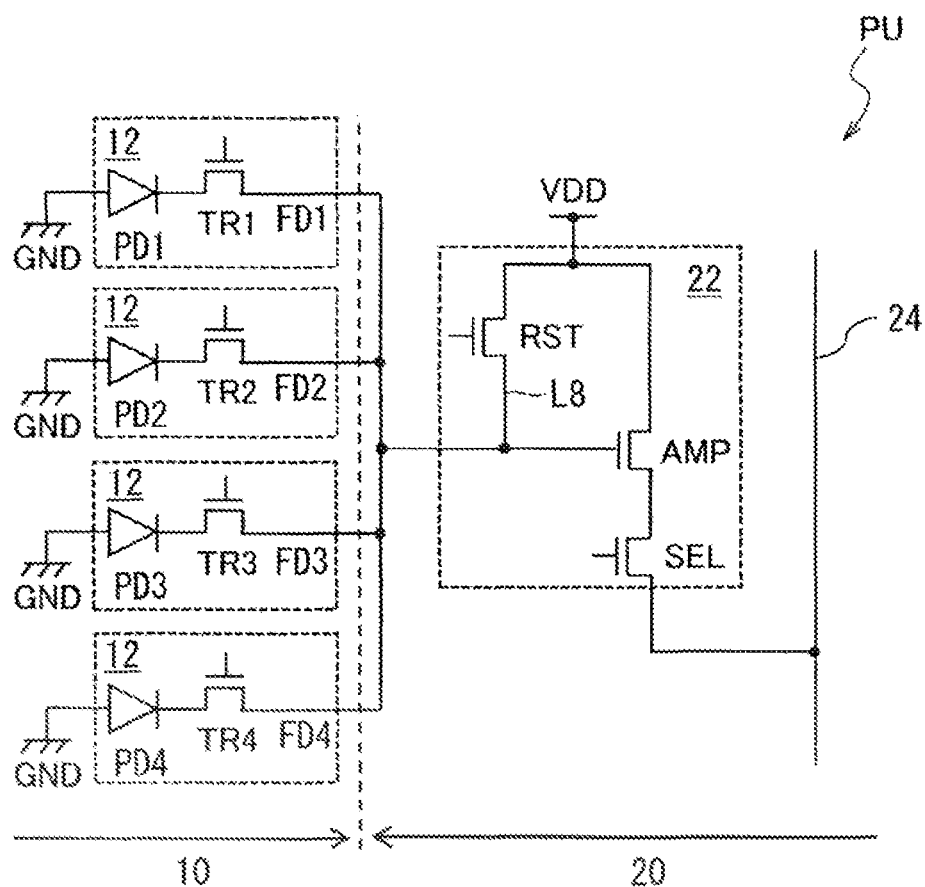
FIG. 2 is an equivalent circuit diagram of a pixel unit of the solid-state imaging apparatus according to the first embodiment of the present technology.

FIG. 2 is an equivalent circuit diagram depicting a configuration example of a pixel unit PU of a solid-state imaging apparatus 1A according to the first embodiment of the present technology. As depicted in FIG. 2, in the solid-state imaging apparatus 1A, four sensor pixels 12 are electrically connected to one readout circuit 22 to form one pixel unit PU. Four sensor pixels 12 share one readout circuit 22, and output from the four sensor pixels 12 is input to the shared readout circuit 22.

Each of the sensor pixels 12 includes common components. In FIG. 2, for distinction of the components of the sensor pixels 12, reference signs (for example, PD, TG, and FD described below) for the components of the sensor pixels 12 are assigned identification numbers (1, 2, 3, and 4) at the end of the reference sign. In a case where the components of the sensor pixels 12 need to be distinguished from one another, the reference signs for the components of the sensor pixels 12 are assigned identification numbers at the end of the reference sign. However, in a case where the components of the sensor pixels 12 need not be distinguished from one another, the identification numbers each assigned to the end of the reference sign for the component of the sensor pixel 12 are omitted.

Each sensor pixel 12 includes, for example, a photodiode PD (example of a photoelectric conversion element), a transfer transistor TR electrically connected to the photodiode PD, and a floating diffusion FD temporarily holding charge output from the photodiode PD via the transfer transistor TR. The photodiode PD performs photoelectric conversion to generate charge corresponding to the amount of light received. A cathode region of the photodiode PD is electrically connected to a source region of the transfer transistor TR, and an anode region of the photodiode PD is electrically connected to a reference potential line (for example, ground). A drain region of the transfer transistor TR is electrically connected to the floating diffusion FD, and a gate electrode of the transfer transistor TR is electrically connected to the pixel driving lines 23. The transfer transistor TR is, for example, a CMOS (Complementary Metal Oxide Semiconductor) transistor. The floating diffusion FD includes an n-type contact region 705 described below (see FIG. 4).

The floating diffusions FD of the sensor pixels 12 sharing one readout circuit 22 are electrically connected to each other and to an input end of the common readout circuit 22.

The readout circuit 22 includes, for example, an amplifying transistor AMP (an example of a first transistor), a reset transistor RST, and a select transistor SEL (an example of a second transistor). Note that the select transistor SEL may be omitted as necessary.

A source region of the reset transistor RST (an input end of the readout circuit 22) is electrically connected to the floating diffusion FD, and a drain region of the reset transistor RST is electrically connected to a power supply line VDD and a drain region of the amplifying transistor AMP. A gate electrode of the reset transistor RST is electrically connected to the pixel driving line 23 (see FIG. 1). A source region of the amplifying transistor AMP is electrically connected to a drain region of the select transistor SEL, and a gate electrode of the amplifying transistor AMP is electrically connected to the source region of the reset transistor RST. A source region of the select transistor SEL (an output end of the readout circuit 22) is electrically connected to the vertical signal line 24, and a gate electrode of the select transistor SEL is electrically connected to the pixel driving line 23 (FIG. 1).

Figure 4:
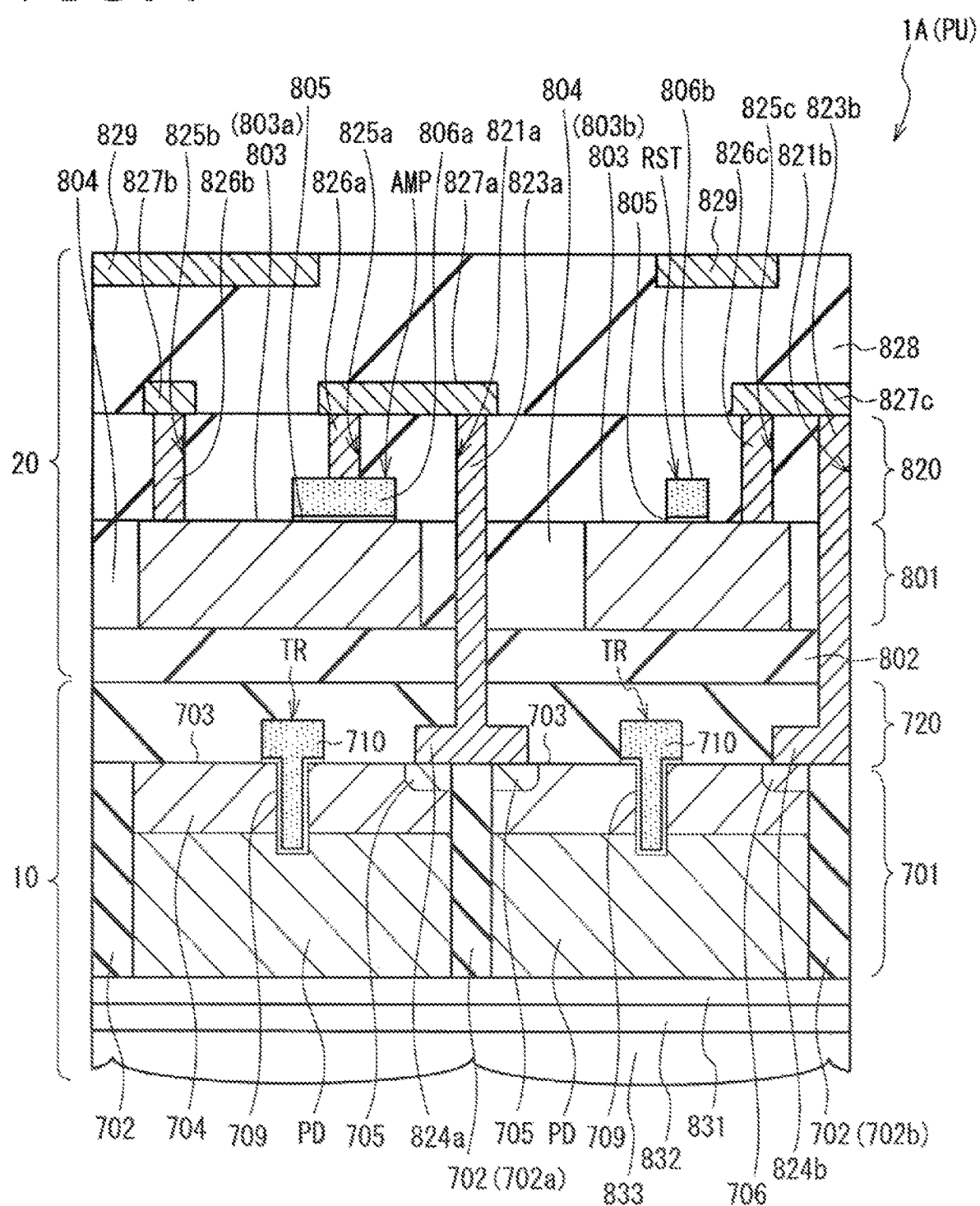
FIG. 4 is a cross-sectional view of a main part of the pixel unit of the solid-state imaging apparatus according to the first embodiment of the present technology.

In an on-state, the transfer transistor TR transfers charge in the photodiode PD to the floating diffusion FD. A gate electrode 710 of the transfer transistor TR, for example, extends from a front surface of the semiconductor layer 701 through a well region 704 to a depth where the gate electrode 710 reaches the photodiode PD, as depicted in FIG. 4 described below. The reset transistor RST resets the potential of the floating diffusion FD to a predetermined potential. In an on-state, the reset transistor RST resets the potential of the floating diffusion FD to the potential of the power supply line VDD. The select transistor SEL controls the output timing of the pixel signal from the readout circuit 22.

The amplifying transistor AMP generates, as a pixel signal, a signal of a voltage corresponding to the level of charge held in the floating diffusion FD. The amplifying transistor AMP constitutes a source follower amplifier, and outputs a pixel signal of a voltage corresponding to the level of charge generated in the photodiode PD. When the select transistor SEL turns on, the amplifying transistor AMP amplifies the potential of the floating diffusion FD, and outputs a voltage corresponding to the potential, to the column signal processing circuit 34 via the vertical signal line 24. The reset transistor RST, the amplifying transistor AMP, and the select transistor SEL are, for example, CMOS transistors.

Figure 3:
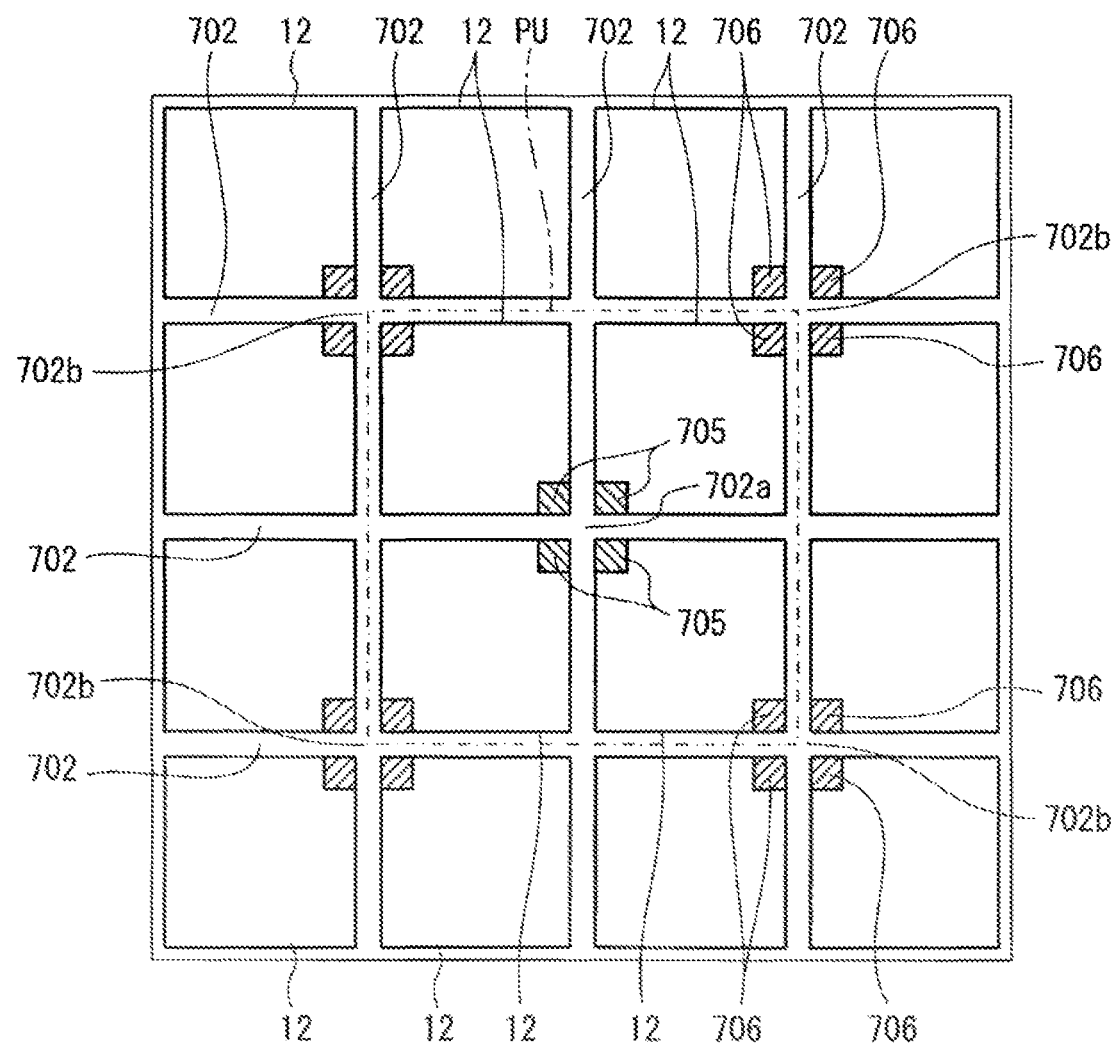
FIG. 3 is a diagram depicting arrangement of contact regions in a pixel unit of the solid-state imaging apparatus according to the first embodiment of the present technology.

FIG. 3 is a diagram illustrating arrangement of the contact regions in the pixel unit of the solid-state imaging apparatus according to the first embodiment of the present technology. FIG. 4 is a cross-sectional view of a main part of the pixel unit of the solid-state imaging apparatus according to the first embodiment of the present technology. Note that the main-part cross-sectional view depicted in FIG. 4 is only a schematic diagram and is not intended to illustrate an actual structure correctly in a strict sense. In the main-part cross-sectional view depicted in FIG. 4, the positions of the transistors and impurity diffusion regions (semiconductor regions) in the horizontal direction are intentionally changed for easy-to-understand description of configuration of the solid-state imaging apparatus 1A with reference to the drawings. Additionally, in FIG. 4, illustration of the third substrate portion is omitted.

As depicted in FIG. 4, the second substrate portion 20 is stacked on a major surface (front surface) side of the first substrate portion (bottom substrate) 10, the major surface corresponding to one surface of the first substrate portion 10. Although not depicted in the drawings, the third substrate portion 20 is stacked on a major surface side of the second substrate portion 20, the major surface corresponding to one surface of the second substrate portion 20.

The first substrate portion 10 includes the semiconductor layer 701 that is used as a first semiconductor layer and an insulating layer 720 that is used as a first insulating layer and that covers the semiconductor layer 701. Additionally, an incident surface of the first substrate portion 10 corresponds to a back surface opposite to the one surface. The back surface side of the first substrate portion 10 is provided with a planarization film 831, a color filter 832, a microlens 833, and the like. The planarization film 831 planarizes the back surface side of the first substrate portion 10. The microlens 833 focuses incident light on the first substrate portion 10. The color filter 832 separates incident light on the first substrate portion 10 into colors. The color filter 832 and the microlens 833 are each provided for each of the sensor pixels 12.

The semiconductor layer 701 includes a plurality of island regions 703 arranged adjacent to one another via an element isolation region 702 in a planar form and used as a plurality of element formation regions each provided with a first active element. The semiconductor layer 701 is formed by grinding a back surface side of a semiconductor substrate by, for example, a CMP method until the plurality of element formation regions delimited by the element isolation regions 702 are formed into the individual island regions 703. As the semiconductor substrate, a monocrystal silicon substrate of a first conductivity type (for example, an n-type) is used. In other words, each of the island regions 703 mainly includes the n-type semiconductor layer 701.

The element isolation region 702 electrically isolates the island regions 703 adjacent to each other. The element isolation region 702 has, for example, an STI (Shallow Trench Isolation) structure and extends from the major surface of the semiconductor layer 701 in a depth direction.

One island region 703 corresponds to one sensor pixel 12. A well region 704 of a second conductivity type (for example, a p-type) is provided in a front layer portion of the island region 703. In a region deeper than the well region 704, n-type photodiodes PD used as first active elements are provided. Additionally, in the front layer portion of the island region 703, the transfer transistors TR are provided as first active elements. Although not depicted in detail, the transfer transistor TR includes a gate insulating film 109 provided along an inner wall of a gate groove extending from the major surface of the island region 703 in the depth direction, a gate electrode 710 having a T shape and including a portion embedded into the gate groove via a gate insulating film 709 and another portion protruding from the gate groove, and a source region and a drain region (not illustrated).

Additionally, as depicted in FIGS. 3 and 4, an n-type contact region 705 is provided inside the well region 704 on the element isolation region 702 side of the front layer portion of the island region 703. As depicted in FIG. 3, the contact region 705 is provided in contact with a first intersecting portion 702a included in intersecting portions at which the element isolation region 702 extending in the row direction intersects the element isolation region 702 extending in the column direction, the first intersecting portion 702a being located at a central portion of the pixel unit PU including four sensor pixels 12 as one unit. The contact regions 705 reduce Ohmic contact resistance between the contact region 705 and a conductive pad 824a described below and share the floating diffusion FD.

Additionally, as depicted in FIGS. 3 and 4, the element isolation region 702 side of the front layer portion of the island region 703 is provided with a p-type contact region 706 that is located inside the well region 704 and that has a higher impurity concentration than that of the well region 704. As depicted in FIG. 3, the contact region 706 is provided in contact with a second intersecting portion 702b included in the intersecting portions of the element isolation region 702 and located at corners of the pixel units PU. The contact regions 706 reduce Ohmic contact resistance between the contact region 706 and a conductive pad 742b described below.

In the central portion of the pixel unit PU, as depicted in FIG. 4, the conductive pad 824a described above is electrically and mechanically connected, across the first intersecting portion 702a of the element isolation region 702, to the contact regions 705 in the respective four island regions 703 arranged via the first intersecting portion 702a of the element isolation region 702. Additionally, a conductive pad 824b described above is electrically and mechanically connected, across the second intersecting portion 702b of the element isolation region 702, to the contact regions 706 in the respective four island regions 703 arranged via the second intersecting portion 702b of the element isolation region 702.

The insulating layer 720 is provided on the semiconductor layer 701 over the island region 703 and over the conductive pads 824a and 824b. The first insulating layer 720 includes, for example, one of a silicon oxide film (SiO), a silicon nitride film (SiN), an oxynitride silicon film (SiON), or a carbonitride silicon film (SiCN), or a stack film formed by stacking two or more of the above-described films.

As depicted in FIG. 4, the second substrate portion 20 includes a semiconductor layer 801 used as a second semiconductor layer and an insulating layer 820 used as a second insulating layer provided on the semiconductor layer 801. Additionally, the second substrate portion 20 includes an insulating film 802 on a back surface of the semiconductor layer 801, the back surface being opposite to the insulating layer 820 side. The semiconductor layer 801 is disposed on the insulating layer 720 via the insulating film 802. The insulating film 802 includes, for example, a silicon oxide film and is joined to the insulating layer 720 located below the insulating film 802.

As depicted in FIG. 4, the solid-state imaging apparatus 1A according to the first embodiment of the present technology further includes a conductive plug 823a embedded in a connection hole 821a extending from a front surface of the insulating layer 820 to a front surface of the conductive pad 824a, the conductive plug 823a including a material that is identical to the material of the conductive pad 824a and is formed integrally with the conductive pad 824a. The conductive pad 824a has a larger area as viewed in plan than that of the conductive plug 823a. Additionally, the solid-state imaging apparatus 1A according to the first embodiment of the present technology includes a conductive plug 823b embedded in a connection hole 821b extending from the front surface of the insulating layer 820 to a front surface of the conductive pad 824b, the conductive plug 823b including a material that is identical to the material of the conductive pad 824b and is formed integrally with the conductive pad 824b. The conductive pad 824b has a larger area as viewed in plan than that of the conductive plug 823b. As the conductive plug 823a and the conductive pad 824a as well as the conductive plug 823b and the conductive pad 824b, a high-melting-point metal material, such as titanium (Ti), tungsten (W), cobalt (Co), or molybdenum (Mo), can be used, and, for example, tungsten (W) is used.

The insulating layer 820 is provided with a connection hole 825*a* extending from the front surface of the insulating layer 820 to a front surface of a gate electrode 806*a* on an island region 803*a*, a connection hole 825*b* extending from the front surface of the insulating layer 820 to a front surface of the island region 803*a*, and a connection hole 825*c* extending from the front surface of the insulating layer 820 to a front surface of a gate electrode 806*b* on an island region 803*b*. Conductive plugs 826*a* to 826*c* are embedded in the connection holes 825*a* to 825*c*. As the conductive plugs 826*a* to 826*c*, a high-melting-point metal material can be used, and, for example, tungsten (W) is used.

On the insulating layer 820, a wire 827*a* is provided. The wire 827*a* is electrically and mechanically connected to and extending over the conductive plug 823*a* and over the conductive plug 826*a*. Additionally, on the insulating layer 820, a wire 827*b* is provided. The wire 827*b* is electrically and mechanically connected to and extending over the conductive plug 826*b*. In addition, on the insulating layer 820, a wire 827*c* is provided. The wire 827*c* is electrically and mechanically connected to and extending over the conductive plug 823*b* and over the conductive plug 826*c*.

On the insulating layer 820, an insulating film 828 is provided in such a manner as to cover the wires 827*a* to 827*c*. Wires 829 are provided in a front layer portion of the insulating film 828. As a material for the wires 827*a* to 827*c* and the wires 829, for example, metal such as copper (Cu) is used.

The amplifying transistor AMP includes a gate insulating film 205 formed on a major surface of the island region 803*a*, a gate electrode 806*a* provided on the gate insulating film 805, and a source region and a drain region formed in a front layer portion of the island region 803*a*. The reset transistor RST includes a gate insulating film 805 formed on a major surface of the island region 803*b*, a gate electrode 806*b* provided on the gate insulating film 805, and a source region and a drain region formed in a front layer portion of the island region 803*b*.

The gate electrode 806*a* of the amplifying transistor AMP provided in the second substrate portion 20 is electrically connected, via a conducive path including the conductive plug 826*a*, the wire 827*a*, the conductive plug 823*a*, and the conductive pad 824*a*, to each of the four contact regions 705 adjacent to the first intersecting portion 702*a* of the element isolation region 702 in the first substrate portion 10 in the lower stage. The conductive plug 823*a* in this conductive path includes the material identical to the material of the conductive pad 824*a* and is formed integrally with the conductive pad 824*a*, and thus, compared to a configuration in which the conductive plug 823*a* includes, for example, a polycrystal silicon film, this conductive path includes one less heterogeneous junction. Consequently, the solid-state imaging apparatus 1A of the first embodiment can reduce a resistance value for the conductive path electrically connecting the gate electrode 806*a* of the amplifying transistor AMP provided in the second substrate portion 20 in the upper stage to the contact region 705 provided in the first substrate portion 10 in the lower stage. Additionally, the contact regions 705 share the floating diffusion FD, thus enabling an increase in operation speed of the pixel unit PU.

The island region 803*b* provided in the second substrate portion 20 is electrically connected, via a conducive path including the conductive plug 826*c*, the wire 827*c*, the conductive plug 823*b*, and the conductive pad 824*b*, to each of the contact regions 706 adjacent to the second intersecting portion 702*b* of the element isolation region 702 in the first substrate portion 10 in the lower stage. The conductive plug 823*b* in this conductive path also includes the material identical to the material of the conductive pad 824*b* and is formed integrally with the conductive pad 824*b*, and thus, compared to a configuration in which the conductive plug 823*b* includes, for example, a polycrystal silicon film, this conductive path includes one less heterogeneous junction. Consequently, the solid-state imaging apparatus 1A of the first embodiment can reduce a resistance value for the conductive path electrically connecting the island region 803*b* provided in the second substrate portion 20 in the upper stage to the contact region 706 provided in the first substrate portion 10 in the lower stage.

<Method for Manufacturing Solid-State Imaging Apparatus>

Now, an example of a method for manufacturing the solid-state imaging apparatus according to the first embodiment will be described with reference to FIGS. 5 to 17.

First, the semiconductor layer 701 including a monocrystal silicon semiconductor substrate is prepared.

Figure 5:
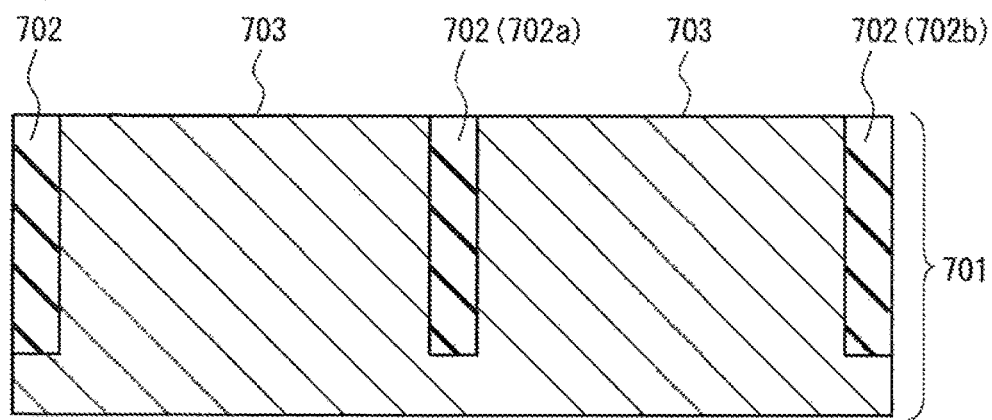
FIG. 5 is a step cross-sectional view of a method for manufacturing the solid-state imaging apparatus according to the first embodiment of the present technology.

Now, as depicted in FIG. 5, element isolation regions 702 are formed on the major surface side of the semiconductor layer 701, and island regions 703 that are used as element formation regions enclosed and delimited by the element isolation regions 702 are formed. Element isolation regions 702 are formed by, for example, using a photolithography technology and an anisotropic dry etching technology, which are well known, to form separation grooves extending from the major surface of the semiconductor layer 701 in the depth direction and then selectively embedding an insulating film into the separation grooves. The insulating film is embedded into the separation grooves by forming, by a CVD method, a silicon oxide film all over the major surface of the semiconductor layer 701 including the inside of the separation grooves, for example, and subsequently selectively removing the insulating film on the major surface of the semiconductor layer 701 by an etchback method or the CMP method.

Then, the photolithography technology, an ion implantation technology, and a thermal treatment technology, which are well known, are used to form p-type well regions 704 and n-type charge forming regions (not illustrated) that constitute photodiodes in the front layer portion (upper portion) of the semiconductor layer 1. This step forms the photodiodes PD in the island regions 703.

Figure 6:
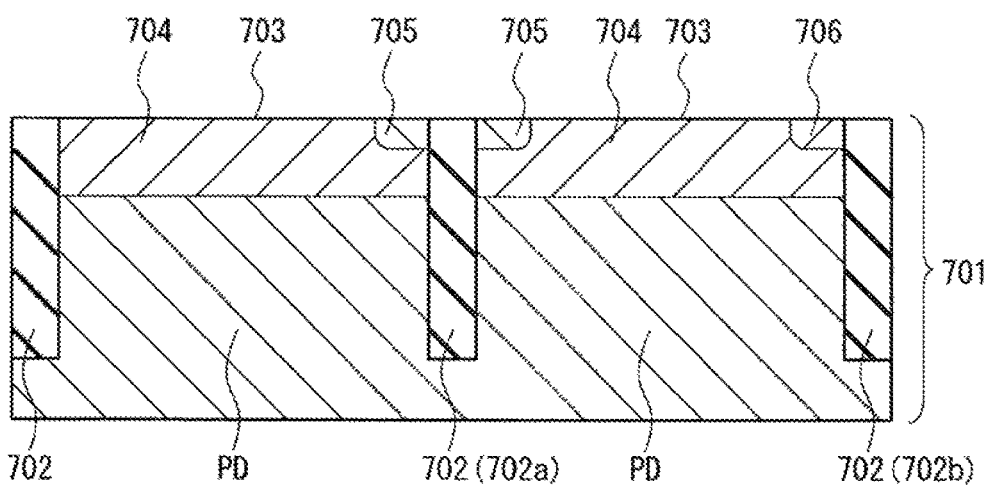
FIG. 6 is a step cross-sectional view of the method for manufacturing the solid-state imaging apparatus according to the first embodiment of the present technology, the step cross-sectional view being continued from FIG. 5.

Then, as depicted in FIG. 6, n-type contact regions 705 are formed on the element isolation region 702 side (first intersecting portion 702*a* side) of the front layer portion of each of the plurality of island regions 703 adjacent to one another via the element isolation region 702, and p-type contact regions 706 are formed on the element isolation region 702 side (second intersecting portion 702*b* side) of the front layer portion of each of the plurality of island regions 703 adjacent to one another via the element isolation region 702. The n-type contact regions 705 and the p-type contact regions 706 are alternately formed at the intersecting portions where the element isolation region extending in the row direction intersects the element isolation region 702 extending in the column direction. The contact regions 705 and the contact regions 706 are executed using the photolithography technology, the ion implantation technology, and the thermal treatment technology, which are well known.

Figure 7:
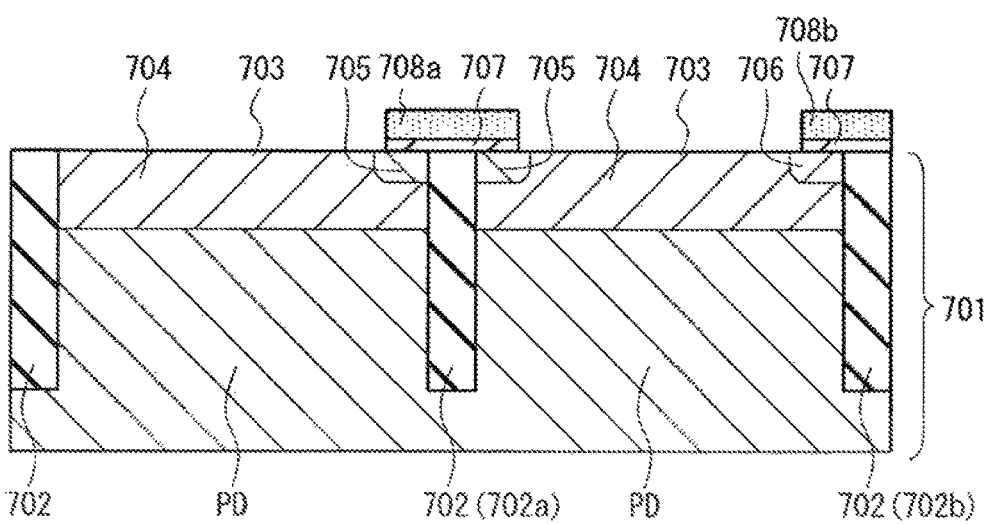
FIG. 7 is a step cross-sectional view of the method for manufacturing the solid-state imaging apparatus according to the first embodiment of the present technology, the step cross-sectional view being continued from FIG. 6.

Then, as depicted in FIG. 7, a pad core 708*a* is formed via an etching stopper film 707 on the n-type contact regions 705 in the respective four island regions 703 in such a manner as to extend across the first intersecting portion 702*a* of the element isolation region 702, and a pad core 708*b* is formed via the etching stopper film 707 on the p-type contact regions 706 in the respective four island regions 703 in such a manner as to extend across the second intersecting portion 702*b* of the element isolation region 702. The etching stopper film 707 and the pad cores 708*a* and 708*b* are formed by, for example, using the CVD method to form a silicon oxide film and a polycrystal silicon film in this order all over the semiconductor layer 701 including the surfaces of the island regions 703 and the element isolation regions 702, and subsequently patterning the polycrystal silicon film and the silicon oxide film in this order. As the polycrystal silicon film, a non-doped type is used into which no impurities reducing the resistance value are introduced during or after deposition.

Figure 8:
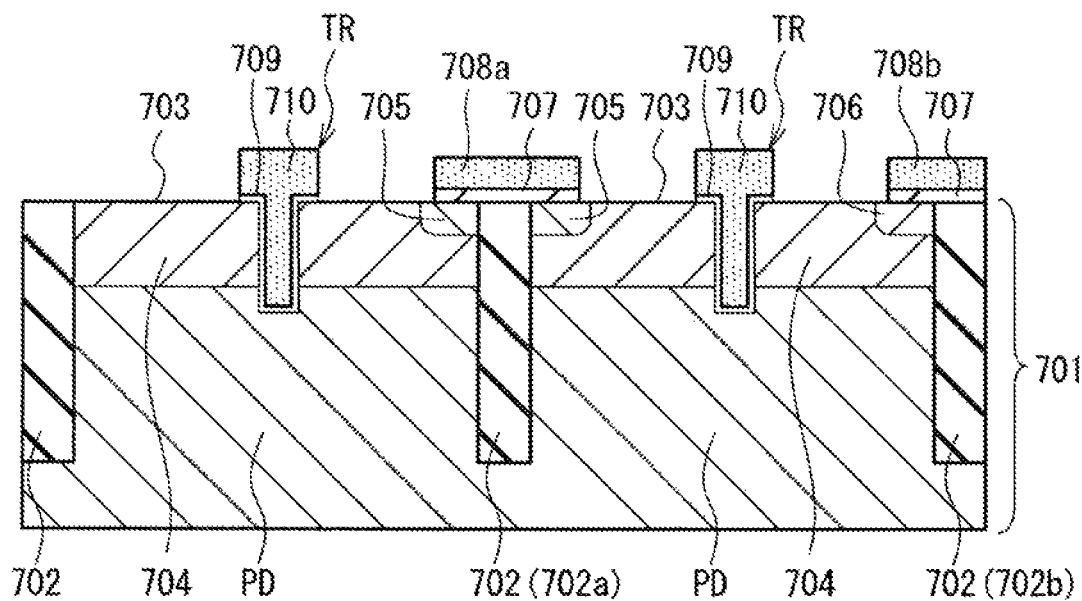
FIG. 8 is a step cross-sectional view of the method for manufacturing the solid-state imaging apparatus according to the first embodiment of the present technology, the step cross-sectional view being continued from FIG. 7.

Then, gate grooves extending from the major surface of the semiconductor layer 701 in the depth direction are formed in the island regions 703. Then, thermal oxidation treatment is executed to form a gate insulating film 709 including a thermal silicon oxide film, on the major surface of the semiconductor layer 701 including the inside of the gate grooves. Then, for example, a polycrystal silicon film is formed, as a gate electrode material, by the CVD method all over the surface of the gate insulating film 709 including the inside of the gate grooves. Impurities reducing the resistance value are introduced into the polycrystal silicon film during or after deposition. Then, the polycrystal silicon film and the gate insulating film 709 are patterned in this order to form gate electrodes 710 having a T shape and including a portion embedded into the gate groove via the gate insulating film 709 and another portion protruding from the gate groove as depicted in FIG. 8. This step forms transfer transistors TR.

Figure 9:
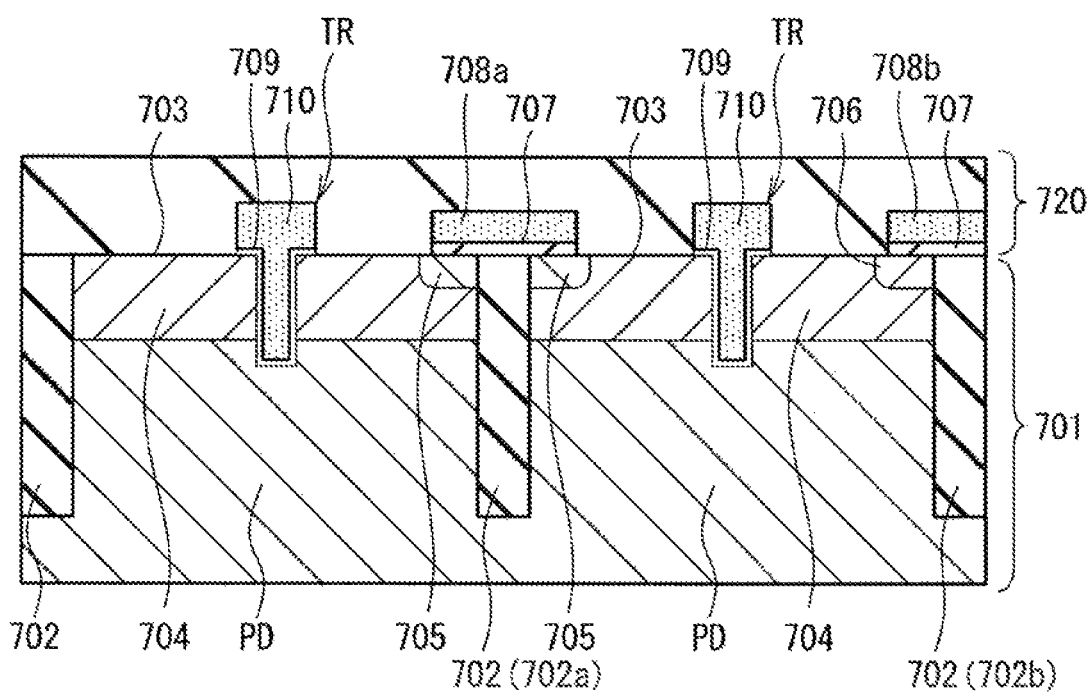
FIG. 9 is a step cross-sectional view of the method for manufacturing the solid-state imaging apparatus according to the first embodiment of the present technology, the step cross-sectional view being continued from FIG. 8.

Then, as depicted in FIG. 9, an insulating layer 720 used as a first insulating layer is formed all over the major surface of the semiconductor layer 701 in such a manner as to cover the gate electrodes 710 and the pad cores 708*a* and 708*b*.

Figure 10:
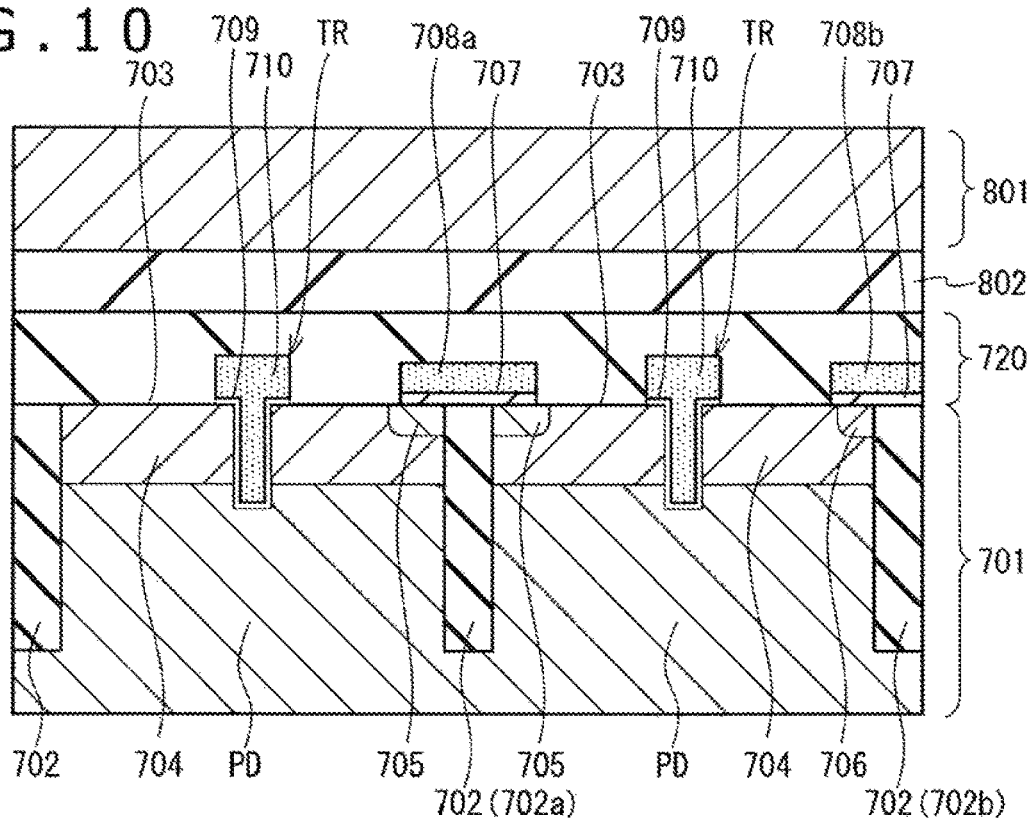
FIG. 10 is a step cross-sectional view of the method for manufacturing the solid-state imaging apparatus according to the first embodiment of the present technology, the step cross-sectional view being continued from FIG. 9.

Then, as a second semiconductor layer, for example, a semiconductor layer 801 including monocrystal silicon is prepared. On a back surface of the semiconductor layer 801, the back surface being opposite to a major surface of the semiconductor layer 801, the insulating film 802 including, for example, a silicon oxide film is provided. Then, as depicted in FIG. 10, the semiconductor layer 801 is laminated to the major surface side of the semiconductor layer 701. Specifically, thermal treatment is executed with the insulating layer 720 on the major surface side of the semiconductor layer 701 being placed opposite to and in close contact with the insulating film 802 on the back surface side of the semiconductor layer 801. Thus, as depicted in FIG. 10, the insulating film 802 and the insulating layer 720 are integrated, and the semiconductor layer 801 in the upper stage is joined to the semiconductor layer 701 in the lower stage via the insulating film 802 and the insulating layer 720. Additionally, the semiconductor layer 801 is disposed on the insulating layer 720. Subsequently, the major surface side of the semiconductor layer 801 is ground by, for example, the CMP method to reduce the thickness of the semiconductor layer 801.

Figure 11:
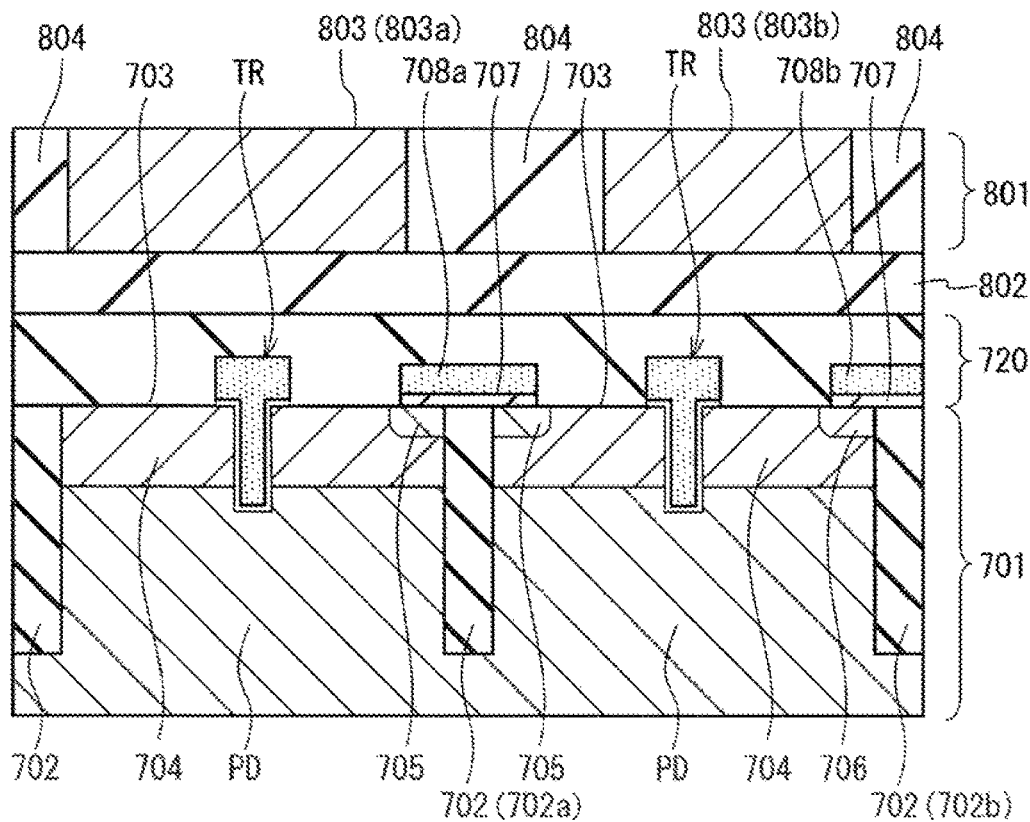
FIG. 11 is a step cross-sectional view of the method for manufacturing the solid-state imaging apparatus according to the first embodiment of the present technology, the step cross-sectional view being continued from FIG. 10.

Then, the photolithography technology, the anisotropic dry etching technology, and the like, which are well known, are used to pattern the semiconductor layer 801 into a plurality of island regions 803, and subsequently an insulating film 804 is embedded between the island regions 803 as depicted in FIG. 11. The insulating film 804 is embedded between the island regions 803 by forming, by the CVD method, the insulating film 804 including a silicon oxide film all over the surface of the semiconductor layer 801 including the surfaces of the island regions 803 and the areas between the island regions 803, and subsequently selectively removing the insulating film 804 on the island region 803 by the etchback method or the CMP method, for example.

Figure 12:
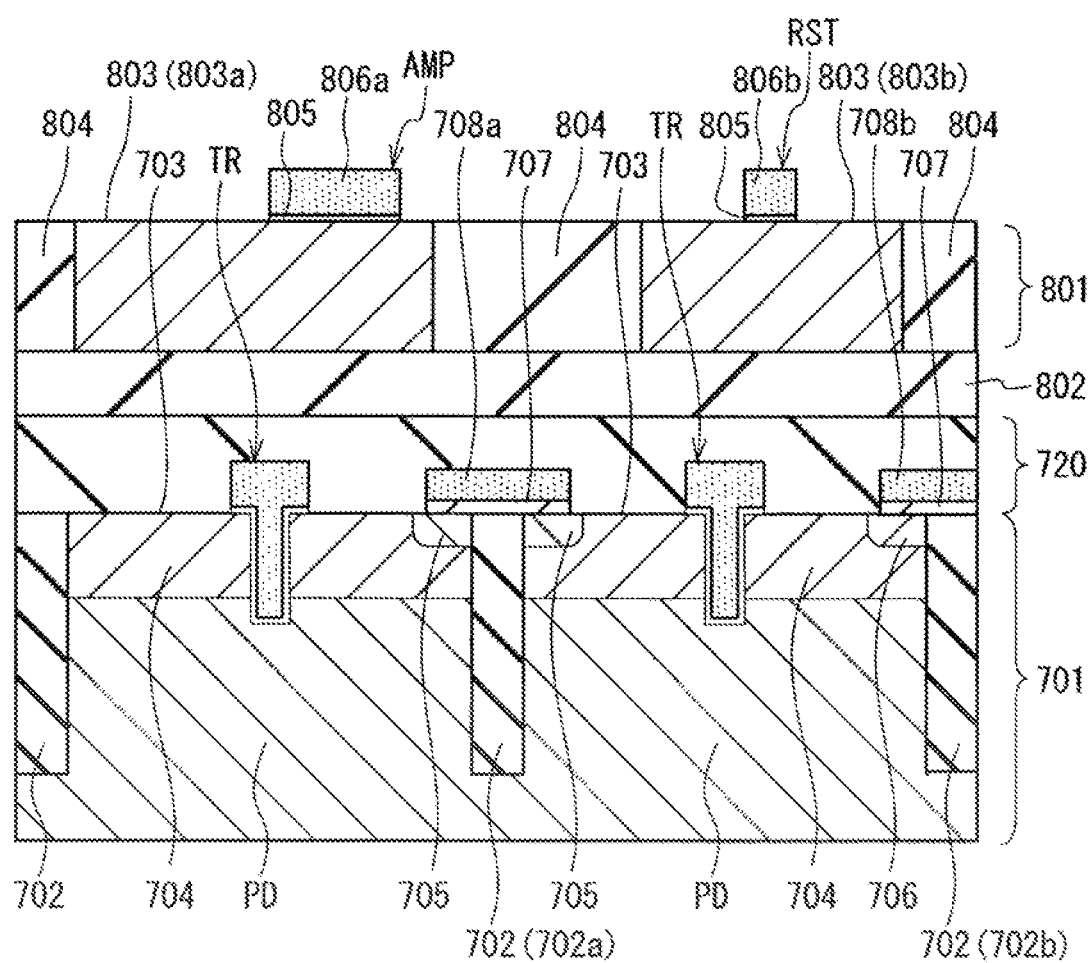
FIG. 12 is a step cross-sectional view of the method for manufacturing the solid-state imaging apparatus according to the first embodiment of the present technology, the step cross-sectional view being continued from FIG. 11.

Then, as depicted in FIG. 12, on an island region 803*a* included in the plurality of island regions 803, an amplifying transistor AMP and a select transistor SEL (not illustrated) are formed as second active elements, and on an island region 803*b* included in the plurality of island regions 803, a reset transistor RST is formed as a second active element. For the second active elements, first, the island region 803 is subjected to thermal oxidation treatment to form, on the major surface of the island region 803, a gate insulating film 805 including a thermal silicon oxide film. Then, for example, a polycrystal silicon film is formed by the CVD method all over the surface of the gate insulating film 805 as a gate electrode material. Impurities reducing the resistance value are introduced into the polycrystal silicon film during or after deposition. Then, the polycrystal silicon film and the gate insulating films 705 are patterned in this order to form gate electrode 806*a* and 806*b* on the island regions 803*a* and 803*b* via the gate insulating film 805. Then, impurities are ion-implanted into the island regions 803*a* and 803*b* by using the gate electrodes 806*a* and 806*b* as masks. Then, thermal treatment for recovery from crystal defects caused by ion implantation (thermal treatment for activating impurities) is executed on island regions 703*a* and 703*b* to form a source region and a drain region. Thus, the amplifying transistor AMP and the select transistor SEL are formed on the island region 803*a*, and the reset transistor RST is formed on the island region 803*b*.

In this step, the thermal oxidation treatment and the crystal defect recovery treatment are executed in a temperature atmosphere of approximately 1000° C. However, the pad cores 708*a* and 708*b* include a non-doped polycrystal silicon film, thus preventing diffusion of impurities from the pad cores 708*a* and 708*b* to the contact regions 705 and 706 and preventing resultant spread of the contact regions 705 and 706. In particular, since the contact regions 705 share the floating diffusions FD, accumulation of charge in the contact regions 705 can be stabilized.

An insulating layer 820 that is used as a second insulating layer and covers the island regions 703*a* and 703*b* is formed. Then, as depicted in FIG. 13, a front surface of the insulating layer 820 is planarized.

Figure 13:
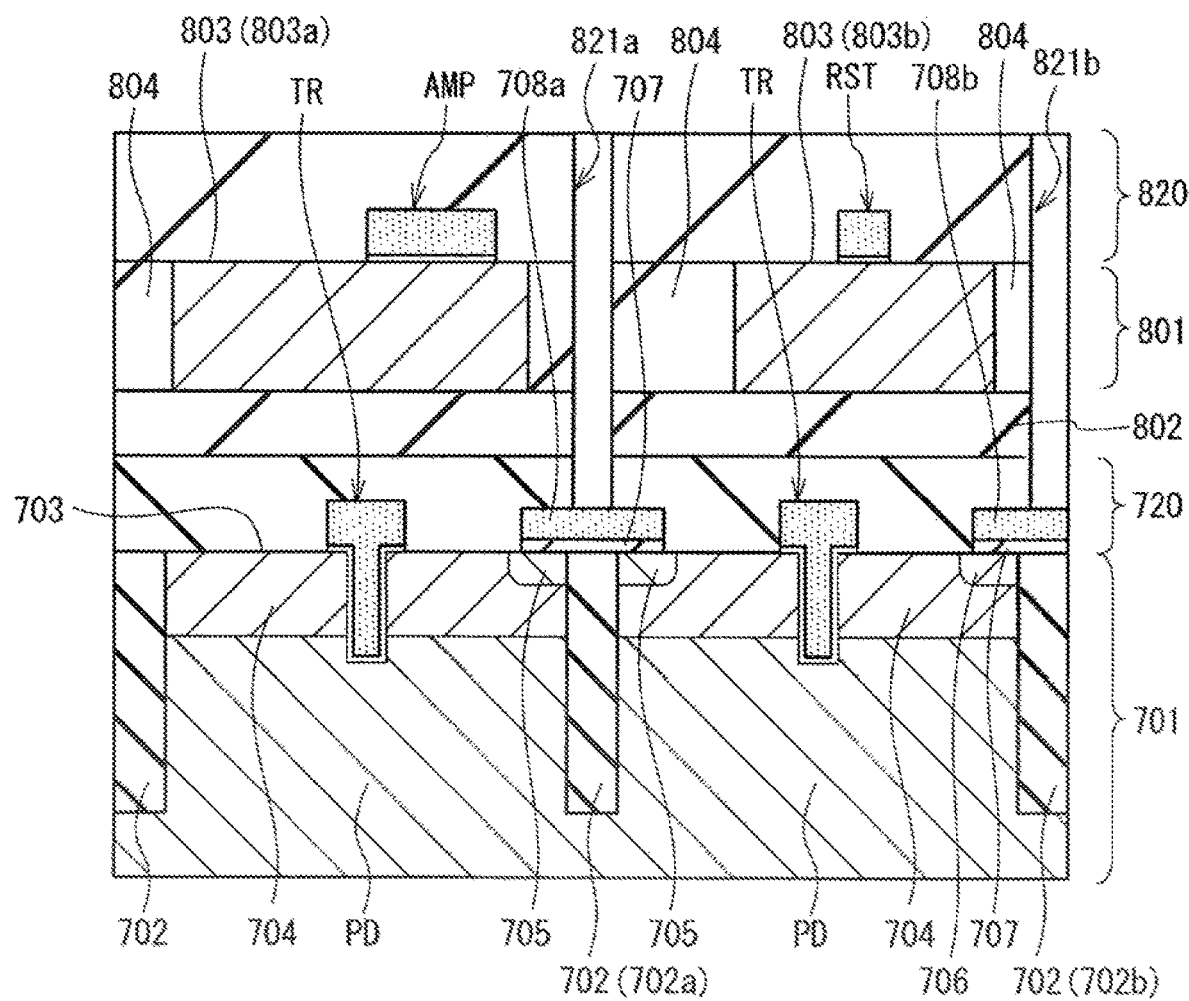
FIG. 13 is a step cross-sectional view of the method for manufacturing the solid-state imaging apparatus according to the first embodiment of the present technology, the step cross-sectional view being continued from FIG. 12.

Then, as depicted in FIG. 13, a connection hole 821*a* that extends from the front surface of the insulating layer 820 to the front surface of pad core 708*a* is formed, and a connection hole 821*b* that extends from the front surface of the insulating layer 820 to the front surface of the pad core 708*b* is formed. The connection holes 821*a* and 821*b* are executed using the photolithography technology and the anisotropic dry etching technology, which are well known.

Figure 14:
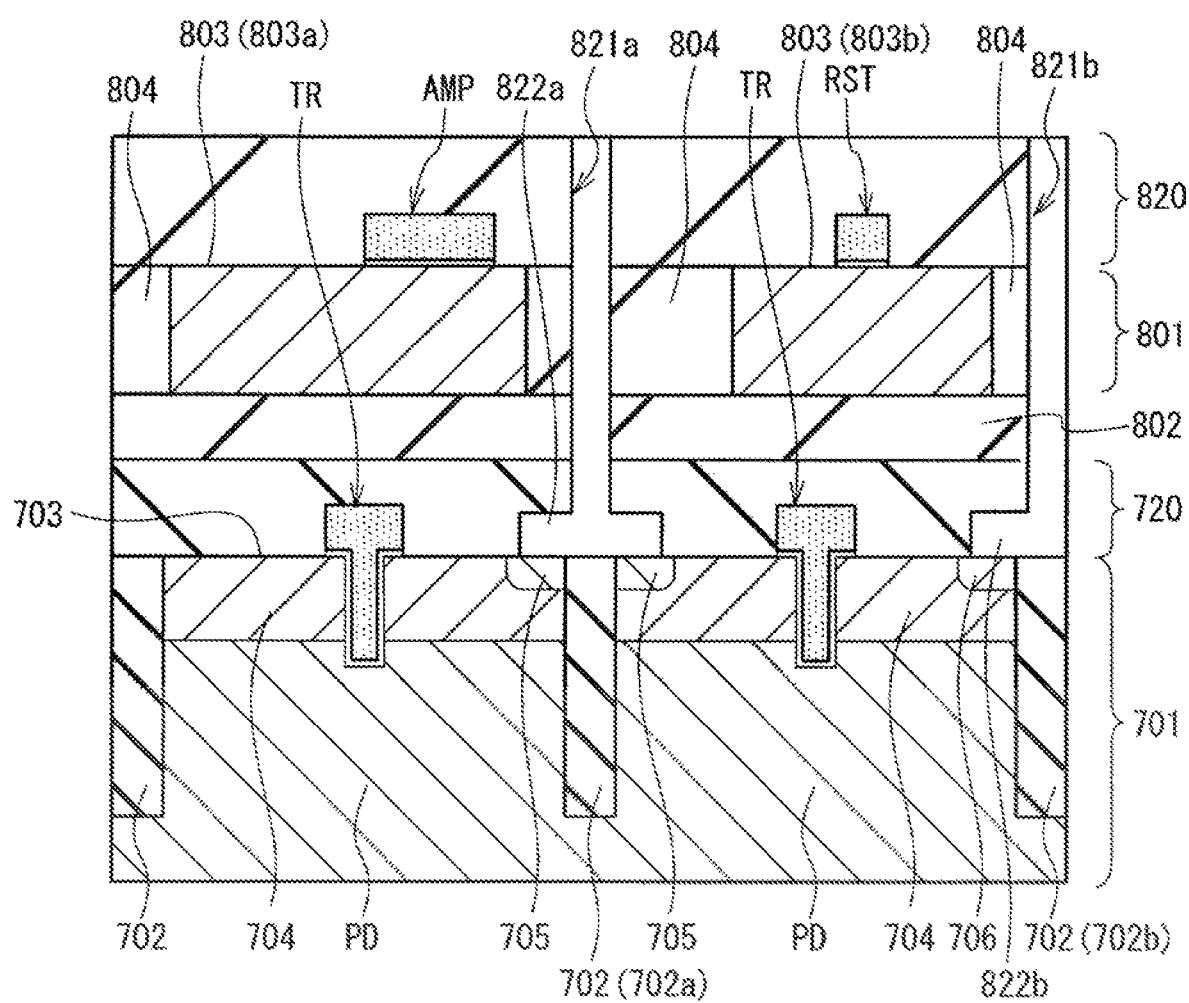
FIG. 14 is a step cross-sectional view of the method for manufacturing the solid-state imaging apparatus according to the first embodiment of the present technology, the step cross-sectional view being continued from FIG. 13.

Then, as depicted in FIG. 14, the pad core 708*a* and the etching stopper film 707 are removed through the connection hole 821*a* to form a space portion 822*a* communicating with the connection hole 821*a*, and the pad core 708*b* and the etching stopper film 707 are removed through the connection hole 821*b* to form a space portion 822*b* communicating with the connection hole 821*a*. The pad cores 708*a* and 708*b* are removed using selective etching conditions for the insulating layer 820, the insulating film 802, the insulating layer 720, and the etching stopper film 707. At this time, the front surfaces of the contact regions 705 and 706 are slightly etched, but compared to a configuration in which the pad cores 708*a* and 708*b* are etched and removed with the etching stopper film 707 not being provided, the present configuration can suppress a decrease in the thickness of the contact regions 705 and 706.

Figure 15:
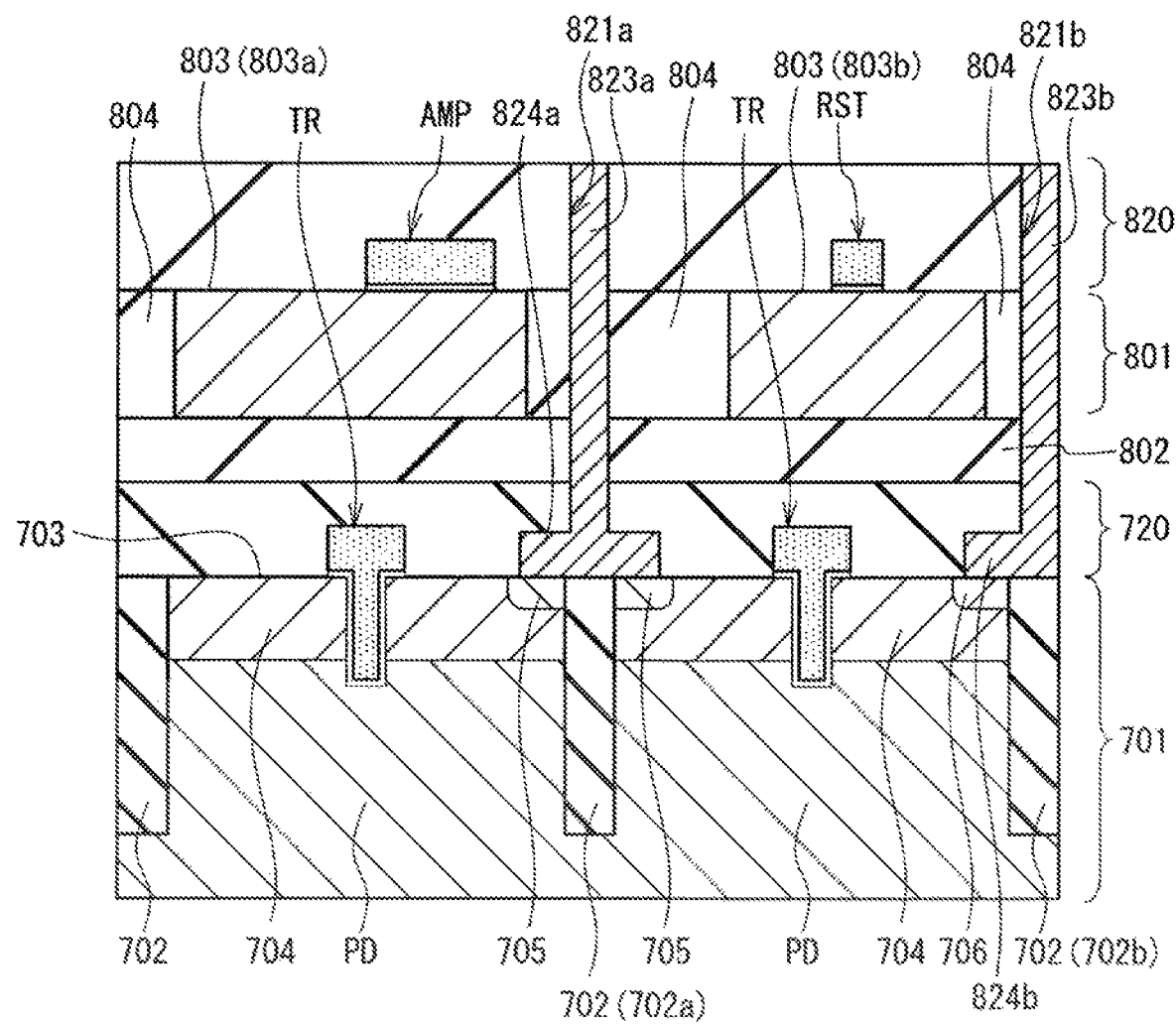
FIG. 15 is a step cross-sectional view of the method for manufacturing the solid-state imaging apparatus according to the first embodiment of the present technology, the step cross-sectional view being continued from FIG. 14.

Then, as depicted in FIG. 15, a conductive material is embedded into the space portions 822a and 822b and the connection holes 821a and 821b to form conductive pads 824a and 824b connected to the contact regions 705 and 706 and conductive plugs 823a and 823b including a material that is identical to the material of the conductive pads 824a and 824b and is formed integrally with the conductive pads 824a and 824b. For the conductive pads 824a and 824b and the conductive plugs 823a and 823b, first, a barrier metal film is formed, for example, by the PVD method, along inner walls of the connection holes 821a and 821b, inner walls of the space portions 822a and 822b, and front surfaces of the contact regions 705 and 706. The barrier metal film includes a composite film including a titanium (Ti) film/titanium nitride (TiN) film in this order from the lower side. The titanium film and the titanium nitride film are each formed to a thickness of, for example, approximately several dozens of nanometers. Then, as a high-melting-point material, for example, a tungsten (W) film is formed by the CVD method in such a manner as to fill the inside of the space portions 822a and 822b and the connection holes 821a and 821b. Then, the tungsten film and the barrier metal film are etched back by dry etching such as RIE to selectively remove the tungsten film and the barrier metal film on the contact regions 705 and 706 and on the insulating layer 820. Thus, the conductive pads 824a and 824b and the conductive plugs 823a and 823b are integrally formed using an identical material.

Figure 16:
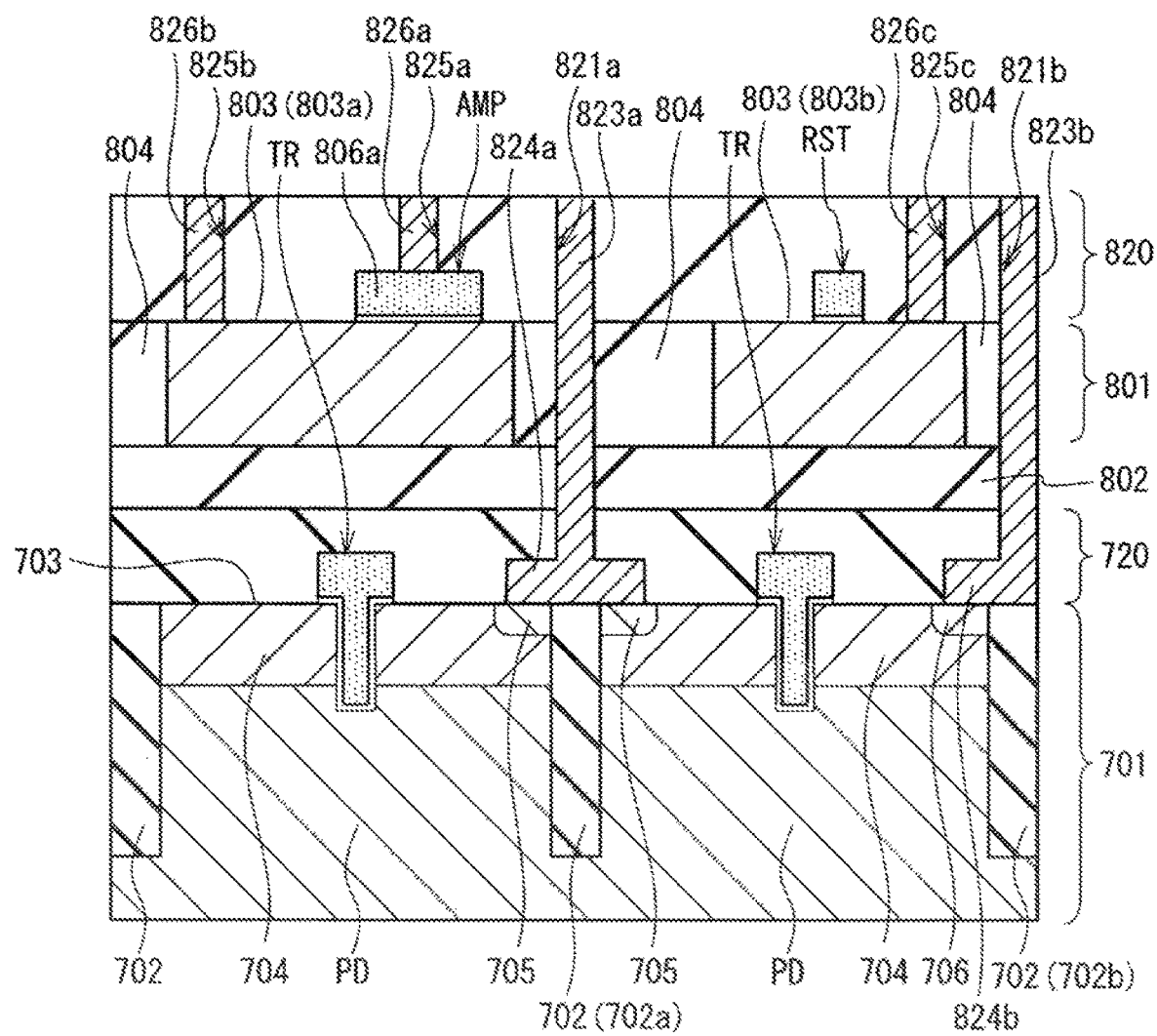
FIG. 16 is a step cross-sectional view of the method for manufacturing the solid-state imaging apparatus according to the first embodiment of the present technology, the step cross-sectional view being continued from FIG. 15.
Figure 17:
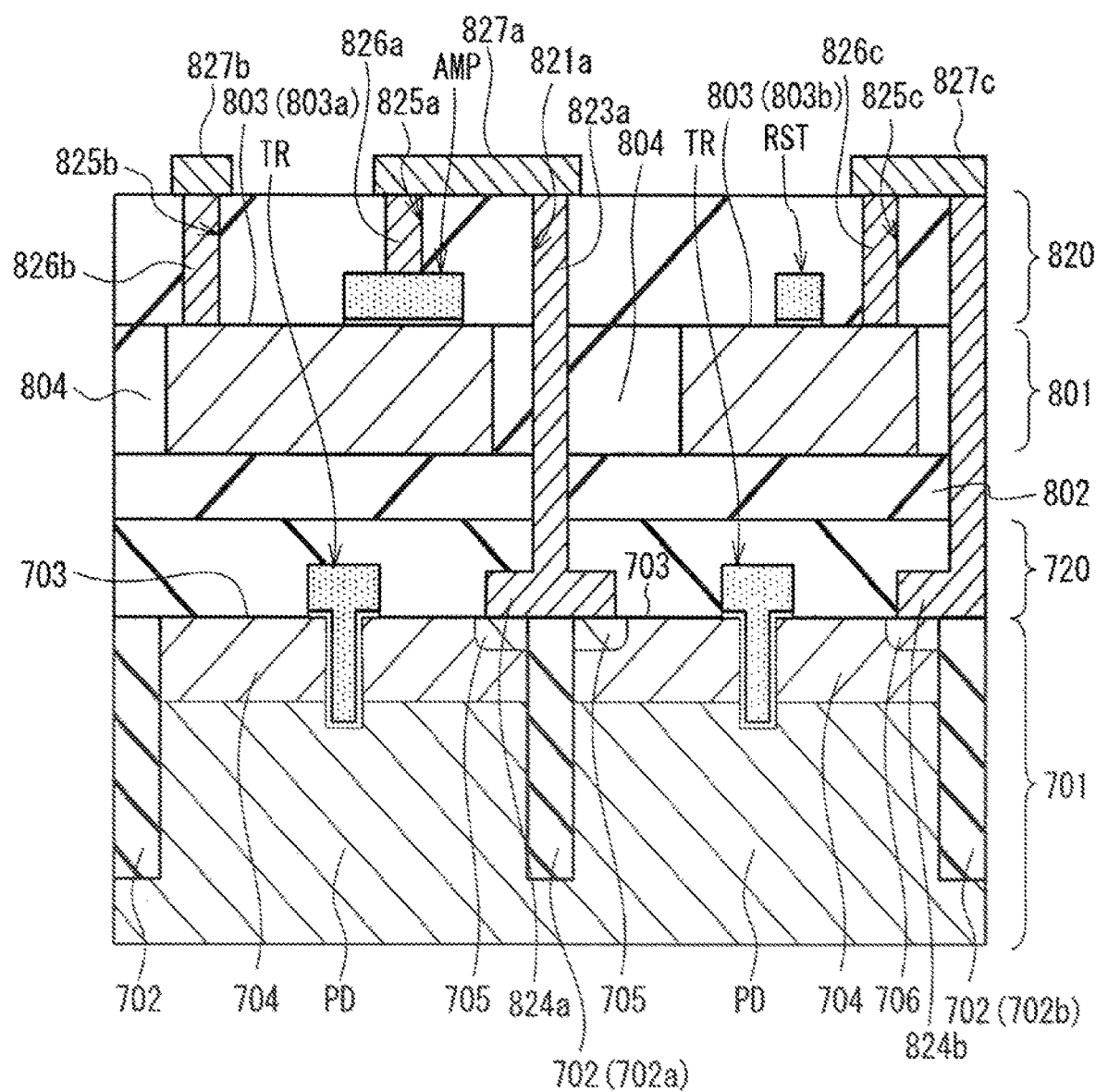
FIG. 17 is a step cross-sectional view of the method for manufacturing the solid-state imaging apparatus according to the first embodiment of the present technology, the step cross-sectional view being continued from FIG. 16.

Then, connection holes 825a, 825b, and 825c are formed. The connection hole 825a extends from the front surface of the insulating layer 820 to a front surface of the gate electrode 806a of the amplifying transistor AMP, the connection hole 825b extends from the front surface of the insulating layer 820 to the front surface of the island region 803a, and the connection hole 825c extends from the front surface of the insulating layer 820 to a front surface of the island region 803b. Then, as depicted in FIG. 16, conductive plugs 826a to 826c are respectively embedded in the connection holes 825a to 825c with use of a method similar to the method for the conductive plug 823a and 823b described above.

Then, wires 826a, 826b, and 826c are formed on the front surface of the insulating layer 820. The wire 827a is electrically and mechanically connected to the conductive plug 823a and the conductive plug 826a, the wire 827b is electrically and mechanically connected to the conductive plug 826b, and the wire 827c is electrically and mechanically connected to the conductive plug 823b and the conductive plug 826c. The wires 827a to 827c are formed by using the CVD method to form, for example, a copper film on the front surface of the insulating layer 820 as a metal film and subsequently patterning the copper film with use of the photolithography technology and the anisotropic dry etching technology.

Then, an insulating film 828 covering the insulating layer 820 including the wires 827a to 827c is formed on the insulating layer 820, and subsequently a wire 829 that is embedded in a front layer portion of the insulating layer 820 is formed.

Then, the third substrate portion 30 on which the logic circuit 32 and the like are formed is laminated to the second substrate portion 20. Then, a back surface side of the semiconductor layer 701 is ground by CMP or the like until the element isolation region 702 is exposed, thus isolating island regions 103 from one another. Further, a planarization film, a color filter, a microlens, and the like are formed on the back surface side of the semiconductor layer 701. Thus, the solid-state imaging apparatus 1A according to the first embodiment depicted in FIG. 1 is substantially completed.

According to the method for manufacturing the solid-state imaging apparatus 1A according to the first embodiment, the conductive plug 823a and the conductive pad 824a are integrally formed using an identical material, and the conductive plug 823b and the conductive pad 824b are integrally formed using an identical material. Therefore, compared to a case where the conductive pad 824a is formed using, for example, a polycrystal silicon film, this method can involve one less heterogeneous junction. Thus, the solid-state imaging apparatus 1A that has a reduced resistance value for the conductive path including the conductive plug 823a and the conductive pad 824a and a reduced resistance value for the conductive path including the conductive plug 823a and the conductive pad 824a can be manufactured.

Additionally, the method for manufacturing the solid-state imaging apparatus 1A according to the first embodiment prevents diffusion of impurities from the conductive pads 824a and 824b to the contact regions 705 and 706, allowing manufacture of the solid-state imaging apparatus 1A with the spread of the contact regions 705 and 706 suppressed.

Note that, for the solid-state imaging apparatus 1A according to the first embodiment described above, the semiconductor layer 801 in which the insulating film 804 is embedded between the island regions 803 has been described. However, the semiconductor layer 801 may include one semiconductor as is the case with the semiconductor substrate 21 depicted in FIG. 104 for a tenth embodiment described below. In this case, as is the case with the semiconductor substrate 21 in FIG. 104, an element isolation layer 213 enclosing the transistor is formed in the semiconductor layer 801. Additionally, in this case, after a through-hole through which the conductive plug 823a passes and a through-hole through which the conductive plug 823b passes are formed in the semiconductor layer 801, a higher insulating layer 820 may be formed in such a manner to be embedded in the through-holes. In a case where the conductive plugs 823a and 823b are passed through the through-holes formed in the semiconductor layer 801, an insulating film is preferably interposed between the semiconductor layer 801 and the conductive plugs 823a and 823b for insulation and isolation.

Additionally, the second substrate portion 20 of the first embodiment may include semiconductor substrate 21 and 21A stacked on each other, like the second substrate portion 20 depicted in FIG. 104 for the tenth embodiment described below. In this case, the conductive plugs 823a and 823b are preferably formed in such a manner to penetrate a plurality of semiconductor substrates while being insulated and isolated from the plurality of semiconductor substrates.

Second Embodiment

<Configuration of Solid-State Imaging Apparatus>

Figure 18:
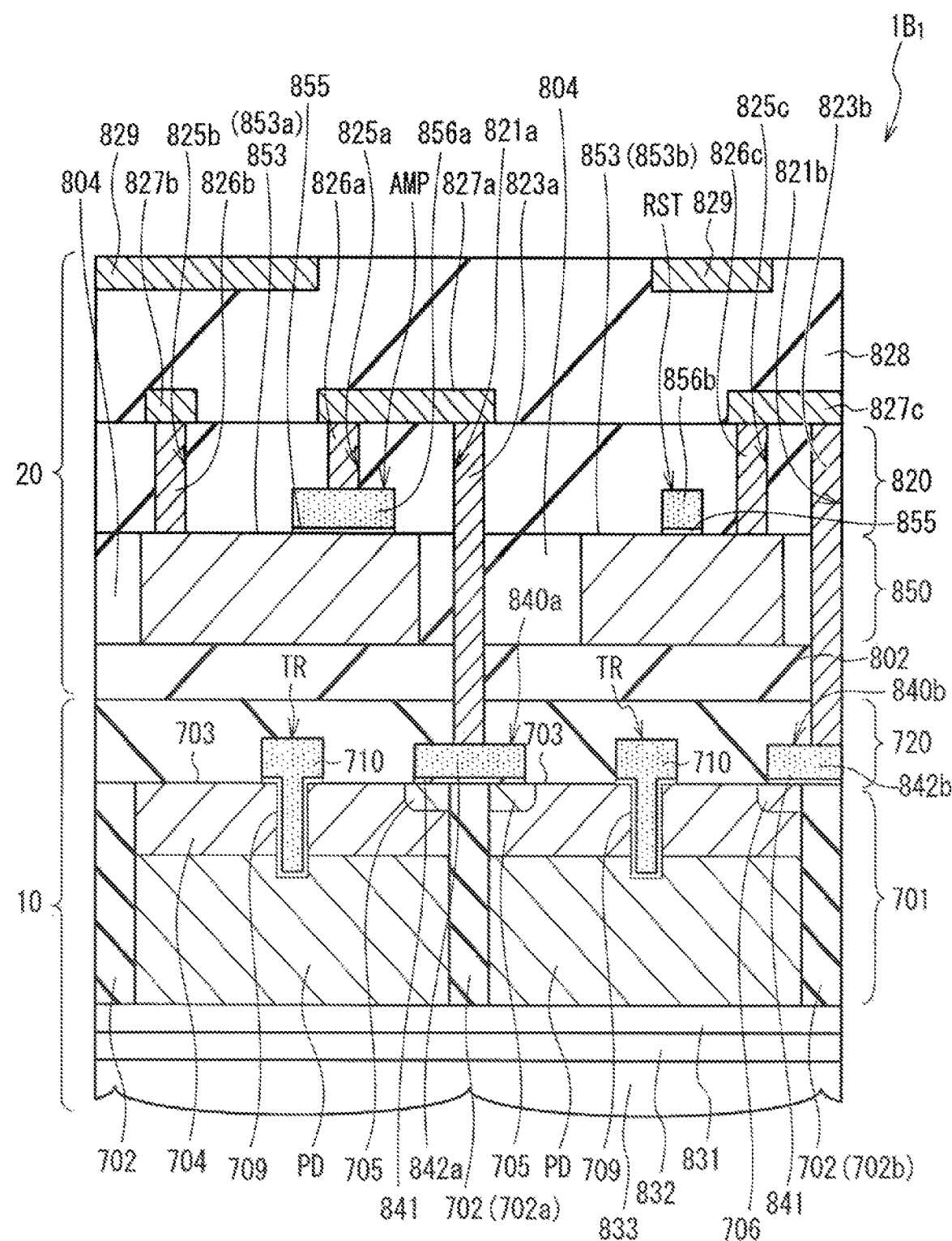
FIG. 18 is a cross-sectional view of a main part of a pixel unit of a solid-state imaging apparatus according to a second embodiment of the present technology.

Basically, a solid-state imaging apparatus $1B_1$ according to a second embodiment of the present technology has a configuration similar to that of the solid-state imaging apparatus 1A according to the first embodiment described above but differs from the solid-state imaging apparatus 1A according to the first embodiment described above in the following aspects. Specifically, the solid-state imaging apparatus $1B_1$ according to the second embodiment of the present technology includes an MIS contact portions 840a and 240a between the contact regions 705 and 706 and the conductive plugs 823a and 823b as depicted in FIG. 18. Additionally, the solid-state imaging apparatus $1B_1$ according to the second embodiment of the present technology includes, as a second semiconductor layer, a compound semiconductor layer 850 instead of the semiconductor layer 801 of the first embodiment described above.

The MIS contact portion 840a includes the contact region 705, an insulating film 841 provided on the contact region 705, and a conductive pad 842a provided on the insulating film 841. An MIS contact portion 840b includes the contact region 706, the insulating film 841 provided on the contact region 706, and a conductive pad 842b provided on the insulating film 841.

The insulating film 841 and conductive pad 842a of the MIS contact portion 840a are disposed on four contact regions 705 over the first intersecting portion 702a of the element isolation region 702. Similarly, the insulating film 841 and conductive pad 842b of the MIS contact portion 840b are disposed on four contact regions 706 over the second intersecting portion 702b of the element isolation region 702. The conductive pads 842a and 842b include a polycrystal silicon (doped polysilicon) film into which impurities reducing the resistance value are introduced during or after film formation. The insulating film 841 is an amorphous film and may be, for example, a titanium oxide ($TiO_2$) film or a strontium titanate oxide ($SrTiO_x$) film.

The MIS contact portions 840a and 840b enable contact offering lower resistance than a junction between polycrystal silicon (conductive pad 842a, 842b) and crystal silicon (contact region 805, 806) by blocking, by means of the insulating film 841, a wave function for electrons penetrating a bandgap of the semiconductor (contact region 805, 806) from the metal (polycrystal silicon film) side, or utilizing an interface dipole generated at an insulating film/semiconductor (contact region 805, 806) interface to generate an electric field effectively reducing Schottky barriers. The MIS contact is described in the following reference.

k.-W. Ang, et al., IEDM 2012, P. 439.

S. Datta et al., VLSI tech. pp. 174-1752014

The compound semiconductor layer 850 includes a plurality of island regions 853 arranged adjacent to one another via the insulating film 802 in a planar form and used as a plurality of element formation regions each provided with a second active element. The compound semiconductor layer 850 is formed during a manufacturing process by laminating, to the first substrate portion 10, a compound semiconductor substrate with the insulating film 802 provided on a back surface of the compound semiconductor substrate, patterning the compound semiconductor substrate to form a plurality of island regions 853, and then embedding the insulating film 804 between the plurality of island regions 853. As the compound semiconductor substrate, a group III-V material or a group IV material can be used. As the group III-V material, indium gallium arsenic (InGaAs) can be used, and as the group IV, silicon germanium (SiGe) or Germanium (Ge) can be used. In the second embodiment, an InGaAs substrate is used. Specifically, each of the plurality of island regions 853 mainly includes the compound semiconductor layer 850 including InGaAs.

On an island region 853a included in the plurality of island regions 853, an amplifying transistor AMP and a select transistor SEL (not illustrated) are formed as second active elements. Additionally, on an island region 853b included in the plurality of island regions 853, a reset transistor RST is formed as a second active element. The island regions 853a and 853b are disposed on four island regions 703 constituting one pixel unit PU.

Although not illustrated in detail, the amplifying transistor AMP includes a gate insulating film 855, a gate electrode 856a, and a source region and a drain region all of which are formed in the island region 853a. Additionally, the select transistor SEL includes a gate insulating film, a gate electrode, and a source region and a drain region all of which are provided in the island region 853a. Although not illustrated in detail, the reset transistor RST includes the gate insulating film 855, a gate electrode 856b, and a source region and a drain region all of which are provided in the island region 853b. The gate insulating film 855 includes, for example, an aluminum oxide film formed by an ALD method on an island region.

According to the solid-state imaging apparatus $1B_1$ according to the second embodiment of the present technology, the MIS contact portion 840a can be formed by forming a thin insulating film between the contact region 705 and the conductive pad 842a. This allows a floating diffusion shared contact structure with low resistance to be obtained. Additionally, the MIS contact portion can be formed by forming a thin insulating film 841 between the contact region 706 and the conductive pad 842b, thus allowing a contact structure with low resistance to be obtained.

<Method for Manufacturing Solid-State Imaging Apparatus>

Next, a method for manufacturing the solid-state imaging apparatus $1B_1$ according to the second embodiment of the present technology will be described.

Figure 19:
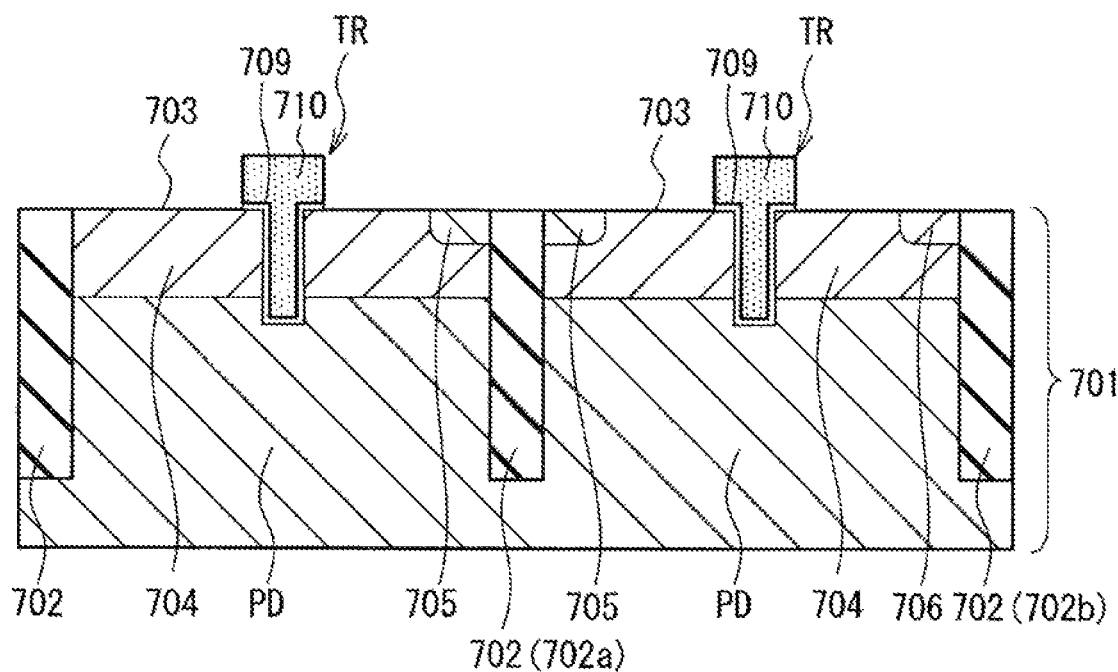
FIG. 19 is a step cross-sectional view of a method for manufacturing the solid-state imaging apparatus according to the second embodiment of the present technology.

First, as depicted in FIG. 19, element isolation regions 702, island regions 703, well regions 704, photodiodes PD, transfer transistors TR, contact regions 705 and 706, and the like are formed in the semiconductor layer 701.

Figure 20:
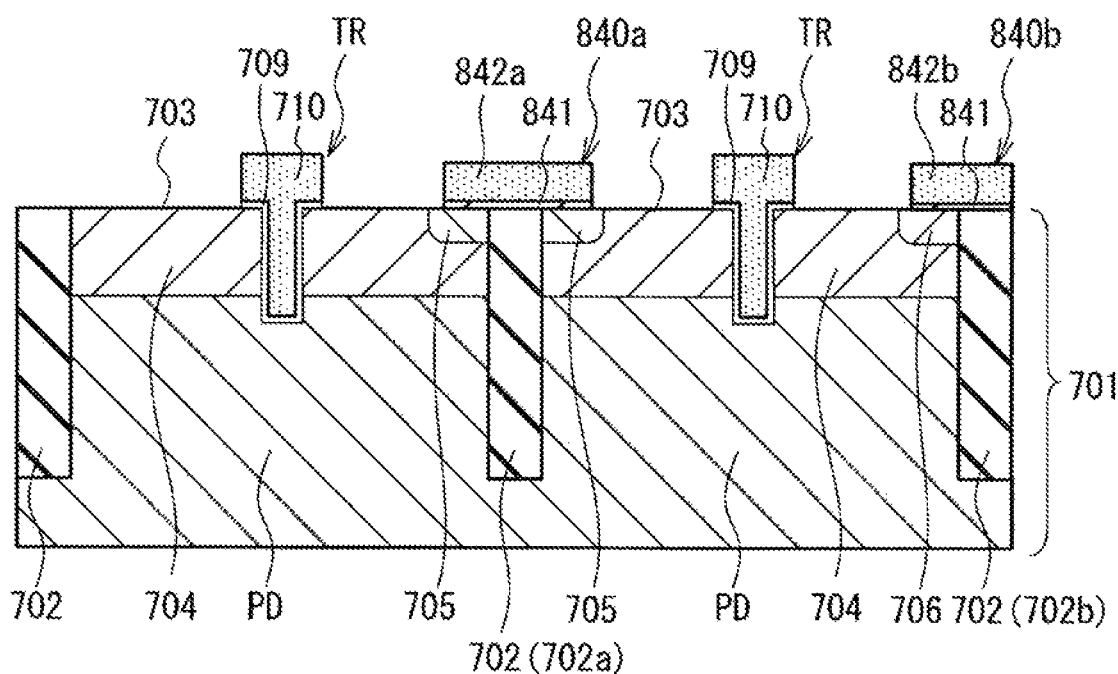
FIG. 20 is a step cross-sectional view of the method for manufacturing the solid-state imaging apparatus according to the second embodiment of the present technology, the step cross-sectional view being continued from FIG. 19.

Then, a titanium oxide ($TiO_x$) film with a film thickness of approximately 10 to 20 nm is formed by the ALD method or a sputtering method all over the surface of the semiconductor layer 701 including the surfaces of the island regions 703. Subsequently, a polycrystal silicon film with a film thickness of approximately 100 nm is formed all over the surface of the titanium oxide film at a low temperature of 550° C. by the CVD method. Then, the polycrystal silicon film and an insulating film are patterned in this order. Thus, as depicted in FIG. 20, a conductive pad 842a is formed via the insulating film 841 on the contact regions 705 in the respective four island regions 703 over the first intersecting portion 702a of the element isolation region 702, and a conductive pad 842b is formed via the insulating film 841 on the contact regions 706 in the respective four island regions 703 over the second intersecting portion 702b of the element isolation region 702. This step forms an MIS contact portion 840a on the four contact regions 705 contacting the first intersecting portion 702a of the element isolation region 702, while forming the MIS contact portion 840b on the four contact regions 706 contacting the second intersecting portion 702b of the element isolation region 702.

Figure 21:
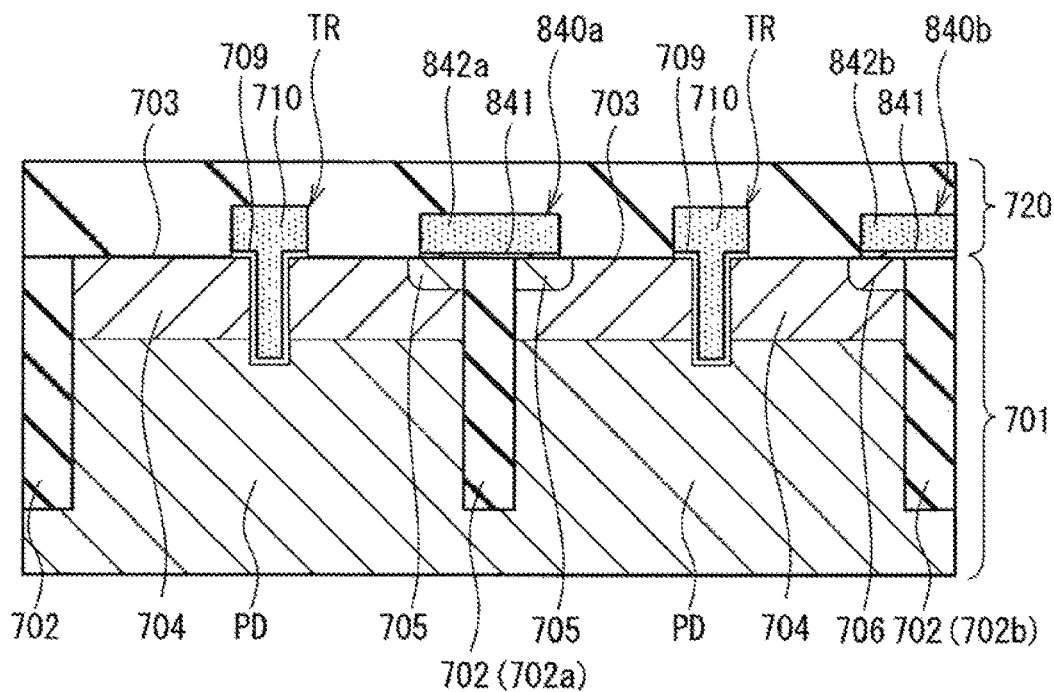
FIG. 21 is a step cross-sectional view of the method for manufacturing the solid-state imaging apparatus according to the second embodiment of the present technology, the step cross-sectional view being continued from FIG. 20.

Then, as depicted in FIG. 21, an insulating layer 720 used as a first insulating layer 720 is formed all over the major surface of the semiconductor layer 701 in such a manner as to cover the gate electrodes 710 and the MIS contact portions 840a and 840b.

Figure 22:
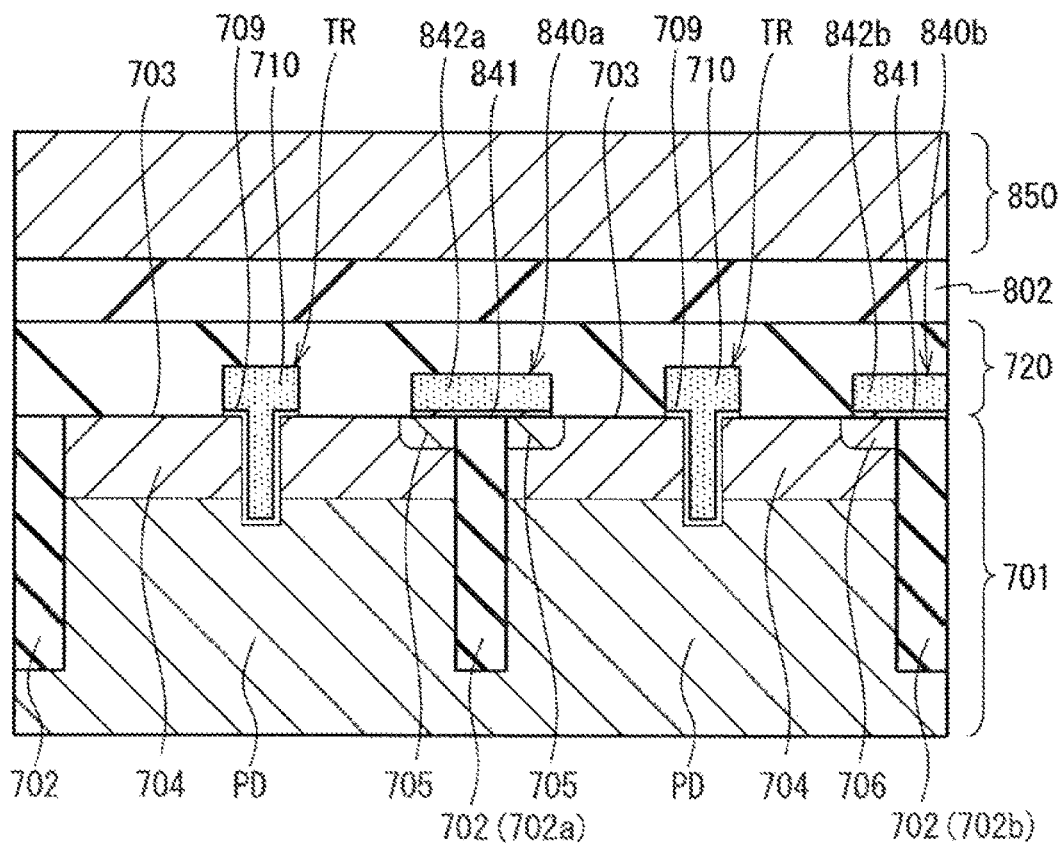
FIG. 22 is a step cross-sectional view of the method for manufacturing the solid-state imaging apparatus according to the second embodiment of the present technology, the step cross-sectional view being continued from FIG. 21.

Then, as a second semiconductor layer, for example, the compound semiconductor layer 850 including InGaAs is prepared. For example, the insulating film 801 including a silicon oxide film is provided on a back surface of the compound semiconductor layer 850, the back surface being opposite to a major surface of the compound semiconductor layer 850. Then, as depicted in FIG. 22, the compound semiconductor layer 850 is laminated to the major surface side of the semiconductor layer 701. Specifically, thermal treatment is executed with the insulating layer 720 on the major surface side of the semiconductor layer 701 placed opposite to and in close contact with the insulating film 802 provided on the back surface side of the compound semiconductor layer 850. Thus, as depicted in FIG. 22, the insulating film 802 and the insulating layer 720 are integrated, and the compound semiconductor layer 850 in the upper stage is joined to the semiconductor layer 701 in the lower stage via the insulating film 802 and the insulating layer 720. Additionally, the compound semiconductor layer 850 is disposed on the insulating layer 720. Subsequently, the major surface side of the compound semiconductor layer 840 is ground by, for example, the CMP method to reduce the thickness of the compound semiconductor layer 850.

Figure 23:
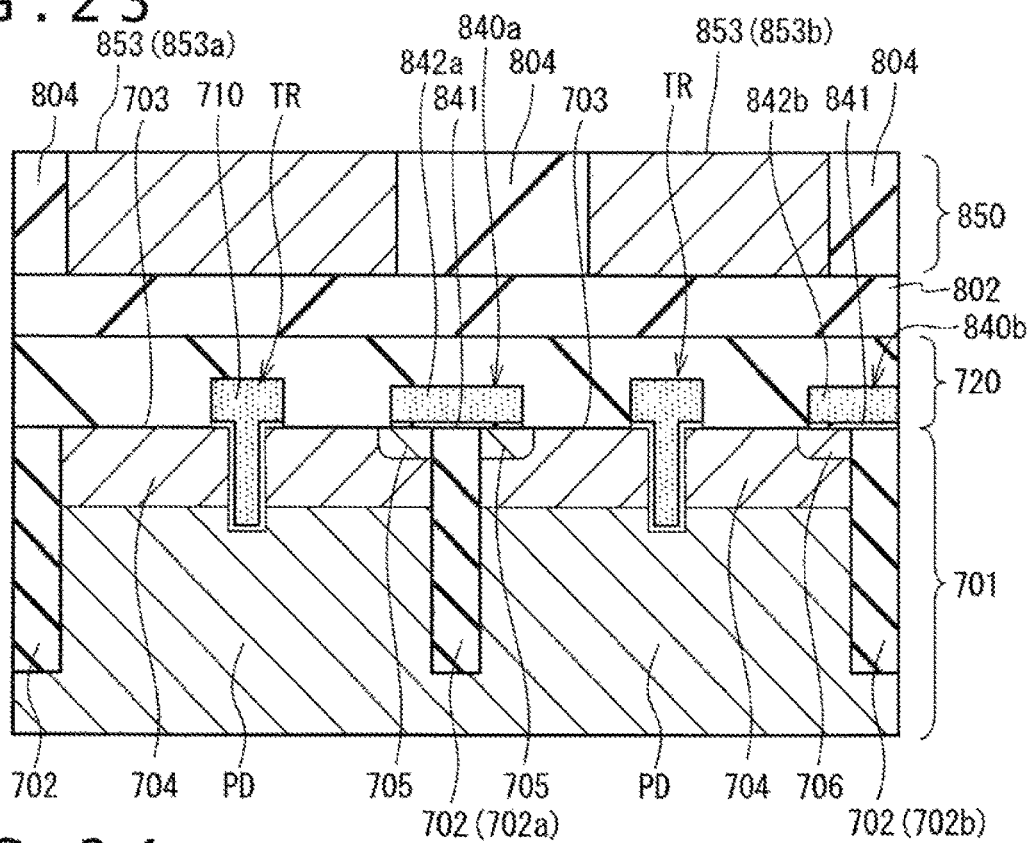
FIG. 23 is a step cross-sectional view of the method for manufacturing the solid-state imaging apparatus according to the second embodiment of the present technology, the step cross-sectional view being continued from FIG. 22.

Then, as depicted in FIG. 23, the photolithography technology, the anisotropic dry etching technology, and the like, which are well known, are used to pattern the compound semiconductor layer 850 into a plurality of island regions 853, and subsequently the insulating film 804 is embedded between the island regions 853 to planarize the major surface side of the compound semiconductor layer 850 as depicted in FIG. 23.

Figure 24:
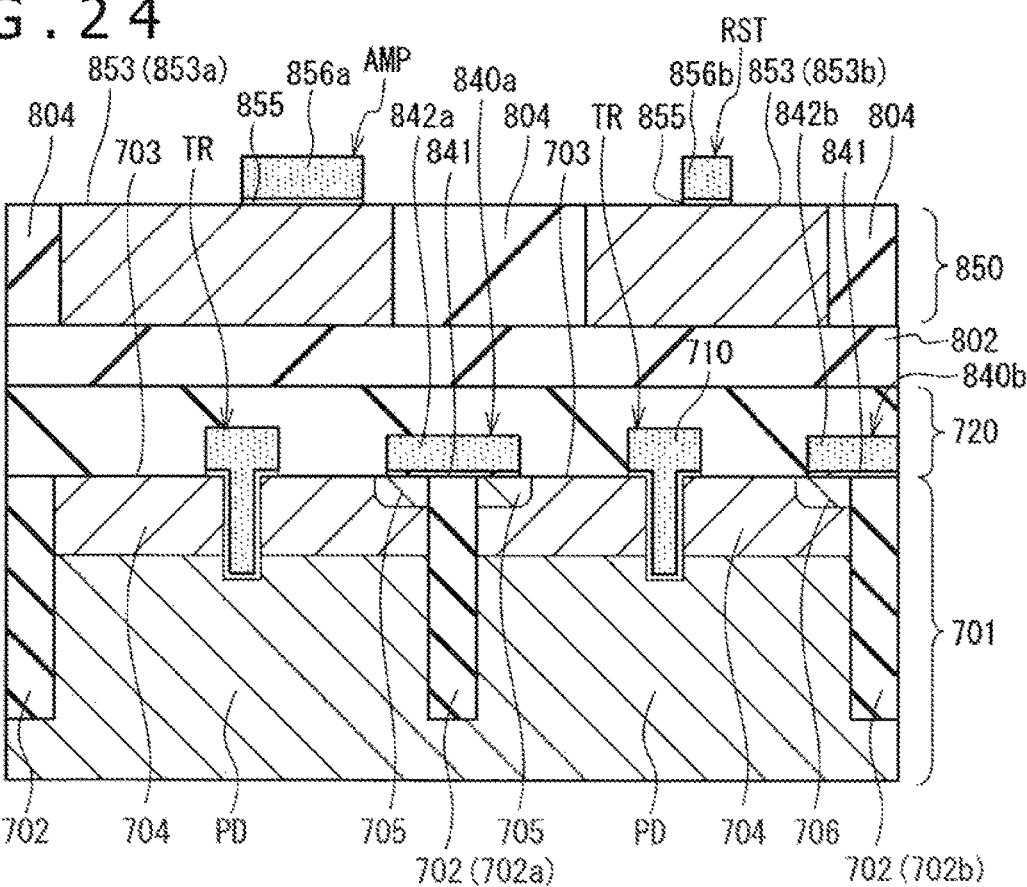
FIG. 24 is a step cross-sectional view of the method for manufacturing the solid-state imaging apparatus according to the second embodiment of the present technology, the step cross-sectional view being continued from FIG. 23.

Then, as depicted in FIG. 24, on the island region 853a included in the plurality of island regions 853, an amplifying transistor AMP and a select transistor SEL (not illustrated) are formed as second active elements, and on the island region 853b included in the plurality of island regions 853, a reset transistor RST is formed as a second active element. For the second active elements, first, a gate insulating film 855 including an Al2O3 film with a film thickness of approximately 10 nm is formed by the ALD method all over the major surface of the compound semiconductor layer 850 including the surface of the island region 853. Then, a gate electrode material including an aluminum (Al) or aluminum alloy film with a film thickness of approximately 100 nm is formed by the sputtering method all over the surface of the gate insulating film 855. The gate electrode material and the gate insulating film 855 are patterned in this order to form gate electrodes 856a and 856b on the island regions 853a and 853b via the gate insulating film 855. Then, a source region and a drain region are formed using a doped epitaxial growth method at a low temperature of 550° C. or lower. Thus, the amplifying transistor AMP and the select transistor SEL are formed on the island region 853a, and the reset transistor RST is formed on the island region 853b.

In this step, the insulating film 841 of the MIS contact portions 840a and 840b is also exposed to a thermal treatment temperature when the second active element is formed. When the insulating film 841 of the MIS contact portions 840a and 840b is exposed to high temperature, the properties of the insulating film 841 are likely to become unstable, leading to difficulty in maintaining reduced resistance. However, the second active elements are formed by the low-temperature process of 550° C. or lower, thus allowing the reduced resistance of the MIS contact portions 840a and 840b to be maintained even after formation of the second active elements.

Then, an insulating layer 820 that is used as a second insulating layer covering the island regions 853a and 853b is formed. Then, as depicted in FIG. 25, the front surface of the insulating layer 820 is planarized.

Figure 25:
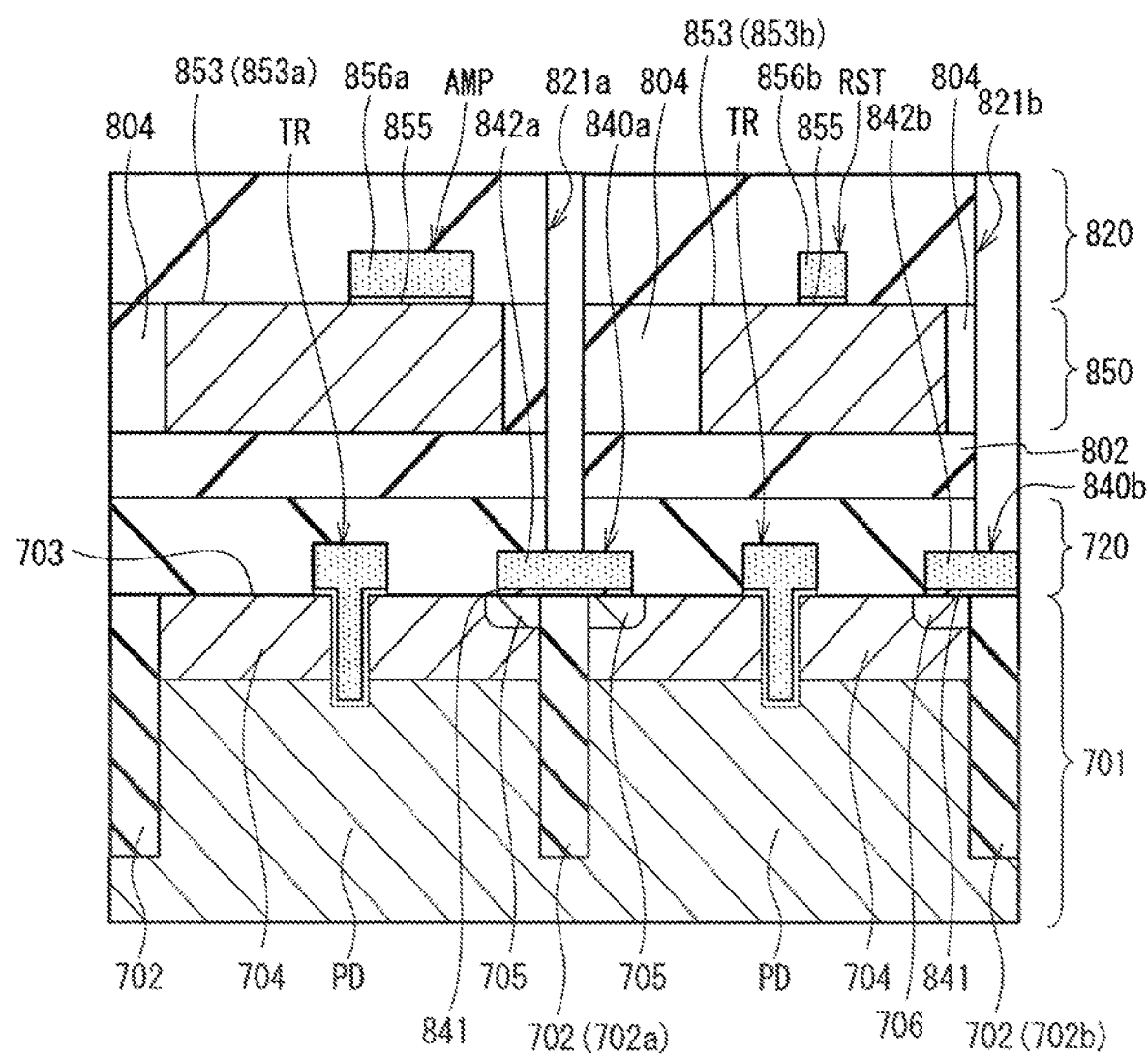
FIG. 25 is a step cross-sectional view of the method for manufacturing the solid-state imaging apparatus according to the second embodiment of the present technology, the step cross-sectional view being continued from FIG. 24.

Then, as depicted in FIG. 25, a connection hole 821a that extends from the front surface of the insulating layer 820 to the front surface of the conductive pad 842a is formed, and a connection hole 821b that extends from the front surface of the insulating layer 820 to the front surface of the conductive pad 842b is formed. The connection holes 821a and 821b are executed using the photolithography technology and the anisotropic dry etching technology, which are well known.

Then, a method similar to the method of the first embodiment described above is used to embed a conductive material into the connection holes 821a and 821b to form conductive plugs 823a and 823b in the connection holes 821a and 821b. Then, a method similar to the method of the first embodiment described above is executed to form the connection holes 825a to 825c, conductive plugs 826a to 826c, wires 827a to 827c, an insulating film 828, a wire 829, and the like and to form, after lamination pf the third substrate portion 30, a planarization film 831, a color filter 832, a microlens 833, and the like on the back surface of the semiconductor layer 701. Thus, the solid-state imaging apparatus 1B$_1$ according to the second embodiment depicted in FIG. 18 is substantially completed.

According to the method for manufacturing the solid-state imaging apparatus 1B$_1$ according to the second embodiment of the present technology, the second active elements are formed by the low-temperature process after the MIS contact portions are formed. Therefore, the solid-state imaging apparatus 1B$_1$ that includes the MIS contact portions 840a and 840b maintaining reduced resistance can be provided. This also allows the second active elements and logic circuits to be stacked on the photodiode PD, thus enabling an increase in pixel area and allowing provision of the solid-state imaging apparatus 1B$_1$ with ultrahigh sensitivity.

Note that, in the solid-state imaging apparatus 1B$_1$ according to the second embodiment as well, the second substrate portion 20 may include the semiconductor substrates 21 and 21A stacked on each other, like the second substrate portion 20 depicted in FIG. 104 for the tenth embodiment described below (the second substrate portion 20 may include a plurality of semiconductor substrates stacked on one another).

Third Embodiment

<Configuration of Solid-State Imaging Apparatus>

Figure 26:
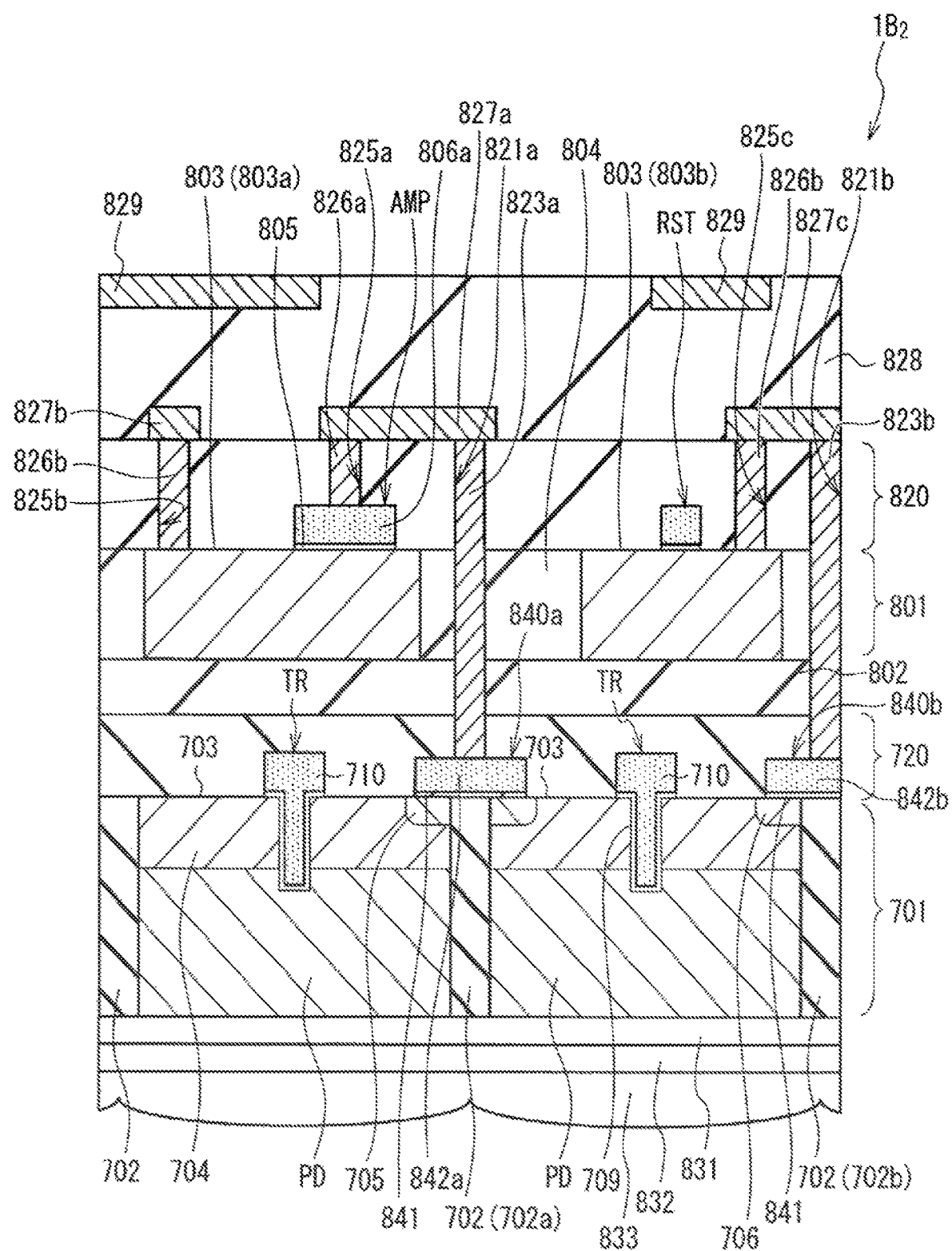
FIG. 26 is a cross-sectional view of a main part of a pixel unit of a solid-state imaging apparatus according to a third embodiment of the present technology.

In the second embodiment described above, the use of the compound semiconductor layer 850 as a second semiconductor layer has been described. However, as depicted in FIG. 26, the present technology allows the semiconductor layer 801 including monocrystal silicon to be used as a second semiconductor layer as is the case with the first embodiment described above.

Figure 27:
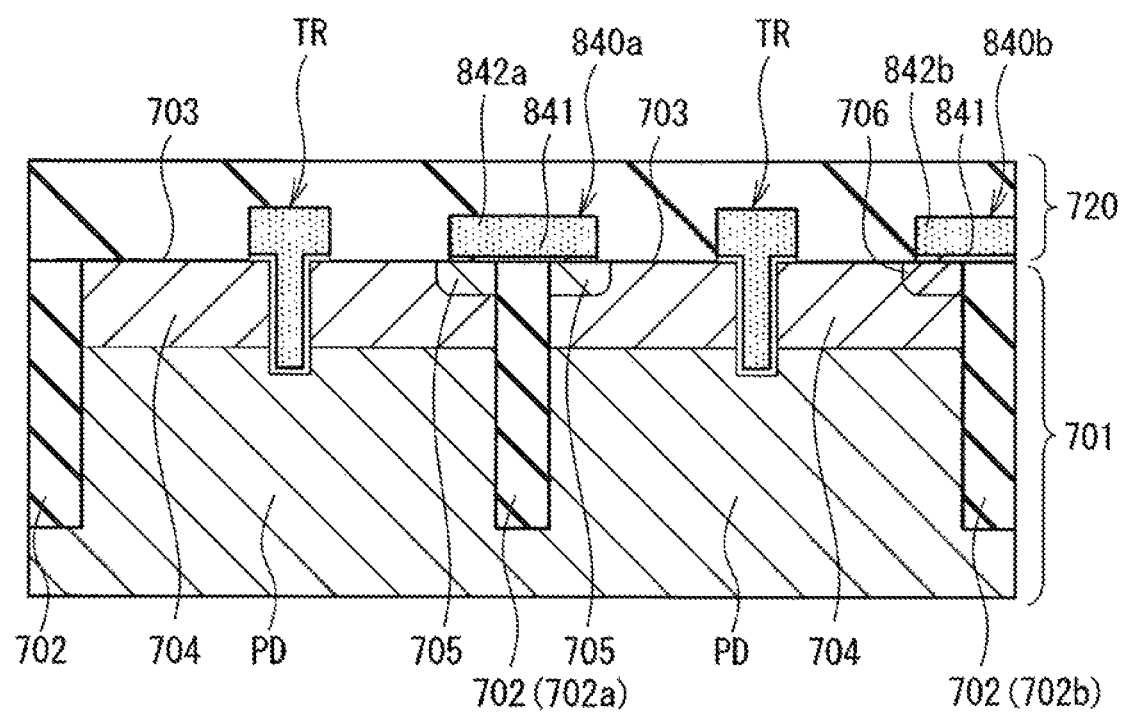
FIG. 27 is a step cross-sectional view of a method for manufacturing the solid-state imaging apparatus according to the third embodiment of the present technology.
Figure 28:
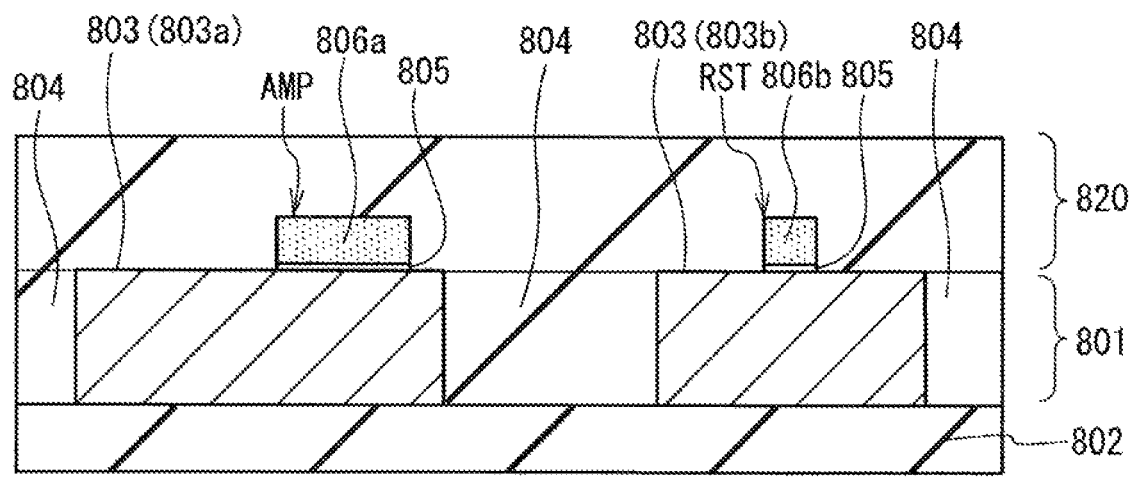
FIG. 28 is a step cross-sectional view of the method for manufacturing the solid-state imaging apparatus according to the third embodiment of the present technology, the step cross-sectional view being continued from FIG. 27.
Figure 29:
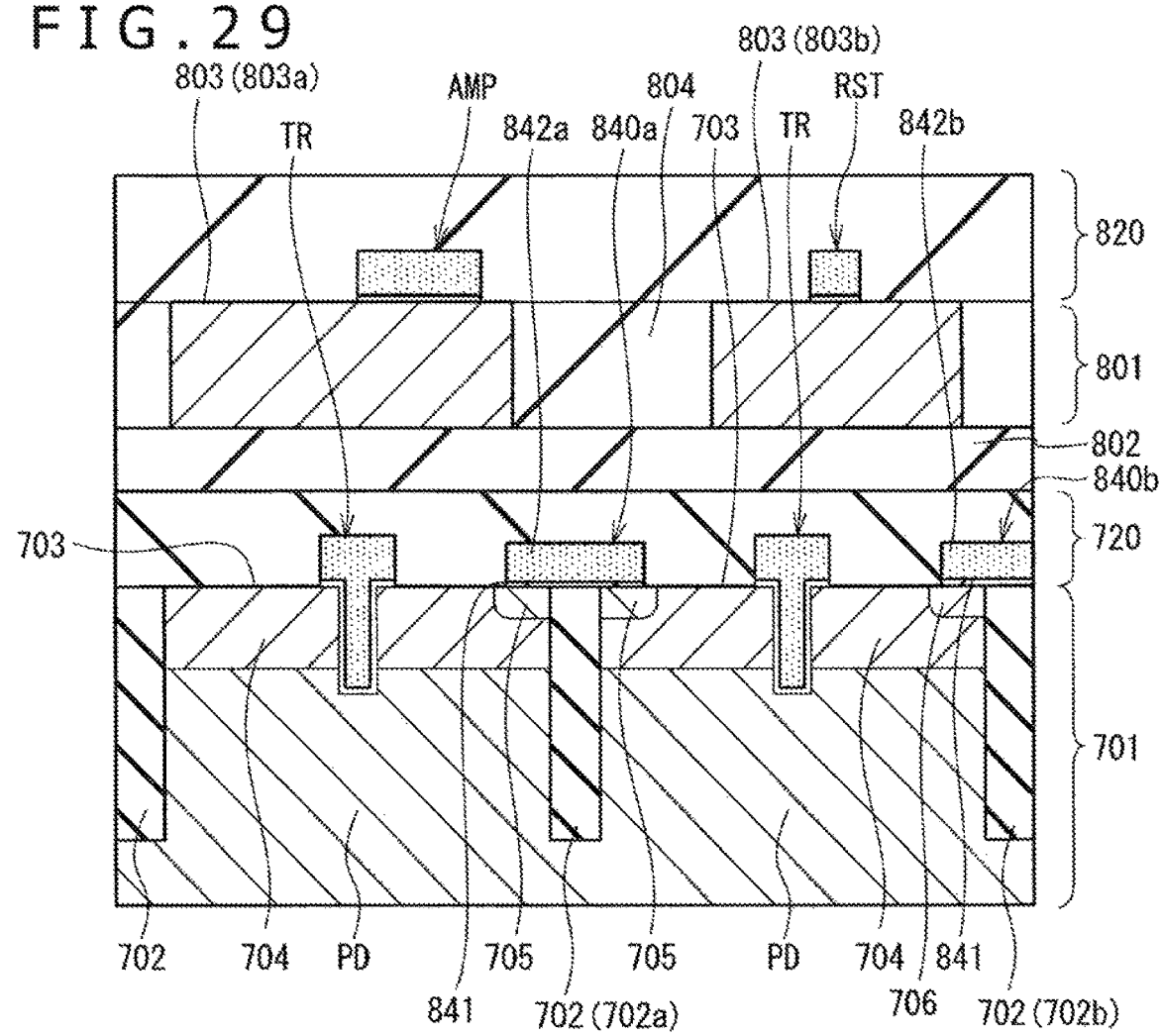
FIG. 29 is a step cross-sectional view of the method for manufacturing the solid-state imaging apparatus according to the third embodiment of the present technology, the step cross-sectional view being continued from FIG. 28.

Specifically, as depicted in FIG. 27, a substrate portion on which the method has been executed up to the step of forming, on the semiconductor layer 701, the insulating layer 720 used as a first insulating layer is prepared, and as depicted in FIG. 28, a substrate portion on which the method has been executed up to the step of forming, on the semiconductor layer 801, the insulating layer 820 used as a second insulating layer covering the semiconductor layer 801 is prepared. Then, as depicted in FIG. 29, thermal treatment is executed with the insulating layer 720 on the major surface side of the semiconductor layer 701 placed opposite to and in close contact with the insulating film 802 on the back surface side of the semiconductor layer 801, and the insulating layer 720 and the insulating film 802 are laminated. Subsequently, steps similar to the corresponding steps of the second embodiment described above are executed to form the connection holes 825a to 825c, wires 825a to 825c, an insulating film 828, wires 829, and the like as depicted in FIG. 26.

According to a method for manufacturing a solid-state imaging apparatus $1B_2$ according to a third embodiment, the substrate portion with the second active elements already formed by high-temperature thermal treatment is laminated to the substrate portion with the MIS contact portions 840a and 840b formed in advance. Therefore, the solid-state imaging apparatus $1B_2$ that includes the MIS contact portions 840a and 840b maintaining reduced resistance can be provided.

Note that, in the solid-state imaging apparatus $1B_2$ according to the third embodiment as well, the second substrate portion 20 may include the semiconductor substrates 21 and 21A stacked on each other, like the second substrate portion 20 depicted in FIG. 104 for the tenth embodiment described below (the second substrate portion 20 may include a plurality of semiconductor substrates stacked on one another).

Fourth Embodiment

<Configuration of Solid-State Imaging Apparatus>

Basically, a solid-state imaging apparatus 1C according to a fourth embodiment of the present technology has a configuration similar to that of the solid-state imaging apparatus 1 according to the first embodiment described above but differs from the solid-state imaging apparatus 1 according to the first embodiment described above in the following aspects.

Figure 30:
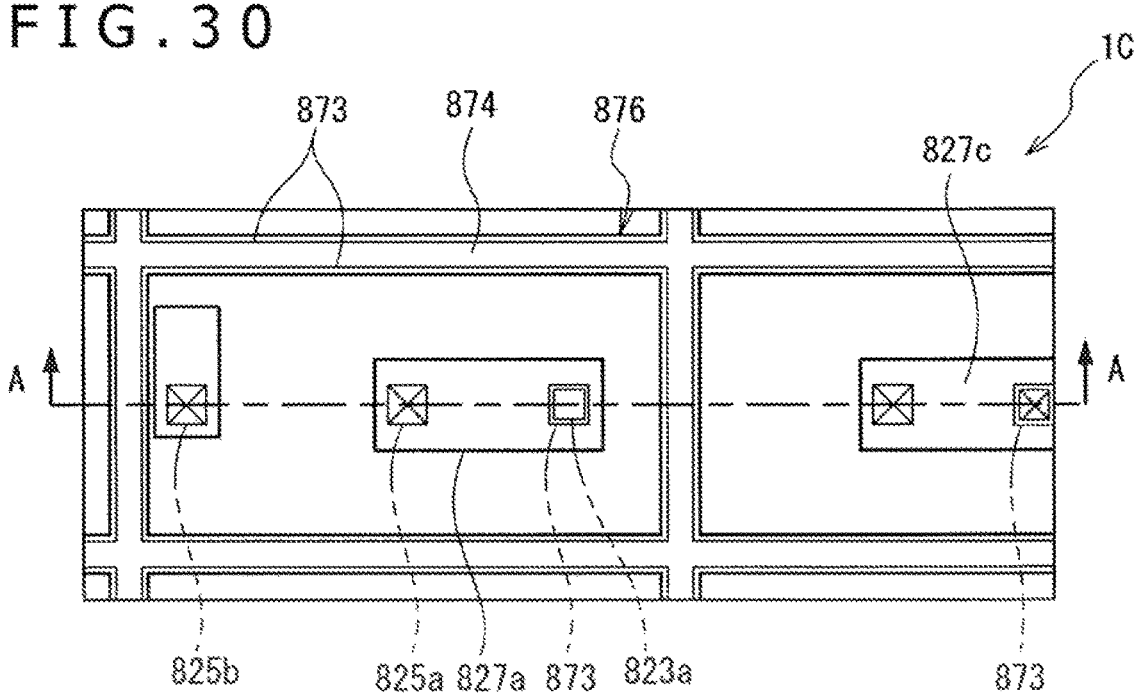
FIG. 30 is a plan view of a main part of a pixel unit of a solid-state imaging apparatus according to a fourth embodiment of the present technology.
Figure 31:
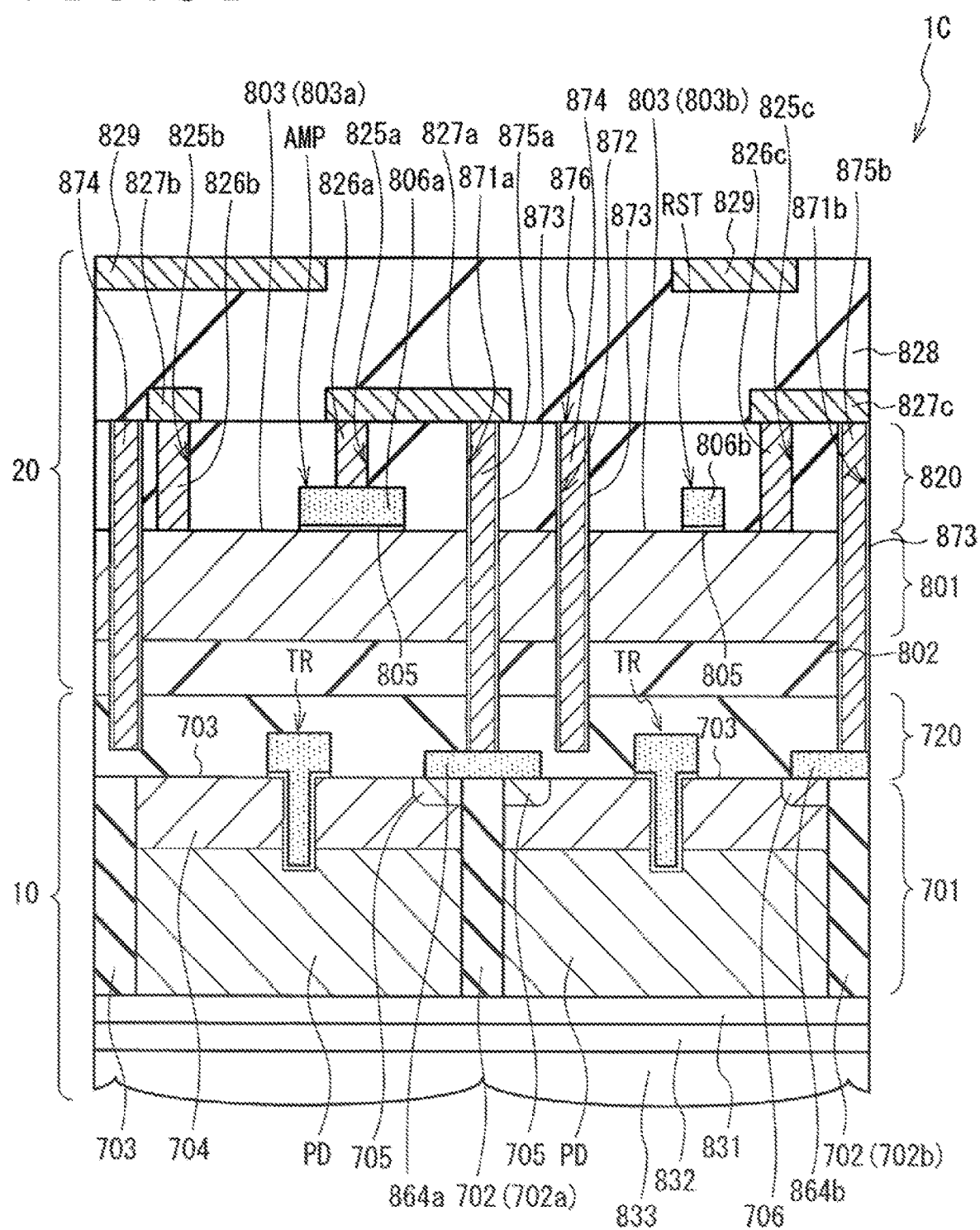
FIG. 31 is a cross-sectional view of a main part depicting a cross-sectional structure taken along a cutting line A-A in FIG. 30.

Specifically, as depicted in FIGS. 30 and 31, the solid-state imaging apparatus 1C according to the fourth embodiment of the present technology includes conductive plugs 875a and 875b embedded via an insulating film 873 in through-holes 871a and 871b extending from the front surface of the insulating layer 820 to the front surfaces of conductive pads 864a and 864b. Additionally, the solid-state imaging apparatus 1C according to the fourth embodiment of the present technology includes an element isolation region 876 including a separation groove 872 separating the element formation region of the semiconductor layer 801 into the island regions 803, insulating films 873 provided on side walls of the separation groove 872, and a conductive material 874 embedded into the inside of the insulating films 873 in the separation groove.

The conductive pad 864a is formed separately from the conductive plug 875a. The conductive pad 864a is disposed on four contact regions 705 over the first intersecting portion 702a of the element isolation regions 702 and is electrically and mechanically connected to the four contact regions 705. Similarly, the conductive pad 864b is formed separately from the conductive plug 875b. The conductive pad 864b is disposed on four contact regions 706 over the second intersecting portion 702b of the element isolation regions 702 and is electrically and mechanically connected to the four contact regions 706. The conductive pads 864a and 864b include, for example, a polycrystal silicon (doped polysilicon) film into which impurities reducing the resistance value are introduced during or after film formation. On the other hand, like the conductive plugs 823a and 823b of the first embodiment, the conductive plugs 875a and 875b include tungsten included in the high-melting-point metal materials.

In the solid-state imaging apparatus 1C according to the fourth embodiment of the present technology, the island region 803 on which the second active element is formed is planarly enclosed by the conductive material 874. Consequently, the solid-state imaging apparatus 1C according to the fourth embodiment of the present technology allows scattering of incident light to be shielded, allowing color mixture to be suppressed. Thus, the solid-state imaging apparatus 1C with ultrahigh sensitivity is obtained.

<Method for Manufacturing Solid-State Imaging Apparatus>

Now, an example of a method for manufacturing a solid-state imaging apparatus according to the fourth embodiment will be described with reference to FIGS. 32 to 36.

Figure 32:
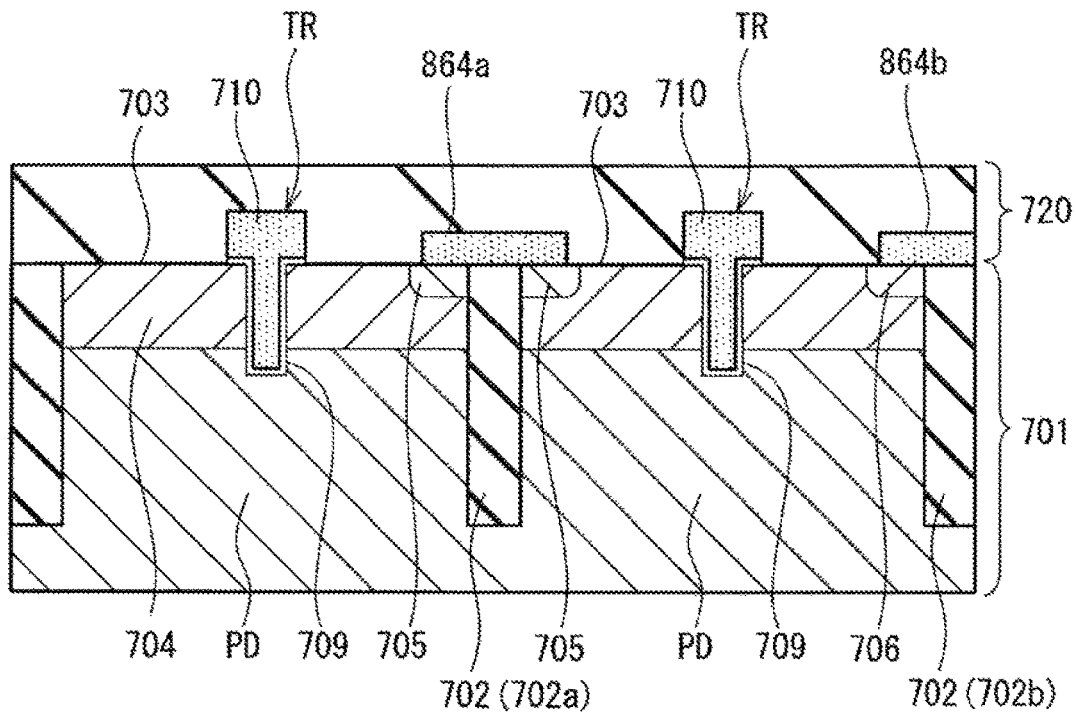
FIG. 32 is a step cross-sectional view of a method for manufacturing the solid-state imaging apparatus according to the fourth embodiment of the present technology.

First, as depicted in FIG. 32, element isolation regions 702, island regions 703, a well region 704, photodiodes PD, transfer transistors TR, contact regions 705 and 706, conductive pads 864a and 864b, and the like are formed in the semiconductor layer 701.

Then, as depicted in FIG. 32, an insulating layer 720 used as a first insulating layer is formed all over the major surface of the semiconductor layer 701 in such a manner as to cover the gate electrode 710 and the conductive pads 864a and 864b.

Figure 33:
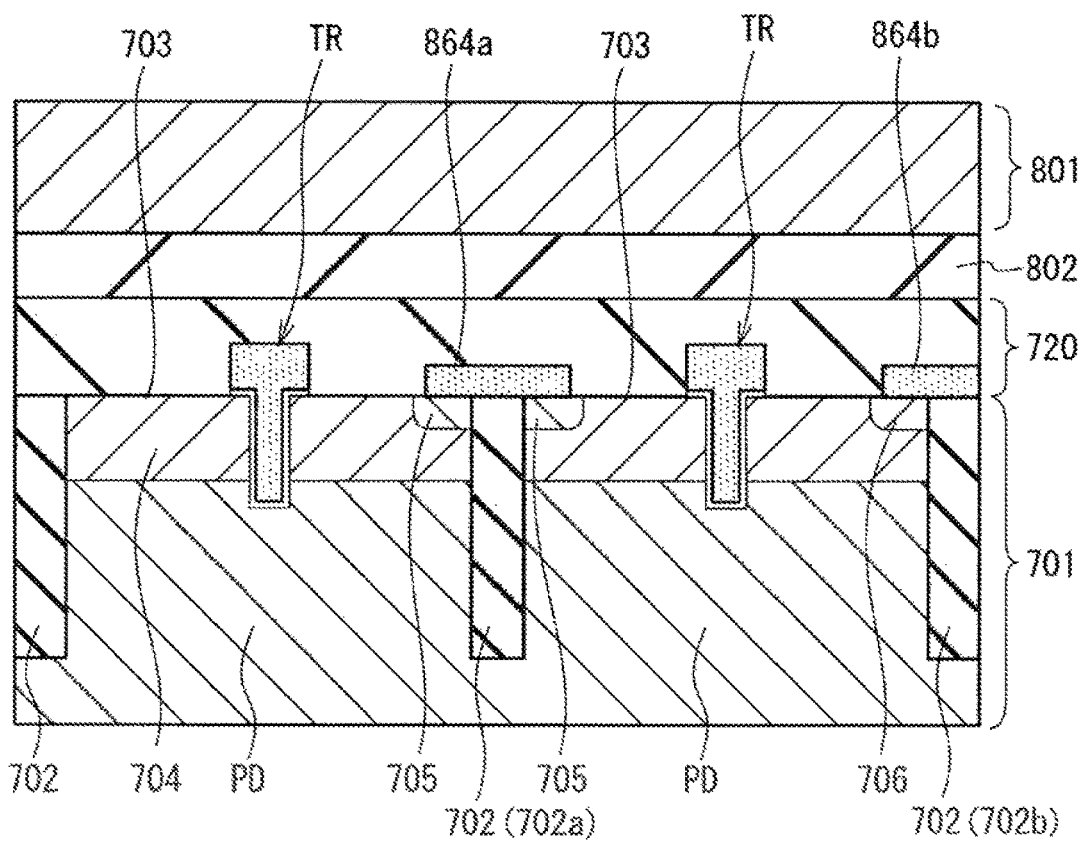
FIG. 33 is a step cross-sectional view of the method for manufacturing the solid-state imaging apparatus according to the fourth embodiment of the present technology, the step cross-sectional view being continued from FIG. 32.

Then, a method similar to the method of the first embodiment described above is used to laminate the semiconductor layer 801 to the major surface side of the semiconductor layer 101 as depicted in FIG. 33. Specifically, thermal treatment is executed with the insulating layer 720 on the major surface side of the semiconductor layer 101 being placed opposite to and in close contact with the insulating film 802 provided on the back surface side of the semiconductor layer 801. Thus, as depicted in FIG. 33, the insulating film 802 and the insulating layer 720 are integrated, and the semiconductor layer 801 in the upper stage is joined to the semiconductor layer 701 in the lower stage via the insulating film 802 and the insulating layer 720. Additionally, the semiconductor layer 801 is disposed on the insulating layer 720. Subsequently, the major surface side of the semiconductor layer 801 is ground by, for example, the CMP method to reduce the thickness of the semiconductor layer 801.

Figure 34:
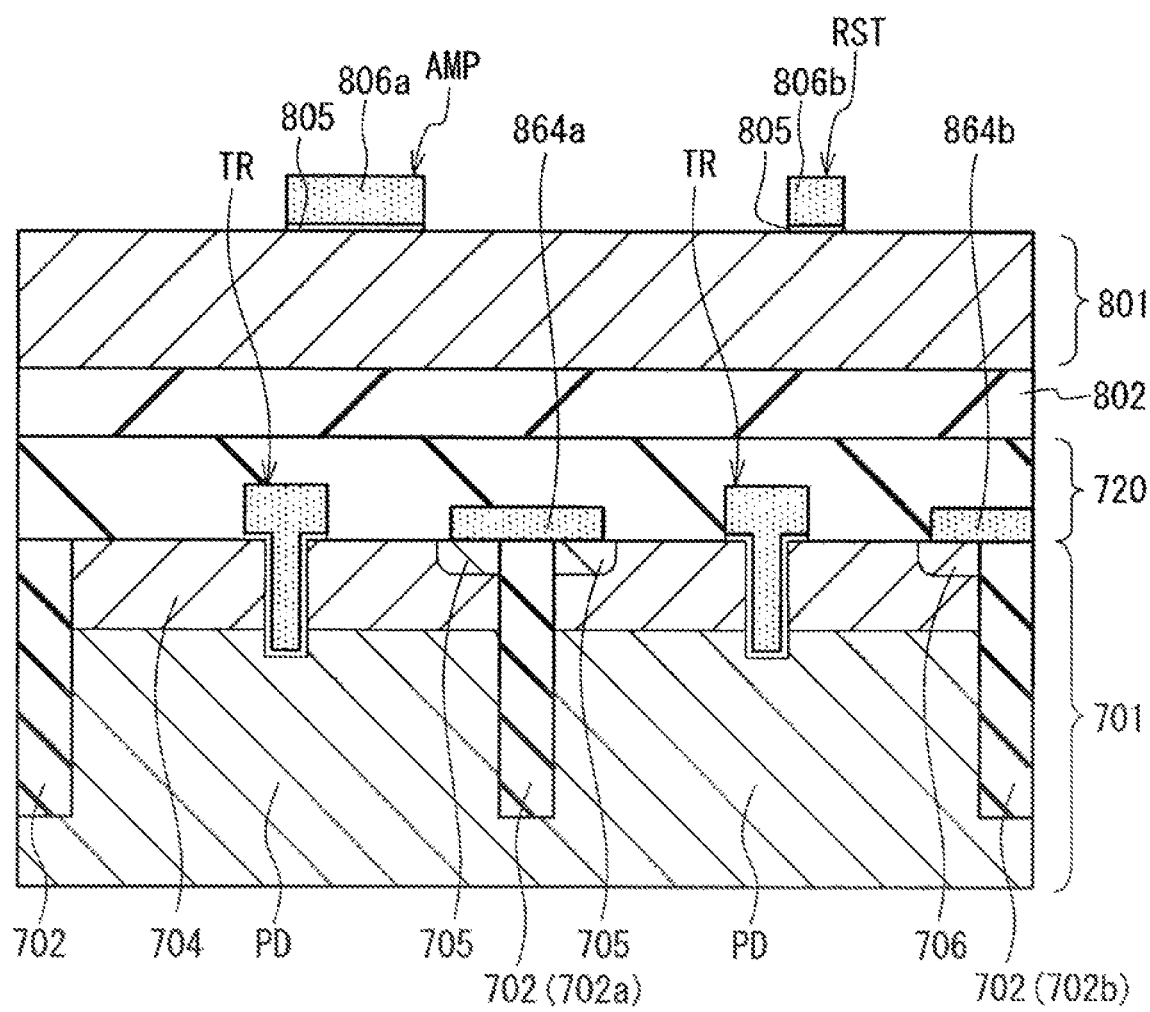
FIG. 34 is a step cross-sectional view of the method for manufacturing the solid-state imaging apparatus according to the fourth embodiment of the present technology, the step cross-sectional view being continued from FIG. 33.

Then, as depicted in FIG. 34, with the element formation regions of the semiconductor layer 801 being left, an amplifying transistor AMP and a select transistor used as second active elements are formed on one of the plurality of element formation regions of the semiconductor layer 801, the one element formation region corresponding to the island region 803a, and a reset transistor RST used as a second active element is formed on one of the plurality of element formation regions that corresponds to the island region 803b. The second active elements are formed by a method similar to the method of the first embodiment described above.

Then, an insulating layer 820 used as a second insulating layer is formed over the island regions 803a and 803b. Then, as depicted in FIG. 35, the front surface of the insulating layer 820 is planarized.

Figure 35:
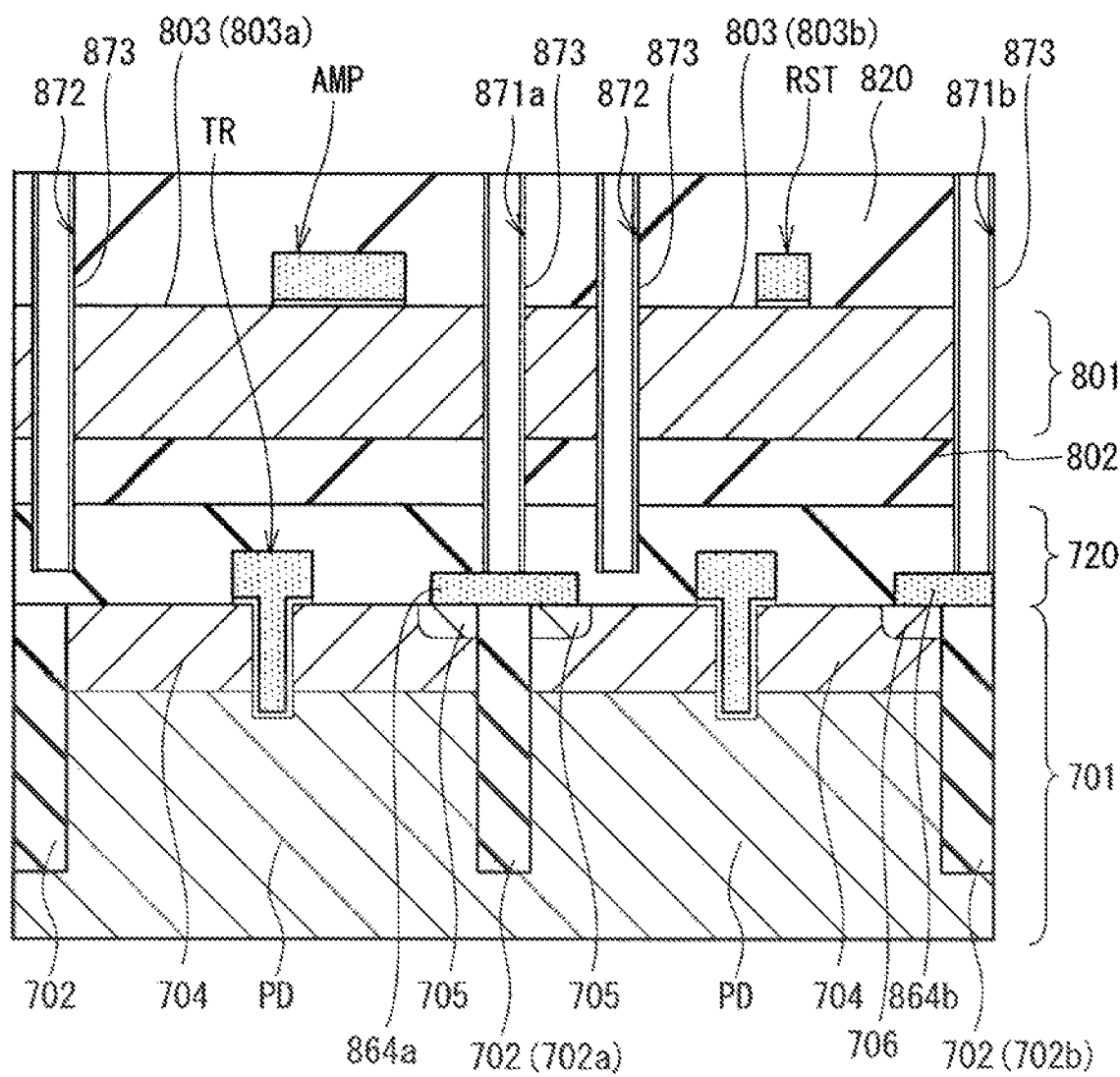
FIG. 35 is a step cross-sectional view of the method for manufacturing the solid-state imaging apparatus according to the fourth embodiment of the present technology, the step cross-sectional view being continued from FIG. 34.

Then, as depicted in FIG. 35, a connection hole 871a that extends from the front surface of the insulating layer 820 to the front surface of the conductive pad 864a is formed, and a connection hole 871b that extends from the front surface of the insulating layer 820 to the front surface of the conductive pad 864b is formed. Further, the element isolation regions of the semiconductor layer 801 are etched and removed to form island region 803. Formation of the island regions 803 can be executed in a step identical to the step of forming connection holes 871a and 871b. Specifically, the use of a photomask (reticle) with a pattern of the connection holes 871a and 871b and a pattern of the island regions 803 allows the execution, in the semiconductor layer 801, in an identical step, of etching for forming the connection holes 871a and 871b and etching for forming the island regions 803. By etching the element isolation regions of the semiconductor layer 801 to form island regions 803, a separation groove 872 is formed between the adjacent island regions 803.

Then, for example, the CVD method is used to form an insulating film 873 such as a silicon oxide film which covers the semiconductor layer 801 inside the connection holes 871a and 871b and the semiconductor layer 801 inside the separation groove 872. Then, for example, the anisotropic etching technology such as RIE is used to selectively remove the insulating film 873 present on the front surface of the insulating layer 820, at bottom portions of the connection holes 871a and 871b, and at a bottom portion of the separation groove 872.

Figure 36:
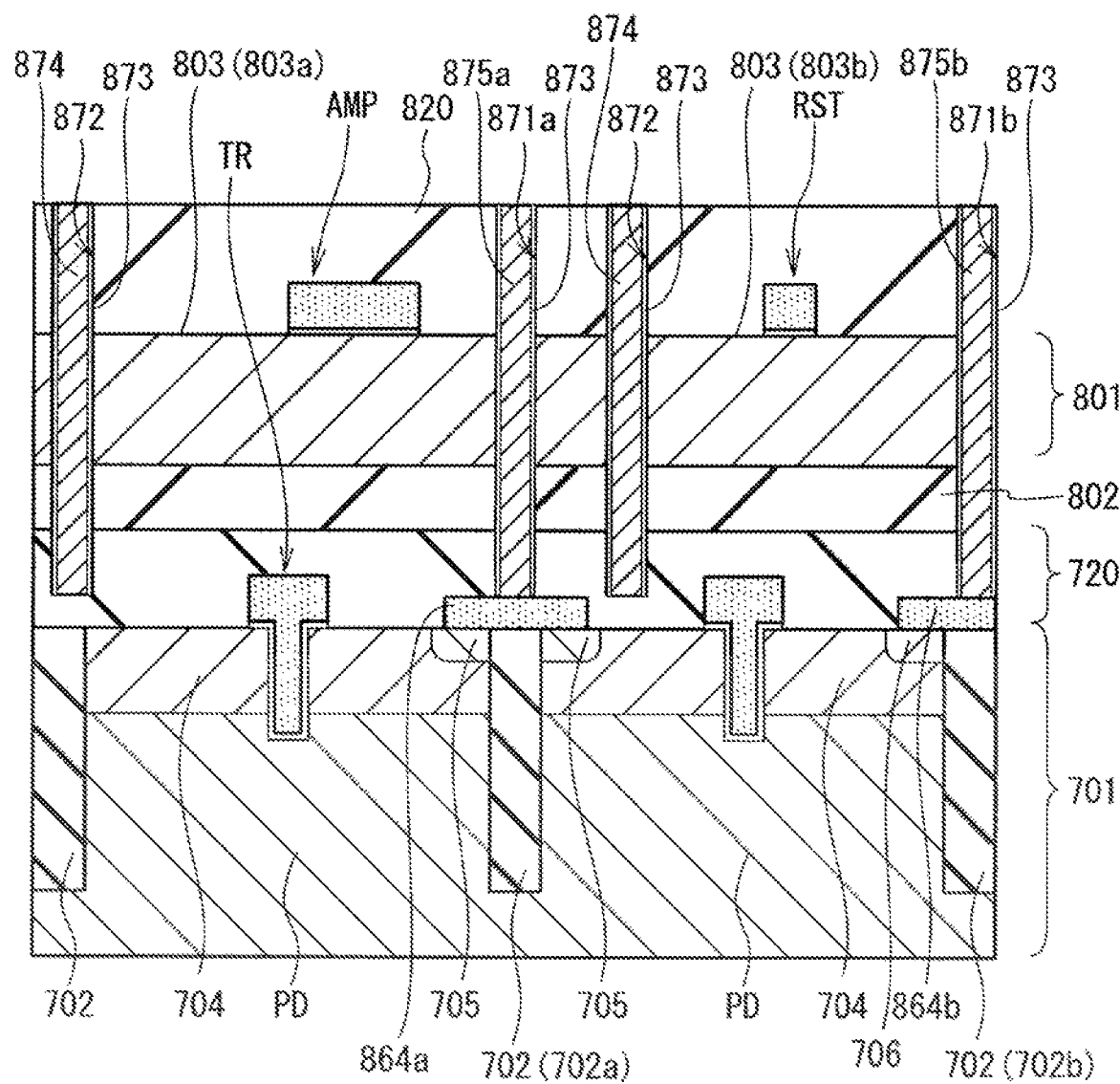
FIG. 36 is a step cross-sectional view of the method for manufacturing the solid-state imaging apparatus according to the fourth embodiment of the present technology, the step cross-sectional view being continued from FIG. 35.

Then, as depicted in FIG. 36, the conductive material 874 is embedded into the inside of the insulating film 873 in the connection holes 871a and 871b to form, in the inside of the connection holes 871a and 871b, conductive plugs 875a and 875b including the conductive material 874, and the conductive material 274 is embedded into the inside of the insulating film 873 in the separation groove 872. The conductive plugs 875a and 875b are insulated from the semiconductor layer 801 in the connection holes 871a and 871b by the insulating film 873 in the connection holes 871a and 871b. Additionally, the conductive material 874 in the separation groove 872 is insulated from the semiconductor layer 801 in the separation groove 872 by the insulating film 873 in the separation groove 872.

Then, a method similar to the method of the first embodiment described above is used to form connection holes 825a to 825c, conductive plugs 826a to 826c, wires 827a to 827c, an insulating film 828, a wire 829, and the like. Then, after lamination of the third substrate portion 30, a planarization film 831, a color filter 832, a microlens 833, and the like are formed on the back surface of the semiconductor layer 701. Thus, the solid-state imaging apparatus 1C according to the fourth embodiment depicted in FIGS. 30 and 31 is substantially completed.

According to the method for manufacturing the solid-state imaging apparatus 1C according to the fourth embodiment of the present technology, the solid-state imaging apparatus 1C in which the island region 803 on which the second active element is formed is planarly enclosed by the conductive material can be provided.

According to the method for manufacturing the solid-state imaging apparatus 1C according to the fourth embodiment of the present technology, the island regions are enclosed by the conductive materials in the step of forming the conductive plugs 875a and 875b in the connection holes 871a and 871b. This enables a reduction in the number of manufacturing steps and in cost of the solid-state imaging apparatus 1C.

Note that, in the solid-state imaging apparatus 1C according to the fourth embodiment as well, the second substrate portion 20 may include the semiconductor substrates 21 and 21A stacked on each other, like the second substrate portion 20 depicted in FIG. 104 for the tenth embodiment described below (the second substrate portion 20 may include a plurality of semiconductor substrates stacked on one another). In this case, the conductive plugs 875a and 875b embedded in the through-holes 871a and 871b via the insulating film 873 may penetrate a plurality of semiconductor substrates.

Fifth Embodiment

<Configuration of Solid-State Imaging Apparatus>

Figure 37:
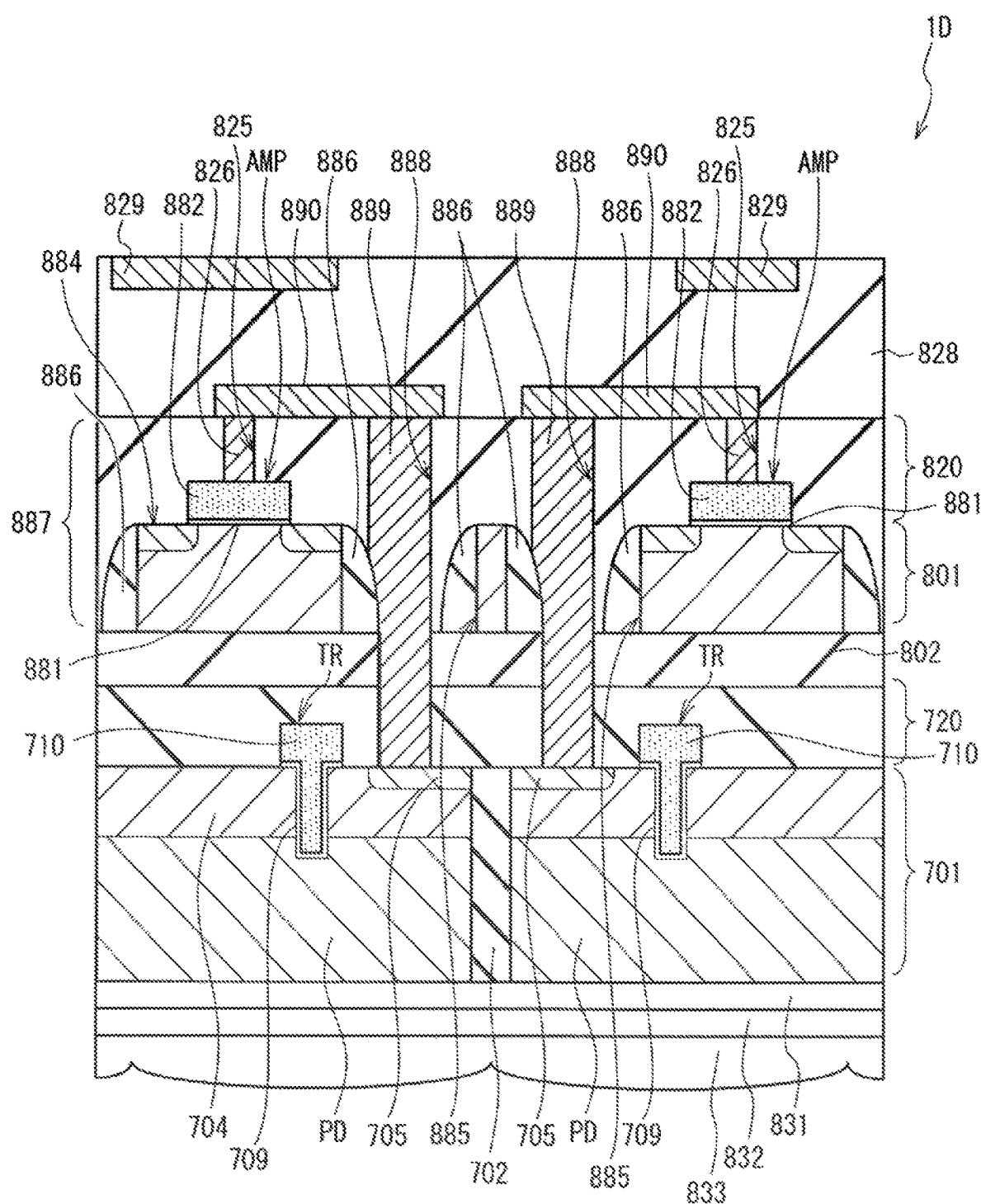
FIG. 37 is a cross-sectional view of a main part of a pixel unit of a solid-state imaging apparatus according to a fifth embodiment of the present technology.

A solid-state imaging apparatus 1D according to a fifth embodiment of the present technology has a configuration of the pixel unit different from that of the solid-state imaging apparatus 1A according to the first embodiment described above. Specifically, the pixel unit PU of the solid-state imaging apparatus 1A according to the first embodiment includes four sensor pixels 12 connected to one readout circuit. In contrast, the pixel unit of the solid-state imaging apparatus 1D of the fifth embodiment of the present technology includes one pixel unit connected to one readout circuit. Further, as depicted in FIG. 37, each sensor pixel is provided with a conductive path electrically connecting a gate electrode 882 of the amplifying transistor AMP in the readout circuit and the contact regions 705 sharing the floating diffusion FD of the sensor pixel. In addition, the conductive path includes a conductive plug 889 embedded into a connection hole 888 extending from a front surface of an insulating layer 887 used as a second insulating layer to the front surface of the contact regions 705.

The amplifying transistor AMP is provided on island regions 884 into which the element formation region of the semiconductor layer 801 used as a second semiconductor layer is divided. In FIG. 37, each of the amplifying transistors AMP of two adjacent readout circuits is provided parallel with one island region 884. The amplifying transistor AMP includes, for example, a gate insulating film 881 that is provided on a major surface of the island region 884 and that includes a thermal silicon oxide film, a gate electrode 882 that is provided on the gate insulating film 881 and that includes a polycrystal silicon film, and a source region and a drain region that are formed in a front layer portion of the island region 884 and that include a semiconductor region.

The island region 884 is provided with a through-hole 885 penetrating the island region 884 in an up-down direction and corresponding to a conductive plug 889. Further, side walls 886 having higher etching selectivity than that of an insulating layer 887 covering the island region 884 are formed on wall surfaces in the through-hole 885 in the island region 884 and on side surfaces at an outer periphery of the island region 884. Moreover, the conductive plug 889 is formed along the side walls 886. The side walls 886 include at least any one of an SiN film, an SiBN film, and an SiBCN film that can exhibit etching selectivity with respect to the silicon oxide film.

<Method for Manufacturing Solid-State Imaging Apparatus>

Now, a method for manufacturing the solid-state imaging apparatus 1D according to the fifth embodiment will be described with reference to FIGS. 38 to 45.

Figure 38:
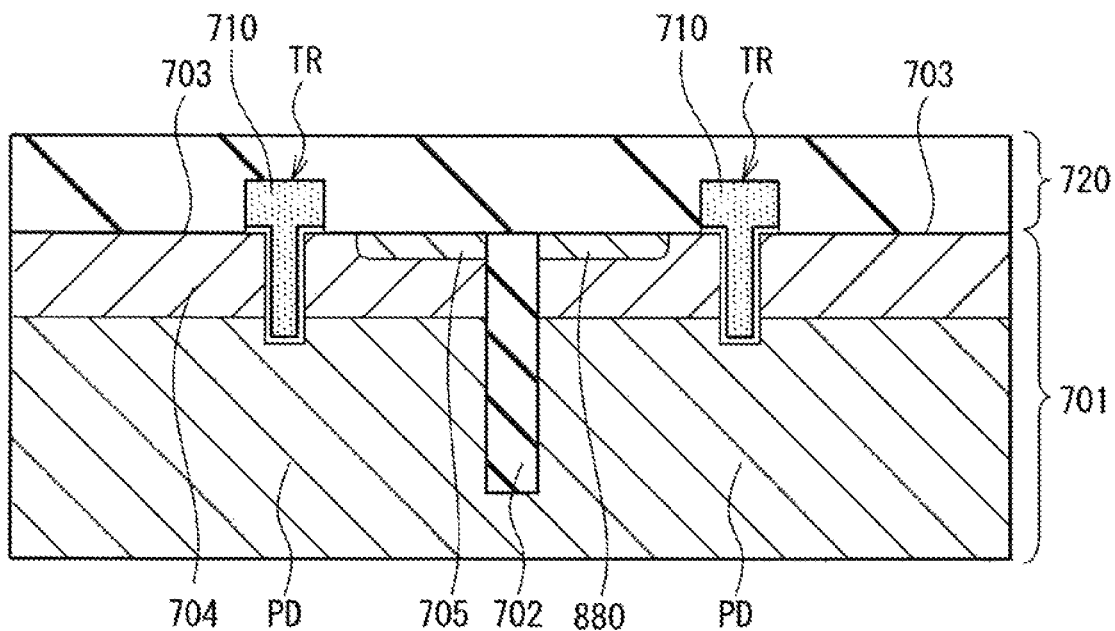
FIG. 38 is a step cross-sectional view of a method for manufacturing the solid-state imaging apparatus according to the fifth embodiment of the present technology.

First, as depicted in FIG. 38, an element isolation region 702, island regions 703, a well region 704, photodiodes PD, transfer transistors TR, contact regions 705, and the like are formed in the semiconductor layer 701.

Then, as depicted in FIG. 38, an insulating layer 720 used as a first insulating layer is formed all over the major surface of the semiconductor layer 701 in such a manner as to cover the gate electrodes 710.

Figure 39:
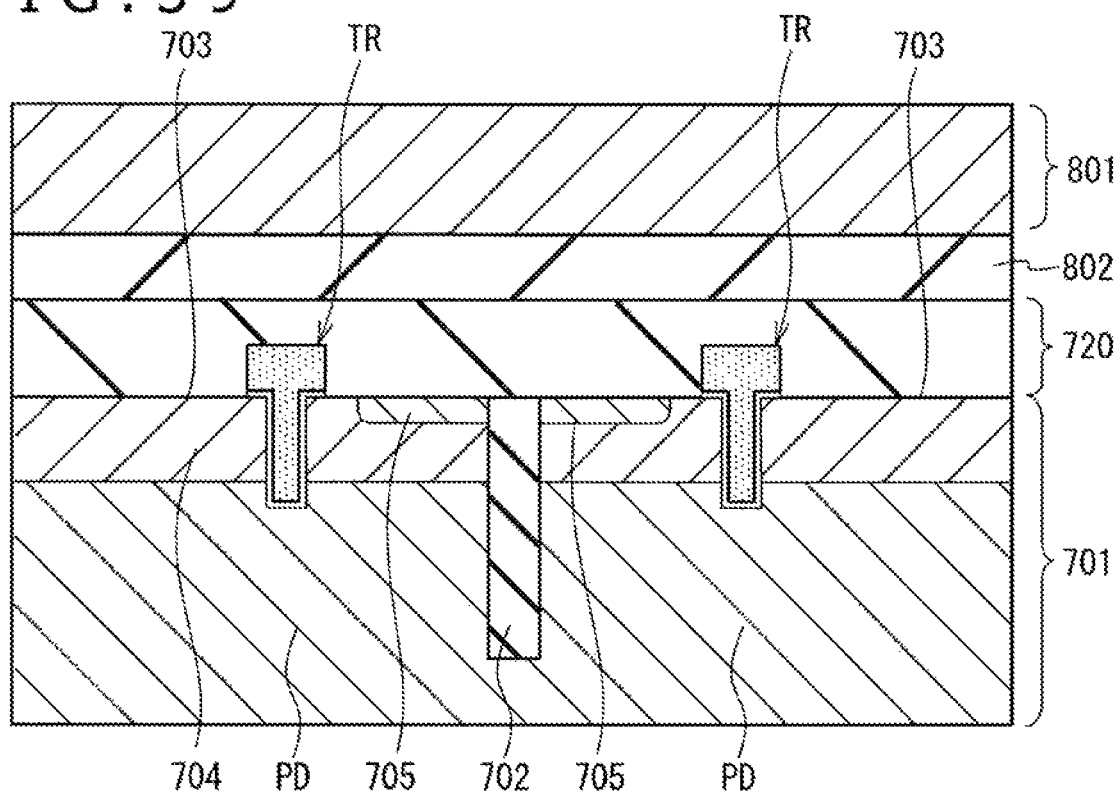
FIG. 39 is a step cross-sectional view of the method for manufacturing the solid-state imaging apparatus according to the fifth embodiment of the present technology, the step cross-sectional view being continued from FIG. 38.

Then, a method similar to the method of the first embodiment described above is used to laminate the semiconductor layer 801 to the major surface side of the semiconductor layer 701 as depicted in FIG. 39. Specifically, thermal treatment is executed with the insulating layer 720 on the major surface side of the semiconductor layer 701 being placed opposite to and in close contact with the insulating film 802 provided on the back surface side of the semiconductor layer 801. Thus, as depicted in FIG. 39, the insulating film 802 and the insulating layer 720 are integrated, and the semiconductor layer 801 in the upper stage is joined to the semiconductor layer 701 in the lower stage via the insulating film 802 and the insulating layer 720. Additionally, the semiconductor layer 801 is disposed on the insulating layer 720. Subsequently, the major surface side of the semiconductor layer 801 is ground by, for example, the CMP method to reduce the thickness of the semiconductor layer 801.

Figure 40:
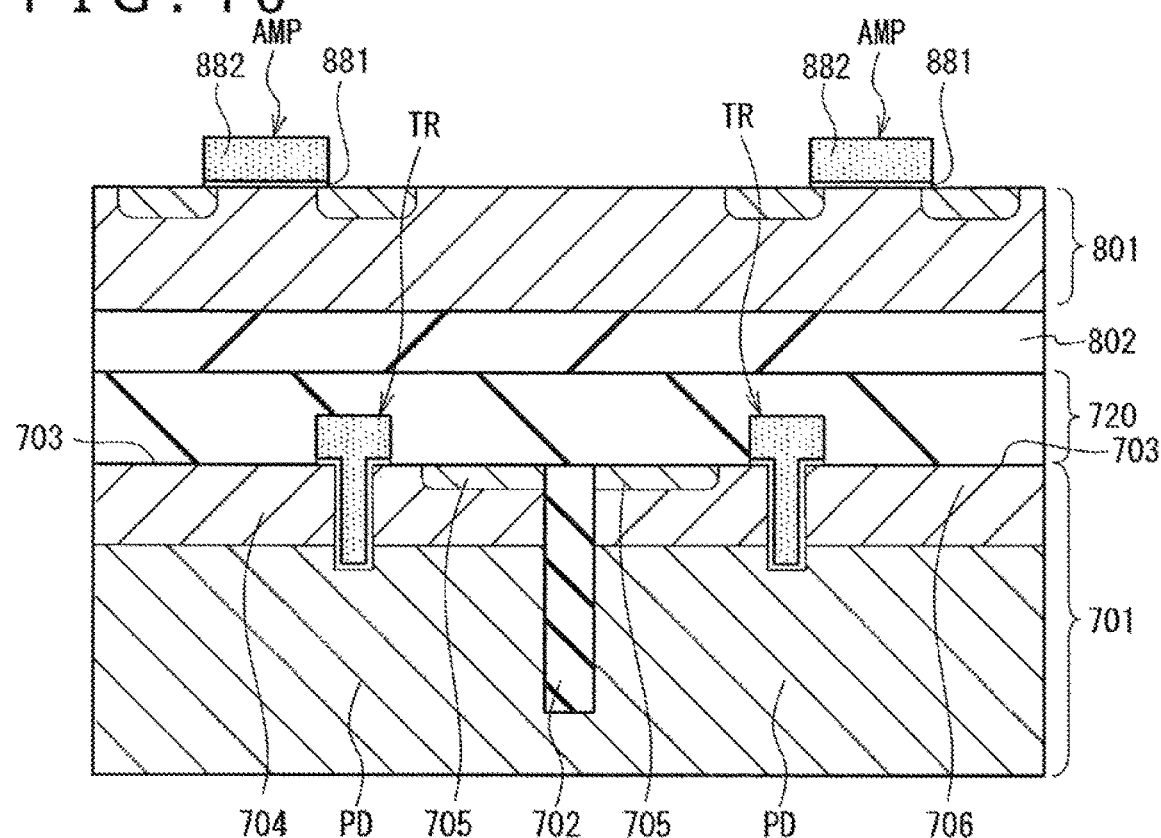
FIG. 40 is a step cross-sectional view of the method for manufacturing the solid-state imaging apparatus according to the fifth embodiment of the present technology, the step cross-sectional view being continued from FIG. 39.

Then, as depicted in FIG. 40, with the element formation regions of the semiconductor layer 801 being left, amplifying transistors AMP used as second active elements are formed on the plurality of element formation regions of the semiconductor layer 801. Additionally, although not depicted in the drawings, a select transistor and a reset transistor RST used as second active elements are formed. The second active elements are formed by a method similar to that of the first embodiment described above.

Figure 41:
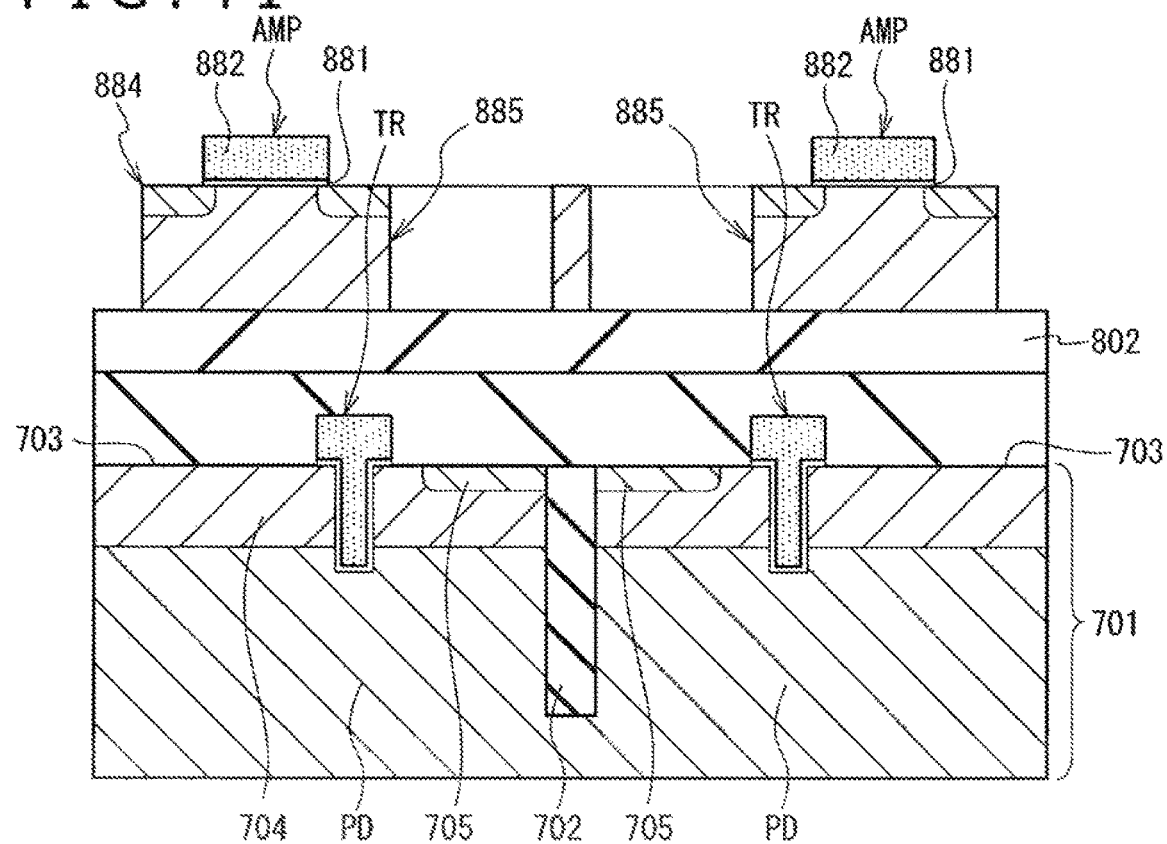
FIG. 41 is a step cross-sectional view of the method for manufacturing the solid-state imaging apparatus according to the fifth embodiment of the present technology, the step cross-sectional view being continued from FIG. 40.

Then, as depicted in FIG. 41, the photolithography technology, the anisotropic dry etching technology, and the like, which are well known, are used to divide the element formation region of the semiconductor layer 801 to form a plurality of island regions 884 and to form, in the island regions 884, a through-hole 885 through which the conductive plug 889 is passed. The through-hole 885 is disposed at a position where the through-hole 885 overlaps the contact region 705 as viewed in plan.

Figure 42:
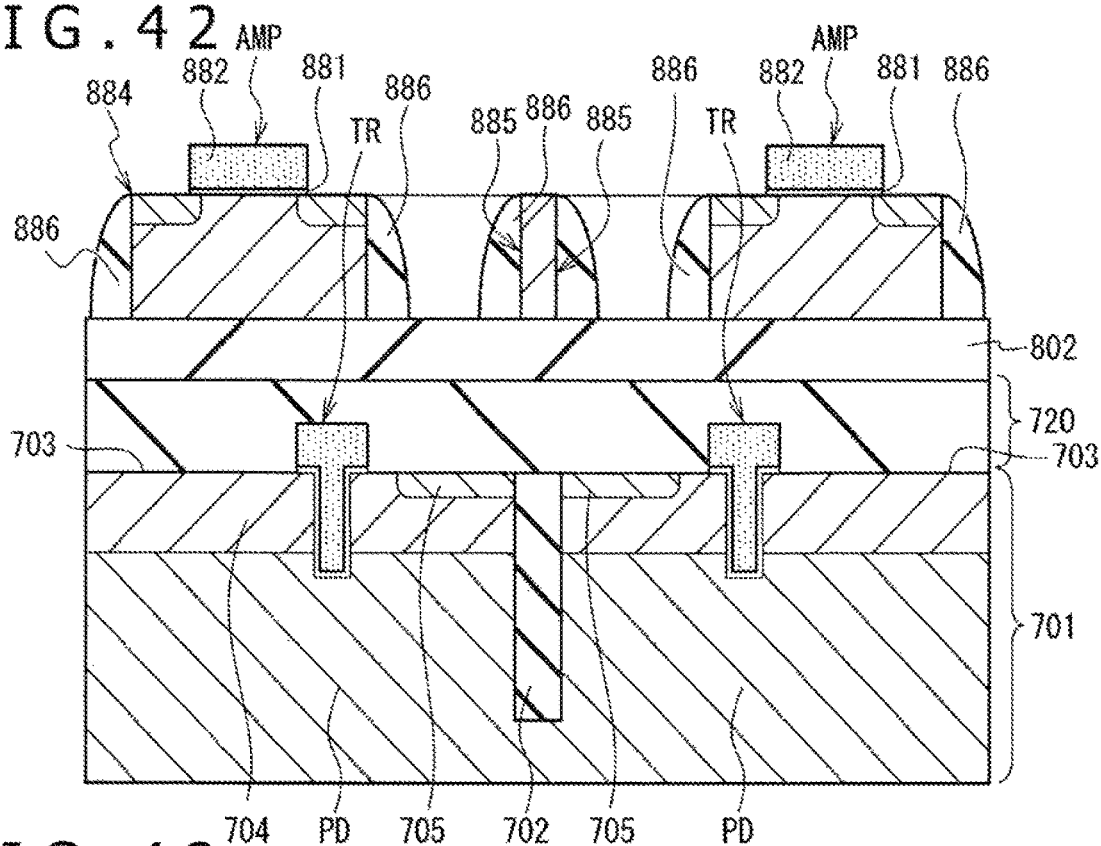
FIG. 42 is a step cross-sectional view of the method for manufacturing the solid-state imaging apparatus according to the fifth embodiment of the present technology, the step cross-sectional view being continued from FIG. 41.

Then, as depicted in FIG. 42, side walls 886 are formed on side walls in the through-hole 885 in the island region 884 and on side walls at the outer periphery of the island region 884. The side walls 886 can be formed by, for example, using the CVD method to deposit an insulating film in such a manner that the insulating film covers the side walls in the through-hole 885 in the island region 884 and the side walls at the outer periphery of the island region 884, and subsequently executing anisotropic dry etching on the insulating film. The side walls 886 include, for example, a silicon nitride film.

Figure 43:
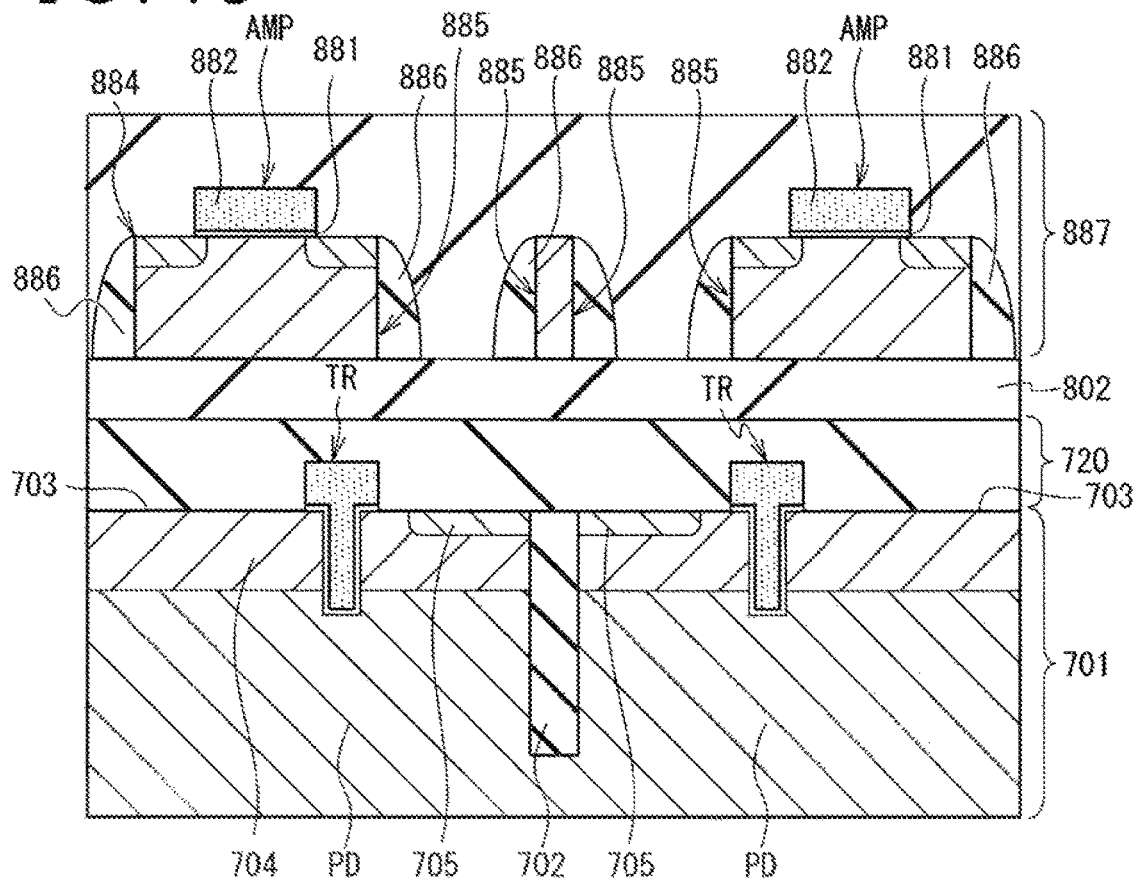
FIG. 43 is a step cross-sectional view of the method for manufacturing the solid-state imaging apparatus according to the fifth embodiment of the present technology, the step cross-sectional view being continued from FIG. 42.

Then, as depicted in FIG. 43, an insulating layer 887 is formed by, for example, the CVD method as a second insulating layer covering the island regions 884, in such a manner as to be embedded between the adjacent island regions 884 and the inside the side walls 886 of the through-hole 885 in the island region 884. The insulating layer 887 includes silicon oxide having selectivity with respect to the side wall 886.

Figure 44:
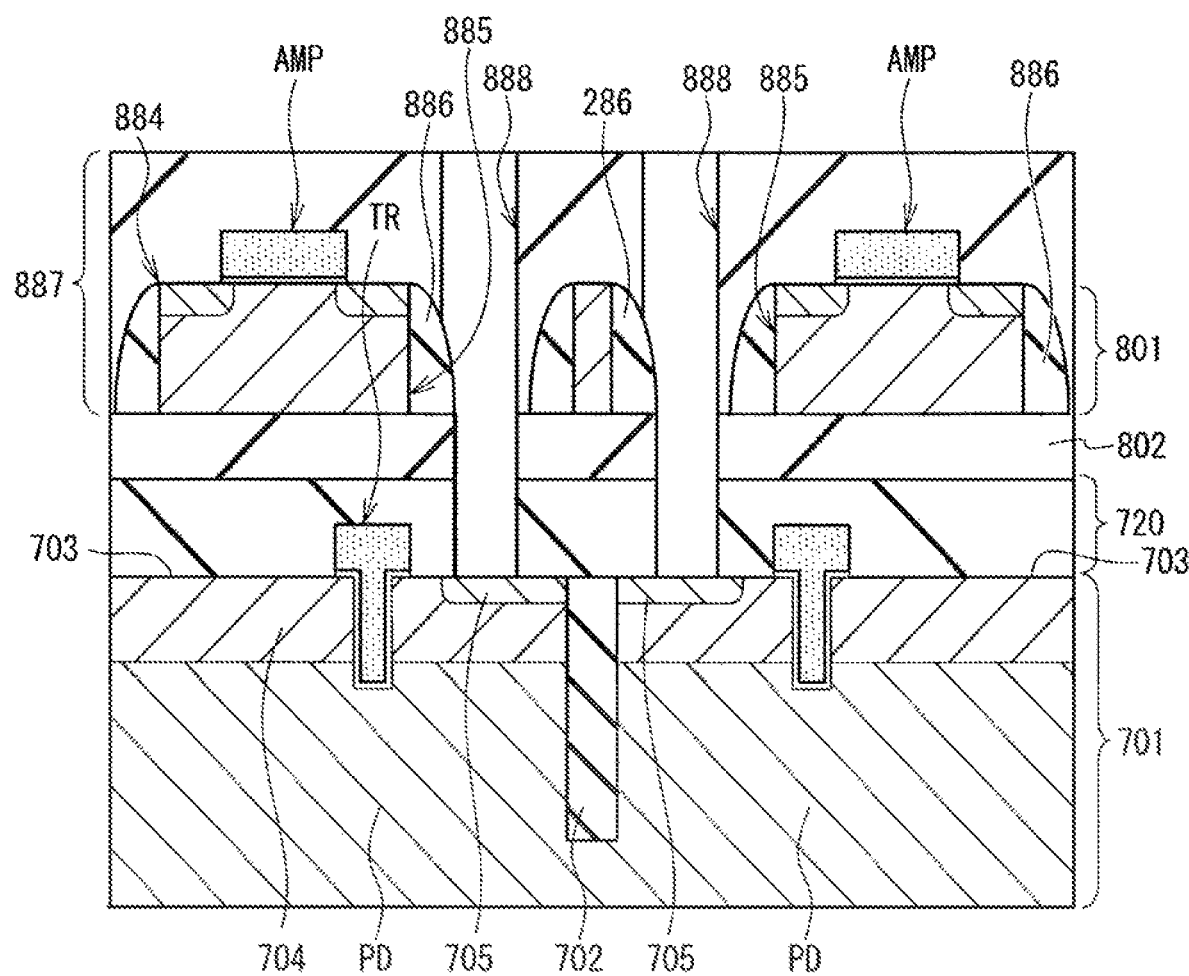
FIG. 44 is a step cross-sectional view of the method for manufacturing the solid-state imaging apparatus according to the fifth embodiment of the present technology, the step cross-sectional view being continued from FIG. 43.

Then, after a front surface of the insulating layer 887 is planarized, connection holes 888 that extend from the front surface of the insulating layer 887 through the through-hole 885 in the island region 884 to the front surface of the contact region 705 are formed, as depicted in FIG. 44. At this time, the connection holes 888 are formed using the photolithography technology, and are thus formed along the side walls 886 even in a case where a photoresist pattern is misaligned, due to misalignment of a mask, in a direction in which the photoresist pattern planarly overlaps the side walls 886.

Figure 45:
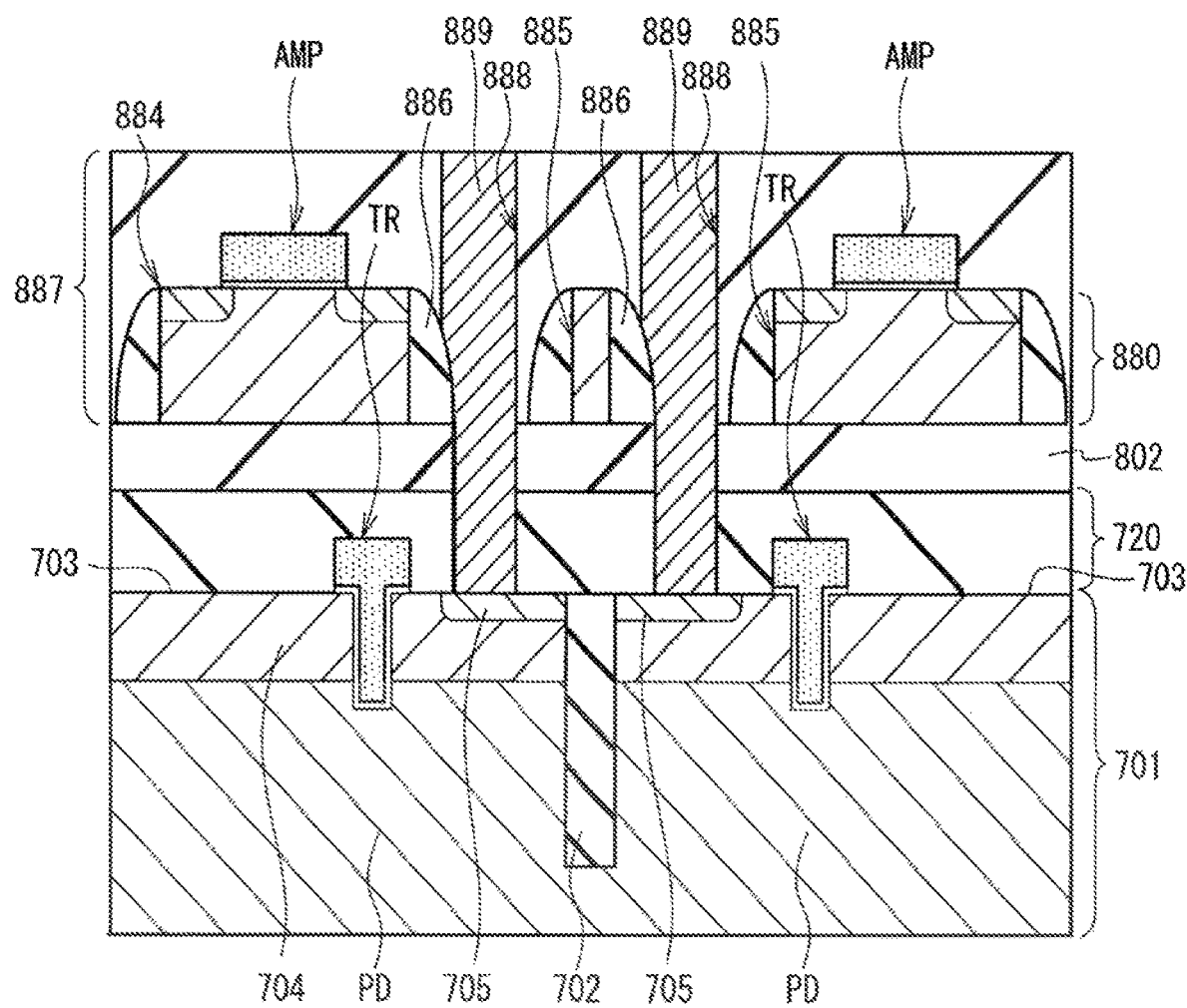
FIG. 45 is a step cross-sectional view of the method for manufacturing the solid-state imaging apparatus according to the fifth embodiment of the present technology, the step cross-sectional view being continued from FIG. 44.

Then, as depicted in FIG. 45, a method similar to the method of the first embodiment described above is used to embed a conductive material into the connection holes 888 to form conductive plugs 889. Then, a method similar to the method of the first embodiment described above is used to form connection holes 825, conductive plugs 826, wires 890, an insulating film 828, wires 829, and the like. Then, after lamination of the third substrate portion 30, a planarization film, a color filter, a microlens, and the like are formed on the back surface of the semiconductor layer 701. Thus, the solid-state imaging apparatus 1D according to the fifth embodiment depicted in FIG. 37 is substantially completed.

According to the method for manufacturing the solid-state imaging apparatus 1D according to the fifth embodiment of the present technology, the connection holes 888 are formed along the side walls 886, and thus the conductive plugs 889 embedded in the connection holes 888 are formed along the connection holes 888. This enables a reduction in misalignment between the conductive plug 889 and the semiconductor layer (island region 884). On the other hand, parasitic capacitance parasitic in the conductive plug 889 varies with the conductive plug 889 due to the misalignment between the conductive plug 889 and the semiconductor layer (island region 884). Consequently, the method for manufacturing the solid-state imaging apparatus 1D according to the fifth embodiment of the present technology enables a reduction in variation in parasitic capacitance parasitic in the conductive plug 889. Additionally, the variation in parasitic capacitance parasitic in the conductive plug 889 affects variation in conversion efficiency. Consequently, the variation in parasitic capacitance parasitic in the conductive plug 889 can be reduced, thus allowing the conversion efficiency to be stabilized.

Note that, in the solid-state imaging apparatus 1D according to the fifth embodiment as well, the second substrate portion 20 may include the semiconductor substrates 21 and 21A stacked on each other, like the second substrate portion 20 depicted in FIG. 104 for the tenth embodiment described below (the second substrate portion 20 may include a plurality of semiconductor substrates stacked on one another). In this case, the conductive plugs 889 may be formed along the side walls 286 formed in each of the plurality of semiconductor substrates.

Sixth Embodiment

<Configuration of Solid-State Imaging Apparatus>

Figure 46:
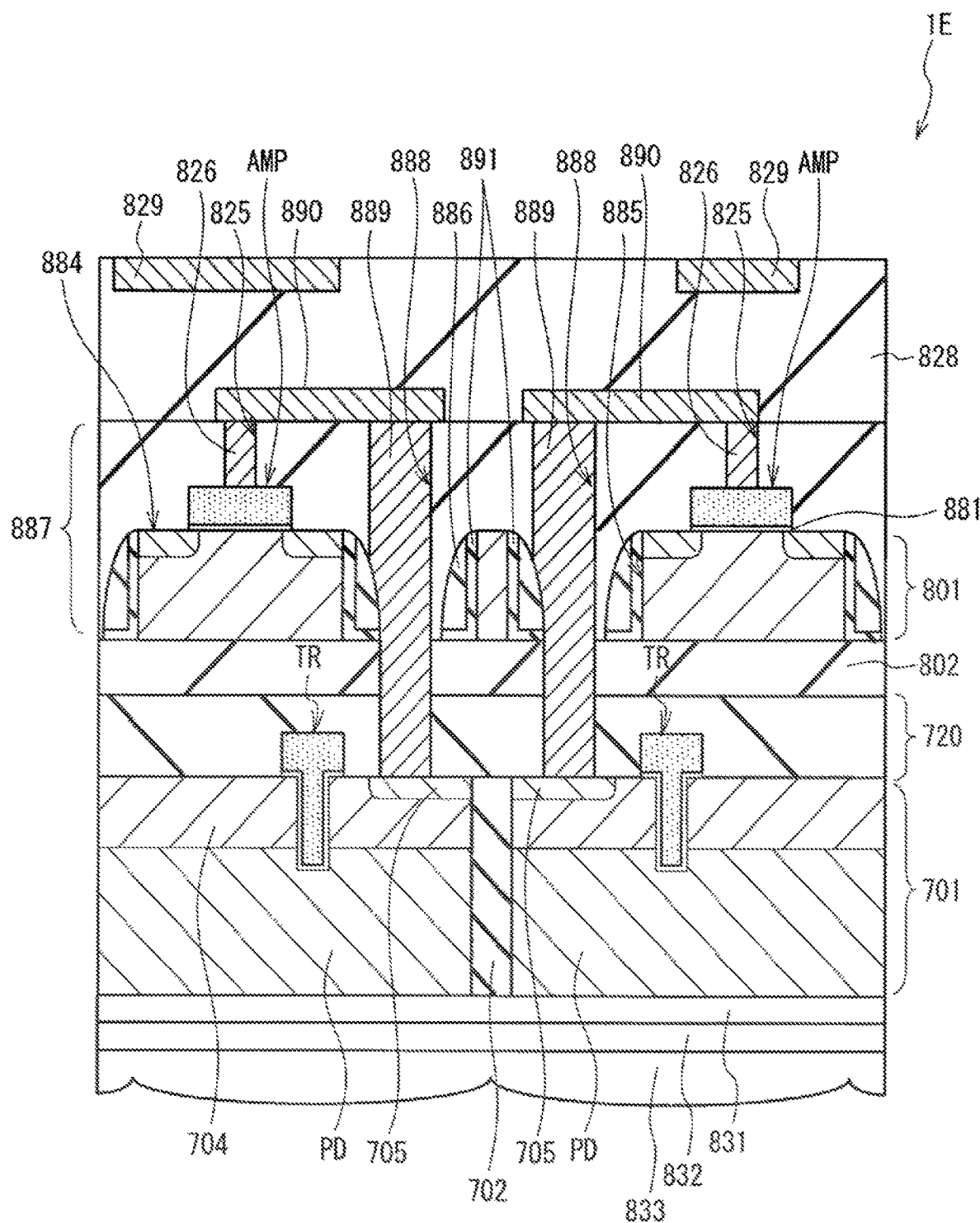
FIG. 46 is a cross-sectional view of a main part of a pixel unit of a solid-state imaging apparatus according to a sixth embodiment of the present technology.

As depicted in FIG. 46, a solid-state imaging apparatus 1E according to a sixth embodiment of the present technology has a configuration substantially similar to that of the solid-state imaging apparatus 1D according to the fifth embodiment described above but differs from the solid-state imaging apparatus 1D according to the fifth embodiment in the following aspects.

Specifically, the solid-state imaging apparatus 1E according to the sixth embodiment of the present technology includes low-permittivity films 891 that are located between the island regions 884 (semiconductor layer) and the side walls 886 and that have a lower permittivity than that of the side walls 886. As the low-permittivity film 891, a low-permittivity material that contains Si, has a lower N content than that of the side walls 886, and includes the addition of B, O, C, or the like is preferably used. Further, the low-permittivity film may be porous and contain air bubbles, and may be a laminate film with two or more layers.

The solid-state imaging apparatus 1E according to the sixth embodiment of the present technology enables a reduction in variation in parasitic capacitance and a reduction in parasitic capacitance itself.

In the sixth embodiment described above, the case in which the conductive plugs 889 penetrate the island regions 884 has been described, as depicted in FIG. 47(*a*). However, the present technology is not limited to this configuration, and can be applied to a case where the conductive plugs 889 pass between two island regions 884 in the up-down direction, for example, as depicted in FIG. 47(*b*). Additionally, as depicted in FIG. 47(*c*), the present technology can be applied to a case where two conductive plugs 889 individually pass between the island region 884 and another island region.

Seventh Embodiment

A seventh embodiment will be described below in detail with reference to the drawings. Note that the description will be in the following order.
1. Embodiment (Imaging Apparatus Including Stacked Structure of Three Substrates)
2. Modified Example 1 (Example 1 of Planar Configuration)
3. Modified Example 2 (Example 2 of Planar Configuration)
4. Modified Example 3 (Example 3 of Planar Configuration)
5. Modified Example 4 (Example Including Inter-substrate Contact Portion in Central Portion of Pixel Array Portion)
6. Modified Example 5 (Example Including Planar Transfer Transistor)
7. Modified Example 6 (Example with One Pixel Connected to One Pixel Circuit)
8. Modified Example 7 (Configuration Example of Pixel Isolation Portion)
9. Application Example (Imaging System)
10. Applied Example 1. Embodiment

[Functional Configuration of Imaging Apparatus 1]

Figure 48:
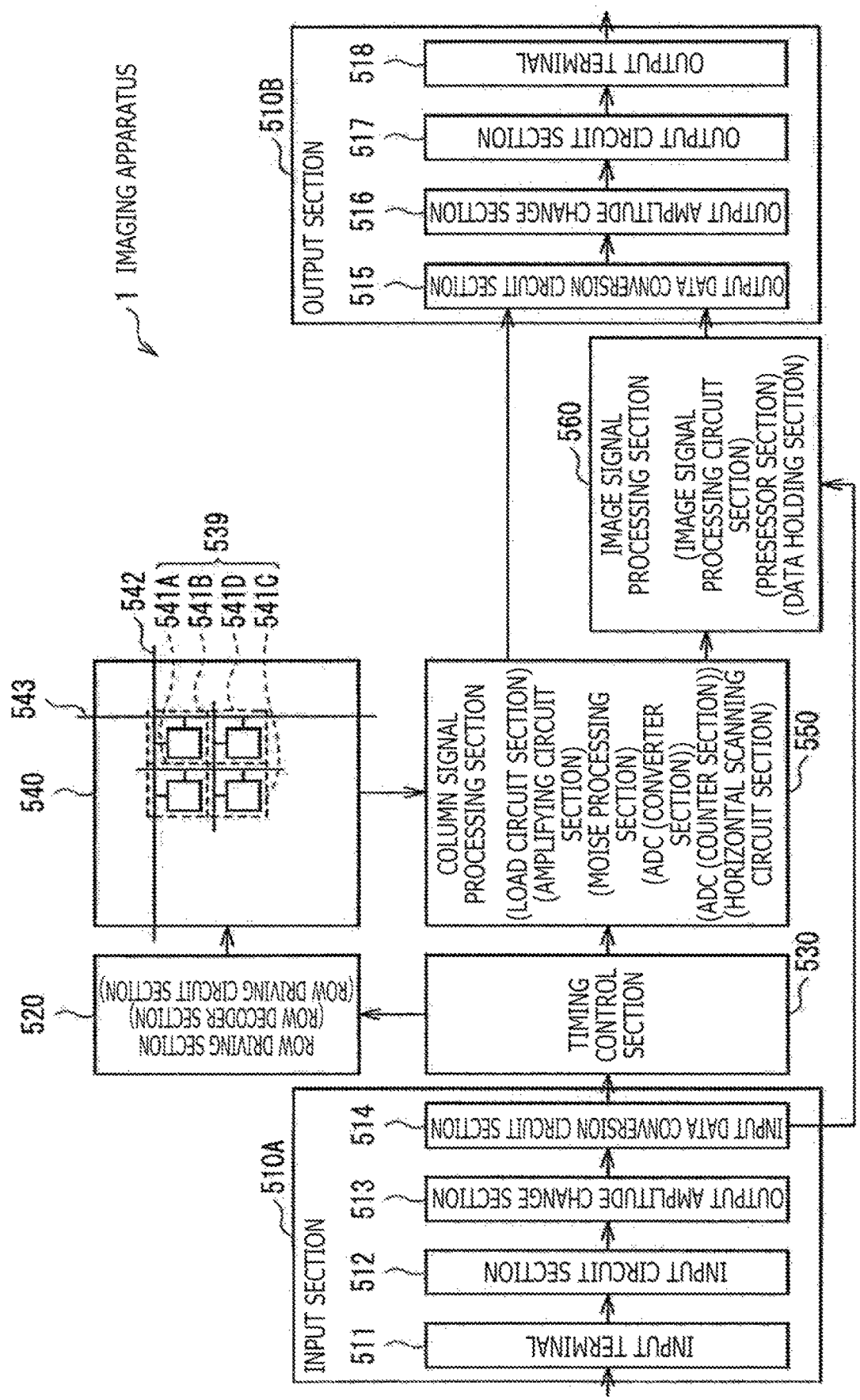
FIG. 48 is a block diagram illustrating an example of a functional configuration of an imaging apparatus according to a seventh embodiment.

FIG. 48 is a block diagram depicting an example of a functional configuration of an imaging apparatus (imaging apparatus 1) according to an embodiment of the present disclosure.

An imaging apparatus 1 in FIG. 48 includes, for example, an input section 510A, a row driving section 520, a timing control section 530, a pixel array portion 540, a column signal processing section 550, an image signal processing section 560, and an output section 510B.

The pixel array portion 540 includes pixels 541 repeatedly arranged in array. More specifically, pixel sharing units 539 each including a plurality of pixels constitute repeating units, and are repeatedly arranged in an array including a row direction and a column direction. Note that, for convenience, the row direction may be referred to as an H direction and the column direction orthogonal to the row direction may be referred to as a V direction. In an example in FIG. 48, one pixel sharing unit 539 includes four pixels (pixels 541A, 541B, 541C, and 541D). Each of the pixels 541A, 541B, 541C, and 541D includes the photodiode PD (depicted FIG. 53 and the like described below). The pixel sharing unit 539 is a unit that shares one pixel circuit (pixel circuit 210 in FIG. 50 described below). In other words, one pixel circuit (pixel circuit 210 described below) is provided for every four pixels (pixels 541A, 541B, 541C, and 541D). The pixel circuit is operated on a time-sharing basis to sequentially read pixel signals from the respective pixels 541A, 541B, 541C, and 541D. The pixels 541A, 541B, 541C, and 541D are arranged, for example, in two rows by two columns. The pixel array portion 540 is provided with a plurality of row driving signal lines 542 and a plurality of vertical signal lines (column read lines) 543, along with the pixels 541A, 541B, 541C, and 541D. The row driving signal lines 542 drive the pixels 541 included in the plurality of pixel sharing units 539 arranged in the pixel array portion 540 in the row direction. In the pixel sharing unit 539, the pixels arranged in the row direction are driven. As described below in detail with reference to FIG. 51, the pixel sharing unit 539 is provided with a plurality of transistors. For driving of each of the plurality of transistors, a plurality of row driving signal lines 542 are connected to one pixel sharing unit 539. The pixel sharing unit 539 is connected to the vertical signal lines (column read lines) 543. Pixel signals are read via the vertical signal lines (column read lines) 543 from the pixels 541A, 541B, 541C, and 541D included in the pixel sharing unit 539.

The row driving section 520 includes, for example, a row address control section determining the position of a row for pixel driving, in other words, a row decoder section, and a row driving circuit section generating signals for driving the pixels 541A, 541B, 541C, and 541D.

The column signal processing section 550 includes, for example, a load circuit section that is connected to the vertical signal lines 543 and that forms a source follower circuit with the pixels 541A, 541B, 541C, and 541D (pixel sharing unit 539). The column signal processing section 550 may include an amplifying circuit section amplifying signals read from the pixel sharing unit 539 via the vertical signal lines 543. The column signal processing section 550 may include a noise processing section. The noise processing section, for example, removes system noise levels from signals read from the pixel sharing unit 539 as a result of photoelectric conversion.

The column signal processing section 550 includes, for example, an analog digital converter (ADC). The analog digital converter converts a signal read from the pixel sharing unit 539 or an analog signal subjected to the noise processing described above. The ADC includes, for example, a comparator section and a counter section. The comparator section compares an analog signal to be converted and a reference signal to be compared with the analog signal. The counter section measures the amount of time left until a comparison result from the comparator section is inverted. The column signal processing section 550 may include a horizontal scan circuit section performing control for scanning read columns.

The timing control section 530 supplies signals controlling timing, to the row driving section 520 and the column signal processing section 550 on the basis of a reference clock signal and a timing control signal that are input to the apparatus.

The image signal processing section 560 is a circuit executing various types of signal processing on data resulting from photoelectric conversion, in other words, data resulting from an imaging operation in the imaging apparatus 1. The image signal processing section 560 includes, for example, an image signal processing circuit section and a data holding section. The image signal processing section 560 may include a processor section.

An example of signal processing executed in the image signal processing section 560 is tone curve correction processing for providing many gradations to imaging data subjected to AD conversion in a case where the imaging data corresponds to capturing of an image of a dark subject, while providing fewer gradations to the imaging data in a case where the imaging data corresponds to capturing of an image of a bright subject. In this case, the data holding section of the image signal processing section 560 is desirably caused to store in advance tone curve property data regarding what tone curve is used as a basis for correcting the gradation of the imaging data.

The input section 510A is configured to, for example, input the reference clock signal, timing control signal, property data, and the like described above, from the outside of the apparatus to the imaging apparatus 1. The timing control signal includes, for example, a vertical synchronization signal, a horizontal synchronization signal, and the like. The property data is intended to, for example, be stored in the data holding section of the image signal processing section 560. The input section 510A includes, for example, an input terminal 511, an input circuit section 512, an input amplitude change section 513, an input data conversion circuit section 514, and a power supply section (not illustrated).

The input terminal 511 is an external terminal configured to input data. The input circuit section 512 is configured to load, into the imaging apparatus 1, a signal input to the input terminal 511. The input amplitude change section 513 changes the amplitude of the signal loaded by the input circuit section 512 to an amplitude easily utilized inside the imaging apparatus 1. The input data conversion circuit section 514 changes arrangement of a data sequence of input data. The input data conversion circuit section 514 includes, for example, a serial parallel conversion circuit. The serial parallel conversion circuit converts, into a parallel signal, a serial signal received as input data. Note that the input amplitude change section 513 and the input data conversion circuit section 514 may be omitted from the input section 510A. The power supply section supplies power set to various voltages required inside the imaging apparatus 1, on the basis of power externally supplied to the imaging apparatus 1.

When the imaging apparatus 1 is connected to an external memory device, the input section 510A may be provided with a memory interface circuit receiving data from the external memory device. The external memory device is, for example, a flash memory, an SRAM, a DRAM, and the like.

The output section 510B outputs image data to the outside of the apparatus. The image data is, for example, image data of an image captured by the imaging apparatus 1, image data subjected to signal processing by the image signal processing section 560, and the like. The output section 510B includes, for example, an output data conversion circuit section 515, an output amplitude change section 516, an output circuit section 517, and an output terminal 518.

The output data conversion circuit section 515 includes, for example, a parallel serial conversion circuit, and converts, into a serial signal, a parallel signal used inside the imaging apparatus 1. The output amplitude change section 516 changes the amplitude of the signal used inside the imaging apparatus 1. The signal of the changed amplitude is easily utilized by an external device externally connected to the imaging apparatus 1. The output circuit section 517 is a circuit that outputs data from the inside to the outside of the imaging apparatus 1, and drives a wire located outside the imaging apparatus 1 and connected to the output terminal 518. The output terminal 518 outputs data from the imaging apparatus 1 to the outside of the apparatus. The output data conversion circuit section 515 and the output amplitude change section 516 may be omitted from the output section 510B.

When the imaging apparatus 1 is connected to an external memory device, the output section 510B may be provided with a memory interface circuit outputting data to the external memory device. The external memory device is, for example, a flash memory, an SRAM, a DRAM, and the like.

[General Configuration of Imaging Apparatus 1]

Figure 49:
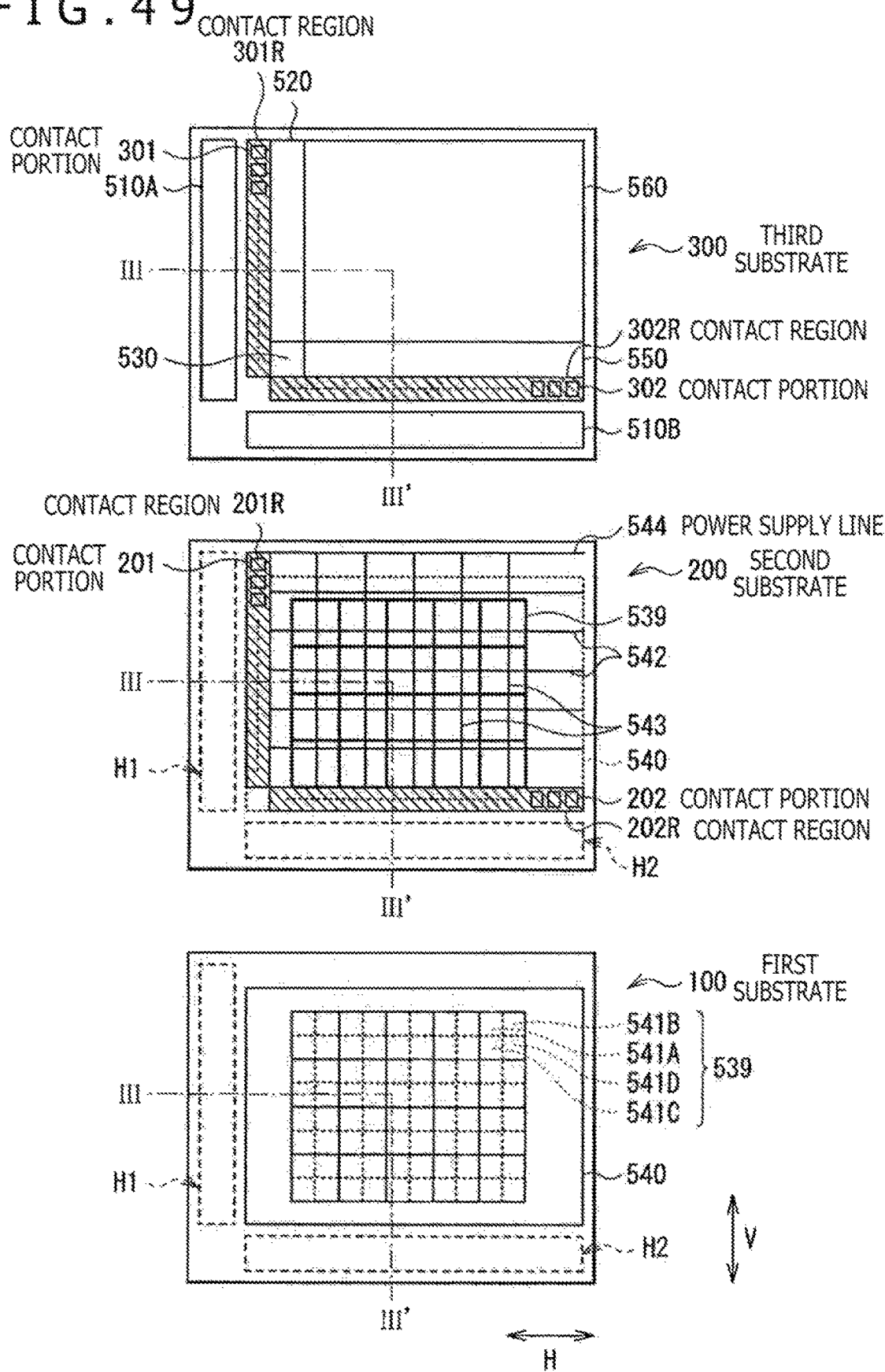
FIG. 49 depicts schematic plan views each illustrating a general configuration of the imaging apparatus depicted in FIG. 48.
Figure 50:
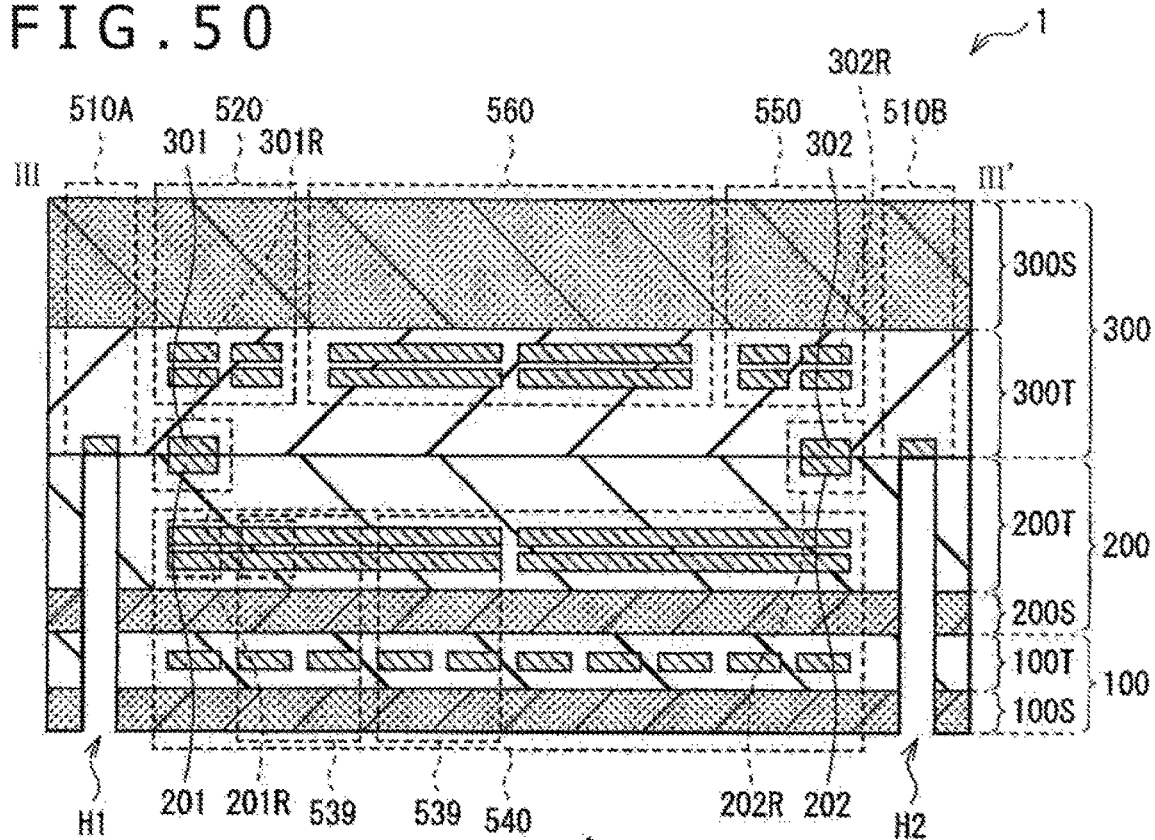
FIG. 50 is a schematic diagram illustrating a cross-sectional configuration taken along line III-III' depicted in FIG. 49.

FIGS. 49 and 50 illustrate an example of a general configuration of the imaging apparatus 1. The imaging apparatus 1 includes three substrates (a first substrate 100, a second substrate 200, and a third substrate 300). FIG. 49 schematically illustrates a planar configuration of each of the first substrate 100, the second substrate 200, and the third substrate 300, and FIG. 50 schematically illustrates a cross-sectional configuration of the first substrate 100, the second substrate 200, and the third substrate 300 that are stacked on one another. FIG. 50 corresponds to a cross-sectional configuration taken along line III-III' depicted in FIG. 49. The imaging apparatus 1 is a three-dimensional imaging apparatus constructed by laminating three substrates (first substrate 100, second substrate 200, and third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. In this regard, a combination of wires and an interlayer insulating film around the wires that is included in each of the first substrate 100, the second substrate 200, and the third substrate 300 is referred to as a wiring layer (100T, 200T, 300T) provided in each of the substrates (first substrate 100, second substrate 200, and third substrate 300) for convenience. The first substrate 100, the second substrate 200, and the third substrate 300 are stacked in this order, and the semiconductor layer 100S, the wiring layer 100T, the semiconductor layer 200S, the wiring layer 200T, the wiring layer 300T, and the semiconductor layer 300S are arranged in this order along a stacking direction. Specific configurations of the first substrate 100, the second substrate 200, and the third substrate 300 will be described below. An arrow depicted in FIG. 50 illustrates a direction in which light L is incident on the imaging apparatus 1. For convenience, in subsequent cross-sectional views, a light incidence side of the imaging apparatus 1 may hereinafter be referred to as "lower," "lower side," and "downward," and the side opposite to the light incidence side may hereinafter be referred to as "upper," "upper side," and "upward." Additionally, for convenience, for the substrate including the semiconductor layer and the wiring layer, the side of the wiring layer may hereinafter be referred to as a front surface, and the side of the semiconductor layer may hereinafter be referred to as a back surface. Note that the description herein is not limited to the above-described designations. The imaging apparatus 1 is, for example, a back-illuminated imaging apparatus in which light is incident on the back surface side of the first substrate 100 including a photodiode.

The pixel array portion 540 and the pixel sharing unit 539 included in the pixel array portion 540 are both constructed using both the first substrate 100 and the second substrate 200. The first substrate 100 is provided with a plurality of pixels 541A, 541B, 541C, and 541D provided in the pixel sharing unit 539. Each of the pixels 541 includes a photodiode (photodiode PD described below) and a transfer transistor (transfer transistor TR described below). The second substrate 200 is provided with a pixel circuit (pixel circuit 210 described below) provided in the pixel sharing unit 539. The pixel circuit reads pixel signals transferred from the photodiodes of the pixels 541A, 541B, 541C, and 541D via the transfer transistors or resets the photodiodes. In addition to the pixel circuit described above, the second substrate 200 includes a plurality of row driving signal lines 542 extending in the row direction and a plurality of vertical signal lines 543 extending in the column direction. The second substrate 200 further includes a power supply line 544 extending in the row direction. The third substrate 300 includes, for example, the input section 510A, the row driving section 520, the timing control section 530, the column signal processing section 550, the image signal processing section 560, and the output section 510B. The row driving section 520 is provided in a region where the row driving section 520 partly overlaps the pixel array portion 540, in a stacking direction of the first substrate 100, the second substrate 200, and the third substrate 300 (hereinafter simply referred to as the stacking direction), for example. More specifically, the row driving section 520 is provided, in the stacking direction, in a region where the row driving section 520 overlaps a region around an end of the pixel array portion 540 in the H direction (FIG. 49). The column signal processing section 550 is provided, for example, in the stacking direction, in a region where the column signal processing section 550 overlaps the pixel array portion 540. More specifically, the column signal processing section 550 is provided, in the stacking direction, in a region where the column signal processing section 550 overlaps a region around an end of the pixel array portion 540 in the V direction (FIG. 49). Although not depicted in the drawings, the input section 510A and the output section 510B may be disposed in a portion other than the third substrate 300 and may be disposed, for example, in the second substrate 200. Alternatively, the input section 510A and the output section 510B may be provided on a back surface (light incidence) side of the first substrate 100. Note that, as another designation, the pixel circuit provided in the second substrate 200 may be referred to as a pixel transistor circuit, a pixel transistor group, a pixel transistor, a pixel readout circuit, or a readout circuit. The designation "pixel circuit" is used herein.

The first substrate 100 and the second substrate 200 are electrically connected to each other by, for example, through vias (through vias 120E and 121E in FIG. 53 described below). The second substrate 200 and the third substrate 300 are electrically connected to each other, for example, via contact portions 201, 202, 301, and 302. The second substrate 200 is provided with the contact portions 201 and 202, and the third substrate 300 is provided with the contact portions 301 and 302. The contact portion 201 of the second substrate 200 is in contact with the contact portion 301 of the third substrate 300, and the contact portion 202 of the second substrate 200 is in contact with the contact portion 302 of the third substrate 300. The second substrate 200 includes a contact region 201R provided with a plurality of contact portions 201 and a contact region 202R provided with a plurality of contact portions 202. The third substrate 300 includes a contact region 301R provided with a plurality of contact portions 301 and a contact region 302R provided with a plurality of contact portions 302. The contact regions 201R and 301R are provided between the pixel array portion 540 and the row driving section 520 (FIG. 50) in the stacking direction. In other words, the contact regions 201R and 301R are provided, for example, in or near a region where the row driving section 520 (third substrate 300) overlaps the pixel array portion 540 (second substrate 200) in the stacking direction. The contact regions 201R and 301R are disposed at an end of such a region in the H direction (FIG. 49), for example. In the third substrate 300, the contact region 301R is provided, for example, in a part of the row driving section 520, specifically, at a position where the contact region 301R overlaps the end of the row driving section 520 in the H direction (FIGS. 49 and 50). The contact portions 201 and 301 are configured to, for example, connect the row driving section 520 provided in the third substrate 300 and the row driving line 542 provided in the second substrate 200 to each other. The contact portions 201 and 301 may, for example, connect the input section 510A provided in the third substrate 300, to the power supply line 544 and a reference potential line (reference potential line VSS described below). The contact regions 202R and 302R are provided between the pixel array portion 540 and the column signal processing section 550 in the stacking direction (FIG. 50). In other words, the contact regions 202R and 302R are provided, for example, in or near a region where the column signal processing section 550 (third substrate 300) overlaps the pixel array portion 540 (second substrate 200) in the stacking direction. The contact regions 202R and 302R are disposed at an end of such a region in the V direction (FIG. 49). In the third substrate 300, the contact region 301R is provided, for example, in a part of the column signal processing section 550, specifically, at a position where the contact region 301R overlaps the end of the column signal processing section 550 in the V direction (FIGS. 49 and 50). The contact portions 202 and 302 are configured to, for example, connect, to the column signal processing section 550 provided in the third substrate 300, pixel signals (signals corresponding to the amount of charge resulting from photoelectric conversion in the photodiodes) output from the plurality of respective pixel sharing units 539 provided in the pixel array portion 540. The pixel signals are sent from the second substrate 200 to the third substrate 300.

FIG. 50 is an example of a cross-sectional view of the imaging apparatus 1 as described above. The first substrate 100, the second substrate 200, and the third substrate 300 are electrically connected via the wiring layers 100T, 200T, and 300T. For example, the imaging apparatus 1 includes electric connection portions electrically connecting the second substrate 200 and the third substrate 300 to each other. Specifically, the contact portions 201, 202, 301, and 302 are formed using electrodes including a conductive material. The conductive material includes, for example, a metal material such as copper (Cu), aluminum (Al), gold (Au), or the like. The contact regions 201R, 202R, 301R, and 302R, for example, directly join wires formed as electrodes to electrically connect the second substrate and the third substrate to each other, enabling input and/or output of signals between the second substrate 200 and the third substrate 300.

Electric connection portions electrically connecting the second substrate 200 and the third substrate 300 to each other can be provided at desired points. For example, as described as the contact regions 201R, 202R, 301R, and 302R with reference to FIG. 50, the electric connection portions may be provided in a region where the electric connection portions overlap the pixel array portion 540 in the stacking direction. Additionally, the electric connection portions may be provided in a region where the electric connection portions do not overlap the pixel array portion 540 in the stacking direction. Specifically, the electric connection portions may be provided in a region where the electric connection portions overlap, in the stacking direction, a peripheral portion disposed outside the pixel array portion 540.

The first substrate 100 and the second substrate 200 are provided with, for example, connection hole portions H1 and H2. The connection hole portions H1 and H2 penetrate the first substrate 100 and the second substrate 200 (FIG. 50). The connection hole portions H1 and H2 are provided outside the pixel array portion 540 (or a portion overlapping the pixel array portion 540) (FIG. 49). For example, the connection hole portion H1 is disposed outside the pixel array portion 540 in the H direction, and the connection hole portion H2 is disposed outside the pixel array portion 540 in the V direction. For example, the connection hole portion H1 reaches the input section 510A provided in the third substrate 300, and the connection hole portion H2 reaches the output section 510B provided in the third substrate 300. The connection hole portions H1 and H2 may be cavities and may at least partly include a conductive material. For example, a bonding wire may be connected to an electrode formed as the input section 510A and/or the output section 510B. Alternatively, an electrode formed as the input section 510A and/or the output section 510B may be connected to a conductive material provided in the connection hole portions H1, H2. The conductive material provided in the connection hole portion H1, H2 may be embedded in a part or all of the connection hole portion H1, H2, or may be formed on the side walls of the connection hole portion H1, H2.

Note that FIG. 50 depicts the structure in which the third substrate 300 is provided with the input section 510A and the output section 510B but that the structure is not limited thereto. For example, by sending a signal from the third substrate 300 to the second substrate 200 via the wiring layers 200T and 300T, the input section 510A and/or the output section 510B can be provided in the second substrate 200. Similarly, by sending a signal from the second substrate 200 to the first substrate 1000 via the wiring layers 100T and 200T, the input section 510A and/or the output section 510B can be provided in the first substrate 100.

Figure 51:
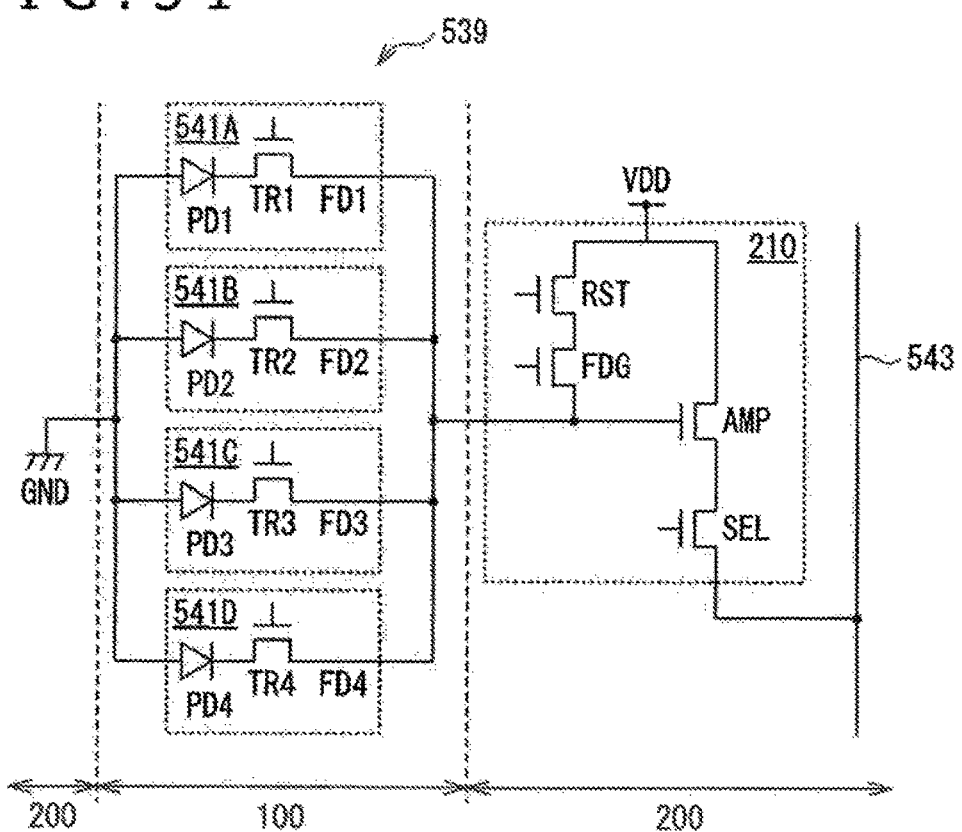
FIG. 51 is an equivalent circuit diagram of a pixel sharing unit depicted in FIG. 48.

FIG. 51 is an equivalent circuit diagram illustrating an example of a configuration of the pixel sharing unit 539. The pixel sharing unit 539 includes a plurality of pixels 541 (in FIG. 51, the plurality of pixels 541 correspond to four pixels 541A, 541B, 541C, and 541D), one pixel circuit 210 connected to the plurality of pixels 541, and vertical signal lines 5433 connected to the pixel circuit 210. The pixel circuit 210 includes, for example, four transistors, specifically, the amplifying transistor AMP, the select transistor SEL, the reset transistor RST, and an FD conversion gain switching transistor FD. As described above, the pixel sharing unit 539 operates one pixel circuit 210 on a time-sharing basis to sequentially output, to the vertical signal line 543, pixel signals for the four respective pixels 541 (pixels 541A, 541B, 541C, and 541D) included in the pixel sharing unit 539. One pixel circuit 210 is connected to the plurality of pixels 541, and a manner in which pixel signals for the plurality of pixels 541 are output on a time-sharing basis by one pixel circuit 210 is expressed as the "plurality of pixels 541 share one pixel circuit 210."

The pixels 541A, 541B, 541C, and 541D share components. For the purpose of distinction of components of the pixels 541A, 541B, 541C, and 541D, reference signs for the components of the pixel 541A are assigned identification number 1 at the end of the reference sign, reference signs for the components of the pixel 541B are assigned identification number 2 at the end of the reference sign, reference signs for the components of the pixel 541C are assigned identification number 3 at the end of the reference sign, and reference signs for the components of the pixel 541D are assigned identification number 4 at the end of the reference sign. In a case where the components of the pixels 541A, 541B, 541C, and 541D need not be distinguished from one another, the identification numbers at the end of the reference signs for the components of the pixels 541A, 541B, 541C, and 541D are omitted.

The pixels 541A, 541B, 541C, and 541D each include, for example, the photodiode PD, the transfer transistor TR electrically connected to the photodiode PD, and the floating diffusion FD electrically connected to the transfer transistor TR. The photodiodes PD (PD1, PD2, PD3, and PD4) each include a cathode electrically connected to a source of the transfer transistor TR and an anode electrically connected to a reference potential line (for example, ground). The photodiode PD photoelectrically converts incident light and generates charge according to the amount of light received. The transfer transistors TR (transfer transistors TR1, TR2, TR3, and TR4) are each, for example, an n-type CMOS (Complementary Metal Oxide Semiconductor) transistor. The transfer transistor TR includes a drain electrically connected to the floating diffusion FD and a gate electrically connected to a driving signal line. The driving signal line is a part of the plurality of row driving signal lines 542 (see FIG. 48) connected to the one pixel sharing unit 539. The transfer transistor TR transfers, to the floating diffusion FD, charge generated by the photodiode PD. The floating diffusions FD (floating diffusions FD1, FD2, FD3, and FD4) are each an n-type diffusion region formed in a p-type semiconductor layer. The floating diffusion FD is charge holding means for temporarily holding charge transferred from the photodiode PD, and is charge-voltage conversion means for generating a voltage according to the amount of charge.

The four floating diffusions FD (floating diffusions FD1, FD2, FD3, and FD4) included in the one pixel sharing unit 539 are electrically connected to one another and electrically connected to a gate of the amplifying transistor AMP and a source of an FD conversion gain switching transistor FDG. The FD conversion gain switching transistor FDG includes a drain connected to a source of the reset transistor RST and a gate connected to a driving signal line. The driving signal line is a part of the plurality of row driving signal lines 542 connected to the one pixel sharing unit 539. The reset transistor RST includes a drain connected to the power supply line VDD and a gate connected to a driving signal line. The driving signal line is a part of the plurality of row driving signal lines 542 connected to the one pixel sharing unit 539. The amplifying transistor AMP includes a gate connected to the floating diffusion FD, a drain connected to the power supply line VDD, and a source connected to a drain of the select transistor SEL. The select transistor SEL includes a source connected to the vertical signal line 543 and a gate connected to a driving signal line. The driving signal line is a part of the plurality of row driving signal lines 542 connected to the one pixel sharing unit 539.

When the transfer transistor TR turns on, the transfer transistor TR transfers charge in the photodiode PD to the floating diffusion FD. A gate of the transfer transistor TR (transfer gate TG) includes, for example, what is generally called a vertical electrode, and as depicted in FIG. 53 described below, is provided to extend from the front surface of a semiconductor layer (semiconductor layer 100S in FIG. 53 described below) to a depth where the gate reaches the PD. The reset transistor RST resets the potential of the floating diffusion FD to a predetermined potential. When the reset transistor RST turns on, the reset transistor RST resets the potential of the floating diffusion FD to the potential of the power supply line VDD. The select transistor SEL controls an output timing for a pixel signal from the pixel circuit 210. The amplifying transistor AMP generates, as a pixel signal, a signal of a voltage corresponding to the level of charge held in the floating diffusion FD. The amplifying transistor AMP is connected to the vertical signal lines 543 via the select transistor SEL. The amplifying transistor AMP constitutes a source follower in the column signal processing section 550 along with a logic circuit section (see FIG. 48) connected to the vertical signal line 543. When the select transistor SEL turns on, the amplifying transistor AMP outputs the voltage of the floating diffusion FD to the column signal processing section 550 via the vertical signal line 543. The reset transistor RST, the amplifying transistor AMP, and the select transistor SEL are, for example, N-type CMOS transistors.

The FD conversion gain switching transistor FDG is used to change the gain of charge-voltage conversion in the floating diffusion FD. In general, the pixel signal is small during image capturing in a dark place. On the basis of Q=CV, during charge-voltage conversion, an increased capacitance (FD capacitance C) of the floating diffusion FD reduces V obtained by conversion performed by the amplifying transistor AMP. On the other hand, in a bright place, the pixel signal is larger. Therefore, an increased FD capacitance C prevents the floating diffusion FD from receiving the charge in the photodiode PD. Further, to prevent an excessive increase in V obtained by conversion performed by the amplifying transistor AMP (in other words, to reduce V), the FD capacitance C needs to be increased. On the basis of this, turning on the FD conversion gain switching transistor FDG increases gate capacitance by an amount corresponding to the FD conversion gain switching transistor FDG, thus increasing the whole FD capacitance C. On the other hand, turning off the FD conversion gain switching transistor FDG reduces the whole FD capacitance C. In such a way, switching the FD conversion gain switching transistor FDG on and off enables the FD capacitance C to be varied, allowing conversion efficiency to be switched. The FD conversion gain switching transistor FDG is, for example, an N-type CMOS transistor.

Note that a configuration that is not provided with the FD conversion gain switching transistor FDG is also possible. At this time, for example, the pixel circuit 210 includes, for example, three transistors of the amplifying transistor AMP, the select transistor SEL, and the reset transistor RST. The pixel circuit 210 includes, for example, at least one of pixel transistors such as the amplifying transistor AMP, the select transistor SEL, the reset transistor RST, and the FD conversion gain switching transistor FDG.

The select transistor SEL may be provided between the power supply line VDD and the amplifying transistor AMP. In this case, a drain of the reset transistor RST is electrically connected to the power supply line VDD and the drain of the select transistor SEL. A source of the select transistor SEL is electrically connected to a drain of the amplifying transistor AMP, and a gate of the select transistor SEL is electrically connected to the row driving signal lines 542 (see FIG. 48). A source (an output end of the pixel circuit 210) of the amplifying transistor AMP is electrically connected to the vertical signal line 543, and the gate of the amplifying transistor AMP is electrically connected to the source of the reset transistor RST. Note that, although not depicted in the drawings, the number of pixels 541 sharing one pixel circuit 210 may be other than four. For example, two or eight pixels 541 may share one pixel circuit 210.

Figure 52:
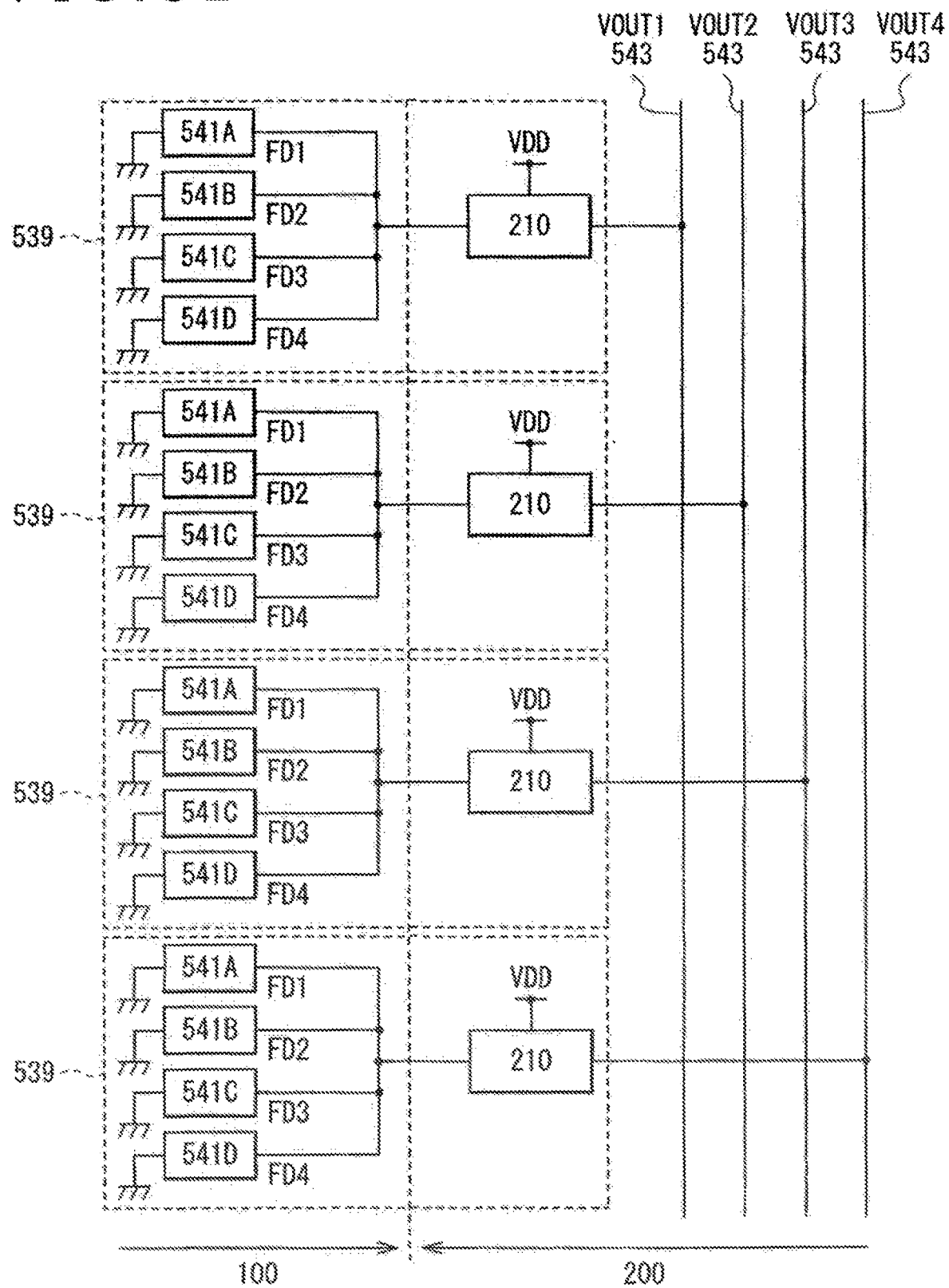
FIG. 52 is a diagram illustrating an example of an aspect of connection among a plurality of pixel sharing units and a plurality of vertical signal lines.

FIG. 52 illustrates an example of a connection aspect of a plurality of pixel sharing units 539 and vertical signal lines 543. For example, four pixel sharing units 539 arranged in the column direction are divided into four groups, and the vertical signal lines 543 are connected to the four respective groups. For simplification of description, FIG. 52 depicts an example in which each of the four groups includes one pixel sharing unit 539. However, each pf the four groups may include a plurality of pixel sharing units 539. In such a way, in the imaging apparatus 1, the plurality of pixel sharing units 539 arranged in the column direction may be divided into groups each including one or a plurality of pixel sharing units 539. For example, the vertical signal line 543 and the column signal processing circuit 550 are connected to each group to allow pixel signals to be simultaneously read from the groups. Alternatively, in the imaging apparatus 1, one vertical signal line 543 may be connected to the plurality of pixel sharing units 539 arranged in the column direction. In this case, pixel signals are sequentially read, on a time-sharing basis, from the plurality of pixel sharing units 539 connected to the one vertical signal line 543.

[Specific Configuration of Imaging Apparatus 1]

FIG. 53 illustrates an example of a cross-sectional configuration of the imaging apparatus 1 in a direction perpendicular to major surfaces of the first substrate 100, the second substrate 100, and the third substrate 300. FIG. 53 is schematically drawn in order to make the positional relation among the components easily understood, and may be different from an actual cross section. In the imaging apparatus 1, the first substrate 100, the second substrate 200, and the third substrate 300 are stacked in this order. The imaging apparatus 1 further includes a light receiving lens 401 on the back surface side (light incident surface side) of the first substrate 100. A color filter layer (not illustrated) may be provided between the light receiving lens 401 and the first substrate 100. The light receiving lens 401 is provided, for example, in each of the pixels 541A, 541B, and 541C. The imaging apparatus 1 is, for example, a back-illuminated imaging apparatus. The imaging apparatus 1 includes a pixel array portion 540 disposed in a central portion and a peripheral portion 540B disposed outside the pixel array portion 540.

The first substrate 100 includes an insulating film 111, a fixed charge film 112, a semiconductor layer 100S, and a wiring layer 100T arranged in this order from the light receiving lens 401 side. The semiconductor layer 100S includes, for example, a silicon substrate. The semiconductor layer 100S includes, for example, a p-well layer 115 located in a part of a front surface (wiring layer 100T-side surface) of the semiconductor layer 100S and near the front surface, and an n-type semiconductor region 114 located in other regions (regions deeper than the p-well layer 115). For example, the n-type semiconductor region 114 and the p-well layer 115 constitute a pn junction photodiode PD. The p-well layer 115 is a p-type semiconductor region.

Figure 54A:
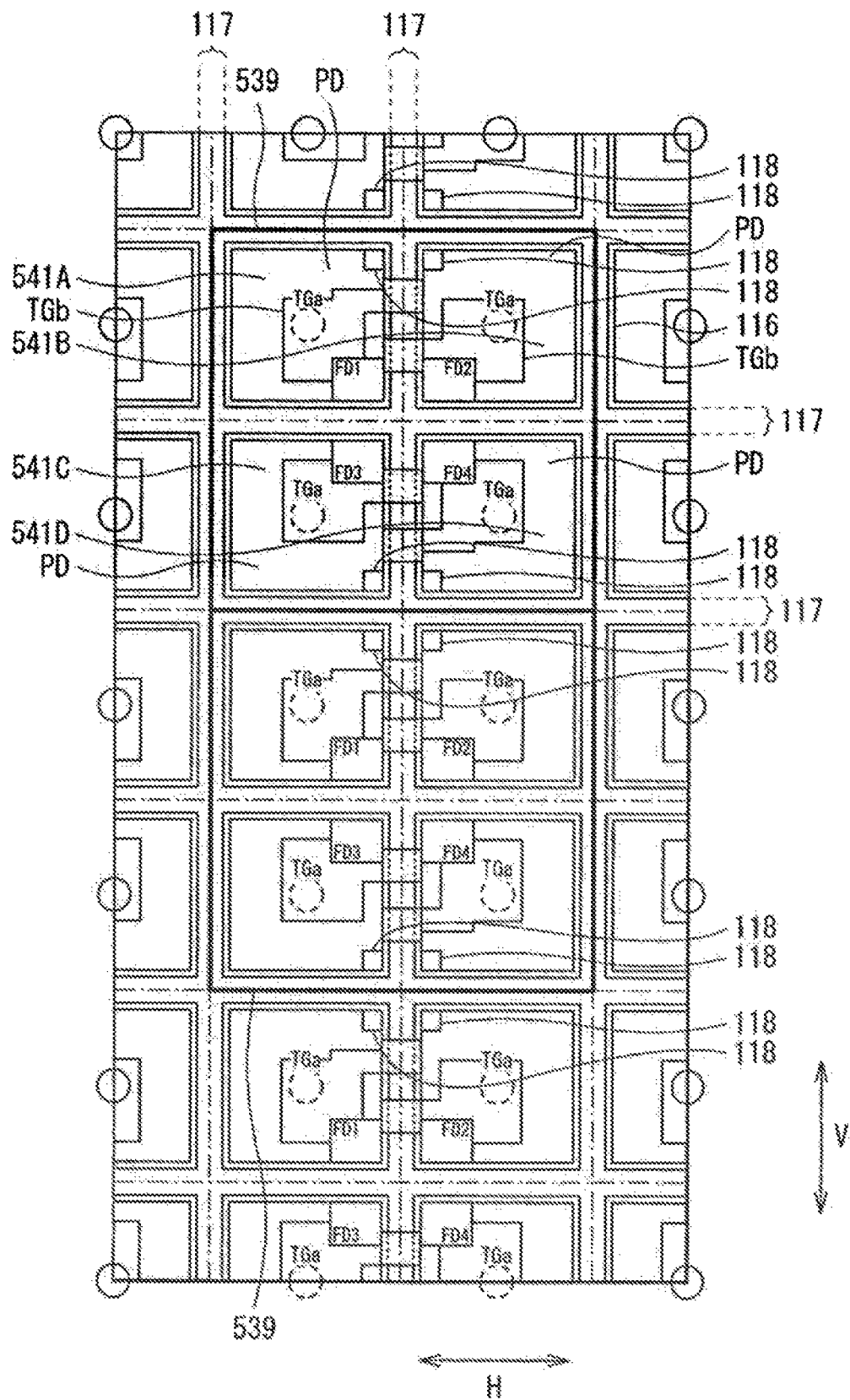
FIG. 54A is a schematic diagram illustrating an example of a planar configuration of a main part of a first substrate depicted in FIG. 53.

FIG. 54A illustrates an example of a planar configuration of the first substrate 100. FIG. 54A mainly illustrates a planar configuration of pixel isolation portions 117, the photodiodes PD, the floating diffusions FD, VSS contact regions 118, and the transfer transistors TR, which are included in the first substrate 100. The configuration of the first substrate 100 will be described using FIG. 54A along with FIG. 53.

The floating diffusions FD and the VSS contact regions 118 are provided near the front surface of the semiconductor layer 100S. The floating diffusion FD includes an n-type semiconductor region provided in the p-well layer 115. The floating diffusions FD (floating diffusions FD1, FD2, FD3, and FD4) in the pixels 541A, 541B, 541C, and 541D are provided, for example, in a central portion of the pixel sharing unit 539 and in proximity to one another (FIG. 54A). As described below in detail, the four floating diffusions (floating diffusions FD1, FD2, FD3, and FD4) included in the sharing unit 539 are electrically connected to one another in the first substrate 100 (more specifically, in the wiring layer 100T) via electric connection means (pad portions 120 described below). Further, the floating diffusions FD are connected from the first substrate 100 to the second substrate 200 (more specifically, from the wiring layer 100T to the wiring layer 200T) via electric means (through via 120E described below). In the second substrate 200 (more specifically, inside the wiring layer 200T), the electric means electrically connects the floating diffusions FD to the gate of the amplifying transistor AMP and the source of the FD conversion gain switching transistor FDG.

The VSS contact regions 118 are regions electrically connected to a reference potential line VSS and are spaced apart from the floating diffusions FD. For example, each of the pixels 541A, 541B, 541C, and 541D includes the floating diffusions FD disposed at one end of the pixel in the V direction and the VSS contact regions 118 disposed at the other end in the V direction (FIG. 54A). The VSS contact region 118 includes, for example, a p-type semiconductor region. The VSS contact region 118 is connected to, for example, a ground potential and a fixed potential. This supplies a reference potential to the semiconductor layer 100S.

The first substrate 100 is provided with the transfer transistors TR, in addition to the photodiode PD, the floating diffusions FD, and the VSS contact regions 118. The photodiode PD, the floating diffusion FD, the VSS contact region 118, and the transfer transistor TR are provided in each of the pixels 541A, 541B, 541C, and 541D. The transfer transistor TR is provided on the front surface side of the semiconductor layer 100S (side opposite to the light incident surface side or the second substrate 200 side). The transfer transistor TR includes the transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. One end of the vertical portion TGa is in contact with the horizontal portion TGb, and the other end of the vertical portion TGa is provided in the n-type semiconductor region 114. When the transfer transistor TR includes a vertical transistor, pixel signals are unlikely to be improperly transferred, and the efficiency with which pixel signals are read can be improved.

The horizontal portion TGb of the transfer gate TG extends from a position opposite to the vertical portion TGa to, for example, the central portion of the pixel sharing unit 539 in the H direction (FIG. 54A). Thus, the position, in the H direction, of a through via (through vias TGV described below) reaching the transfer gate TG can be located closer to the position, in the H direction, of a through via (through via 120E, 121E described below) connected to the floating diffusion FD or the VSS contact region 118. For example, the plurality of pixel sharing units 539 provided in the first substrate 100 have an identical configuration (FIG. 54A).

Figure 54B:
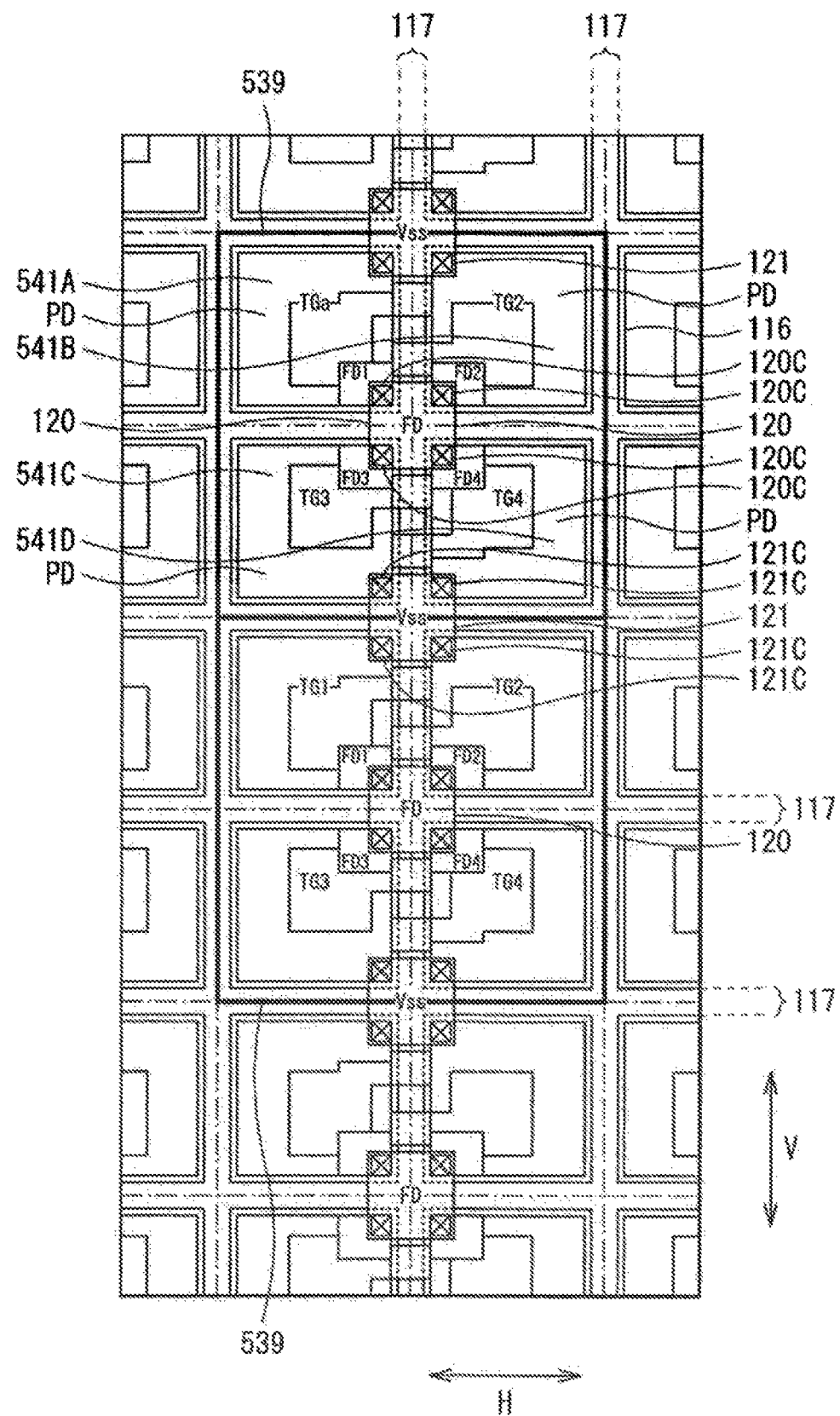
FIG. 54B is a schematic diagram illustrating a planar configuration of a pad portion along with a main part of the first substrate depicted in FIG. 54A.

The semiconductor layer 100S is provided with the pixel isolation portions 117 isolating the pixels 541A, 541B, 541C, and 541D from one another. The pixel isolation portions 117 are formed extending in a normal direction of the semiconductor layer 100S (the direction perpendicular to the front surface of the semiconductor layer 100S). The pixel isolation portions 117 are provided delimiting the pixels 541A, 541B, 541C, and 541D from one another and have, for example, a grid-like planar shape (FIGS. 54A and 54B). The pixel isolation portions 117, for example, electrically and optically isolate the pixels 541A, 541B, 541C, and 541D from one another. The pixel isolation portion 117 includes, for example, a light shielding film 117A and an insulating film 117B. For example, tungsten (W) or the like is used for the light shielding film 117A. The insulating film 117B is provided between the light shielding film 117A and the p-well layer 115 or the n-type semiconductor region 114. The insulating film 117B includes, for example, silicon oxide (SiO). The pixel isolation portion 117, for example, has an FTI (Full Trench Isolation) structure and penetrates the semiconductor layer 100S. Although not illustrated, the pixel isolation portion 117 is not limited to the FTI structure in which the pixel isolation portion 117 penetrates the semiconductor layer 100S. For example, the pixel isolation portion 117 may have a DTI (Deep Trench Isolation) structure in which the pixel isolation portion 117 does not penetrate the semiconductor layer 100S. The pixel isolation portion 117 extends in the normal direction of the semiconductor layer 100S and is formed in a partial region of the semiconductor layer 100S.

The semiconductor layer 100S is provided with, for example, first pinning regions 113 and second pinning regions 116. The first pinning regions 113 are each provided near a back surface of the semiconductor layer 100S and disposed between the n-type semiconductor region 114 and the fixed charge film 112. The second pinning regions 116 are each provided on a side surface of the pixel isolation portion 117, and specifically provided between the pixel isolation portion 117 and the p-well layer 115 or the n-type semiconductor region 114. The first pinning region 113 and the second pinning region 116 each include, for example, a p-type semiconductor region.

The fixed charge film 112 with negative fixed charge is provided between the semiconductor layer 100S and the insulating film 111. An electric field induced by the fixed charge film 112 forms a first pinning region 113 of a hole accumulating layer at a light receiving surface (back surface) of the semiconductor layer 100S. This suppresses generation of a dark current caused by the interface state of the light receiving surface side of the semiconductor layer 100S. The fixed charge film 112 includes, for example, an insulating film with negative charge. A material for the insulating film with negative fixed charge includes, for example, hafnium oxide, zircon oxide, aluminum oxide, titanium oxide, or tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is, for example, selectively provided in the semiconductor layer 100S at a position facing the pixel isolation portion 117. The insulating film 111 is provided in such a manner as to cover the light shielding film 117A. The insulating film 111 includes, for example, silicon oxide.

The wiring layer 100T provided between the semiconductor layer 100S and the second substrate 200 includes an interlayer insulating film 119, pad portions 120 and 121, a passivation film 122, an interlayer insulating film 123, and a junction film 124 arranged in this order from the semiconductor layer 100S side. The horizontal portion TGb of the transfer gate TG is provided, for example, in the wiring layer 100T. The interlayer insulating film 119 is provided all over the front surface of the semiconductor layer 100S and in contact with the semiconductor layer 100S. The interlayer insulating film 119 includes, for example, a silicon oxide film. Note that the configuration of the wiring layer 100T is not limited to the above-described configuration and that any configuration may be used as long as the configuration includes a wire and an insulating film.

FIG. 54B illustrates a configuration of the pad portions 120 and 121 along with the planar configuration depicted in FIG. 54A. The pad portions 120 and 121 are provided in selective regions on the interlayer insulating film 119. The pad portion 120 is intended to connect the floating diffusions FD (floating diffusions FD1, FD2, FD3, and FD4) in the respective pixels 541A, 541B, 541C, and 541D to one another. The pad portion 120 is disposed, for example, in each pixel sharing unit 539 at the central portion of the pixel sharing unit 539 in plan view (FIG. 54B). The pad portion 120 is provided across the pixel isolation portion 117 and disposed overlapping at least a part of each of the floating diffusions FD1, FD2, FD3, and FD4 (FIG. 53 and FIG. 54B). Specifically, the pad portion 120 is formed in a region overlapping, in a direction perpendicular to the front surface of the semiconductor layer 100S, at least a part of each of the plurality of floating diffusions FD (floating diffusions FD1, FD2, FD3, and FD4) sharing the pixel circuit 210 and at least a part of the pixel isolation portions 117 formed between the plurality of photodiodes PD (photodiodes PD1, PD2, PD3, and PD4) sharing the pixel circuit 210. The interlayer insulating film 119 is provided with connection vias 120C for electrically connecting the pad portion 120 to the floating diffusions FD1, FD2, FD3, and FD4. The connection vias 120C are respectively provided in the pixels 541A, 541B, 541C, and 541D. For example, a part of the pad portion 120 is embedded in each of the connection vias 120C to electrically connect the pad portion 120 to the floating diffusions FD1, FD2, FD3, and FD4.

The pad portion 121 is intended to connect the plurality of VSS contact regions 118 to each other. For example, the VSS contact regions 118 provided in the pixels 541C and 541D in one of the pixel sharing units 539 adjacent to each other in the V direction are electrically connected by the pad portion 121 to the VSS contact regions 118 provided in the pixels 541A and 541B in the other pixel sharing unit 539. The pad portion 121 is provided, for example, across the pixel isolation portions 117 and disposed overlapping at least a part of each of the four VSS contact regions 118. Specifically, the pad portion 121 is formed in a region overlapping, in the direction perpendicular to the front surface of the semiconductor layer 100S, at least a part of each of the plurality of VSS contact regions 118 and at least a part of the pixel isolation portions 117 formed between the plurality of VSS contact regions 118. The interlayer insulating film 119 is provided with connection vias 121C for electrically connecting the pad portion 121 to the VSS contact regions 118. The connection vias 121C are respectively provided in the pixels 541A, 541B, 541C, and 541D. For example, a part of the pad portion 121 is embedded in each of the connection vias 121C to electrically connect the pad portion 121 to the VSS contact regions 118. For example, the pad portions 120 and pad portions 121 in the plurality of pixel sharing units 539 arranged in the V direction are disposed at substantially identical positions in the H direction (FIG. 54B).

Providing the pad portions 120 enables a reduction in the number of wires in the whole chip used to connect each floating diffusion FD to the pixel circuit 210 (for example, the gate electrode of the amplifying transistor AMP). Similarly, providing the pad portions 121 enables a reduction in the number of wires in the whole chip used to supply a potential to each of the VSS contact regions 118. This enables a reduction in the area of the entire chip, suppression of electric interference among wires in miniaturized pixels, and/or a reduction in the number of components leading to cost reduction.

The pad portions 120 and 121 can be provided at desired positions in the first substrate 100 and the second substrate 200. Specifically, the pad portions 120 and 121 can be provided in one of the wiring layer 100T or an insulating region 212 of the semiconductor layer 200S. In a case where the pad portions 120 and 121 are provided in the wiring layer 100T, the pad portions 120 and 121 may be in direct contact with the semiconductor layer 100S. Specifically, the pad portions 120 and 121 may be connected directly to at least a part of each of the floating diffusions FD and/or the VSS contact regions 118. Additionally, in an alternative configuration, connection vias 120C and 121C may be provided, extending from each of the floating diffusions FD and/or the VSS contact regions 118 connected to the pad portions 120 and 121, and the pad portions 120 and 121 may be provided at desired positions in the wiring layer 100T and the insulating region 2112 of the semiconductor layer 200S.

In particular, in a case where the pad portions 120 and 121 are provided in the wiring layer 100T, the number of wires connected to the floating diffusions FD and/or the VSS contact regions 118 in the insulating region 212 of the semiconductor layer 200S can be reduced. This enables a reduction in the area of the insulating region 212 included in the second substrate 200 forming the pixel circuit 210, the insulating region 212 being used to form through-wires for connecting the floating diffusions FD to the pixel circuit 210. This provides a large area for the second substrate 200 forming the pixel circuit 210. By providing a large area for the pixel circuit 210, large pixel transistors can be formed, enabling a reduction in noise and the like to contribute to improving image quality.

In particular, in a case where the FTI structure is used for the pixel isolation portion 117, the floating diffusions FD and/or the VSS contact region 118 is preferably provided in each pixel 541, and thus the use of the configuration of the pad portions 120 and 121 enables a significant reduction in the number of wires connecting the first substrate 100 and the second substrate 200.

Additionally, as depicted in FIG. 54B, for example, the pad portions 120 to each of which the plurality of floating diffusions FD are connected are arranged linearly and alternately, in the V direction, with the pad portions 121 to each of which the plurality of VSS contact regions 118 are connected. Additionally, the pad portions 120 and 121 are formed at positions surrounded by the plurality of photodiodes PD, the plurality of transfer gates TG, or the plurality of floating diffusions FD. Thus, in the first substrate 100 in which a plurality of elements are formed, elements other than the floating diffusions FD and the VSS contact regions 118 can be freely disposed, allowing the entire chip to be efficiently laid out. Additionally, symmetry is achieved in the layout of the elements formed in each pixel sharing unit 539, allowing suppression of variation in properties among the pixels 541.

The pad portions 120 and 121 include, for example, polysilicon (Poly Si), more specifically, doped polysilicon with impurities addition. The pad portions 120 and 121 preferably include highly heat-resistant conductive material such as polysilicon, tungsten (W), titanium (Ti), and titanium nitride (TiN). This enables the pixel circuit 210 to be formed after lamination of the semiconductor layer 200S of the second substrate 200 to the first substrate 100. The reason will be explained below. Note that a first manufacturing method refers to a method for forming the pixel circuit 210 after lamination of the semiconductor layer 200S of the second substrate 200 to the first substrate 100.

In this regard, after the pixel circuit 210 is formed in the second substrate 200, the second substrate 200 may be laminated to the first substrate 100 (this is hereinafter referred to as a second manufacturing method). In the second manufacturing method, an electrode for electric connection is formed in advance on the front surface of the first substrate 100 (front surface of the wiring layer 100T) and on the front surface of the second substrate 200 (front surface of the wiring layer 200T). When the first substrate 100 and the second substrate 200 are laminated to each other, the electrodes for electric connection formed on the respective front surfaces of the first substrate 100 and the second substrate 200 come into contact with each other. This forms electric connection between the wiring included in the first substrate 100 and the wiring included in the second substrate 200. Accordingly, with the configuration of the imaging apparatus 1 obtained using the second manufacturing method, manufacturing can be performed, for example, using an appropriate process depending on the configuration of each of the first substrate 100 and the second substrate 200, allowing manufacture of an imaging apparatus with high quality and high performance.

In such a second manufacturing method, when the first substrate 100 and the second substrate 200 are laminated to each other, an alignment error may be caused by a manufacturing apparatus for lamination. Additionally, for example, the first substrate 100 and the second substrate 200 have a size including a diameter of several dozens of centimeters, and when laminated to each other, the first substrate 100 and the second substrate 200 may be expanded or contracted in microscopic regions of portions of the first substrate 100 and the second substrate 200. The expansion and contraction of the substrates are caused by a slight difference in timing when the substrates come into contact with each other. The expansion and contraction of the first substrate 100 and the second substrate 200 may cause an error in the positions of the electrodes for electric connection formed on the respective front surfaces of the first substrate 100 and the second substrate 200. In the second manufacturing method, measures are preferably taken in advance for allowing the electrodes of the first substrate 100 and the second substrate 200 to be brought into contact with each other in spite of such an error. Specifically, at least one of and preferably both the electrodes of the first substrate 100 and the second substrate 200 are enlarged in consideration of the above-described error. Thus, the use of the second manufacturing method, for example, increases the size (size in a substrate planar direction) of the electrode formed on the front surface of the first substrate 100 or the second substrate 200 such that the electrode is larger than an internal electrode extending from the inside of the first substrate 100 or the second substrate 200 to the front surface in the thickness direction.

On the other hand, when the pad portions 120 and 121 include a heat-resistant conductive material, the above-described first manufacturing method can be used. In the first manufacturing method, after formation of the first substrate 100 including the photodiodes PD, the transfer transistors TR, and the like, the first substrate 100 and the second substrate 200 (semiconductor layer 2000S) are laminated to each other. At this time, the second substrate 200 is in a state in which a pattern of active elements, a wiring layer, and the like constituting the pixel circuit 210 is unformed. Since the second substrate 200 is in the state in which the pattern is unformed, even in a case where, during lamination of the first substrate 100 and the second substrate 200, an error occurs in lamination position, this lamination error is prevented from causing an error in alignment between the pattern of the first substrate 100 and the pattern of the second substrate 200. This is because the second substrate 200 is formed after the first substrate 100 and the second substrate 200 are laminated to each other. Note that, when a pattern is formed in the second substrate, for example, an exposure apparatus for pattern formation is used to form the pattern using, as an alignment target, the pattern formed in the first substrate 100. For the above-described reason, in the first manufacturing method, the error in lamination position between the first substrate 100 and the second substrate 200 poses no problem in the manufacture of the imaging apparatus 1. For a similar reason, in the first manufacturing method, an error caused by the expansion and contraction of the substrates that occur in the second manufacturing method poses no problem in the manufacture of the imaging apparatus 1.

In the first manufacturing method, after lamination of the first substrate 100 and the second substrate 200 (semiconductor layer 200S) as described above, active elements are formed on the second substrate 200. Subsequently, the through vias 120E and 121E and the through vias TGV (FIG. 53) are formed. In the formation of the through vias 120E and 121E and TGV, for example, reduced projection exposure by an exposure apparatus is used to form a pattern of the through vias from above the second substrate 200. Due to the use of the reduced projection exposure, even in a case where an error occurs in alignment between the second substrate 200 and the exposure apparatus, the magnitude of the error in the second substrate 200 is only a fraction of the error in the case of the second manufacturing method (reciprocal of magnification of reduced projection exposure). Accordingly, with the configuration of the imaging apparatus 1 obtained using the first manufacturing method, the elements formed in the first substrate 100 are easily aligned with the elements formed in the second substrate 200, allowing manufacture of an imaging apparatus with high quality and high performance.

The imaging apparatus 1 manufactured using the first manufacturing method as described above has features different from the features of the imaging apparatus manufactured by the second manufacturing method. Specifically, in the imaging apparatus 1 manufactured using the first manufacturing method, for example, the through vias 120E and 121E and TGV have a substantially constant thickness (dimension in the substrate planar direction) from the second substrate 200 to the first substrate 100. Alternatively, when the through vias 120E and 121E and TGV have a tapered shape, the tapered shape has a constant inclination. In the imaging apparatus 1 including the above-described through vias 120E and 121E and TGV, the pixels 541 can be easily miniaturized.

In this regard, when the imaging apparatus 1 is manufactured by the first manufacturing method, active elements are formed in the second substrate 200 after lamination of the first substrate 100 and the second substrate 200 (semiconductor layer 200S). Thus, the first substrate 100 is also affected by heating processing required to form the active elements. Therefore, as described above, a highly heat-resistant conductive material is preferably used for the pad portions 120 and 121 provided in the first substrate 100. For example, for the pad portions 120 and 121, a material that has a higher melting point (specifically that is more heat-resistant) than that of at least a part of a wiring material included in the wiring layer 200T of the second substrate 200 is preferably used. For example, for the pad portions 120 and 121, a highly heat-resistant conductive material such as doped polysilicon, tungsten, titanium, or titanium nitride is used. This enables the imaging apparatus 1 to be manufactured using the first manufacturing method.

The passivation film 122 is provided all over the front surface of the semiconductor layer 100S, for example, in such a manner as to cover the pad portions 120 and 121 (FIG. 53). The passivation film 122 includes, for example, a silicon nitride (SiN) film. The interlayer insulating film 123 covers the pad portions 120 and 121 via the passivation film 122. The interlayer insulating film 123 is provided, for example, all over the front surface of the semiconductor layer 100S. The interlayer insulating film 123 includes, for example, a silicon oxide (SiO) film. The junction film 124 is provided at a junction surface between the first substrate 100 (specifically the wiring layer 100T) and the second substrate 200. In other words, the junction film 124 is in contact with the second substrate 200. The junction film 124 is provided all over the major surface of the first substrate 100. The junction film 124 includes, for example, a silicon nitride film.

The light receiving lens 401, for example, faces the semiconductor layer 100S via the fixed charge film 112 and the insulating film 111 (FIG. 53). The light receiving lens 401 is provided, for example, at a position facing the photodiodes PD of the pixels 541A, 541B, 541C, and 541D.

The second substrate 200 includes the semiconductor layer 200S and the wiring layer 200T arranged in this order from the first substrate 100. The semiconductor layer 200S includes a silicon substrate. The semiconductor layer 200S is provided with a well region 211 extending in the thickness direction. The well region 211 is, for example, a p-type semiconductor region. The second substrate 200 is provided with a pixel circuit 210 disposed in each of the pixel sharing units 539. The pixel circuit 210 is provided, for example, on the front surface side (wiring layer 200T side) of the semiconductor layer 200S. In the imaging apparatus 1, the second substrate 200 is laminated to the first substrate 100 such that the back surface side (semiconductor layer 200S side) of the second substrate 200 faces the front surface side (wiring layer 100T side) of the first substrate 100. In other words, the second substrate 200 and the first substrate 100 are laminated in a face to back direction.

Figure 55:
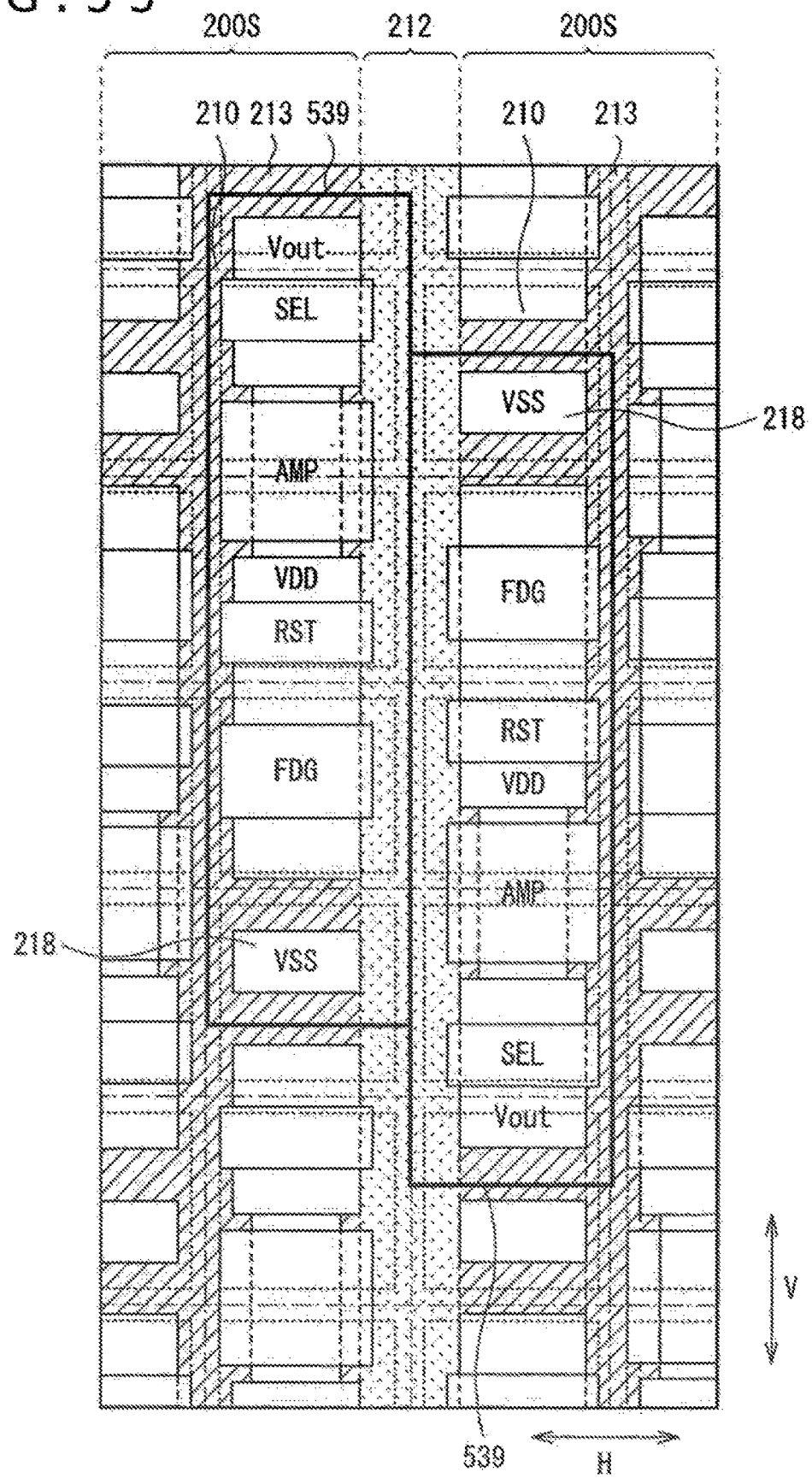
FIG. 55 is a schematic diagram illustrating an example of a planar configuration of a second substrate (semiconductor layer) depicted in FIG. 53.
Figure 56:
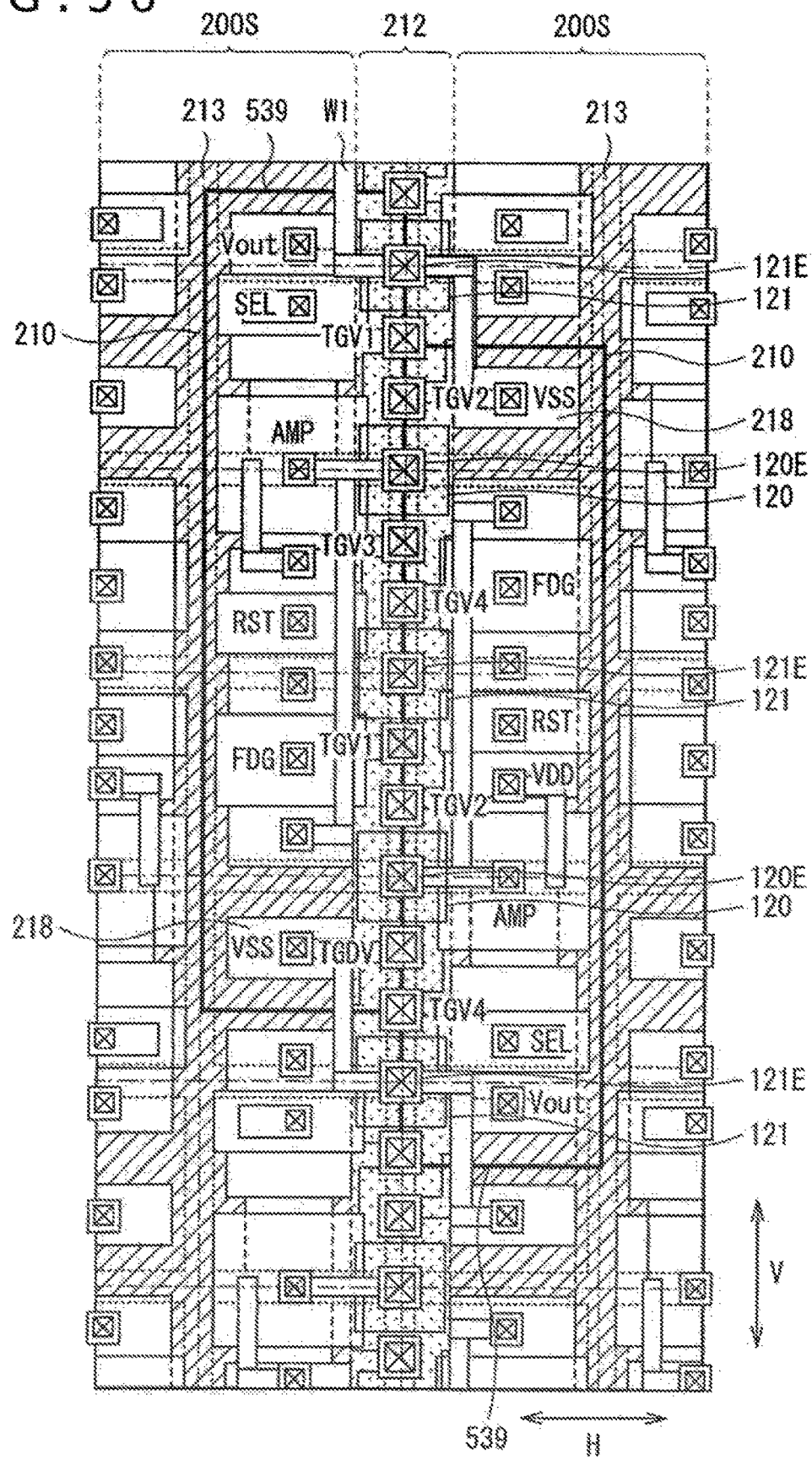
FIG. 56 is a schematic diagram illustrating an example of a planar configuration of a pixel circuit and a main part of the first substrate, along with a first wiring layer depicted in FIG. 53.
Figure 57:
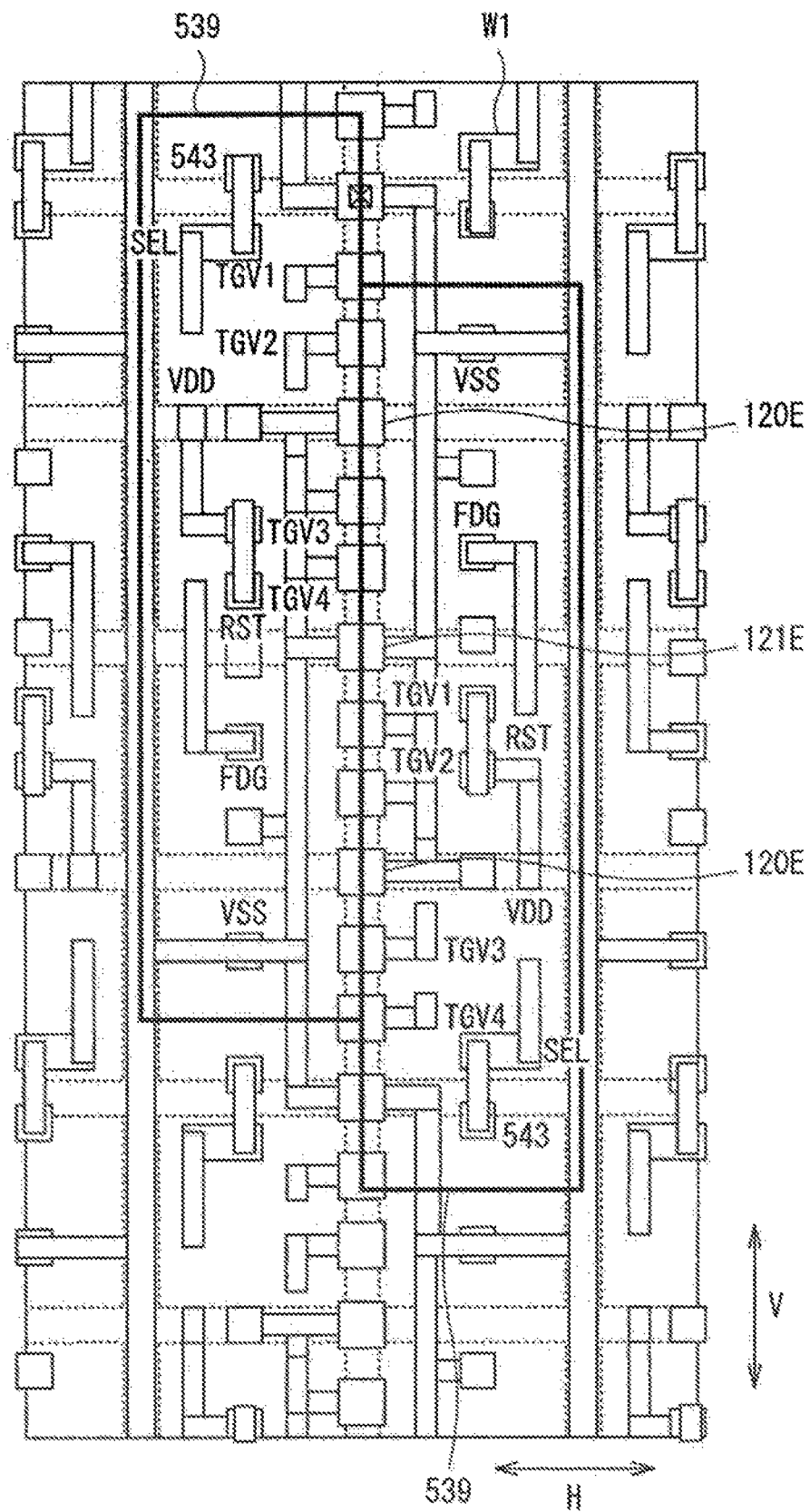
FIG. 57 is a schematic diagram illustrating an example of a planar configuration of the first wiring layer and a second wiring layer that are depicted in FIG. 53.
Figure 58:
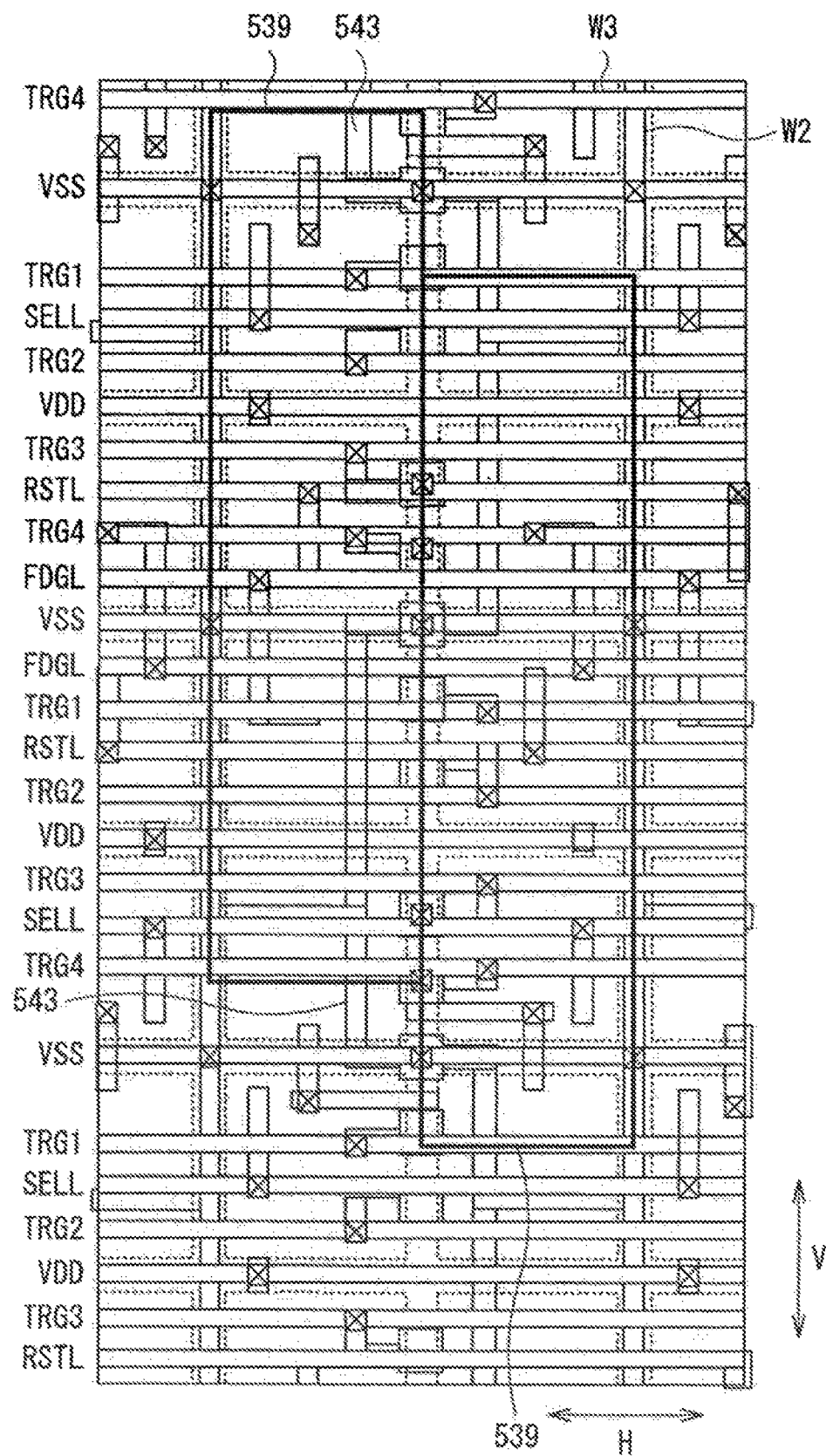
FIG. 58 is a schematic diagram illustrating an example of a planar configuration of the second wiring layer and a third wiring layer that are depicted in FIG. 53.
Figure 59:
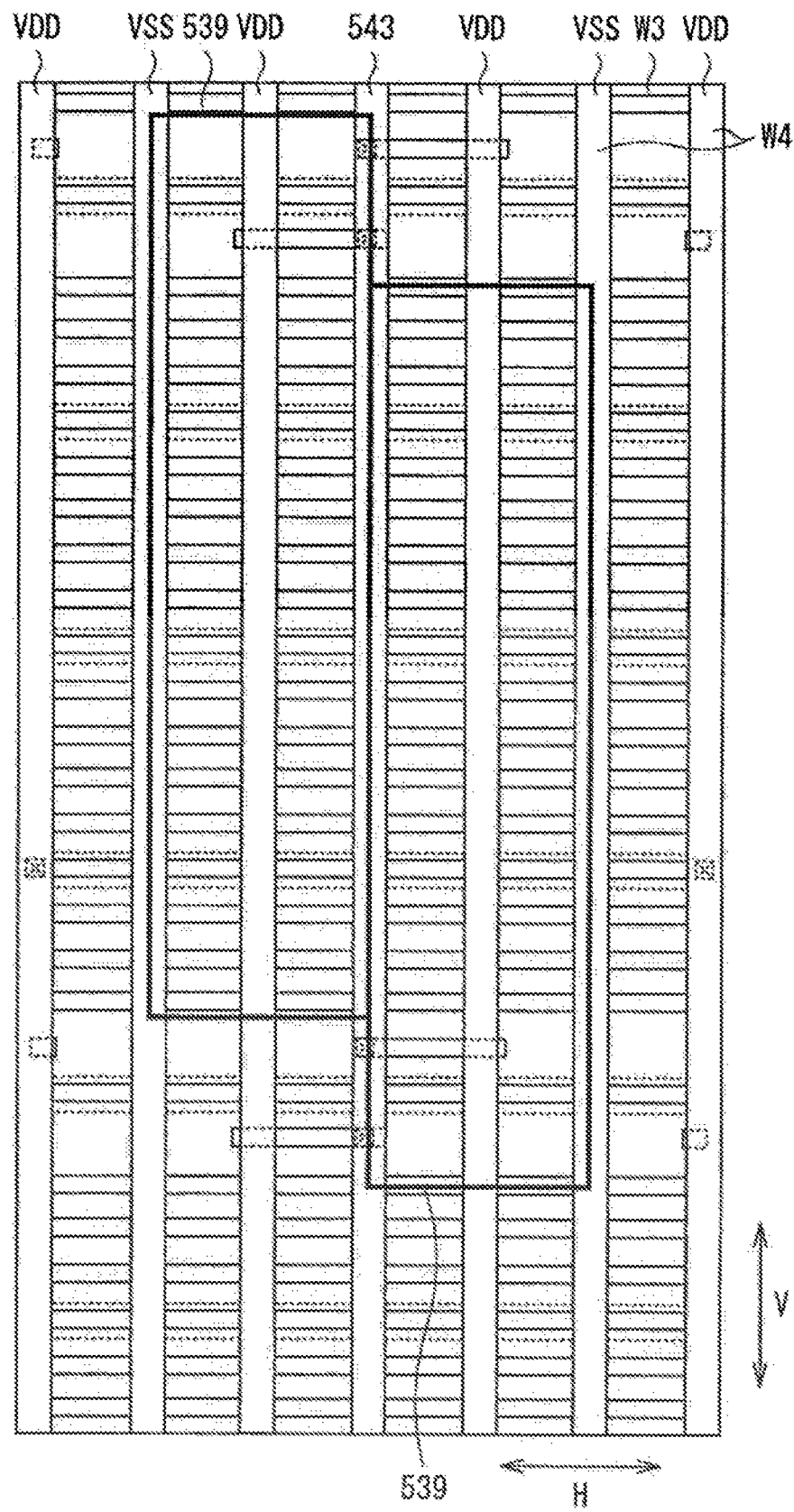
FIG. 59 is a schematic diagram illustrating an example of a planar configuration of the third wiring layer and a fourth wiring layer that are depicted in FIG. 53.

FIGS. 55 to 59 schematically depict an example of a planar configuration of the second substrate 200. FIG. 55 illustrates a configuration of the pixel circuit 210 provided near the front surface of the semiconductor layer 200S. FIG. 56 schematically illustrates a configuration of portions of the wiring layer 200T (specifically, a first wiring layer W1 described below), the semiconductor layer 200S connected to the wiring layer 200T, and the first substrate 100. FIGS. 57 to 59 illustrate an example of a planar configuration of the wiring layer 200T. A configuration of the second substrate 200 will be described below using FIGS. 55 to 59 along with FIG. 53. In FIGS. 55 and 56, dashed lines each illustrate the contour of the photodiode PD (boundary between the pixel isolation portion 117 and the photodiode PD), and dotted lines each illustrate a boundary between the semiconductor layer 200S and the element isolation region 213 or an insulating region 214 which boundary is located at a portion overlapping a gate electrode of each transistor constituting the pixel circuit 210. At a portion overlapping the gate electrode of the amplifying transistor AMP, the boundary between the semiconductor layer 200S and the element isolation region 213 and the boundary between the element isolation region 213 and the insulating region 213 are provided on one side in a channel width direction.

The second substrate 200 is provided with the insulating region 212 dividing the semiconductor layer 200S into portions and the element isolation regions 213 provided in a part of the semiconductor layer 200S in the thickness direction (FIG. 53). For example, in the insulating region 212 provided between the two pixel circuits 210 adjacent to each other in the H direction, the through vias 120E and 121E and the through vias TGV (through vias TGV1, TGV2, TGV3, and TGV4) are disposed that are to be located in two pixel sharing units 539 connected to the two pixel circuits 210 (FIG. 56).

The insulating region 212 has a thickness substantially identical to the thickness of the semiconductor layer 200S (FIG. 53). The semiconductor layer 200S is divided into portions by the insulating region 212. The through vias 120E and 121E and the through vias TGV are disposed in the insulating region 212. The insulating region 212 includes, for example, silicon oxide.

The through vias 120E and 121E are provided penetrating the insulating region 212 in the thickness direction. Upper ends of the through vias 120E and 121E are connected to wires in the wiring layer 200T (a first wire W1, a second wire W2, a third wire W3, and a fourth wire W4 described below). The through vias 120E and 121E are provided penetrating the insulating region 212, the junction film 124, the interlayer insulating film 123, and the passivation film 122, and lower ends of through vias 120E and 121E are connected to the pad portions 120 and 121 (FIG. 53). The through via 120E is intended to electrically connect the pad portion 120 and the pixel circuit 210. Specifically, the through via 120E electrically connects the floating diffusions FD in the first substrate 100 to the pixel circuit 210 in the second substrate 200. The through via 121E is intended to electrically connect the pad portion 121 and the reference potential line VSS in the wiring layer 200T. Specifically, the through via 121E electrically connects the VSS contact region 118 of the first substrate 100 to the reference potential line VSS in the second substrate 200.

The through vias TGV are provided penetrating the insulating region 212 in the thickness direction. An upper end of each of the through vias TGV is connected to a wire in the wire 200T. The through via TGV is provided penetrating the insulating region 212, the junction film 124, the interlayer insulating film 123, the passivation film 122, and the interlayer insulating film 119, and a lower gate of the through via TGV is connected to the transfer gate TG (FIG. 53). The through vias TGV as described above are intended to electrically connect the transfer gates TG (transfer gates TG1, TG2, TG3, and TG4) of the pixels 541A, 541B, 541C, and 541D to the wires in the wiring layer 200T (some of the row driving signal lines 542 in the wiring layer 200T, specifically, wires TRG1, TRG2, TRG3, and TRG4 in FIG. 58 described below). Specifically, the through via TGV electrically connects the transfer gate TG in the first substrate 100 to the wire TRG in the second substrate 200 to send a driving signal to each of the transfer transistors TR (transfer transistors TR1, TR2, TR3, and TR4).

The insulating region 212 is a region where the through vias 120E and 121E and the through vias TGV, used to electrically connect the first substrate 100 and the second substrate 200, are provided insulated from the semiconductor layer 200S. For example, in the insulating region 212 provided between the two pixel circuits 210 (the sharing units 539) adjacent to each other in the H direction, the through vias 120E and 121E and the through vias TGV (through vias TGV1, TGV2, TGV3, and TGV4) that are connected to the two pixel circuits 210 are disposed. The insulating region 212 is provided, for example, extending in the V direction (FIGS. 55 and 56). In this regard, the arrangement of the horizontal portion TGb of the transfer gate TG is modified such that the positions of the through vias TGV in the H direction are closer to the positions of the through vias 120E and 121E in the H direction than the position of the vertical portion TGa (FIGS. 54A and 56). For example, the through vias TGV are disposed at positions substantially identical to the positions of the through vias 120E and 121E in the H direction. Thus, in the insulating region 212 extending in the V direction, the through vias 120E and 121E and the through vias TGV can be collectively provided. In an alternative arrangement example, the horizontal portion TGb may be provided exclusively in a region overlapping the vertical portion TGa. In this case, the through via TGV is formed substantially immediately above the vertical portion TGa, and for example, the through via TGV is disposed in a substantially central portion of each pixel 541 in the H direction and in the V direction. In this case, the position of the through via TGV in the H direction is significantly misaligned with the positions of the through vias 120E and 121E in the H direction. For example, the insulating region 212 is provided around each of the through vias TGV and the through vias 120E and 121E to electrically insulate the through vias TGV and the through vias 120E and 121E from the semiconductor layer 200S located in proximity to the through vias. In a case where the position of the through via TGV in the H direction is significantly spaced apart from the positions of the through vias 120E and 121E in the H direction, the insulating region 212 needs to be provided independently around each of the through vias 120E and 121E and TGV. This divides the semiconductor layer 200S into small portions. The size of the semiconductor layer 200S in the H direction can be increased, compared to the above-described configuration, by a layout in which the through vias 120E and 121E and the through vias TGV are collectively disposed in the insulating region 212 extending in the V direction. Accordingly, the semiconductor element formation region can be provided with a large region in the semiconductor layer 200S. This enables, for example, an increase in the size of the amplifying transistor AMP, allowing suppression of noise.

As described with reference to FIG. 51, the pixel sharing unit 539 has a structure that electrically connects the floating diffusions FD provided in the respective plural pixels 541, which share one pixel circuit 210. The electric connection among the floating diffusions FD is achieved by the pad portion 120 provided in the first substrate 100 (FIGS. 53 and 54B). The electric connection portion provided in the first substrate 100 (pad portion 120) is electrically connected via one through via 120E to the pixel circuit 210 provided in the second substrate 200. In an alternative structure example, the electric connection portion among the floating diffusions FD may be provided in the second substrate 200. In this case, the pixel sharing unit 539 is provided with four through vias respectively connected to the floating diffusions FD1, FD2, FD3, and FD4. Consequently, in the second substrate 200, an increased number of through vias penetrate the semiconductor layer 200S, enlarging the insulating region 212 insulating the peripheries of the through vias. Compared to this configuration, the structure in which the pad portion 120 is provided in the first substrate 100 (FIGS. 53 and 54B) enables a reduction in the number of through vias and in the size of the insulating region 212. Accordingly, the semiconductor element formation region in the semiconductor layer 200S can be provided with a large area. This enables, for example, an increase in the size of the amplifying transistor AMP, suppressing noise.

The element isolation region 213 is provided on the front surface side of the semiconductor layer 200S. The element isolation region 213 has an STI (Shallow Trench Isolation) structure. In the element isolation region 213, the semiconductor layer 200S is carved in the thickness direction (in the direction perpendicular to the major surface of the second substrate 200), with an insulating film embedded in the carved portion. The insulating film includes, for example, silicon oxide. The element isolation region 213 isolates a plurality of transistors constituting the pixel circuit 210, from one another according to the layout of the pixel circuit 210. Below the element isolation region 213 (in a deep portion of the semiconductor layer 200S), the semiconductor layer 200S (specifically the well region 211) extends.

Now, with reference to FIGS. 54A, 54B, and 55, a description will be given about a difference between the contour shape of the pixel sharing unit 539 in the first substrate 100 (contour shape in the substrate planar direction) and the contour shape of the pixel sharing unit 539 in the second substrate 200.

In the imaging apparatus 1, the pixel sharing unit 539 is provided over both the first substrate 100 and the second substrate 200. For example, the contour shape of the pixel sharing unit 539 provided in the first substrate 100 differs from the contour shape of the pixel sharing unit 539 provided in the second substrate 200.

In FIGS. 54A and 54B, the contour lines of the pixels 541A, 541B, 541C, and 541D are represented by alternate long and short dash lines, and the contour shape of the pixel sharing unit 539 is represented by a thick line. For example, the pixel sharing unit 539 in the first substrate 100 includes two pixels 541 (pixels 541A and 541B) disposed adjacent to each other in the H direction and two pixels 541 (pixels 541C and 541D) disposed adjacent to the pixels 541A and 541B in the V direction. Specifically, the pixel sharing unit 539 in the first substrate 100 includes four pixels 541 of two adjacent rows by two adjacent columns, and the pixel sharing unit 539 in the first substrate 100 has a substantially square contour shape. In the pixel array portion 540, such pixel sharing units 539 are arranged adjacent to one another at a pitch of two pixels in the H direction (pitch corresponding to two pixels 541) and adjacent to one another at a pitch of two pixels in the V direction (pitch corresponding to two pixels 541).

In FIGS. 55 and 56, the contour lines of the pixels 541A, 541B, 541C, and 541D are represented by long and two short dash lines, and the contour shape of the pixel sharing unit 539 is represented by a thick line. For example, the contour shape of the pixel sharing unit 539 in the second substrate 200 is smaller than the contour shape of the pixel sharing unit 539 in the first substrate 100 in the H direction but is larger than the contour shape of the pixel sharing unit 539 in the first substrate 100 in the V direction. For example, the pixel sharing unit 539 in the second substrate 200 is formed with a size (region) corresponding to one pixel in the H direction and in a size corresponding to four pixels in the V direction. Specifically, the pixel sharing unit 539 in the second substrate 200 is formed with a size corresponding to pixels arranged in adjacent one row×four columns, and the pixel sharing unit 539 in the second substrate 200 has a generally rectangular contour shape.

For example, in each pixel circuit 210, the select transistor SEL, the amplifying transistor AMP, the reset transistor RST, and the FD conversion gain switching transistor FDG are arranged in this order in the V direction (FIG. 55). By providing each pixel circuit 210 with a generally rectangular contour shape as described above, four transistors (select transistor SEL, the amplifying transistor AMP, the reset transistor RST, and the FD conversion gain switching transistor FDG) can be arranged in one direction (in FIG. 55, the V direction). This allows the drain of the amplifying transistor AMP and the drain of the reset transistor RST to be shared in one diffusion region (diffusion region connected to the power supply line VDD). For example, a formation region for each pixel circuit 210 can be generally shaped like a square (see FIG. 68 described below). In this case, two transistors are disposed along one direction, leading to difficulty in sharing the drain of the amplifying transistor AMP and the drain of the reset transistor RST in one diffusion region. Accordingly, by shaping the formation region for the pixel circuit 210 generally like a rectangle, four transistors are easily disposed in proximity to one another, enabling a reduction in the formation region for the pixel circuit 210. In other words, the pixels can be miniaturized. Additionally, when the size of the formation region for the pixel circuit 210 need not be reduced, the size of the formation region for the amplifying transistor AMP can be increased, allowing noise to be suppressed.

For example, near the front surface of the semiconductor layer 200S, a VSS contact region 218 connected to the reference potential line VSS is provided in addition to the select transistor SEL, the amplifying transistor AMP, the reset transistor RST, and the FD conversion gain switching transistor FDG. The VSS contact region 218 includes, for example, a p-type semiconductor region. The VSS contact region 218 is electrically connected to the VSS contact region 118 of the first substrate 100 (semiconductor layer 100S) via a wire in the wiring layer 200T and the through via 121E. The VSS contact region 218 is provided, for example, adjacent to the source of the FD conversion gain switching transistor FDG across the element isolation region 213 (FIG. 55).

Now, with reference to FIGS. 54B and 55, a description will be given about a positional relation between the pixel sharing unit 539 provided in the first substrate 100 and the pixel sharing unit 539 provided in the second substrate 200. For example, one of the two pixel sharing units 539 arranged in the V direction of the first substrate 100 (for example, the pixel sharing unit 539 on the upper side of sheet of FIG. 54B) is connected to one of the two pixel sharing units 539 arranged in the H direction of the second substrate 200 (for example, the pixel sharing unit 539 on the left side of sheet of FIG. 55). For example, the other of the two pixel sharing units 539 arranged in the V direction of the first substrate 100 (for example, the pixel sharing unit 539 on the lower side of sheet of FIG. 54B) is connected to the other of the two pixel sharing units 539 arranged in the H direction of the second substrate 200 (for example, the pixel sharing unit 539 on the right side of sheet of FIG. 55).

For example, in the two pixel sharing units 539 arranged in the H direction of the second substrate 200, the internal layout (arrangement of the transistors and the like) of one of the pixel sharing units 539 is substantially equal to a layout obtained by inverting the internal layout of the other pixel sharing unit 539 in the V direction and the H direction. Effects produced by this layout will be described below.

In the two pixel sharing units 539 arranged in the V direction of the first substrate 100, each of the pad portions 120 is disposed in a central portion of the contour shape of the pixel sharing unit 539, that is, the central portion of the pixel sharing unit 539 in the V direction and the H direction (FIG. 54B). On the other hand, the pixel sharing unit 539 in the second substrate 200 has a generally rectangular contour shape that is long in the V direction as described above, and thus, for example, the amplifying transistor AMP connected to the pad portion 120 is disposed at a position above the center of the pixel sharing unit 539 in the V direction in the sheet. For example, when the two pixel sharing units 539 arranged in the H direction of the second substrate 200 have an identical internal layout, the distance between the amplifying transistor AMP of one of the pixel sharing units 539 and the pad portion 120 (for example, the pad portion 120 of the pixel sharing unit 539 on the upper side of sheet of FIG. 54) is relatively short. However, the distance between the amplifying transistor AMP of the other of the pixel sharing units 539 and the pad portion 120 (for example, the pad portion 120 of the pixel sharing unit 539 on the lower side of sheet of FIG. 54) is long. Thus, the wire required to connect the amplifying transistor AMP and the pad portion 120 has an increased area, and a wiring layout of the pixel sharing unit 539 may be complicated. This may affect miniaturization of the imaging apparatus 1.

In contrast, in the two pixel sharing units 539 arranged in the H direction of the second substrate 200, mutually inverting, at least in the V direction, the internal layouts of the pixel sharing units 539 enables a reduction in the distance between the amplifying transistor AMP and the pad portion 120 in both pixel sharing units 539. Consequently, this configuration, compared to the configuration in which the two pixel sharing units 539 arranged in the H direction of the second substrate 200 have an identical internal layout, facilitates the miniaturization of the imaging apparatus 1. Note that a planar layout of each of the plurality of pixel sharing units 539 of the second substrate 200 is laterally symmetric within the range illustrated in FIG. 55 but that when the layout of the first wiring layer W1 illustrated in FIG. 56 described below is added, the planar layout is laterally asymmetric.

Additionally, the internal layouts of the two pixel sharing units 539 arranged in the H direction of the second substrate 200 are preferably also mutually inverted in the H direction. The reason will be explained below. As depicted in FIG. 56, the two pixel sharing units 539 arranged in the H direction of the second substrate 200 are each connected to the pad portions 120 and 121 of the first substrate 100. For example, the pad portions 120 and 121 are disposed in the central portion in the H direction of the two pixel sharing units 539 (disposed between the two pixel sharing units 539) arranged in the H direction of the second substrate 200. Consequently, by also mutually inverting, in the H direction, the internal layouts of the two pixel sharing units 539 arranged in the H direction of the second substrate 200, the distance between each of the plurality of pixel sharing units 539 in the second substrate 200 and each of the pad portions 120 and 121 can be reduced. In other words, the miniaturization of the imaging apparatus 1 is further facilitated.

Additionally, the position of the contour line of the pixel sharing unit 539 in the second substrate 200 need not be aligned with the position of the contour line of any one of the pixel sharing units 539 in the first substrate 100. For example, in one of the two pixel sharing units 539 arranged in the H direction of the second substrate 200 (for example, the pixel sharing unit 539 on the left side of sheet of FIG. 56), one of the contour lines in the V direction (for example, the contour line on the upper side of sheet of FIG. 56) is disposed outside one of the contour lines in the V direction of the corresponding pixel sharing unit 539 in the first substrate 100 (for example, the pixel sharing unit 539 on the upper side of sheet of FIG. 54B). Additionally, in the other of the two pixel sharing units 539 arranged in the H direction of the second substrate 200 (for example, the pixel sharing unit 539 on the right side of sheet of FIG. 56), the other of the contour lines in the V direction (for example, the contour line on the lower side of sheet of FIG. 56) is disposed outside the other of the contour lines in the V direction of the corresponding pixel sharing unit 539 in the first substrate 100 (for example, the pixel sharing unit 539 on the lower side of sheet of FIG. 54B). By mutually disposing the pixel sharing units 539 in the second substrate 200 and the pixel sharing units 539 in the first substrate 100 as described above, the distance between the amplifying transistor AMP and the pad portion 120 can be reduced. Consequently, the miniaturization of the imaging apparatus 1 is facilitated.

Additionally, between the plurality of pixel sharing units 539 in the second substrate 200, the positions of the contour lines need not be aligned with one another. For example, in the two pixel sharing units 539 arranged in the H direction of the second substrate 200, the positions of the contour lines in the V direction are misaligned with one another. This enables a reduction in the distance between the amplifying transistor AMP and the pad portion 120. Consequently, the miniaturization of the imaging apparatus 1 is facilitated.

With reference to FIGS. 54B and 56, repetitive arrangement of the pixel sharing units 539 in the pixel array portion 540 will be described. The pixel sharing unit 539 in the first substrate 100 has a size corresponding to two pixels 541 in the H direction and a size corresponding to two pixels 541 in the V direction (FIG. 54B). For example, in the pixel array portion 540 in the first substrate 100, the pixel sharing units 539 each with a size corresponding to four pixels 541 are repetitively arranged adjacent to one another at a pitch of two pixels in the H direction (pitch corresponding to two pixels 541) and at a pitch of two pixels in the V direction (pitch corresponding to two pixels 541). Alternatively, a pair of the pixel sharing units 539 disposed adjacent to each other in the V direction may be provided in the pixel array portion 540 in the first substrate 100. In the pixel array portion 540 in the first substrate 100, for example, pairs of the pixel sharing units 539 are repetitively arranged adjacent to one another at a pitch of two pixels in the H direction (pitch corresponding to two pixels 541) and at a pitch of two pixels in the V direction (pitch corresponding to two pixels 541). The pixel sharing unit 539 in the second substrate 200 has a size corresponding to one pixel 541 in the H direction and a size corresponding to four pixels 541 in the V direction (FIG. 56). For example, in the pixel array portion 540 in the second substrate 200, a pair of the pixel sharing units 539 that includes two pixel sharing units 539 each with a size corresponding to four pixels 541 is provided. The pixel sharing units 539 are disposed adjacent to each other in the H direction but misaligned with each other in the V direction. In the pixel array portion 540 in the second substrate 200, for example, pairs of the pixel sharing units 539 are repetitively arranged with no gap at a pitch of two pixels in the H direction (pitch corresponding to two pixels 541) and at a pitch of four pixels in the V direction (pitch corresponding to four pixels 541). Such repetitive arrangement of the pixel sharing units 539 enables the pixel sharing units 539 to be disposed with no gap. Consequently, the miniaturization of the imaging apparatus 1 is facilitated.

The amplifying transistor AMP preferably has, for example, a three-dimensional structure of a Fin type or the like (FIG. 53). This increases the size of an effective gate width, enabling noise to be suppressed. The select transistor SEL, the reset transistor RST, and the FD conversion gain switching transistor FDG have, for example, a planar structure. The amplifying transistor AMP may have a planar structure. Alternatively, the select transistor SEL, the reset transistor RST, and the FD conversion gain switching transistor FDG may have a three-dimensional structure.

The wiring layer 200T includes, for example, a passivation film 221, an interlayer insulating film 222, and a plurality of wires (a first wiring layer W1, a second wiring layer W2, a third wiring layer W3, and a fourth wiring layer W4). The passivation film 221 is in contact with the front surface of the semiconductor layer 200S in such a manner as to cover the entire front surface of the semiconductor layer 200S, for example. The passivation film 221 covers the gate electrode of each of the select transistor SEL, the amplifying transistor AMP, the reset transistor RST, and the FD conversion gain switching transistor FDG. The interlayer insulating film 222 is provided between the passivation film 221 and the third substrate 300. The interlayer insulating film 222 separates the plurality of wires (the first wiring layer W1, the second wiring layer W2, the third wiring layer W3, and the fourth wiring layer W4) from one another. The interlayer insulating film 222 includes, for example, silicon oxide.

The wiring layer 200T is provided with, for example, the first wiring layer W1, the second wiring layer W2, the third wiring layer W3, the fourth wiring layer W4, and the contact portions 201 and 202 arranged in this order from the semiconductor layer 200S side, and these components are insulated from one another by the interlayer insulating film 222. The interlayer insulating film 222 is provided with the first wiring layer W1, the second wiring layer W2, the third wiring layer W3, or the fourth wiring layer W4, and a plurality of connection portions connecting each of the wiring layers to the lower layer. The connection portions are each a connection hole which is provided in the interlayer insulating film 222 and into which a conductive material is embedded. For example, the interlayer insulating film 222 is provided with a connection portion 218V connecting the first wiring layer W1 to the VSS contact region 218 of the semiconductor layer 200S. For example, the connection portion connecting the elements in the second substrate 200 has a hole diameter different from the hole diameter of each of the through vias 120E and 121E and the through vias TGV. Specifically, the connection hole connecting the elements in the second substrate 200 preferably has a smaller hole diameter than each of the through vias 120E and 121E and the through vias TGV. The reason will be explained below. The connection portions (connection portion 218V and the like) provided in the wiring layer 200T have a smaller depth than the through vias 120E and 121E and the through vias TGV. Thus, the connection portions allow a conductive material to be embedded into the connection hole more easily than the through vias 120E and 121E and the through vias TGV. By making the hole diameter of each of the connection portions smaller than the hole diameter of each of the through vias 120E and 121E and the through vias TGV, the miniaturization of the imaging apparatus 1 is facilitated.

For example, the first wiring layer W1 connects the through via 120E to the gate of the amplifying transistor AMP and the source of the FD conversion gain switching transistor FDG (specifically the connection hole reaching the source of the FD conversion gain switching transistor FDG). The first wiring layer W1, for example, connects the through via 121E and the connection portion 218V, thus electrically connecting the VSS contact region 218 of the semiconductor layer 200S and the VSS contact region 118 of the semiconductor layer 100S.

Now, a planar configuration of the wiring layer 200T will be described using FIGS. 57 to 59. FIG. 57 illustrates an example of a planar configuration of the first wiring layer W1 and the second wiring layer W2. FIG. 58 illustrates an example of a planar configuration of the second wiring layer W2 and the third wiring layer W3. FIG. 59 illustrates an example of a planar configuration of the third wiring layer W3 and the fourth wiring layer W4.

For example, the third wiring layer W3 includes wires TRG1, TRG2, TRG3, TRG4, SELL, RSTL, and FDGL extending in the H direction (row direction) (FIG. 58). The wires correspond to a plurality of row driving signal lines 542 described with reference to FIG. 51. The wires TRG1, TRG2, TRG3, and TRG4 are intended to send driving signals to transfer gates TG1, TG2, TG3, and TG4. The wires TRG1, TRG2, TRG3, and TRG4 are respectively connected to the transfer gates TG1, TG2, TG3, and TG4 via the second wiring layer W2, the first wiring layer W1, and the through via 120E. The wire SELL is intended to send a driving signal to the gate of the select transistor SEL, the wire RSTL is intended to send a driving signal to the gate of the reset transistor RST, and the wire FDGL is intended to send a driving signal to the gate of the FD conversion gain switching transistor FDG. The wires SELL, RSTL, and FDGL are connected to the gates of the select transistor SEL, the reset transistor RST, and the FD conversion gain switching transistor FDG via the second wiring layer W2, the first wiring layer W1, and the connection portion.

For example, the fourth wiring layer W4 includes the power supply line VDD, the reference potential line VSS, and the vertical signal line 543, extending in the V direction (column direction) (FIG. 59). The power supply line VDD is connected to the drain of the amplifying transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. Additionally, the reference potential line VSS is connected to the VSS contact region 118 of the first substrate 100 via the third wiring layer W3, the second wiring layer W2, the first wiring layer W1, the through via 121E, and the pad portion 121. The vertical signal line 543 is connected to the source (Vout) of the select transistor SEL via the third wiring layer W3, the second wiring layer W2, the first wiring layer W1, and the connection portion.

The contact portions 201 and 202 may be provided at positions where the contact portions 201 and 202 overlap the pixel array portion 540 in plan view (for example, FIG. 50) or may be provided in the peripheral portion 540B outside the pixel array portion 540 (for example, FIG. 53). The contact portions 201 and 202 are provided in the front surface (wiring layer 200T-side surface) of the second substrate 200. The contact portions 201 and 202 include, for example, metal such as Cu (copper) and Al (aluminum). The contact portions 201 and 202 are exposed at the front surface (third substrate 300-side surface) of the wiring layer 200T. The contact portions 201 and 202 are used to electrically connect and laminate the second substrate 200 and the third substrate 300.

FIG. 53 illustrates an example in which a peripheral circuit is provided in the peripheral portion 540B of the second substrate 200. The peripheral circuit may include a part of the row driving section 520, a part of the column signal processing section 550, or the like. Additionally, as illustrated in FIG. 50, instead of the peripheral circuit disposed in the peripheral portion 540B of the second substrate 200, connection hole portions H1 and H2 may be disposed near the pixel array portion 540.

The third substrate 300 includes, for example, the wiring layer 300T and the semiconductor layer 300S in this order from the second substrate 200 side. For example, the front surface of the semiconductor layer 300S is provided on the second substrate 200 side. The semiconductor layer 300S includes a silicon substrate. A circuit is provided in a front surface side portion of the semiconductor layer 300S. Specifically, the front surface side portion of the semiconductor layer 300S is provided with, for example, at least some of the input section 510A, the row driving section 520, the timing control section 530, the column signal processing section 550, the image signal processing section 560, and the output section 510B. The wiring layer 300T provided between the semiconductor layer 300S and the second substrate 200 includes, for example, an interlayer insulating film, a plurality of wiring layers into which the wiring layer 300T is separated by the interlayer insulating film, and the contact portions 301 and 302. The contact portions 301 and 302 are exposed at the front surface of the wiring layer 300T (second substrate 200-side surface). The contact portion 301 is in contact with the contact portion 201 of the second substrate 200, and the contact portion 302 is in contact with the contact portion 202 of the second substrate 200. The contact portions 301 and 302 are electrically connected to a circuit formed in the semiconductor layer 300S (for example, at least any of the input section 510A, the row driving section 520, the timing control section 530, the column signal processing section 550, the image signal processing section 560, and the output section 510B). The contact portions 301 and 302 include, for example, Cu (copper), aluminum (Al), and the like. For example, an external terminal TA is connected to the input section 510A via the connection hole portion H1, and an external terminal TB is connected to the output section 510B via the connection hole portion H2.

Now, features of the imaging apparatus 1 will be described.

In general, the imaging apparatus includes, as main components, photodiodes and a pixel circuit. In this regard, an increased size of each of the photodiodes increases charge resulting from photoelectric conversion, resulting in an improved signal/noise ratio (S/N ratio) of pixel signals. This allows the imaging apparatus to output better image data (image information). On the other hand, an increased size of each of the transistors included in the pixel circuit (particularly an increased size of the amplifying transistor) reduces noise generated in the pixel circuit, resulting in an improved signal/noise ratio (S/N ratio) of pixel signals. This allows the imaging apparatus to output better image data (image information).

However, in an imaging apparatus in which photodiodes and a pixel circuit are provided in a semiconductor substrate, an increased area of each of the photodiodes within the limited area of the semiconductor substrate may reduce the size of each of the transistors included in the pixel circuit. Additionally, an increased size of each of the transistors included in the pixel circuit may reduce the area of each of the photodiodes.

To solve these problems, for example, the imaging apparatus 1 of the present embodiment uses a structure in which the plurality of pixels 541 share one pixel circuit 210 and in which the pixel circuit 210 shared is disposed overlapping the photodiodes PD. This allows the area of each photodiode PD and the size of each transistor included in the pixel circuit 210 to be maximized within the limited area of the semiconductor substrate. This improves the S/N ratio of pixel signals, allowing the imaging apparatus 1 to output better image data (image information).

When the structure in which the plurality of pixels 541 share one pixel circuit 210 and the pixel circuit 210 is disposed overlapping the photodiodes PD is implemented, a plurality of wires connected to the one pixel circuit 210 extend from the floating diffusions FD in the respective plural pixels 541. To provide a large area for the semiconductor substrate forming the pixel circuit 210, for example, a connection wire that mutually connects the plurality of extending wires can be formed. For a plurality of wires extending from the VSS contact regions 118 as well, a connection wire that mutually connects the plurality of extending wires can be formed.

For example, in a case where a connection wire connecting a plurality of wires extending from the floating diffusions FD in the respective plural pixels 541 is formed in the semiconductor substrate 210 forming the pixel circuit 210, the area in which the transistors included in the pixel circuit 210 are formed may be reduced. Similarly, in a case where a connection wire connecting a plurality of wires extending from the VSS contact regions 118 of the respective plural pixels 541 is formed in the semiconductor substrate 200 forming the pixel circuit 210, the area in which the transistors included in the pixel circuit 210 are formed may be reduced.

To solve this problem, for example, the imaging apparatus 1 of the present embodiment can include a structure in which the plurality of pixels 541 share one pixel circuit 210 and the pixel circuit 210 shared is disposed overlapping the photodiodes PD and in which the first substrate 100 is provided with the connection wire that mutually connects the floating diffusions FD in the respective plurality of pixels 541 and the connection wire that mutually connects the VSS contact regions 118 included in the respective plurality of pixels 541.

In a case where the second manufacturing method described above is used as a manufacturing method for providing the first substrate 100 with the connection wire that mutually connects the floating diffusions FD in the respective plurality of pixels 541 and the connection wire that mutually connects the VSS contact regions 118 included in the respective plurality of pixels 541, then, for example, the manufacture can be achieved using an appropriate process corresponding to the configuration of each of the first substrate 100 and the second substrate 200. Thus, an imaging apparatus 1 with high quality and high performance can be manufactured. Additionally, an easy process can be used to form connection wires for the first substrate 100 and the second substrate 200. Specifically, in a case where the second manufacturing method described above is used, electrodes connected to the floating diffusions FD and electrodes connected to the VSS contact regions 118 are respectively provided on the front surface of the first substrate 100 and the front surface of the second substrate 200, which are used as lamination boundary surfaces of the first substrate 100 and the second substrate 200. Further, larger electrodes are preferably formed on the two substrate surfaces such that when the first substrate 100 and the second substrate 200 are laminated, the electrodes formed on the two substrate surfaces come into contact with one another even in a case where the electrodes provided on the two substrate surfaces are misaligned with one another. In this case, the electrodes may be difficult to be placed within the limited areas of the pixels included in the imaging apparatus 1.

To achieve the object to satisfy the need for large electrodes on the lamination boundary surfaces of the first substrate 100 and the second substrate 200, for example, the imaging apparatus 1 of the present embodiment can use the first manufacturing method described above as a manufacturing method in which the plurality of pixels 541 share one pixel circuit 210 and in which the pixel circuit 210 shared is disposed overlapping the photodiodes PD. This facilitates alignment of the elements formed on the first substrate 100 and on the second substrate 200, allowing manufacture of an imaging apparatus with high quality and high performance. Further, the imaging apparatus includes a specific structure obtained by using this manufacturing method. Specifically, the imaging apparatus includes a structure in which the semiconductor layer 100S and wiring layer 100T of the first substrate 100 and the semiconductor layer 200S and wiring layer 200T of the second substrate 200 are stacked in this order, in other words, a structure in which the first substrate 100 and the second substrate 200 are stacked in a face to back direction, and includes the through vias 120E and 121E extending from the front surface side of the semiconductor layer 200S of the second substrate 200 to the front surface of the semiconductor layer 100S of the first substrate 100 by penetrating the semiconductor layer 200S and the wiring layer 100T of the first substrate 100.

The first manufacturing method is used to stack the second substrate 200 and the structure in which the first substrate 100 is provided with the connection wire that mutually connects the floating diffusions FD in the respective plurality of pixels 541 and the connection wire that mutually connects the VSS contact regions 118 of the respective plurality of pixels 541, and the pixel circuit 210 is formed in the second substrate 200. Then, heating treatment required to form active elements included in the pixel circuit 210 may affect the connection wires formed on the first substrate 100.

Thus, to achieve the object to prevent the adverse effect of heating treatment during formation of active elements, the imaging apparatus 1 of the present embodiment desirably uses a highly heat-resistant conductive material for the connection wire that mutually connects the floating diffusions FD in the respective plurality of pixels 541 and the connection wire that mutually connects the VSS contact regions 118 of the respective plurality of pixels 541. Specifically, as the highly heat-resistant conductive material, a material that has a higher melting point than that of at least a part of a wiring material included in the wiring layer 200T of the second substrate 200 can be used.

Thus, for example, the imaging apparatus 1 of the present embodiment includes (1) the structure in which the first substrate 100 and the second substrate 200 are stacked in a face to back direction (specifically, the structure in which the semiconductor layer 100S and wiring layer 100T of the first substrate 100 and the semiconductor layer 200S and wiring layer 200T of the second substrate 200 are stacked in this order), (2) the structure provided with the through vias 120E and 121E extending from the front surface side of the semiconductor layer 200S of the second substrate 200 to the front surface of the semiconductor layer 100S of the first substrate 100 by penetrating the semiconductor layer 200S and the wiring layer 100T of the first substrate 100, and (3) the structure that uses a highly heat-resistant conductive material for the connection wire that mutually connects the floating diffusions FD included in the respective plurality of pixels 541 and the connection wire that mutually connects the VSS contact regions 118 included in the respective plurality of pixels 541. This enables the first substrate 100 to be provided with the connection wire that mutually connects the floating diffusions FD included in the respective plurality of pixels 541 and the connection wire that mutually connects the VSS contact regions 118 included in the respective plurality of pixels 541, with no large electrodes provided at the interface between the first substrate 100 and the second substrate 200.

[Operations of Imaging Apparatus 1]

Figure 60:
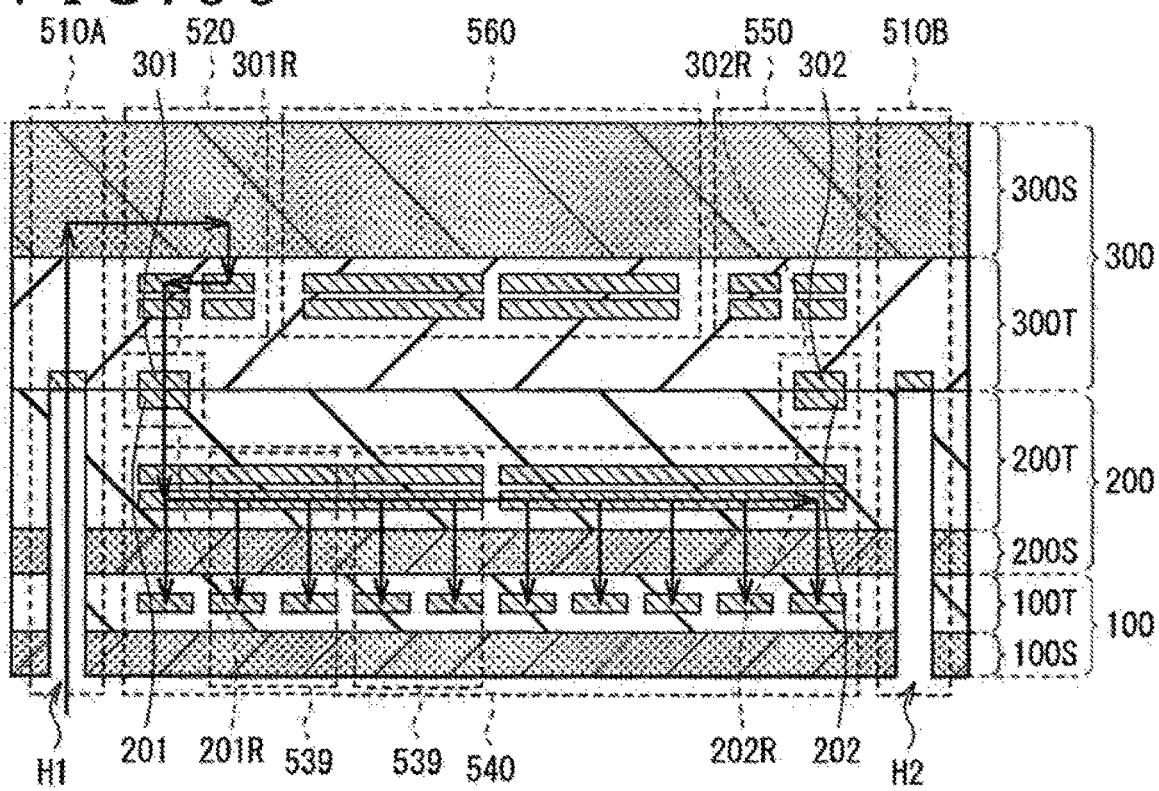
FIG. 60 is a schematic diagram for explaining a path of an input signal to the imaging apparatus depicted in FIG. 50.
Figure 61:
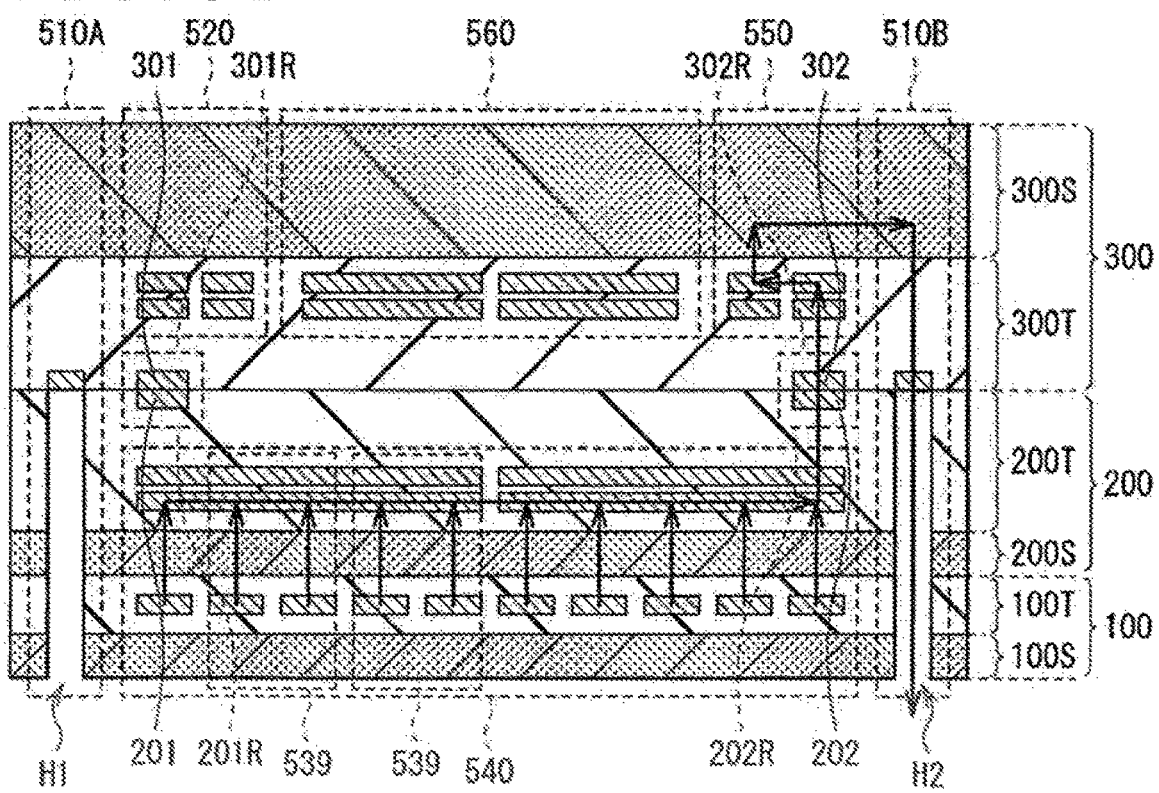
FIG. 61 is a schematic diagram for explaining signal paths of pixel signals from the imaging apparatus depicted in FIG. 50.

Now, operations of the imaging apparatus 1 will be described using FIGS. 60 and 61. FIGS. 60 and 61 correspond to FIG. 50 in which arrows representing paths of signals are additionally drawn. In FIG. 60, arrows represent an input signal externally input to the imaging apparatus 1 and paths of a power supply potential and a reference potential. In FIG. 61, arrows represent a signal path of a pixel signal output from the imaging apparatus 1 to the outside. For example, an input signal (for example, a pixel clock or a synchronization signal) is input to the imaging apparatus 1 via the input section 510A and then transmitted to the row driving section 520 of the third substrate 300, and the row driving section 520 creates row driving signals. The row driving signals are sent to the second substrate 200 via the contact portions 301 and 301. Further, the row driving signals reach the pixel sharing units 539 in the pixel array portion 540 via row driving signal lines 542 in the wiring layer 200T. Of the row driving signals having reached the pixel sharing units 539 in the second substrate 200, the driving signals other than those for the transfer gates TG are input to the pixel circuit 210 to drive the transistors included in the pixel circuit 210. The driving signals for the transfer gates TG are input to the transfer gates TG1, TG2, TG3, and TG4 in the first substrate 100 via the through vias TGV to drive the pixels 541A, 541B, 541C, and 541D (FIG. 60). Additionally, the power supply potential and the reference potential provided to the input section 510A (input terminal 511) of the third substrate 300 from the outside of the imaging apparatus 1 are sent to the second substrate 200 via the contact portions 301 and 201, and provided to the pixel circuits 210 for the respective pixel sharing units 539 via the wires in the wiring layer 200T. The reference potential is also provided to the pixels 541A, 541B, 541C, and 541D in the first substrate 100 via the through vias 121E. On the other hand, pixel signals obtained by photoelectric conversion by the pixels 541A, 541B, 541C, and 541D in the first substrate 100 are sent, via the through vias 120E, to the pixel circuits 210 in the second substrate 200 for the respective pixel sharing units 539. Pixel signals based on the above-described pixel signals are sent from the pixel circuits 210 to the third substrate 300 via the vertical signal lines 543 and the contact portions 202 and 302. The pixel signals are processed by the column signal processing section 550 and the image signal processing section 560 of the third substrate 300, and then the pixel signals processed are output to the outside via the output section 510B.

[Effects]

In the present embodiment, the substrates in which the pixels 541A, 541B, 541C, and 541D (pixel sharing units 539) are provided differ from the substrate in which the pixel circuits 210 are provided (first substrate 100 and second substrate 200). This enables an increase in the area of each of the pixels 541A, 541B, 541C, and 541D and the area of the pixel circuit 210 compared to a case in which the pixels 541A, 541B, 541C, and 541D and the pixel circuits 210 are formed in an identical substrate. As a result, the amount of pixel signals obtained by photoelectric conversion can be increased, and transistor noise from the pixel circuit 210 can be reduced. These configurations allow the signal/noise ratio of pixel signals to be improved, enabling the imaging apparatus 1 to output better pixel data (image information). Additionally, the imaging apparatus 1 can be miniaturized (in other words, the pixel size and the size of the imaging apparatus 1 can be reduced). In the imaging apparatus 1, a reduced pixel size enables an increase in the number of pixels per unit area, allowing high-quality images to be output.

Additionally, in the imaging apparatus 1, the first substrate 100 and the second substrate 200 are electrically connected to each other by the through vias 120E and 121E provided in the insulating region 212. For example, a method in which the first substrate 100 and the second substrate 200 are connected by joining pad electrodes to each other or by using through vias (for example, TSV (Thorough Si Via) penetrating the semiconductor layer is possible. Compared to such a method, providing the through vias 120E and 121E in the insulating region 212 enables a reduction in area required to connect the first substrate 100 and the second substrate 200. This in turn enables a reduction in pixel size and in size of the imaging apparatus 1. Additionally, further reducing the area per pixel allows for an increase in resolution. When a reduction in chip size is unnecessary, the formation regions for the pixels 541A, 541B, 541C, and 541D and the pixel circuit 210 can be enlarged. As a result, the amount of pixel signals obtained by photoelectric conversion can be increased, and noise from the transistors included in the pixel circuit 210 can be reduced. This improves the signal/noise ratio of pixel signals, enabling the imaging apparatus 1 to output better pixel data (image information).

Additionally, in the imaging apparatus 1, the substrate in which the pixel circuits 210 are provided differs from the substrate in which the column signal processing section 550 and the image signal processing section 560 are provided (second substrate 200 and third substrate 300). This enables an increase in the area of the pixel circuit 210 and in the areas of the column signal processing section 550 and image signal processing section 560 compared to a case in which the pixel circuits 210 and both the column signal processing section 550 and the image signal processing section 560 are formed in an identical substrate. This enables a reduction in noise generated in the column signal processing section 550 and allows mounting of a more advanced image processing circuit in the image signal processing section 560. Accordingly, the signal/noise ratio of pixel signals is improved, enabling the imaging apparatus 1 to output better pixel data (image information).

Additionally, in the imaging apparatus 1, the pixel array portion 540 is provided in the first substrate 100 and the second substrate 200, and the column signal processing section 550 and the image signal processing section 560 are provided in the third substrate 300. In addition, the contact portions 201, 202, 301, and 302 connecting the second substrate 200 and the third substrate 300 are formed above the pixel array portion 540. Thus, the contact portions 201, 202, 301, and 302 can be freely laid out with the various wires that are included in the pixel arrays being prevented from interfering with the layout. This enables the contact portions 201, 202, 301, and 302 to be used for electric connection between the second substrate 200 and the third substrate 300. The use of the contact portions 201, 202, 301, and 302, for example, increases the degree of freedom of layout of the column signal processing section 550 and the image signal processing section 560. This enables a reduction in noise generated in the column signal processing section 550 and allows mounting of a more advanced image processing circuit in the image signal processing section 560. Consequently, the signal/noise ratio of pixel signals is improved, enabling the imaging apparatus 1 to output better pixel data (image information).

Additionally, in the imaging apparatus 1, the pixel isolation portion 117 penetrates the semiconductor layer 100S. Thus, even in a case where a reduced area per pixel reduces the distance between adjacent pixels (pixels 541A, 541B, 541C, and 541D), possible color mixture among the pixels 541A, 541B, 541C, and 541D can be suppressed. Thus, the signal/noise ratio of pixel signals is improved, enabling the imaging apparatus 1 to output better pixel data (image information).

Additionally, in the imaging apparatus 1, the pixel circuit 210 is provided for each pixel sharing unit 539. This configuration enables enlargement of the formation regions for the transistors constituting the pixel circuit 210 (amplifying transistor AMP, reset transistor RST, select transistor SEL, and FD conversion gain switching transistor FDG) compared to a configuration in which the pixel circuit 210 is provided for each of the pixels 541A, 541B, 541C, and 541D. For example, the formation region for the amplifying transistor AMP is enlarged, enabling noise to be suppressed. Thus, the signal/noise ratio of pixel signals is improved, enabling the imaging apparatus 1 to output better pixel data (image information).

Further, in the imaging apparatus 1, the first substrate 100 is provided with the pad portion 120 electrically connecting the floating diffusions FD (floating diffusions FD1, FD2, FD3, and FD4) in the four pixels (pixels 541A, 541B, 541C, and 541D). This enables a reduction in the number of through vias (through vias 120E) connecting the first substrate 100 and the second substrate 200 compared to a case where the pad portion 120 as described above is provided in the second substrate 200. Consequently, the size of the insulating region 212 can be reduced, providing a formation region (semiconductor layer 200S) with a sufficient size for the transistors constituting the pixel circuit 210. This enables a reduction in noise from the transistors included in the pixel circuit 210, improving the signal/noise ratio of pixel signals. Thus, the imaging apparatus 1 can output better pixel data (image information).

A modified example of the imaging apparatus 1 according to the above-described embodiments will be described below. In the modified example described below, components common to the above-described embodiments are assigned identical reference signs in the description.

2. Modified Example 1

Figure 62:
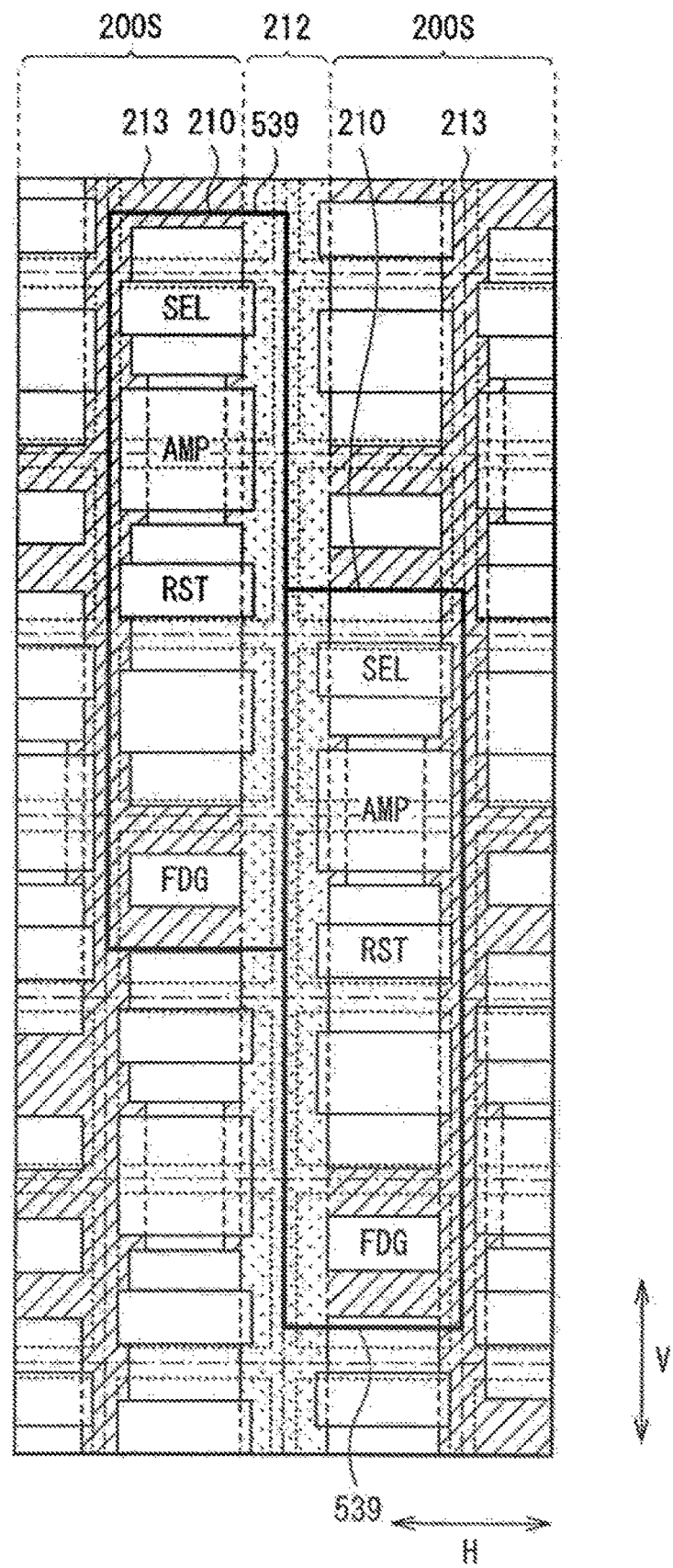
FIG. 62 is a schematic diagram illustrating a modified example of a planar configuration of the second substrate (semiconductor layer) depicted in FIG. 55.
Figure 63:
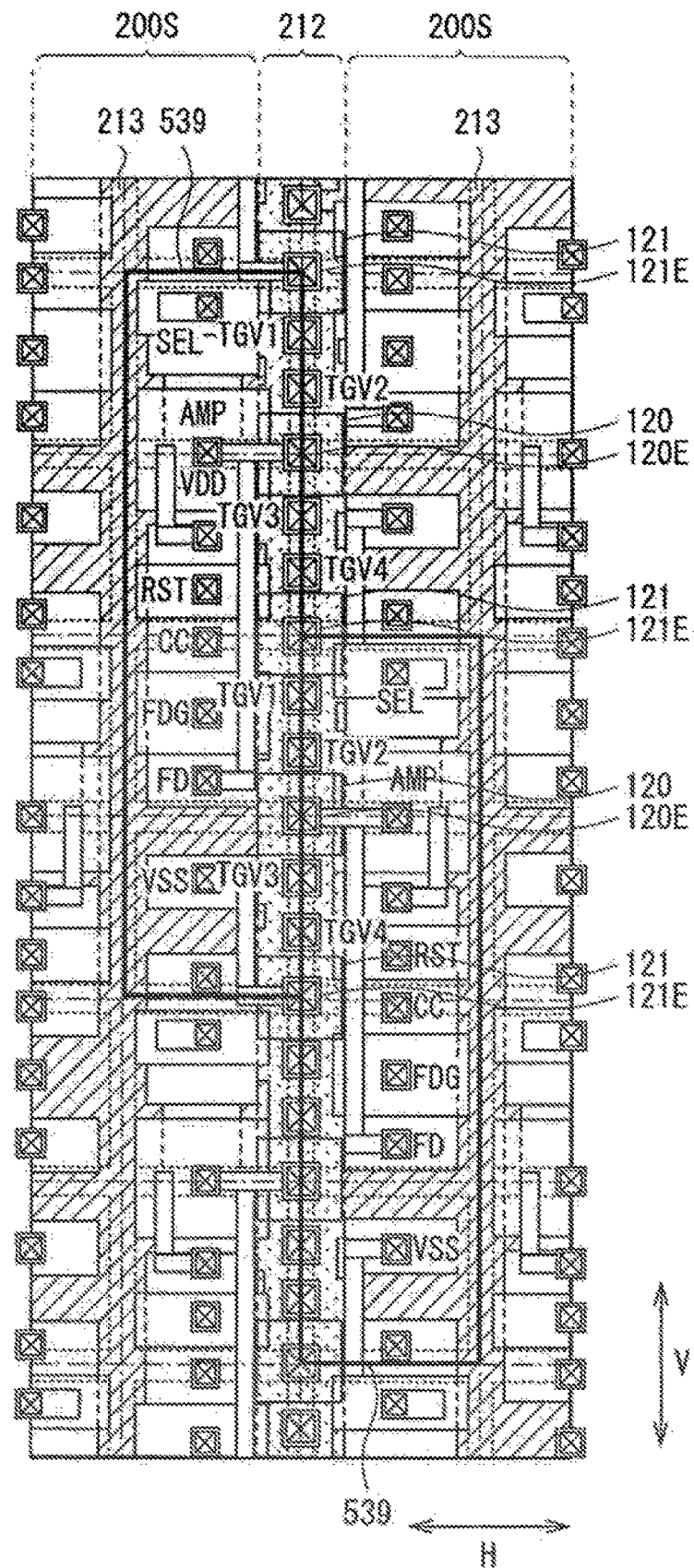
FIG. 63 is a schematic diagram illustrating a planar configuration of a first wiring layer and a main part of the first substrate, along with a pixel circuit depicted in FIG. 62.
Figure 64:
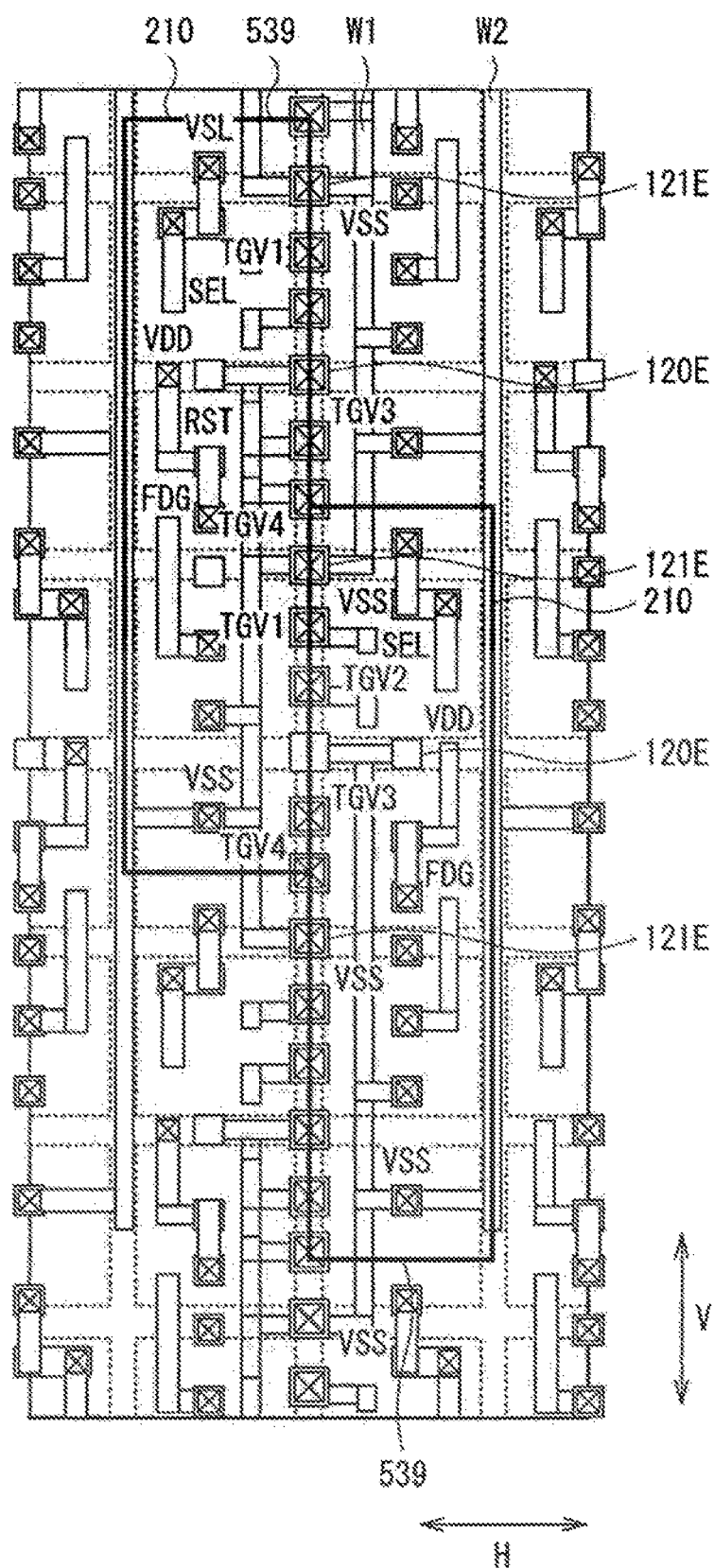
FIG. 64 is a schematic diagram illustrating an example of a planar configuration of a second wiring layer along with the first wiring layer depicted in FIG. 63.
Figure 65:
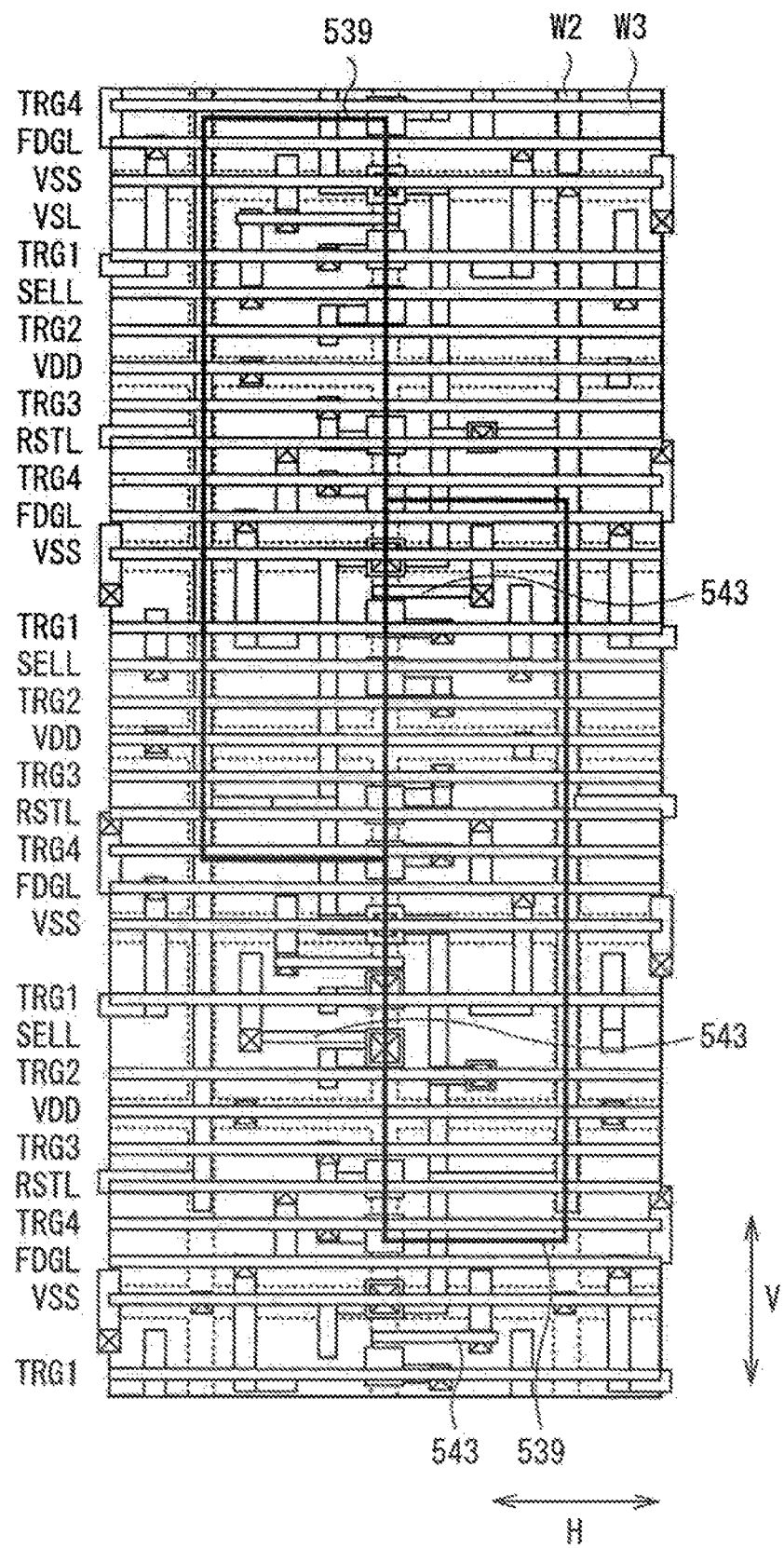
FIG. 65 is a schematic diagram illustrating an example of a planar configuration of a third wiring layer along with the second wiring layer depicted in FIG. 64.
Figure 66:
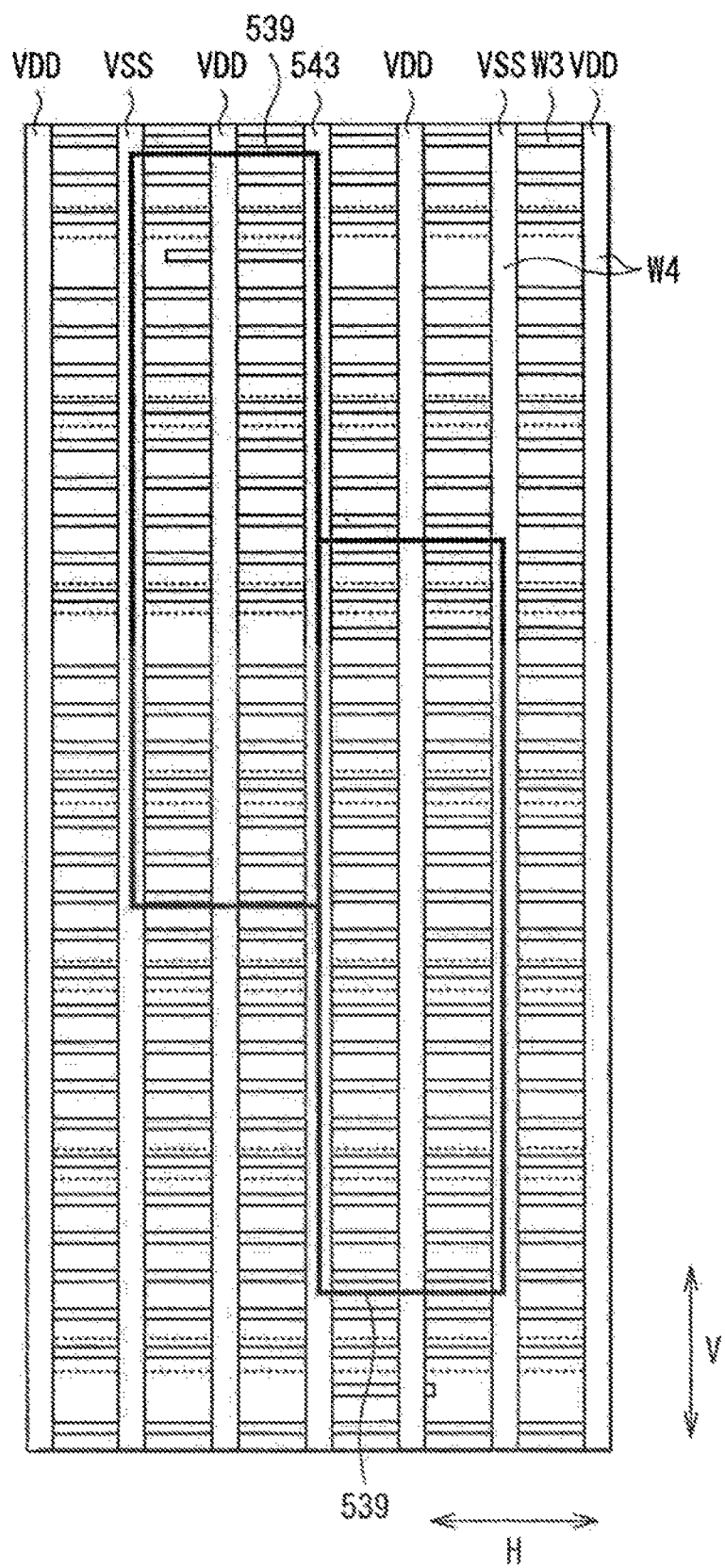
FIG. 66 is a schematic diagram illustrating an example of a planar configuration of a fourth wiring layer along with the third wiring layer depicted in FIG. 65.

FIGS. 62 to 66 illustrate a modified example of a planar configuration of the imaging apparatus 1 according to the above-described embodiments. FIG. 62 schematically illustrates a planar configuration near the front surface of the semiconductor layer 200S in the second substrate 200, and corresponds to FIG. 55 described above in the embodiments. FIG. 63 schematically illustrates the configuration of the first wiring layer W1, the semiconductor layer 200S connected to the first wiring layer W1, and components of the first substrate 100, and corresponds to FIG. 56 described above in the embodiments. FIG. 64 illustrates an example of a planar configuration of the first wiring layer W1 and the second wiring layer W2, and corresponds to FIG. 57 described above in the embodiments. FIG. 65 illustrates an example of a planar configuration of the second wiring layer W2 and the third wiring layer W3, and corresponds to FIG. 58 described above in the embodiments. FIG. 66 illustrates an example of a planar configuration of the third wiring layer W3 and the fourth wiring layer W4, and corresponds to FIG. 59 described above in the embodiments.

In the present modified example, as depicted in FIG. 63, the internal layout of one of the two pixel sharing units 539 arranged in the H direction of the second substrate 200 (for example, the pixel sharing unit 539 on the right side of sheet of FIG. 63) is obtained by inverting, only in the H direction, the internal layout of the other pixel sharing unit 539 (for example, on the left side of sheet of FIG. 63). Additionally, the misalignment in the V direction between the contour line of the one pixel sharing unit 539 and the contour line of the other pixel sharing unit 539 is more significant than the misalignment described above in the embodiments (FIG. 56). Thus, more significant misalignment in the V direction enables a reduction in the distance between the amplifying transistor AMP in the other pixel sharing unit 539 and the pad portion 120 connected to the amplifying transistor AMP (pad portion 120 of the other of the two pixel sharing units 539 arranged in the V direction illustrated in FIG. 54 (pixel sharing unit 539 on the lower side of sheet of FIG. 54)). With such a layout, in Modified Example 1 of the imaging apparatus 1 illustrated in FIGS. 62 to 66, the area of the two pixel sharing units 539 arranged in the H direction can be made equal to the area of the pixel sharing units 539 in the second substrate 200 described above in the embodiments without mutually inverting, in the V direction, the planar layouts of the two pixel sharing units 539. Note that the planar layout of the pixel sharing units 539 in the first substrate 100 is identical to the planar layout described above in the embodiments (FIGS. 54A and 54B). Consequently, the imaging apparatus 1 in the present modified example can produce effects similar to those of the imaging apparatus 1 described above in the embodiments. The arrangement of the pixel sharing units 539 in the second substrate 200 is not limited to the arrangements described in the embodiment and the present modified example.

3. Modified Example 2

Figure 67:
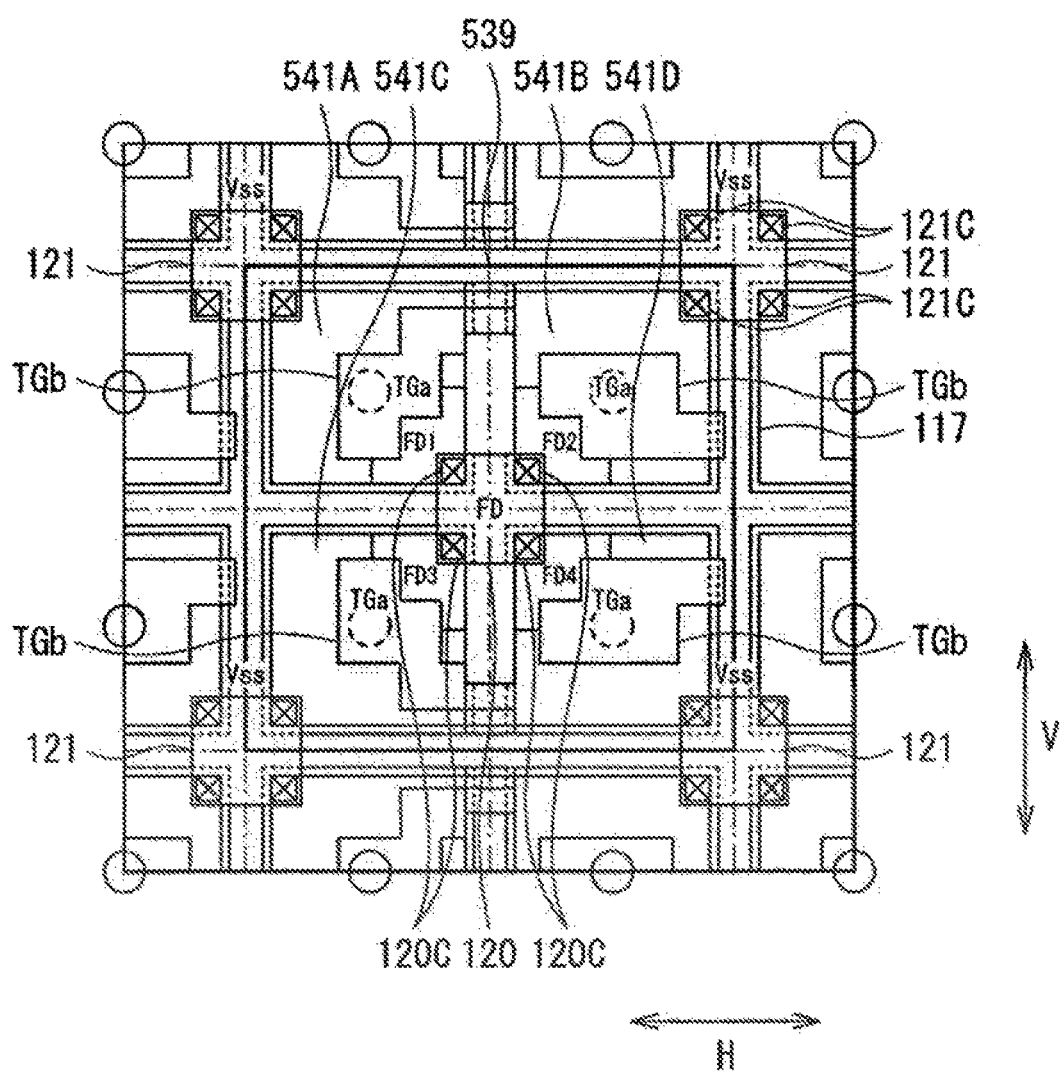
FIG. 67 is a schematic diagram illustrating a modified example of a planar configuration of the first substrate depicted in FIG. 54A.
Figure 68:
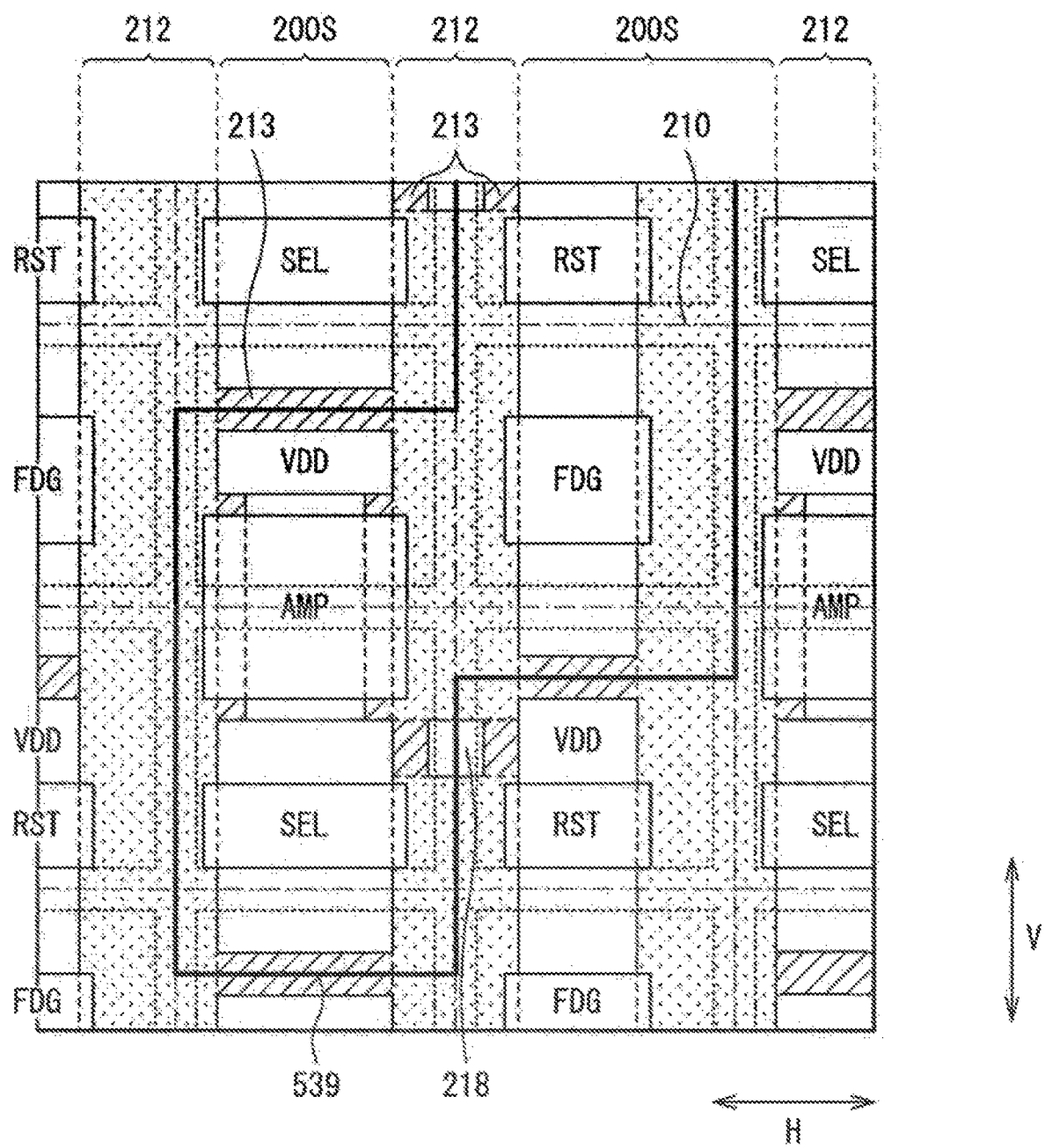
FIG. 68 is a schematic diagram illustrating an example of a planar configuration of a second substrate (semiconductor layer) stacked on the first substrate depicted in FIG. 67.
Figure 69:
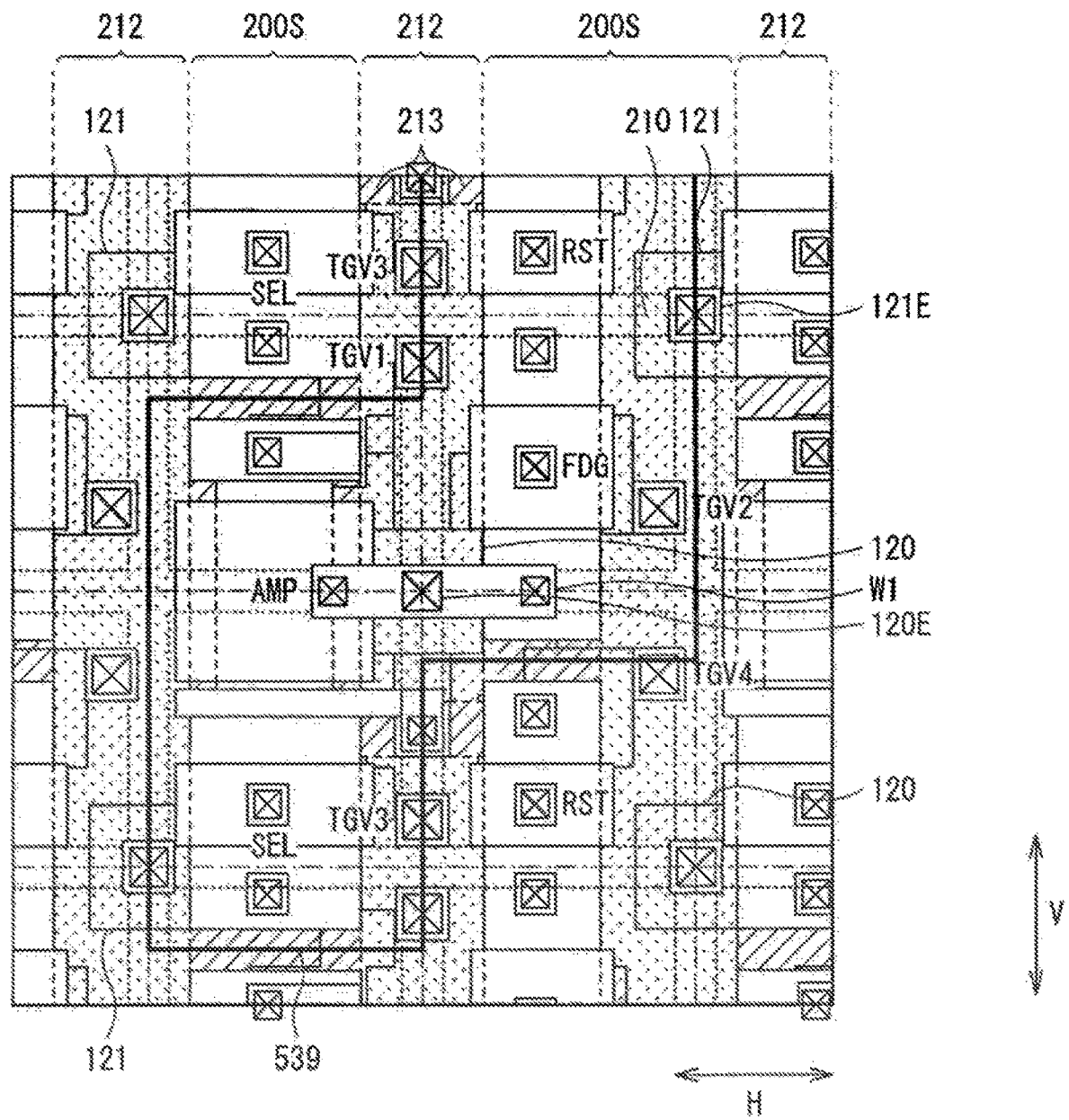
FIG. 69 is a schematic diagram illustrating an example of a planar configuration of a first wiring layer along with a pixel circuit depicted in FIG. 68.
Figure 70:
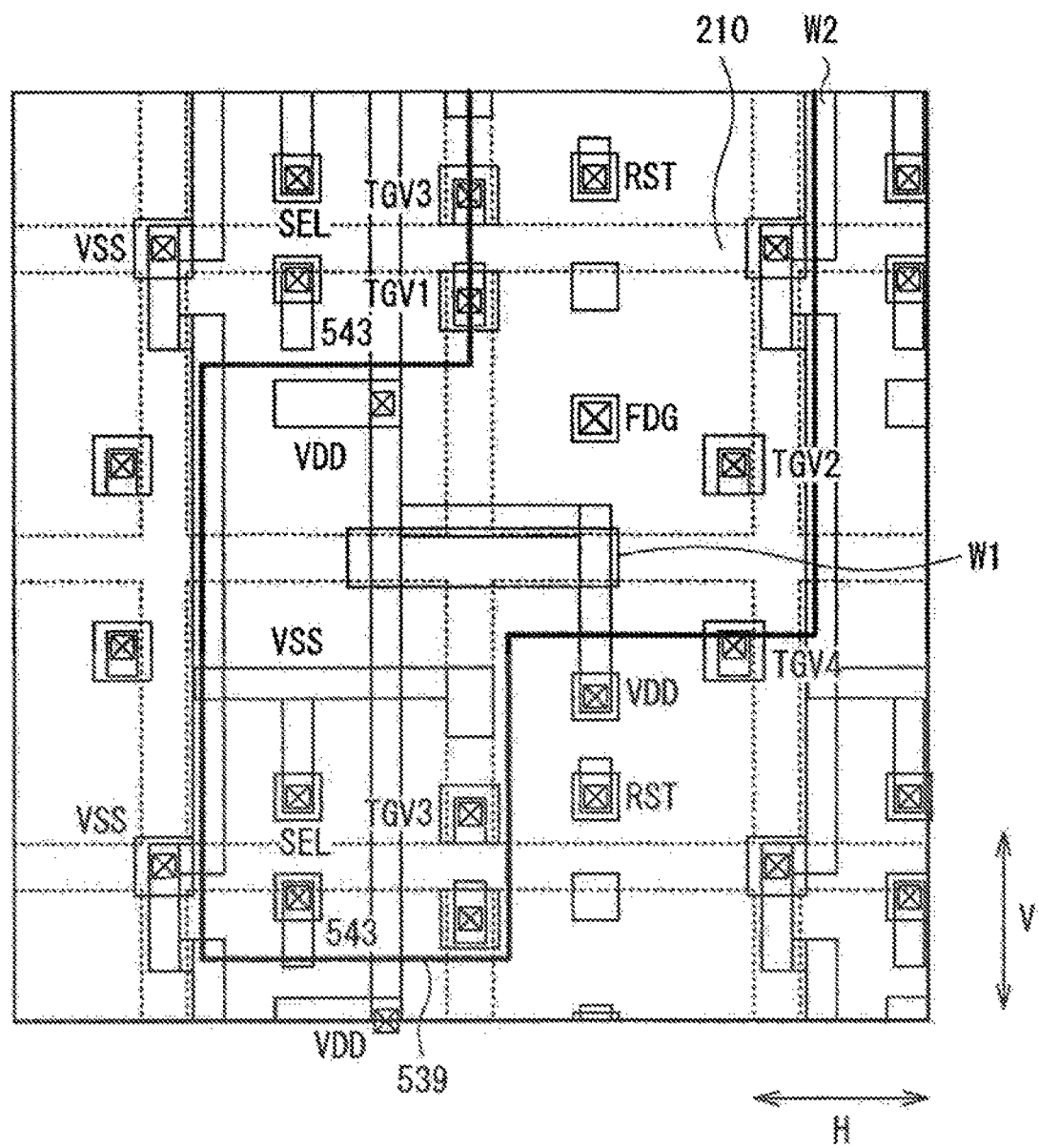
FIG. 70 is a schematic diagram illustrating an example of a planar configuration of a second wiring layer along with the first wiring layer depicted in FIG. 69.
Figure 71:
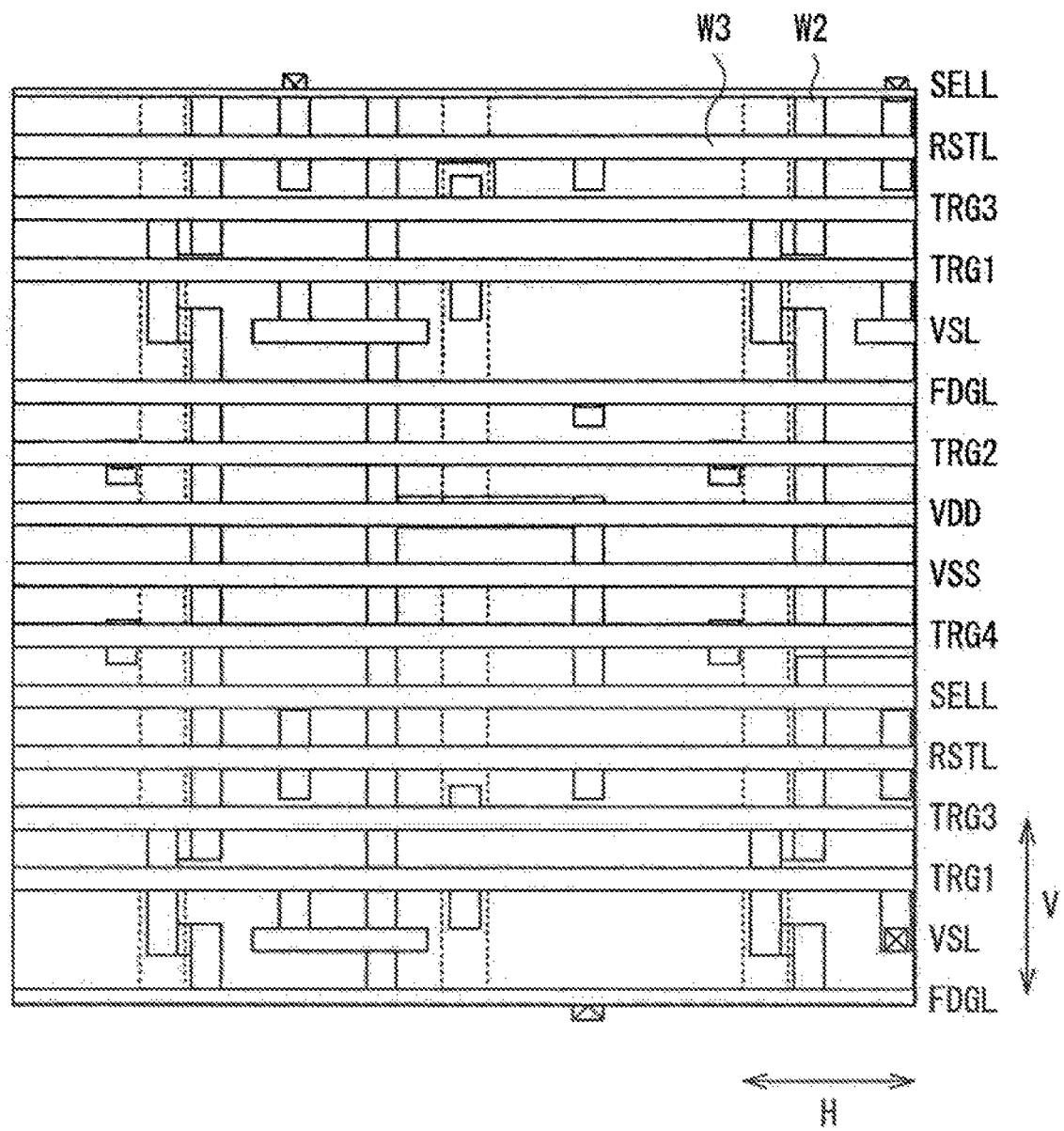
FIG. 71 is a schematic diagram illustrating an example of a planar configuration of a third wiring layer along with the second wiring layer depicted in FIG. 70.
Figure 72:
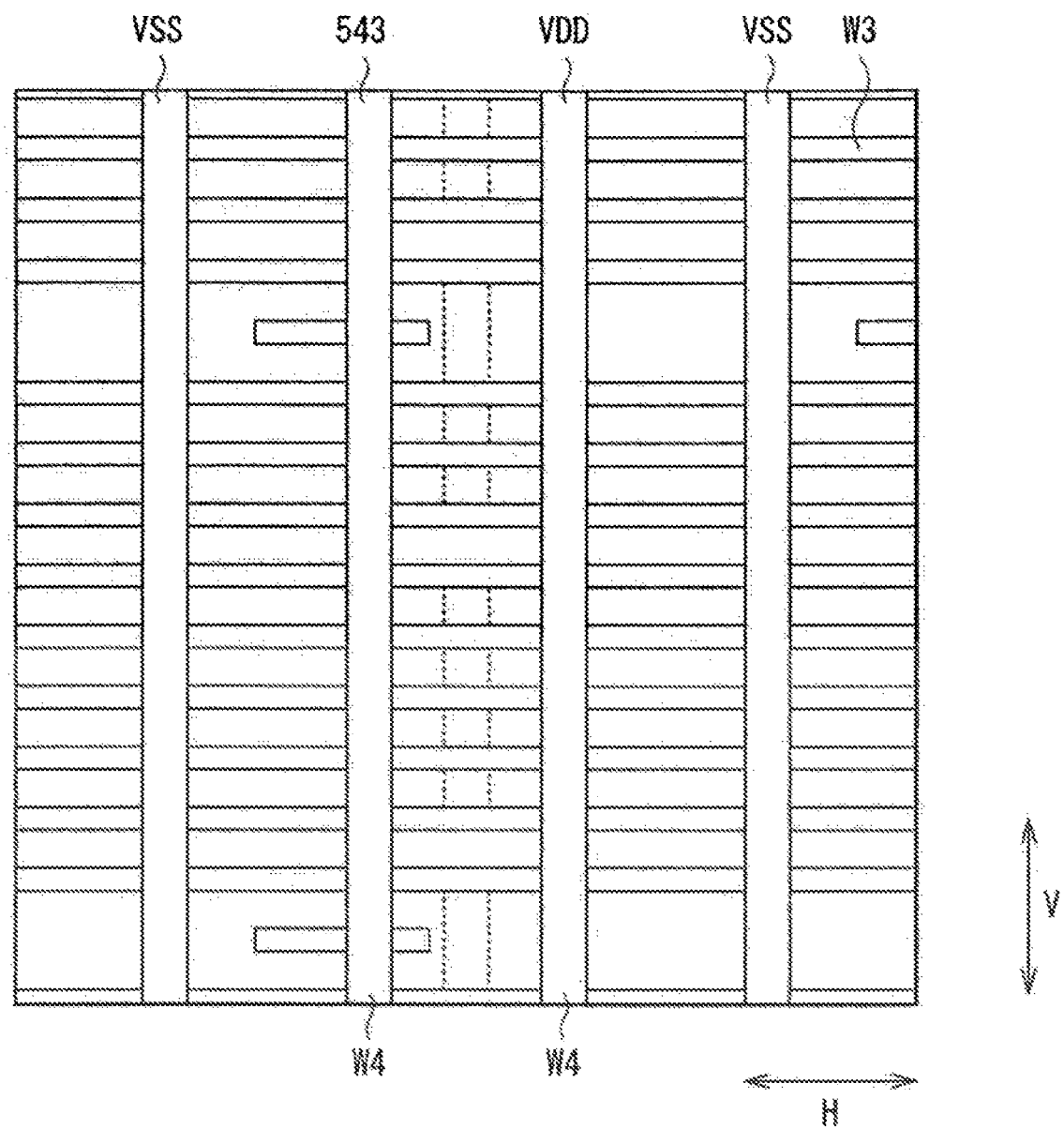
FIG. 72 is a schematic diagram illustrating an example of a planar configuration of a fourth wiring layer along with the third wiring layer depicted in FIG. 71.

FIGS. 67 to 72 illustrate a modified example of a planar configuration of the imaging apparatus 1 according to the above-described embodiments. FIG. 67 schematically illustrates a planar configuration of the first substrate 100, and corresponds to FIG. 54A described above in the embodiments. FIG. 68 schematically illustrates a planar configuration near the front surface of the semiconductor layer 200S in the second substrate 200, and corresponds to FIG. 55 described above in the embodiments. FIG. 69 schematically illustrates the configuration of the first wiring layer W1, the semiconductor layer 200S connected to the first wiring layer W1, and components of the first substrate 100, and corresponds to FIG. 56 described above in the embodiments. FIG. 70 illustrates an example of a planar configuration of the first wiring layer W1 and the second wiring layer W2, and corresponds to FIG. 57 described above in the embodiments. FIG. 71 illustrates an example of a planar configuration of the second wiring layer W2 and the third wiring layer W3, and corresponds to FIG. 58 described above in the embodiments. FIG. 72 illustrates an example of a planar configuration of the third wiring layer W3 and the fourth wiring layer W4, and corresponds to FIG. 59 described above in the embodiments.

In the present modified example, the contour of each pixel circuit 210 has a generally square planar shape (FIG. 68 and the like). In this regard, the planar configuration of the imaging apparatus 1 in the present modified example differs from the planar configuration of the imaging apparatus 1 described above in the embodiments.

For example, the pixel sharing unit 539 in the first substrate 100 is formed over a pixel region of two rows by two columns and has a generally square planar shape as is the case with the above-described embodiments (FIG. 67). For example, in each pixel sharing unit 539, the horizontal portions TGbs of the transfer gates TG1 and TG3 of the pixels 541A and 541C in one of the pixel columns each extend from a position where the horizontal portion TGb overlaps the vertical portion TGa toward the central portion of the pixel sharing unit 539 in the H direction (more specifically, a direction toward the outer edges of the pixels 541A and 541C and a direction toward the central portion of the pixel sharing unit 539), and the horizontal portions TGb of the transfer gates TG2 and TG4 of the pixels 541B and 541D in the other of the pixel columns each extend from a position where the horizontal portion TGb overlaps the vertical portion TGa toward the outer side of the pixel sharing unit 539 in the H direction (more specifically, a direction toward the outer edges of the pixels 541B and 541D and a direction toward the outer side of the pixel sharing unit 539). The pad portion 120 connected to the floating diffusions FD is provided in the central portion of the pixel sharing unit 539 (the central portion of the pixel sharing unit 539 in the H direction and the V direction), and the pad portion 121 connected to the VSS contact regions 118 is provided at ends of the pixel sharing unit 539 at least in the H direction (in FIG. 67, in the H direction and the V direction).

In an alternative arrangement example, the horizontal portions TGbs of the transfer gates TG1, TG2, TG3, and TG4 may be provided exclusively in regions facing the vertical portion TGa. In this case, the semiconductor layer 200S is likely to be divided into small portions as described above in the embodiments. Consequently, forming large transistors in the pixel circuit 210 is difficult. On the other hand, when the horizontal portions TGbs of the transfer gates TG1, TG2, TG3, and TG4 each extend in the H direction from the position where the horizontal portion TGb overlaps the vertical portion TGa as described in the modified example, the width of the semiconductor layer 200S can be increased as described above in the embodiments. Specifically, the positions, in the H direction, of the through vias TGV1 and TGV3 connected to the transfer gates TG1 and TG3 can be placed in proximity to the position of the through via 120E in the H direction, and the positions, in the H direction, of the through vias TGV2 and TGV4 connected to the transfer gates TG2 and TG4 can be placed in proximity to the position of the through via 121E in the H direction (FIG. 69). This enables an increase in the width (size in the H direction) of the semiconductor layer 200S extending in the V direction as described above in the embodiments. This enables an increase in the size of each of the transistors in the pixel circuit 210, particularly in the size of the amplifying transistor AMP. As a result, the signal/noise ratio of pixel signals is improved, enabling the imaging apparatus 1 to output better pixel data (image information).

The pixel sharing unit 539 in the second substrate 200 is, for example, substantially identical to the pixel sharing unit 539 in the first substrate 100 in size in the H direction and the V direction, and is provided, for example, over a region corresponding to a pixel region of substantially two rows by two columns. For example, in each pixel circuit 210, the select transistor SEL and the amplifying transistor AMP are arranged in the V direction in one semiconductor layer 200S extending in the V direction, and the FD conversion gain switching transistor FDG and the reset transistor RST are arranged in the V direction in one semiconductor layer 200S extending in the V direction. In the H direction, the one semiconductor layer 200S in which the select transistor SEL and the amplifying transistor AMP are provided is arranged in juxtaposition, via the insulating region 212, with the one semiconductor layer 200S in which the FD conversion gain switching transistor FDG and the reset transistor RST are provided. The insulating region 212 extends in the V direction (FIG. 68).

Now, the contour of the pixel sharing unit 539 in the second substrate 200 will be described with reference to FIGS. 68 and 69. For example, the pixel sharing unit 539 in the first substrate 100 depicted in FIG. 67 is connected to the amplifying transistor AMP and the select transistor SEL provided on one side (the left side of sheet of FIG. 69) of the pad portion 120 in the H direction and to the FD conversion gain switching transistor FDG and the reset transistor RST provided on the other side (the right side of sheet of FIG. 69) of the pad portion 120 in the H direction. Four outer edges described below determine the contour of the sharing unit 541 in the second substrate 200 including the amplifying transistor AMP, the select transistor SEL, the FD conversion gain switching transistor FDG, and the reset transistor RST.

A first outer edge is an outer edge at one end in the V direction (the end on the upper side of sheet of FIG. 69) of the semiconductor layer 200S including the select transistor SEL and the amplifying transistor AMP. The first outer edge is provided between the amplifying transistor AMP included in the pixel sharing unit 539 and the select transistor SEL included in the pixel sharing unit 539 adjacent to the above-described pixel sharing unit 539 on one side of the pixel sharing unit 539 (on the upper side of sheet of FIG. 69) in the V direction. More specifically, the first outer edge is provided between the amplifying transistor AMP and the select transistor SEL in the central portion of the element isolation region 213 in the V direction. A second outer edge is an outer edge at the other end in the V direction (the end on the lower side of sheet of FIG. 69) of the semiconductor layer 200S including the select transistor SEL and the amplifying transistor AMP. The second outer edge is provided between the select transistor SEL included in the pixel sharing unit 539 and the amplifying transistor AMP included in the pixel sharing unit 539 adjacent to the above-described pixel sharing unit 539 on the other side of the pixel sharing unit 539 (on the lower side of sheet of FIG. 69) in the V direction. More specifically, the second outer edge is provided between the select transistor SEL and the amplifying transistor AMP in the central portion of the element isolation region 213 in the V direction. A third outer edge is an outer edge at the other end in the V direction (the end on the lower side of sheet of FIG. 69) of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the above-described pixel sharing unit 539 on the other side of the pixel sharing unit 539 (on the lower side of sheet of FIG. 69) in the V direction. More specifically, the third outer edge is provided between the FD conversion gain switching transistor FDG and the reset transistor RST in the central portion of the element isolation region 213 in the V direction. A fourth outer edge is an outer edge at one end in the V direction (the end on the upper side of sheet of FIG. 69) of the semiconductor layer 200S including the reset transistor RST and the FD conversion gain switching transistor FDG. The fourth outer edge is provided between the reset transistor RST included in the pixel sharing unit 539 and the FD conversion gain switching transistor FDG (not illustrated) included in the pixel sharing unit 539 adjacent to the above-described pixel sharing unit 539 on the one side of the pixel sharing unit 539 (on the upper side of sheet of FIG. 69) in the V direction. More specifically, the fourth outer edge is provided between the reset transistor RST and the FD conversion gain switching transistor FDG in the central portion of the element isolation region 213 (not illustrated) in the V direction.

In the contour of the pixel sharing unit 539 in the second substrate 200 including the first, second, third, and fourth outer edges as described above, the third and fourth outer edges are displaced from the first and second outer edges toward one side in the V direction (in other words, the third and fourth outer edges are offset from the first and second outer edges toward one side in the V direction). The use of such a layout enables both the gate of the amplifying transistor AMP and the source of the FD conversion gain switching transistor FDG to be disposed as close to the pad portion 120 as possible. Consequently, the area of the wires connecting the transistors AMP and FDG is reduced, facilitating miniaturization of the imaging apparatus 1. Note that the VSS contact region 218 is provided between the semiconductor layer 200S including the select transistor SEL and the amplifying transistor AMP and the semiconductor layer 200S including the reset transistor RST and the FD conversion gain switching transistor FDG. For example, the plurality of pixel circuits 210 have an identical arrangement.

The imaging apparatus 1 including the second substrate 200 as described above also produces effects similar to those described above in the embodiments. The arrangement of the pixel sharing unit 539 in the second substrate 200 is not limited to the arrangement described in the above-described embodiments and the present modified example.

4. Modified Example 3

Figure 73:
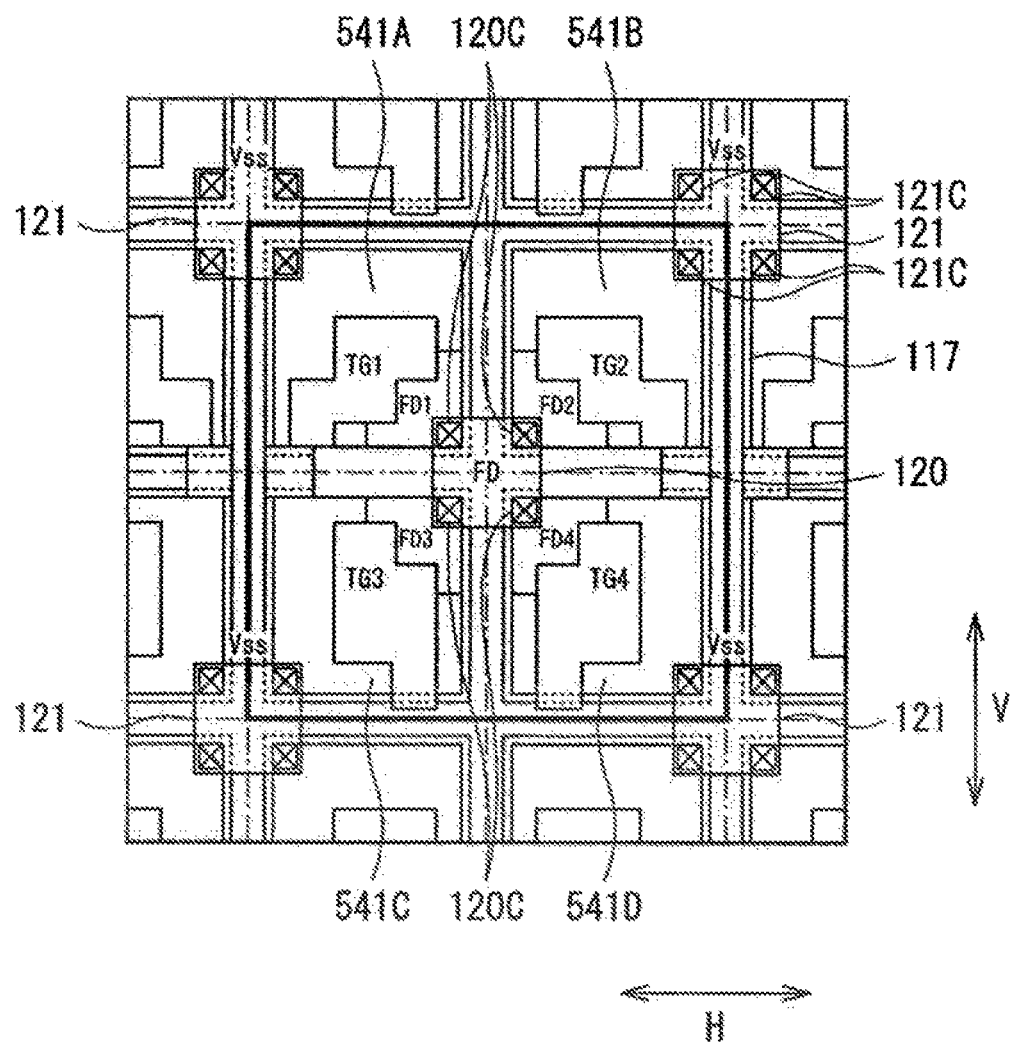
FIG. 73 is a schematic diagram illustrating another example of the planar configuration of the first substrate depicted in FIG. 67.
Figure 74:
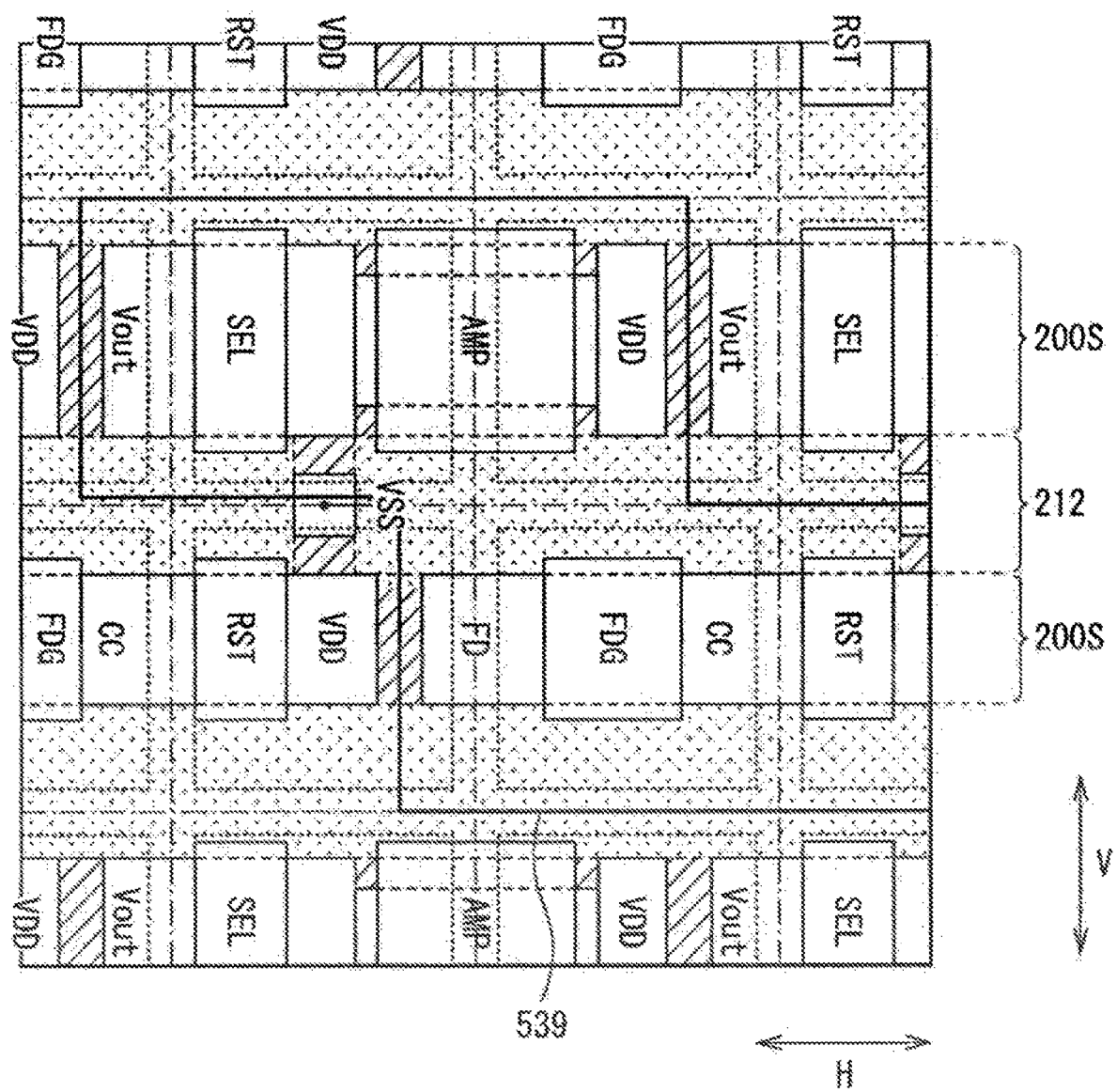
FIG. 74 is a schematic diagram illustrating an example of a planar configuration of a second substrate (semiconductor layer) stacked on the first substrate depicted in FIG. 73.
Figure 75:
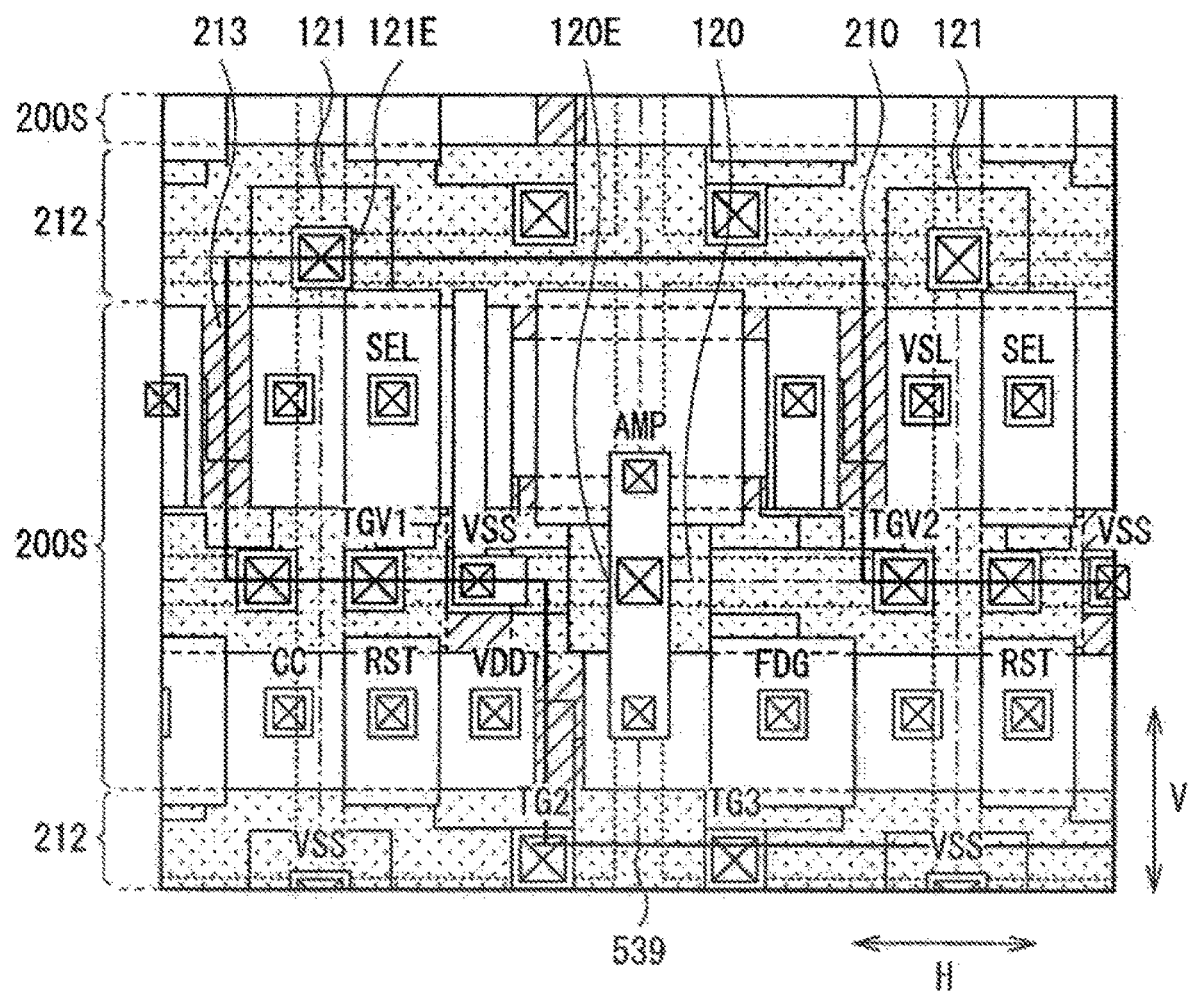
FIG. 75 is a schematic diagram illustrating an example of a planar configuration of a first wiring layer along with a pixel circuit depicted in FIG. 74.
Figure 76:
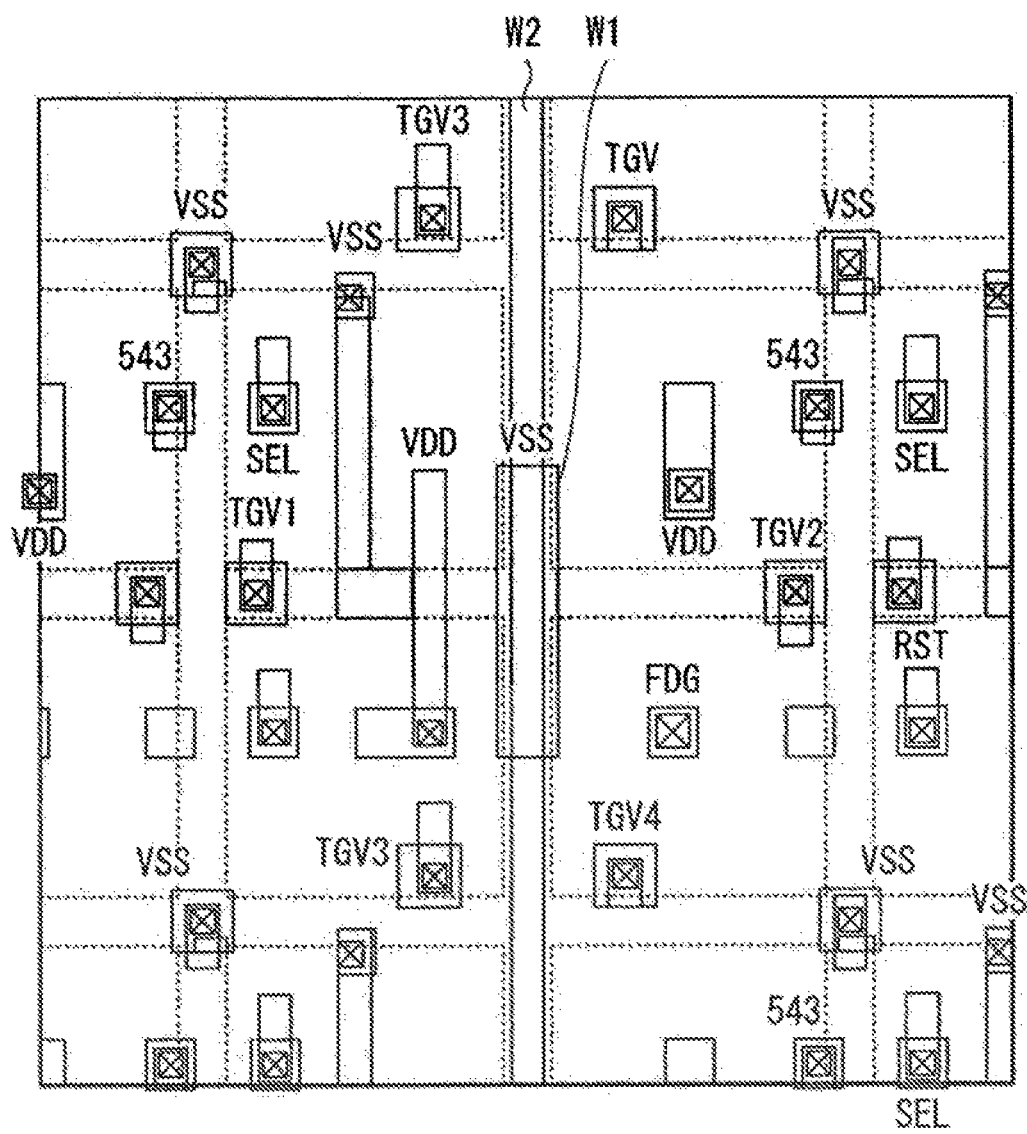
FIG. 76 is a schematic diagram illustrating an example of a planar configuration of a second wiring layer along with the first wiring layer depicted in FIG. 75.
Figure 77:
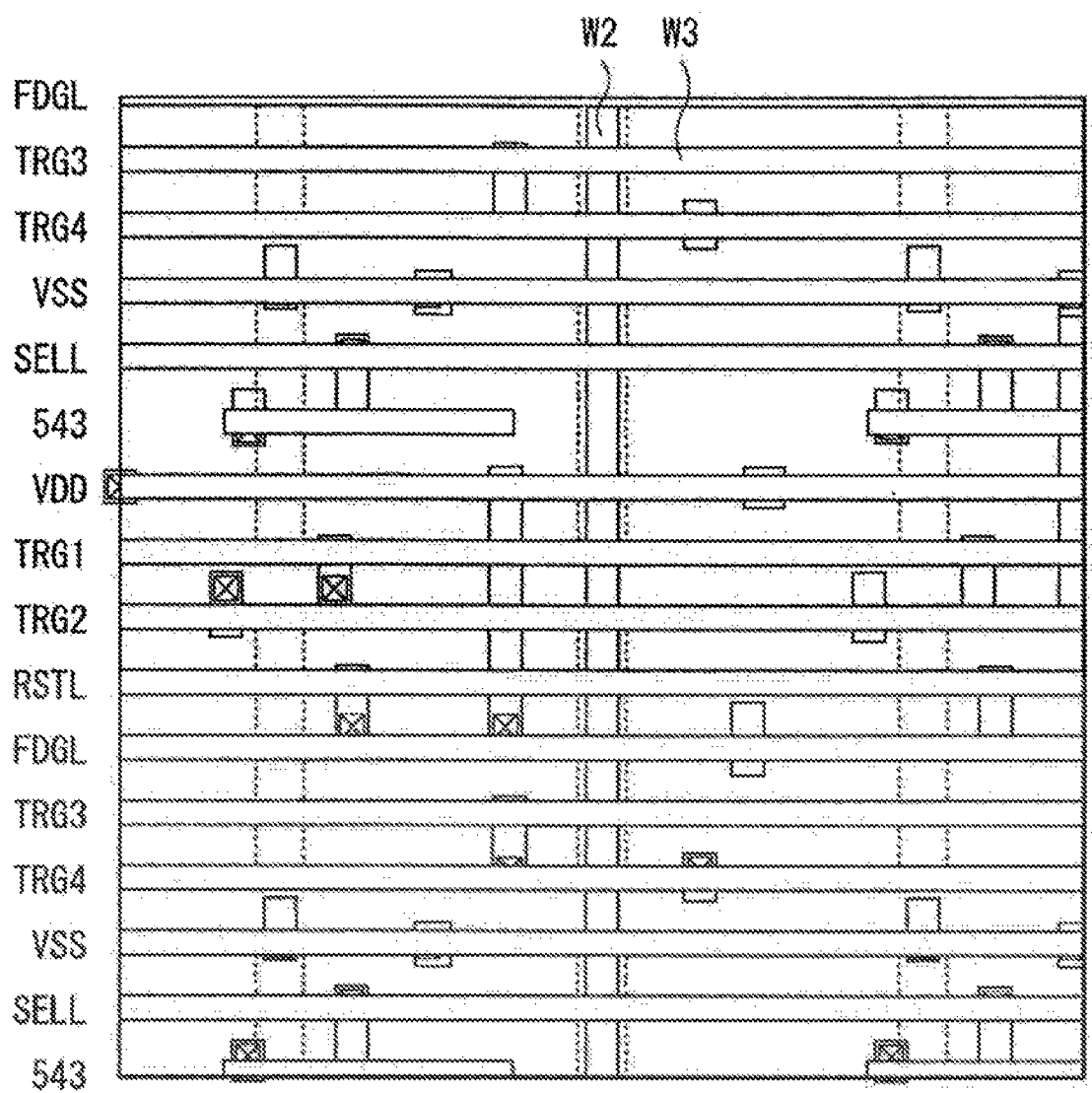
FIG. 77 is a schematic diagram illustrating an example of a planar configuration of a third wiring layer along with the second wiring layer depicted in FIG. 76.
Figure 78:
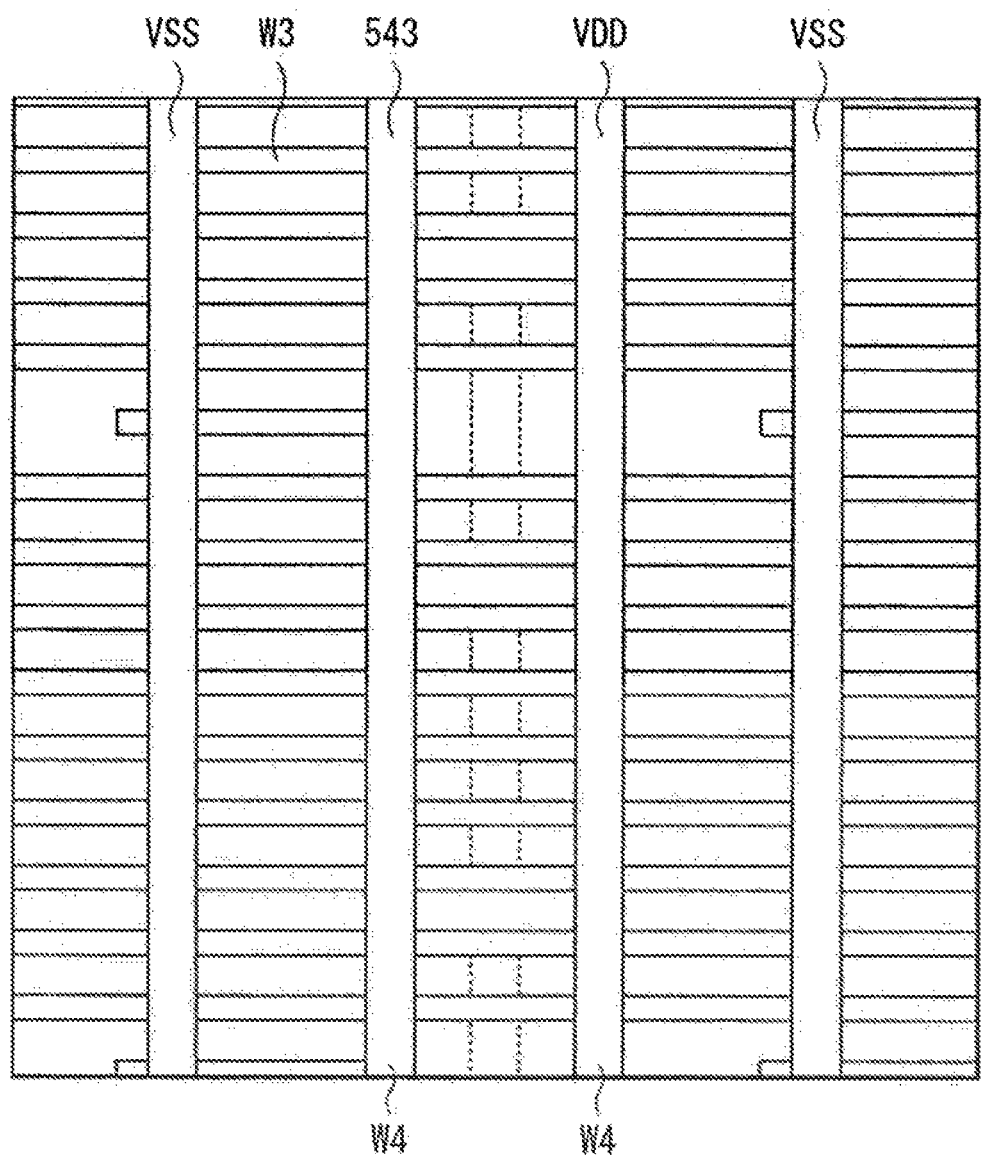
FIG. 78 is a schematic diagram illustrating an example of a planar configuration of a fourth wiring layer along with the third wiring layer depicted in FIG. 77.

FIGS. 73 to 78 illustrate a modified example of a planar configuration of the imaging apparatus 1 according to the above-described embodiments. FIG. 73 schematically illustrates a planar configuration of the first substrate 100, and corresponds to FIG. 54B described above in the embodiments. FIG. 74 schematically illustrates a planar configuration near the front surface of the semiconductor layer 200S in the second substrate 200, and corresponds to FIG. 55 described above in the embodiments. FIG. 75 schematically illustrates the configuration of the first wiring layer W1, the semiconductor layer 200S connected to the first wiring layer W1, and components of the first substrate 100, and corresponds to FIG. 56 described above in the embodiments. FIG. 76 illustrates an example of a planar configuration of the first wiring layer W1 and the second wiring layer W2, and corresponds to FIG. 57 described above in the embodiments. FIG. 77 illustrates an example of a planar configuration of the second wiring layer W2 and the third wiring layer W3, and corresponds to FIG. 58 described above in the embodiments. FIG. 78 illustrates an example of a planar configuration of the third wiring layer W3 and the fourth wiring layer W4, and corresponds to FIG. 59 described above in the embodiments.

In the present modified example, the semiconductor layer 200S in the second substrate 200 extends in the H direction (FIG. 75). In other words, the present modified example substantially corresponds to a configuration obtained by rotating, through 90 degrees, the planar configuration of the imaging apparatus 1 depicted in FIG. 68 and the like described above.

For example, the pixel sharing unit 539 in the first substrate 100 is formed over a pixel region of two rows by two columns and has a generally square planar shape as is the case with the above-described embodiments (FIG. 73). For example, in each pixel sharing unit 539, the transfer gates TG1 and TG2 of the pixels 541A and 541B in one of the pixel rows extend toward the central portion of the pixel sharing unit 539 in the V direction, and the transfer gates TG3 and TG4 of the pixels 541C and 541D in the other pixel row extend toward the outside of the pixel sharing unit 539 in the V direction. The pad portion 120 connected to the floating diffusions FD is provided in the central portion of the pixel sharing unit 539, and the pad portion 121 connected to the VSS contact regions 118 is provided at ends of the pixel sharing unit 539 at least in the V direction (in FIG. 73, in the V direction and the H direction). In this case, the positions of the through vias TGV1 and TGV2 of the transfer gates TG1 and TG2 in the V direction are located closer to the position of the through via 120E in the V direction, and the positions of the through vias TGV3 and TGV4 of the transfer gates TG3 and TG4 in the V direction are located closer to the position of the through via 121E in the V direction (FIG. 75). Consequently, for a reason similar to the reason described above in the embodiments, the width (size in the V direction) of the semiconductor layer 200S extending in the H direction can be increased. Accordingly, the size of the amplifying transistor AMP can be increased, enabling possible noise to be suppressed.

Each pixel circuit 210 includes the select transistor SEL and the amplifying transistor AMP arranged in the H direction, and the reset transistor RST is disposed at a position adjacent to the pixel circuit 210 in the V direction via the select transistor SEL and the insulating region 212 (FIG. 74). The FD conversion gain switching transistor FDG is disposed in juxtaposition with the reset transistor RST in the H direction. The VSS contact region 218 is provided like an island in the insulating region 212. For example, the third wiring layer W3 extends in the H direction (FIG. 77), and the fourth wiring layer W4 extends in the V direction (FIG. 78).

The imaging apparatus 1 including the second substrate 200 as described above also produces effects similar to those described above in the embodiments. The arrangement of the pixel sharing unit 539 in the second substrate 200 is not limited to the arrangement described in the above-described embodiments and the present modified example. For example, the semiconductor layer 200S described in the above-described embodiments and the present modified example may extend in the H direction.

5. Modified Example 4

Figure 79:
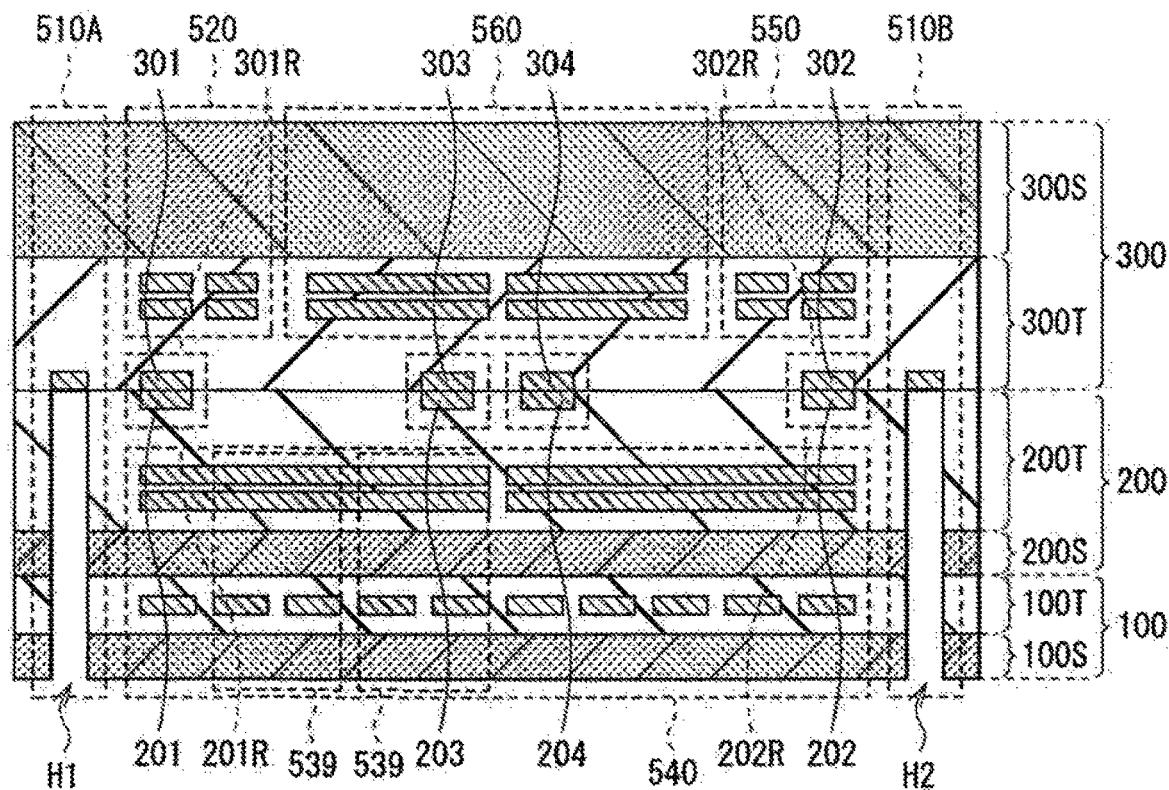
FIG. 79 is a schematic cross-sectional view illustrating another example of the imaging apparatus depicted in FIG. 50.

FIG. 79 schematically illustrates a modified example of a cross-sectional configuration of the imaging apparatus 1 according to the above-described embodiments. FIG. 79 corresponds to FIG. 50 described above in the embodiments. In the present modified example, in addition to the contact portions 201, 202, 301, and 302, the imaging apparatus 1 includes contact portions 203, 204, 303, and 304 at positions opposite to the central portion of the pixel array portion 540. In this regard, the imaging apparatus 1 of the present modified example differs from the imaging apparatus 1 described above in the embodiments.

The contact portions 203 and 204 are provided in the second substrate 200 and exposed at a junction surface between the second substrate 200 and the third substrate 300. The contact portions 303 and 304 are provided in the third substrate 300 and exposed at a junction surface between the third substrate 300 and the second substrate 200. The contact portion 203 is in contact with the contact portion 303, and the contact portion 204 is in contact with the contact portion 304. Specifically, in the imaging apparatus 1, the second substrate 200 and the third substrate 300 are connected by the contact portions 203, 204, 303, and 304 in addition to the contact portions 201, 202, 301, and 302.

Figure 80:
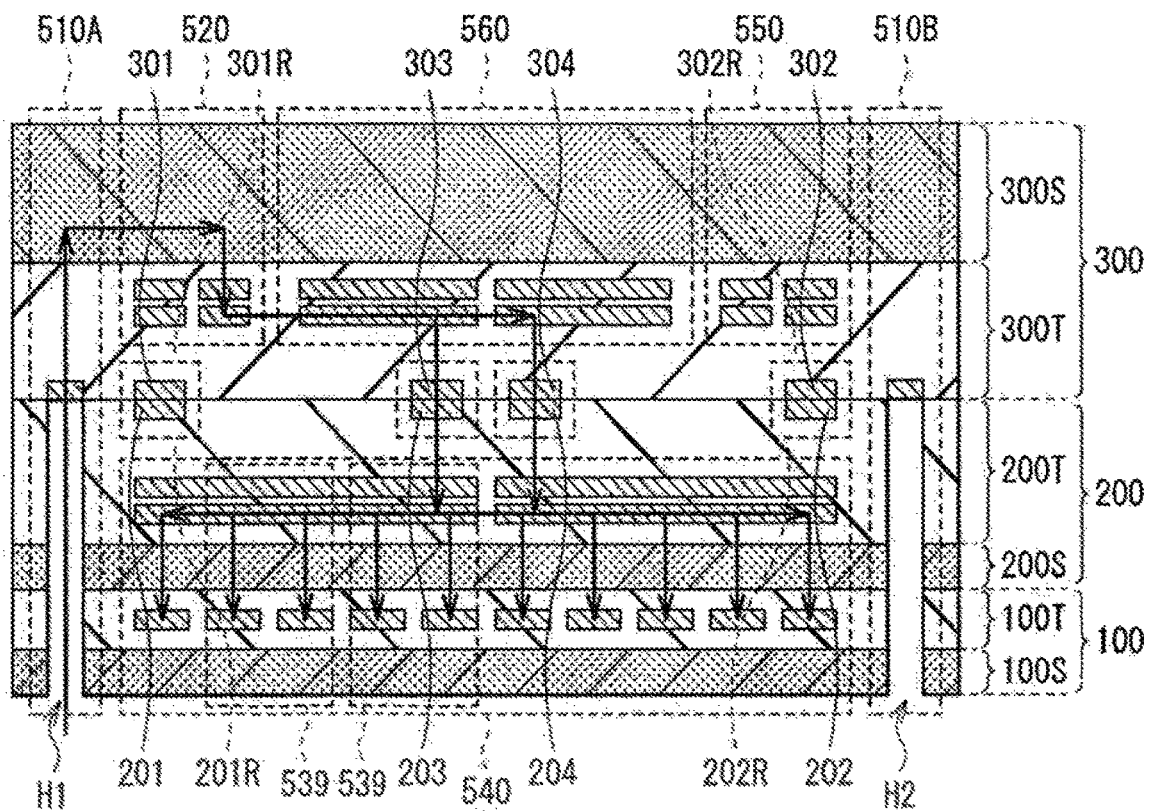
FIG. 80 is a schematic diagram for explaining a path of an input signal to the imaging apparatus depicted in FIG. 79.
Figure 81:
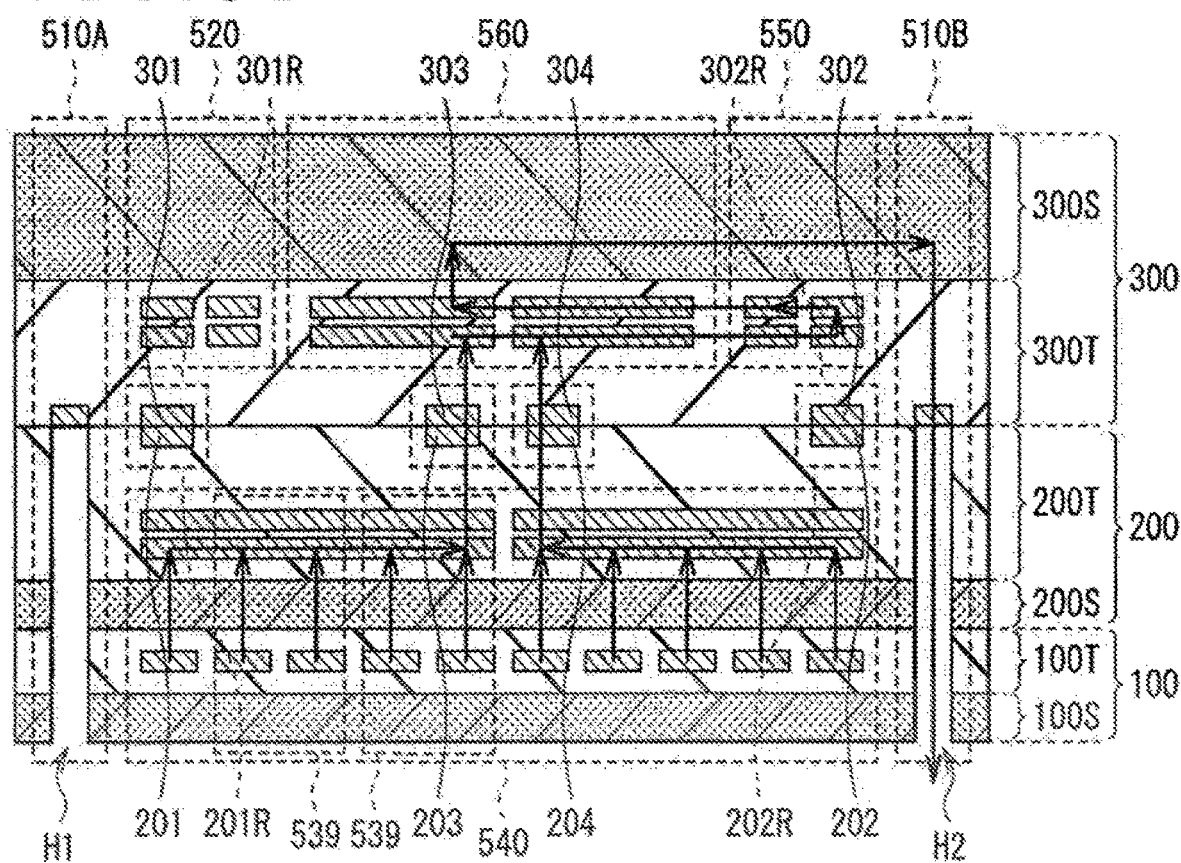
FIG. 81 is a schematic diagram for explaining signal paths of pixel signals from the imaging apparatus depicted in FIG. 79.

Now, operations of the imaging apparatus 1 will be described using FIGS. 80 and 81. In FIG. 80, arrows represent a path of an input signal externally input to the imaging apparatus 1 and paths of the power supply potential and the reference potential. In FIG. 81, arrows represent a signal path of a pixel signal output from the imaging apparatus 1 to the outside. For example, an input signal is input to the imaging apparatus 1 via the input section 510A and then transmitted to the row driving section 520 of the third substrate 300, and the row driving section 520 creates row driving signals. The row driving signals are sent to the second substrate 200 via the contact portions 303 and 203. Further, the row driving signals reach the pixel sharing units 539 in the pixel array portion 540 via the row driving signal lines 542 in the wiring layer 200T. Of the row driving signals having reached the pixel sharing units 539 in the second substrate 200, the driving signals other than those for the transfer gates TG are input to the pixel circuit 210 to drive the transistors included in the pixel circuit 210. The driving signals for the transfer gates TG are input to the transfer gates TG1, TG2, TG3, and TG4 in the first substrate 100 via the through vias TGV to drive the pixels 541A, 541B, 541C, and 541D. Additionally, the power supply potential and the reference potential provided to the input section 510A (input terminal 511) of the third substrate 300 from the outside of the imaging apparatus 1 are sent to the second substrate 200 via the contact portions 303 and 203, and provided to the pixel circuits 210 for the respective pixel sharing units 539 via the wires in the wiring layer 200T. The reference potential is also provided to the pixels 541A, 541B, 541C, and 541D in the first substrate 100 via the through vias 121E. On the other hand, pixel signals obtained by photoelectric conversion by the pixels 541A, 541B, 541C, and 541D in the first substrate 100 are sent to the pixel circuits 210 in the second substrate 200 for the respective pixel sharing units 539. Pixel signals based on the above-described pixel signals are sent from the pixel circuits 210 to the third substrate 300 via the vertical signal lines 543 and the contact portions 202 and 302. The pixel signals are processed by the column signal processing section 550 and the image signal processing section 560 of the third substrate 300, and then the pixel signals processed are output to the outside via the output section 510B.

The imaging apparatus 1 including the contact portions 203, 204, 303, and 304 as described above also produces effects similar to those described above in the embodiments. According to the design of the circuit in the third substrate 300, to which the wires are connected via the contact portions 303 and 304, the positions, the number, and the like of the contact portions can be changed.

6. Modified Example 5

Figure 82:
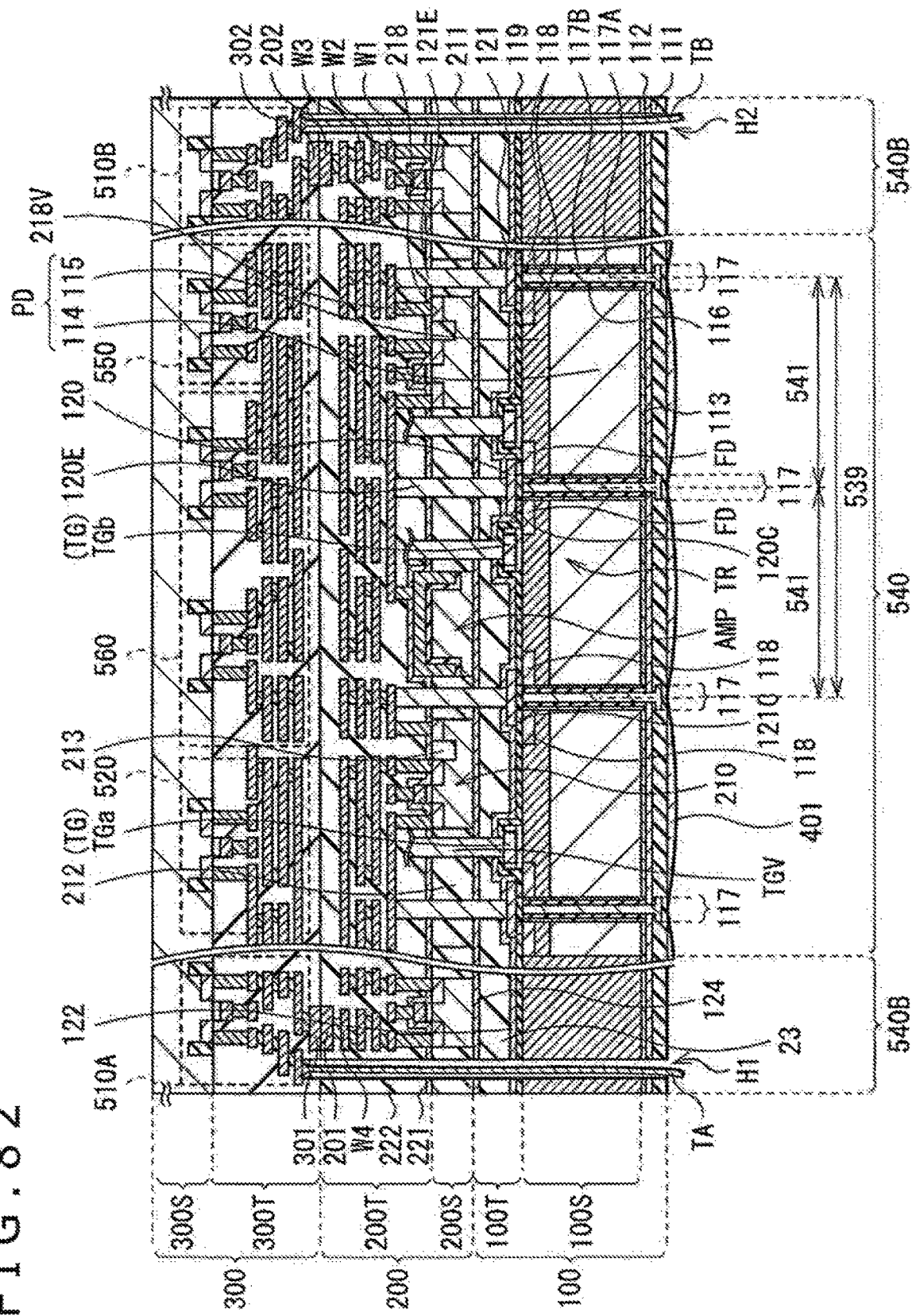
FIG. 82 is a schematic cross-sectional view illustrating another example of the imaging apparatus depicted in FIG. 53.

FIG. 82 illustrates a modified example of a cross-sectional configuration of the imaging apparatus 1 according to the above-described embodiments. FIG. 82 corresponds to FIG. 53 described above in the embodiments. In the present modified example, the first substrate 100 is provided with transfer transistors TR having a planar structure. In this regard, the imaging apparatus 1 of the present modified example differs from the imaging apparatus 1 described above in the embodiments.

In the transfer transistor TR, the transfer gate TG includes only the horizontal portion TGb. In other words, the transfer gate TG does not include the vertical portion TGa, and is provided facing the semiconductor layer 100S.

The imaging apparatus 1 including the transfer transistors TR of the planar structure as described above also produces effects similar to those of the above-described embodiments. Further, compared to the first substrate 100 provided with vertical transfer transistors TR, the first substrate 100 provided with the planar transfer gates TG may allow the photodiodes PD to be formed closer to the front surface of the semiconductor layer 100S, thus increasing a saturation signal amount (Qs). Additionally, the method of forming the planar transfer gates TG in the first substrate 100 includes fewer manufacturing steps than the method of forming the vertical transfer gates TG in the first substrate 100, and may be unlikely to affect the photodiodes PD in connection with the manufacturing steps.

7. Modified Example 6

Figure 83:
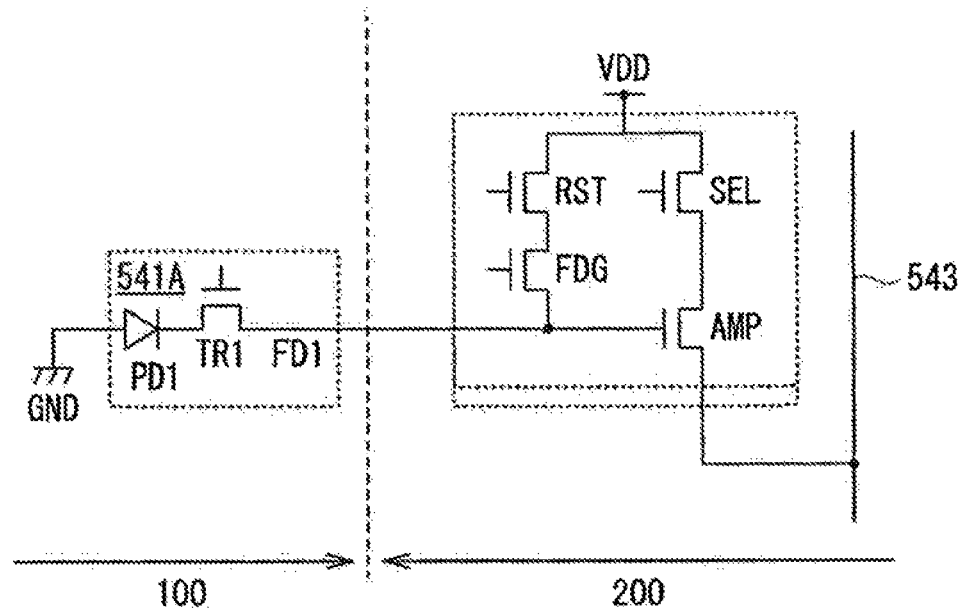
FIG. 83 is a diagram illustrating another example of the equivalent circuit depicted in FIG. 51.

FIG. 83 illustrates a modified example of a pixel circuit in the imaging apparatus 1 according to the above-described embodiments. FIG. 83 corresponds to FIG. 51 described above in the embodiments. In the present modified example, each pixel (pixel 541A) is provided with the pixel circuit 210. In other words, the pixel circuit 210 is not shared among a plurality of pixels. In this regard, the imaging apparatus 1 in the present modified example differs from the imaging apparatus 1 described above in the embodiments.

The imaging apparatus 1 in the present modified example is identical to the imaging apparatus 1 described above in the embodiments in that the substrate in which the pixels 541 are provided differs from the substrate in which the pixel circuits 210 are provided (first substrate 100 and second substrate 200). Thus, the imaging apparatus 1 in the present modified example can also produce effects similar to those described above in the embodiments.

8. Modified Example 7

Figure 84:
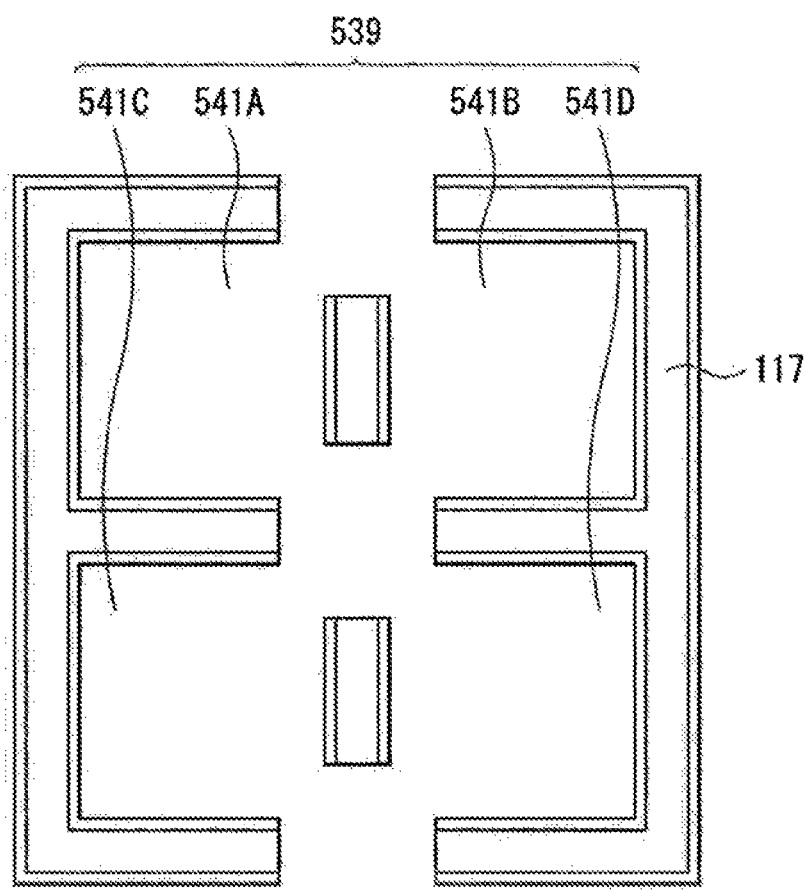

FIG. 84 illustrates a modified example of a planar configuration of the pixel isolation portion 117 described above in the embodiments. Gaps may be formed in the pixel isolation portion 117 enclosing the pixels 541A, 541B, 541C, and 541D. In other words, not the entire periphery of the pixels 541A, 541B, 541C, and 541D need be enclosed by the pixel isolation portion 117. For example, the gaps in the pixel isolation portion 117 are provided near the pad portions 120 and 121 (FIG. 54B).

In the above-described embodiments, an example has been described in which the imaging apparatus 1 includes the FTI structure with the pixel isolation portion 117 penetrating the semiconductor layer 100S (see FIG. 53). However, the pixel isolation portion 117 may have a configuration other than the FTI structure. For example, the pixel isolation portion 117 need not be provided, completely penetrating the semiconductor layer 100S, and may include what is generally called a DTI (Deep Trench Isolation) structure.

9. Applied Example

Figure 85:
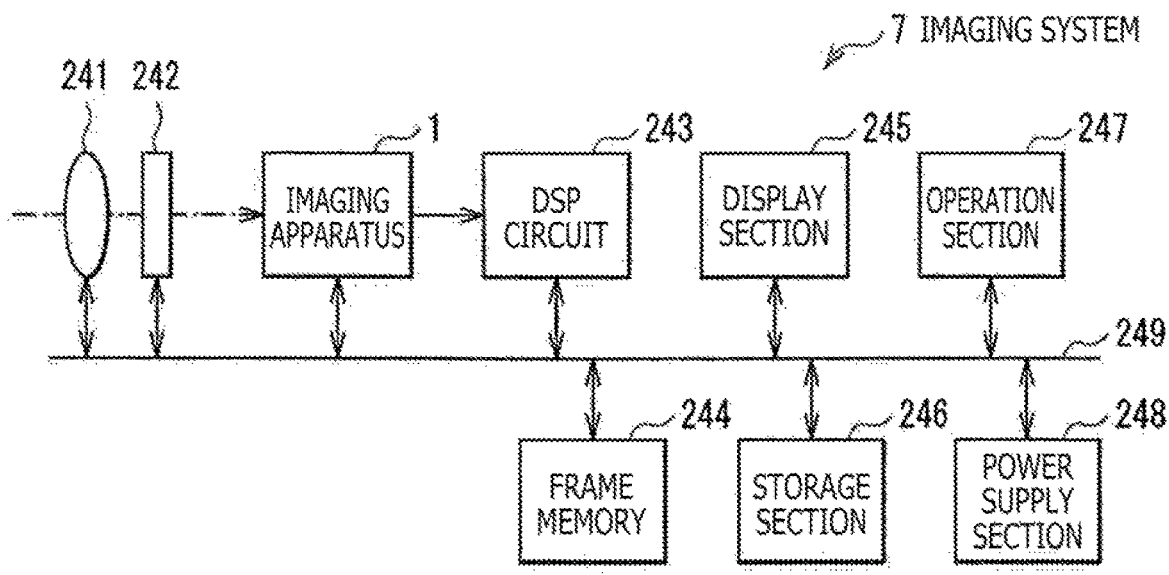
FIG. 85 is a diagram illustrating an example of a general configuration of an imaging system including an imaging apparatus according to the above-described embodiments and modified examples of the embodiments.

FIG. 85 illustrates an example of a general configuration of an imaging system 7 including the imaging apparatus 1 according to the above-described embodiments and the modified examples of the embodiments.

The imaging system 7 is, for example, an imaging apparatus such as a digital still camera or a video camera, or electronic equipment such as a portable terminal apparatus such as a smartphone or a tablet terminal. The imaging system 7 includes, for example, the imaging apparatus 1 according to above-described embodiments and the modified examples of the embodiments, a DSP circuit 243, a frame memory 244, a display section 245, a storage section 246, an operation section 247, and a power supply section 248. In the imaging system 7, a bus line 249 is used to connect together the imaging apparatus 1 according to above-described embodiments and the modified examples of the embodiments, the DSP circuit 243, the frame memory 244, the display section 245, the storage section 246, the operation section 247, and the power supply section 248.

The imaging apparatus 1 according to above-described embodiments and the modified examples of the embodiments outputs image data according to incident light. The DSP circuit 243 is a signal processing circuit processing signals (image data) output from the imaging apparatus 1 according to above-described embodiments and the modified examples of the embodiments. The frame memory 244 temporarily holds, in frame units, the image data processed by the DSP circuit 243. The display section 245, for example, includes a panel display apparatus such as a liquid crystal panel or an organic EL (Electro Luminescence) panel, and displays moving images or still images captured by the imaging apparatus 1 according to above-described embodiments and the modified examples of the embodiments. The storage section 246 records, in a recording medium such as a semiconductor memory or a hard disk, image data of moving images or still images captured by the imaging apparatus 1 according to above-described embodiments and the modified examples of the embodiments. The operation section 247 issues operation instructions for various functions of the imaging system 7, according to operation of a user. The power supply section 248 provides various power supplies used as operating power supplies for the imaging apparatus 1 according to above-described embodiments and the modified examples of the embodiments, the DSP circuit 243, the frame memory 244, the display section 245, the storage section 246, the operation section 247, and the power supply section 248 to supply power to these supply targets as appropriate.

Now, an imaging procedure in the imaging system 7 will be described.

Figure 86:
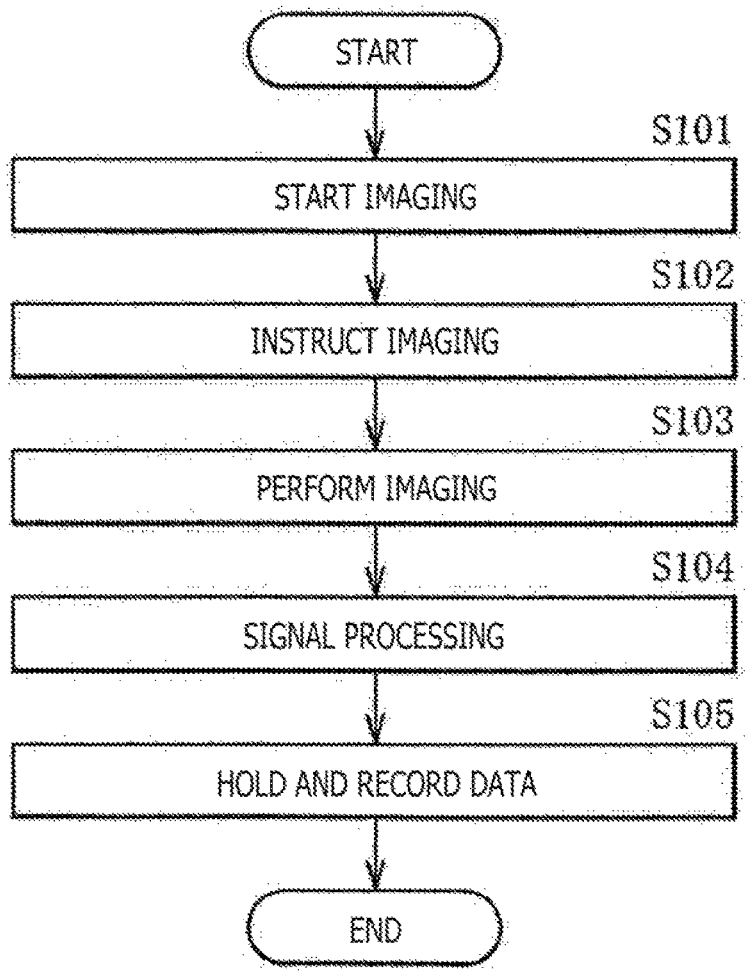
FIG. 86 is a diagram illustrating an example of an imaging procedure of the imaging system depicted in FIG. 85.

FIG. 86 illustrates an example of a flowchart of an imaging operation in the imaging system 7. The user operates the operation section 247 to instruct that imaging be started (step S101). Then, the operation section 247 transmits an imaging instruction to the imaging apparatus 1 (step S102). In response to reception of the imaging instruction, the imaging apparatus 1 (specifically, the system control circuit 36) performs imaging according to a predetermined imaging scheme (step S103).

The imaging apparatus 1 outputs, to the DSP circuit 243, image data obtained by imaging. Here, the image data refers to data of all pixels in pixel signals generated on the basis of the charge temporarily held in the floating diffusions FD. The DSP circuit 243 executes predetermined signal processing (for example, noise reduction processing and the like) on the basis of the image data input from the imaging apparatus 1 (step S104). The DSP circuit 243 causes the frame memory 244 to hold the image data subjected to the predetermined signal processing, and the frame memory 244 causes the storage section 246 to store the image data (step S105). The imaging in the imaging system 7 is performed as described above.

In the present applied example, the imaging apparatus 1 according to the above-described embodiments and the modified examples is applied to the imaging system 7. This enables a reduction in the size of the imaging apparatus 1 and an increase in definition of the imaging apparatus 1, thus allowing provision of the imaging system 7 with a reduced size or an increased definition.

Additionally, the solid-state imaging apparatuses 1A, $1B_1$, $1B_2$, 1C, 1D, and 1E according to the first to sixth embodiments described above are also applied to the imaging system 7.

Additionally, solid-state imaging apparatuses 1F, 1G, and 1H according to eighth to tenth embodiments described below are also applied to the imaging system 7.

10. Applied Example

Applied Example 1

The technology according to the present disclosure can be applied to various products. For example, the technology according to the present disclosure can be implemented as an apparatus mounted in any type of moving body such as an automobile, an electric vehicle, a hybrid electric vehicle, a motorcycle, a bicycle, personal mobility, an airplane, a drone, a ship, and a robot.

Figure 87:
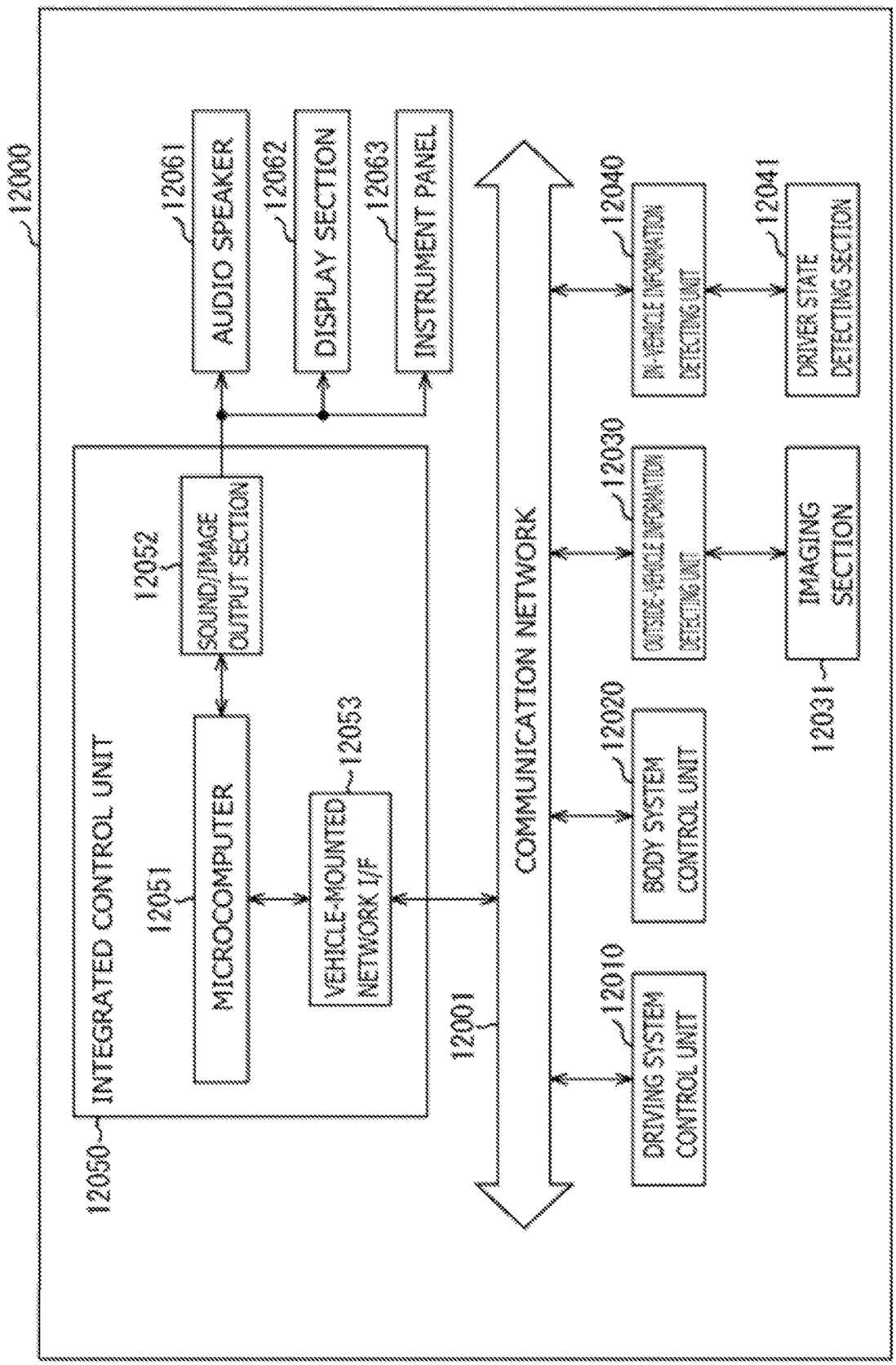
FIG. 87 is a block diagram depicting an example of schematic configuration of a vehicle control system.

FIG. 87 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 87, the vehicle control system 12000 includes a driving system control unit. 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit. 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 87, an audio speaker 12061, a display section 12062, and an instrument panel 12063 are illustrated as the output device. The display section 12062 may, for example, include at least one of an on-board display and a head-up display.

Figure 88:
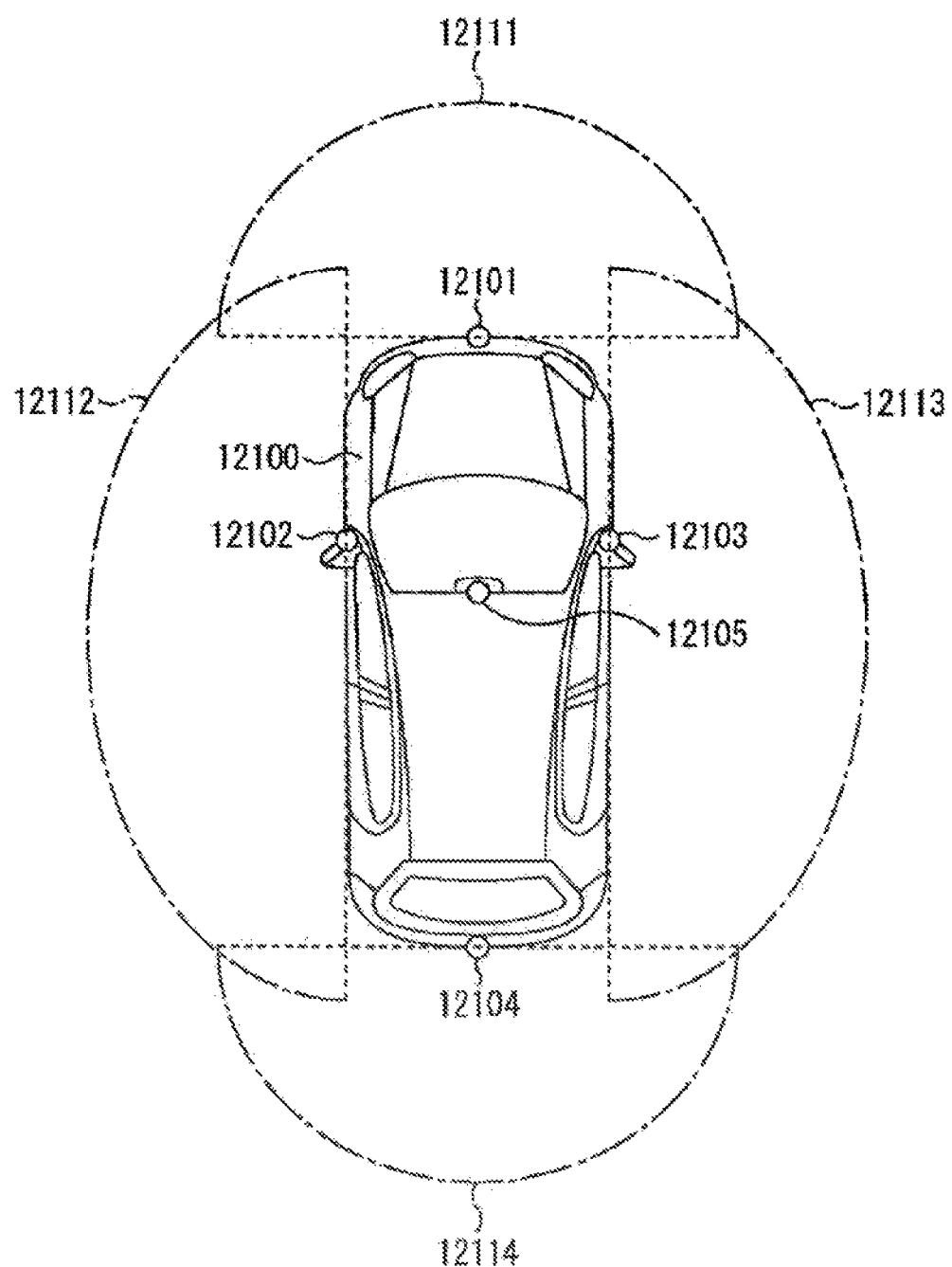
FIG. 88 is a diagram of assistance in explaining an example of installation positions of an outside-vehicle information detecting section and an imaging section.

FIG. 88 is a diagram depicting an example of the installation position of the imaging section 12031.

In FIG. 88, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 88 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the mobile body control system to which the technology according to the present disclosure is applied has been described. The technology according to the present disclosure can be applied to the imaging section 12031 included in the above-described configuration. Specifically, the following can be applied to the imaging section 12031: the imaging apparatus 1 according to the above-described embodiments and the modified examples of the embodiments, the solid-state imaging apparatuses 1A to 1E according to the first to sixth embodiments described above, and solid-state imaging apparatuses 1F, 1G, and 1H according to eighth to tenth embodiments described below. By applying the technology according to the present disclosure to the imaging section 12031, imaged images with reduced noise can be obtained, allowing the mobile body control system to perform accurate control utilizing the imaged images.

Applied Example 2

Figure 89:
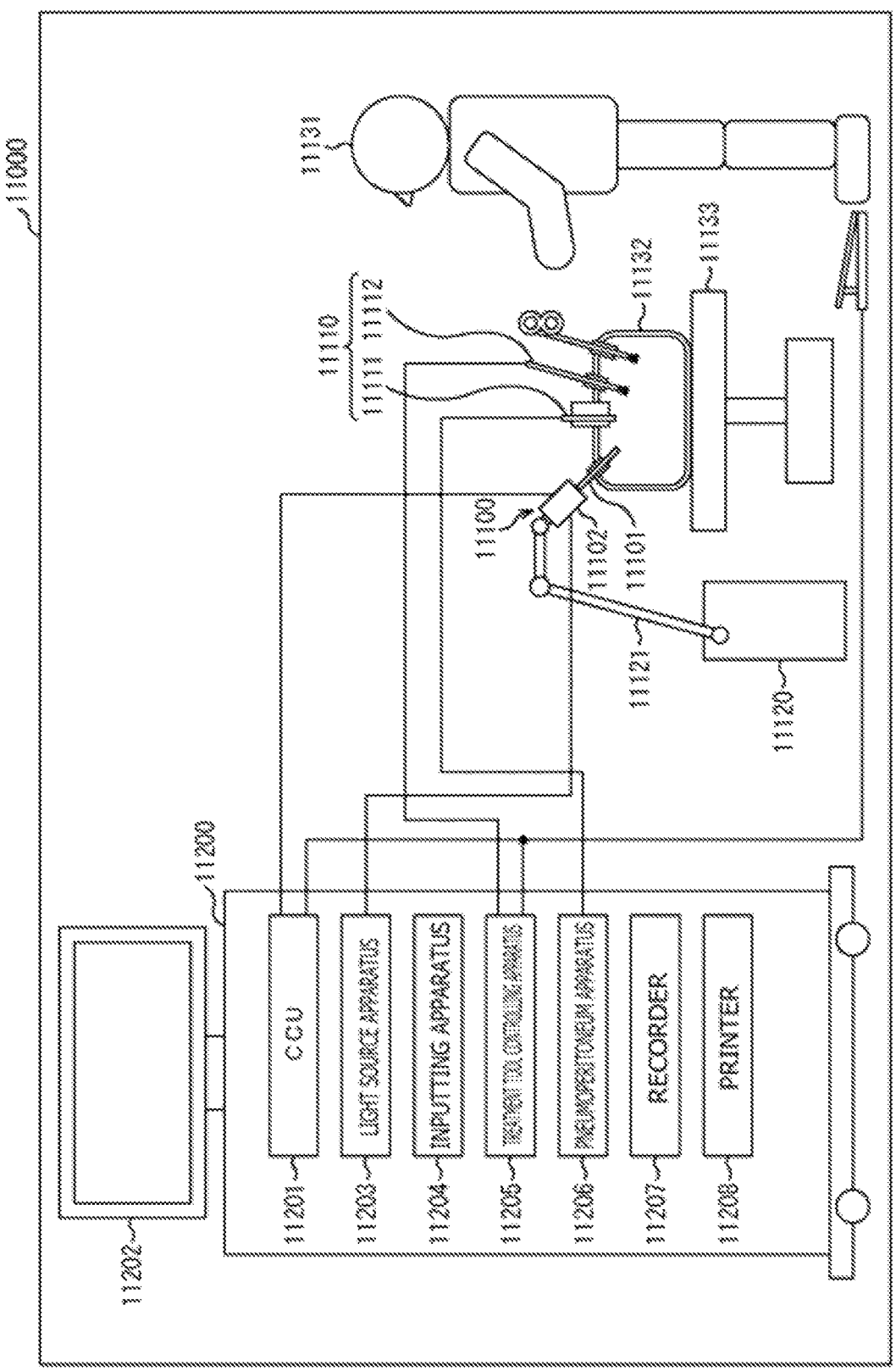
FIG. 89 is a view depicting an example of a schematic configuration of an endoscopic surgery system.

FIG. 89 is a view depicting an example of a schematic configuration of an endoscopic surgery system to which the technology according to an embodiment of the present disclosure (present technology) can be applied.

In FIG. 89, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LE) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A Printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light, of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band at and/or excitation light suitable for special light observation as described above.

Figure 90:
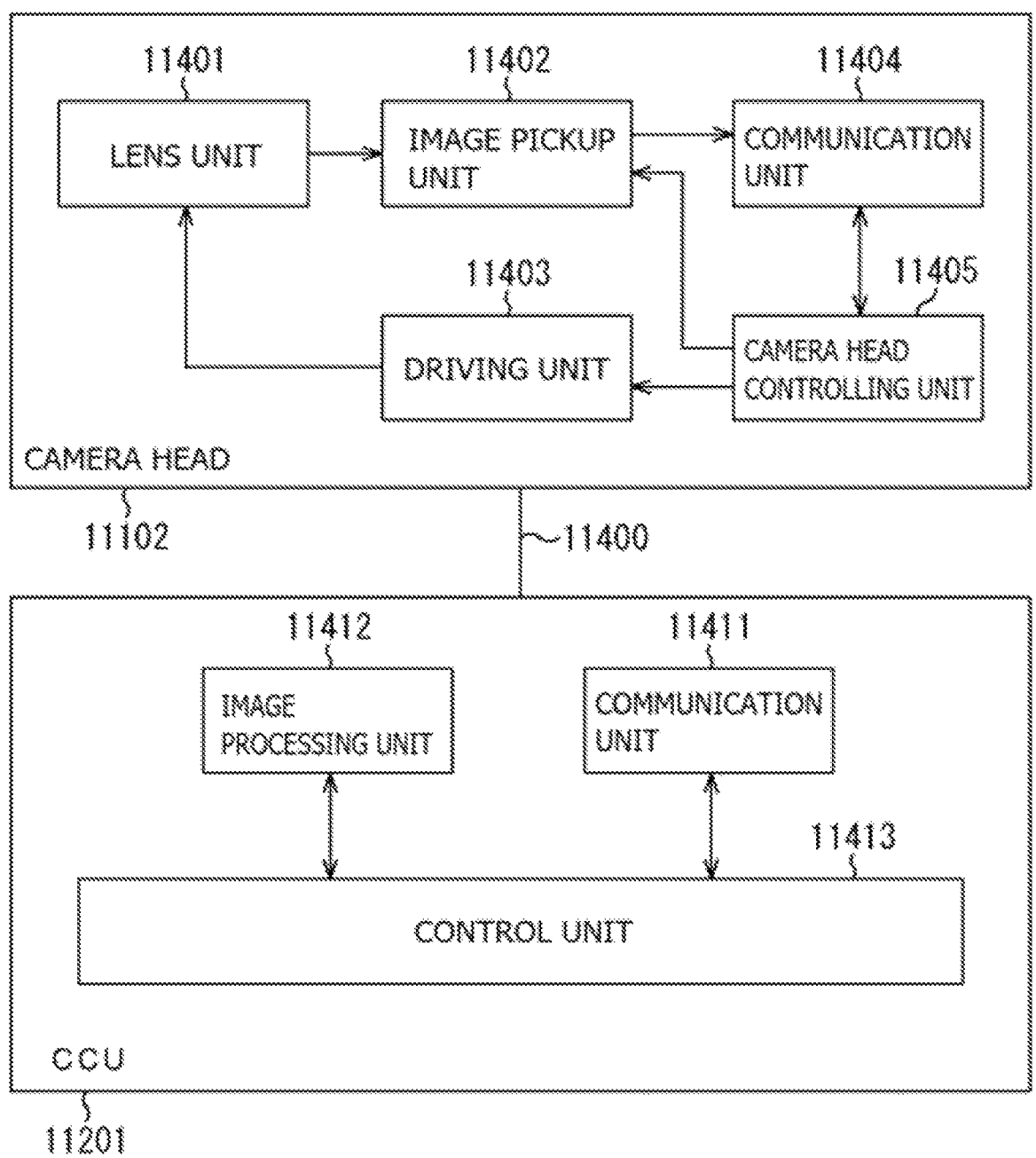
FIG. 90 is a block diagram depicting an example of a functional configuration of a camera head and a camera control unit (CCU).

FIG. 90 is a block diagram depicting an example of a functional configuration of the camera head 11102 and the CCU 11201 depicted in FIG. 89.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applied has been described. The technology according to the present disclosure can be suitably applied to the image pickup unit 11402 included in the above-described configuration and provided in the camera head 11102 of the endoscope 11100. By applying the technology according to the present disclosure to the imaging section 1402, a reduced size and an increased definition of the image pickup unit 11402 can be achieved, allowing the endoscope with a reduced size or an increased definition to be provided.

Eighth Embodiment

<Configuration of Solid Imaging Apparatus>

A solid-state imaging apparatus 1F according to an eighth embodiment of the present technology is basically configured similarly to the solid-state imaging apparatus $1B_2$ according to the third embodiment described above but differs from the solid-state imaging apparatus $1B_2$ in the configuration of the MIS contact portion, the first insulating layer, and the conductive plug.

Figure 91A:
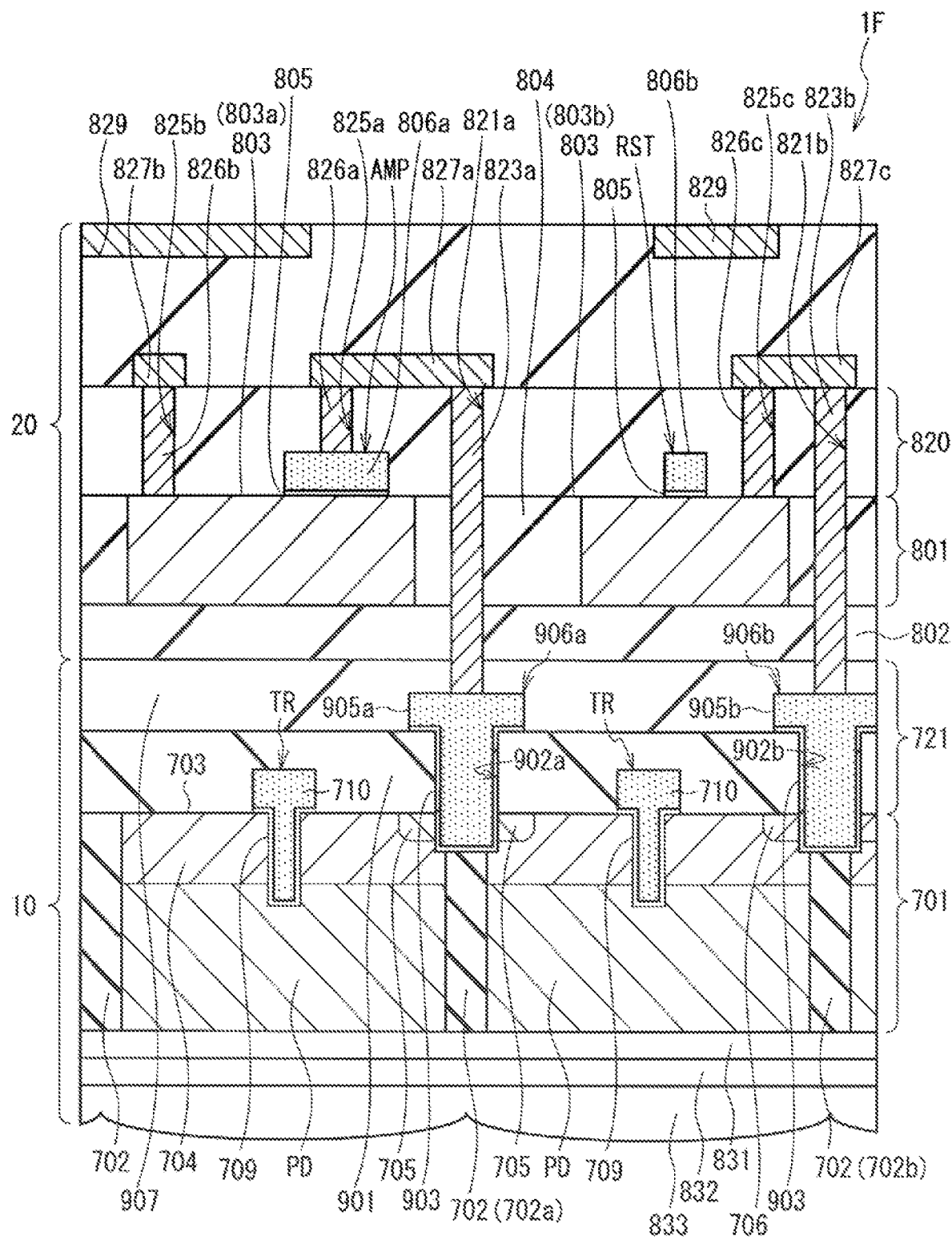
FIG. 91A is a cross-sectional view of a main part of a pixel unit of a solid-state imaging apparatus according to an eighth embodiment of the present technology.

Specifically, as depicted in FIG. 91A, the solid-state imaging apparatus 1F according to the eighth embodiment of the present technology includes MIS contact portions 906a and 906b, an insulating layer 721 used as a first insulating layer, and conductive plugs 923a and 923b according to the third embodiment, which are depicted in FIG. 26, instead of the MIS contact portions 840a and 840b, the insulating layer 720 used as a first insulating layer, and the conductive plugs 823a and 823b. The remaining part of the configuration is substantially similar to the corresponding part of the third embodiment described above.

As depicted in FIG. 91A, the insulating layer 721 includes an interlayer insulating film 901 provided on the semiconductor layer 701 in such a manner as to cover the island region 703 and the element isolation region (isolation region) 702, and an interlayer insulating film 907 provided on the interlayer insulating film 901 in such a manner as to cover conductive pads 905a and 905b described below. Each of the interlayer insulating films 901 and 907 includes, for example, one of a silicon oxide film (SiO), a silicon nitride film (SiN), a silicon oxynitride film (SiON), or a silicon carbonitride film (SiCN), or a stack film in which two or more of the above-described films are stacked.

As depicted in FIG. 91A, the MIS contact portion 906a includes the conductive pad 905a located across the contact regions 705 adjacent to each other via the element isolation region 702 and connected to side surfaces of the contact regions 705 via the insulating film 903. In other words, the MIS contact portion 906a includes the contact region 705, the insulating film 903, and the conductive pad 905a.

Additionally, as depicted in FIG. 91A, the MIS contact portion 906b includes the conductive pad 905b located across the contact regions 706 adjacent to each other via the element isolation region 702 and connected to side surfaces of the contact regions 706 via the insulating film 903. In other words, the MIS contact portion 906b includes the contact region 706, the insulating film 903, and the conductive pad 905b.

Figure 91B:
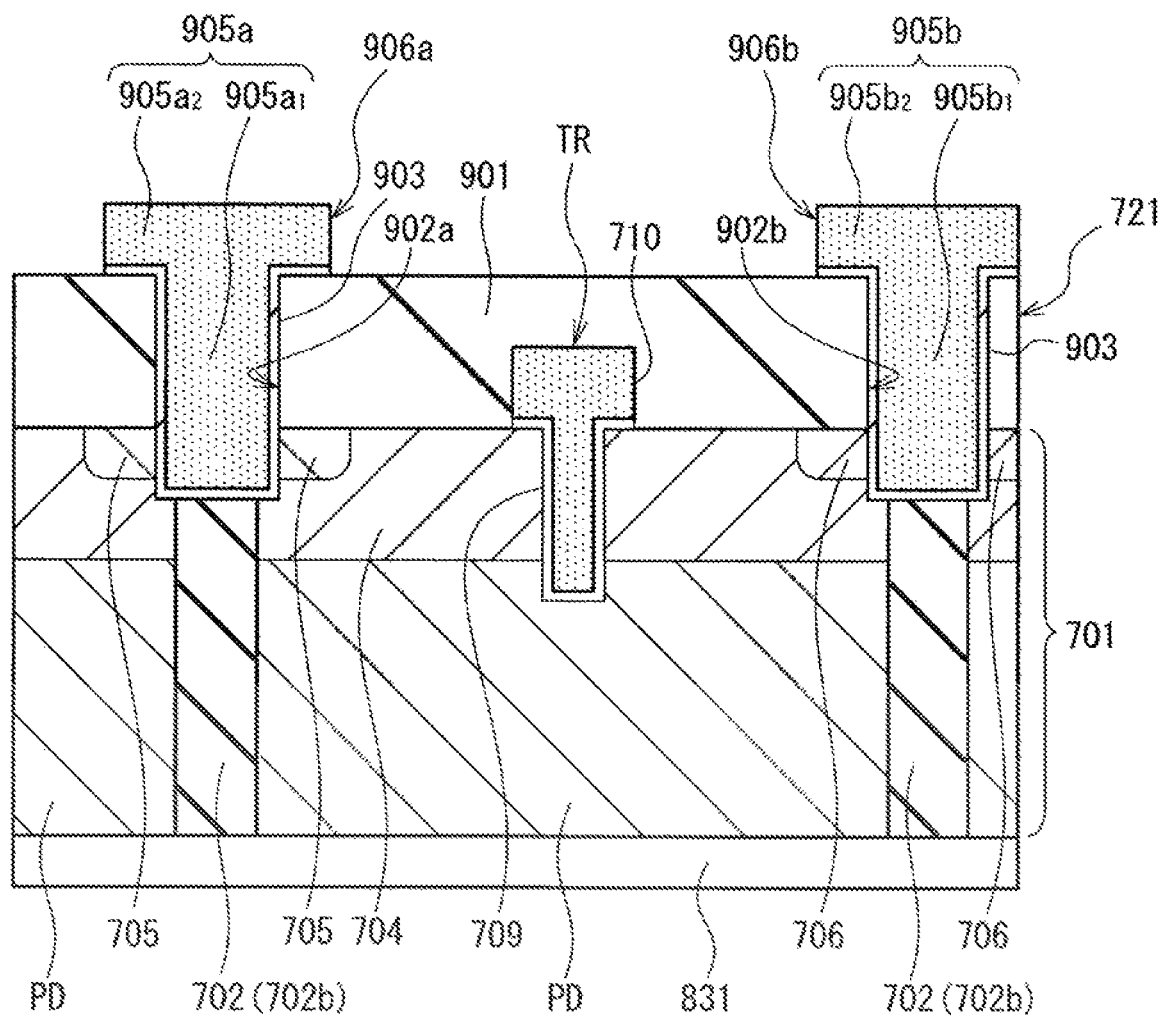
FIG. 91B is a cross-sectional view of a main part corresponding to an enlarged view of a part of FIG. 91A.
Figure 91C:
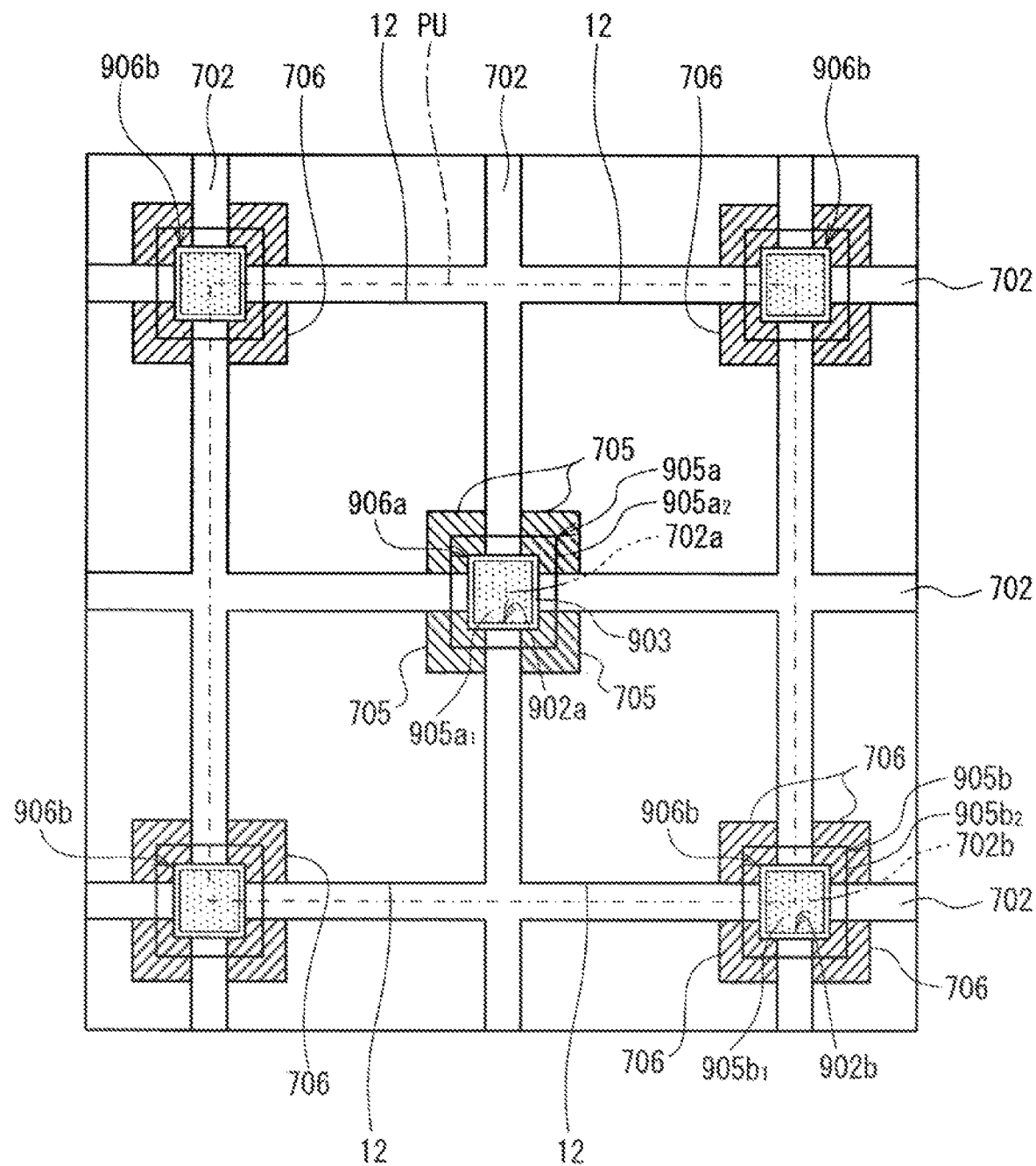
FIG. 91C is a diagram depicting arrangement of contact regions and the shape of conductive pads in the pixel unit of the solid-state imaging apparatus according to the eighth embodiment of the present technology.

As depicted in FIGS. 91B and 91C, the conductive pad 905a of the MIS contact portion 906a is connected via the insulating film 903 to the side surfaces of the four contact regions 705 adjacent to one another, at the first intersecting portion 702a of the element isolation region 702. The conductive pad 905a includes a body portion $905a_1$ connected via the insulating film 903 to the side surfaces of the four contact regions 705 in a recessed portion 902a provided on a major surface side (on the side of a first surface opposite to a second surface) of the semiconductor layer 701, and a head portion $905a_2$ that is formed integrally with the body portion $905a_1$ and that has a larger width than that of the body portion $905a_1$. In the eighth embodiment, the recessed portion 902a extends from an upper surface side of the interlayer insulating film 901 to the semiconductor layer 701. The body portion $905a_1$ is embedded in the recessed portion 902a. The head portion $905a_2$ of the conductive pad 905a protrudes from the recessed portion 902a. The insulating film 903 is provided in such a manner as to cover side wall surfaces and a bottom surface in the recessed portion 902a. The bottom surface of the recessed portion 902a is preferably formed at a position deeper than that of the contact regions 705, in other words, at a depth where the bottom surface is located closer to a light incident surface side (the side of the second surface opposite to the first surface) of the semiconductor layer 701 than the contact regions 705. Additionally, the body portion $905a_1$ of the conductive pad 905a is preferably formed protruding beyond the contact regions 705 toward the light incident surface side of the semiconductor layer 701.

As depicted in FIGS. 91B and 91C, the conductive pad 905b of the MIS contact portion 906b is connected via the insulating film 903 to the side surfaces of the four contact regions 706 adjacent to one another, at the second intersecting portion 702b of the element isolation region 702. The conductive pad 905b includes a body portion $905b_1$ connected via the insulating film 903 to the side surfaces of the four contact regions 706 in a recessed portion 902b provided on the major surface side of the semiconductor layer 701, and a head portion $905b_2$ that is formed integrally with the body portion $905b_1$ and that has a larger width than that of the body portion $905b_1$. In the eighth embodiment, the recessed portion 902b extends from the upper surface side of the interlayer insulating film 901 to the semiconductor layer 701. The body portion $905a_1$ is embedded in the recessed portion 902b. The head portion $905b_2$ of the conductive pad 905b protrudes from the recessed portion 902b. The insulating film 903 is provided in such a manner as to cover side wall surfaces and a bottom surface in the recessed portion 902b. The bottom surface of the recessed portion 902b is also preferably formed at a position deeper than that of the contact regions 706, in other words, at a depth where the bottom surface is located closer to a light incident surface side (the side of the second surface opposite to the first surface) of the semiconductor layer 701 than the contact regions 706. Additionally, the body portion $905b_1$ of the conductive pad 905b is preferably formed protruding beyond the contact regions 706 toward the light incident surface side of the semiconductor layer 701.

As depicted in FIGS. 91B and 91C, the head portions 905a2 and 905b2 of the respective conductive pads 905a and 905b each have, for example, a square planar shape in plan view. Additionally, the body portions $905a_1$ and $905b_1$ and recessed portions 901a and 901b of the respective conductive pads 905a and 905b each have, for example, a square planar shape in plan view.

The conductive pads 905a and 905b include a polycrystal silicon film (doped polysilicon film) into which impurities reducing a resistance value are introduced during or after film formation, for example. The insulating film 903 is an amorphous film and may include, for example, a titanium oxide film ($TiO_2$ film) or a strontium titanate film ($SrTiO_x$ film).

Like the MIS contact portions 840a and 840b of the second and third embodiments described above, the MIS contact portions 906a and 906b enable contact offering lower resistance than a junction between polycrystal silicon (conductive pad 905a, 905b) and crystal silicon (contact region 705, 706) by blocking, by means of the insulating film 903, a wave function for electrons penetrating a band-gap of the semiconductor (contact region 705, 706) from the metal (polycrystal silicon film) side, or utilizing an interface dipole generated at an insulating film/semiconductor (contact region 705, 706) interface to generate an electric field effectively reducing Schottky barriers.

As depicted in FIG. 91A, the conductive pad 905a of the MIS contact portion 906a is electrically connected to the wire 827a via the conductive plug 923a embedded in a connection hole 921a extending from the front surface (upper surface) of the insulating layer 820 to the front surface of the head portion $905a_2$ of the conductive pad 905a. As is the case with the first and third embodiments described above, the wire 827a is electrically connected, via the conductive plug 826a embedded in the connection hole 825a, to the gate electrode 806a of the amplifying transistor AMP provided in the second substrate portion 20.

As depicted in FIG. 91A, the conductive pad 905b of the MIS contact portion 906b is electrically connected to the wire 827c via the conductive plug 923b embedded in a connection hole 921b extending from the front surface (upper surface) of the insulating layer 820 to the front surface of the head portion $905b_2$ of the conductive pad 905b. As is the case with the first and third embodiments described above, the wire 827c is electrically connected, via the conductive plug 826c embedded in the connection hole 825c, to the island region 803b provided in the second substrate portion 20.

<Method for Manufacturing Solid-State Imaging Apparatus>

Now, a method for manufacturing a solid-state imaging apparatus 1F according to an eighth embodiment of the present technology will be described.

Figure 92:
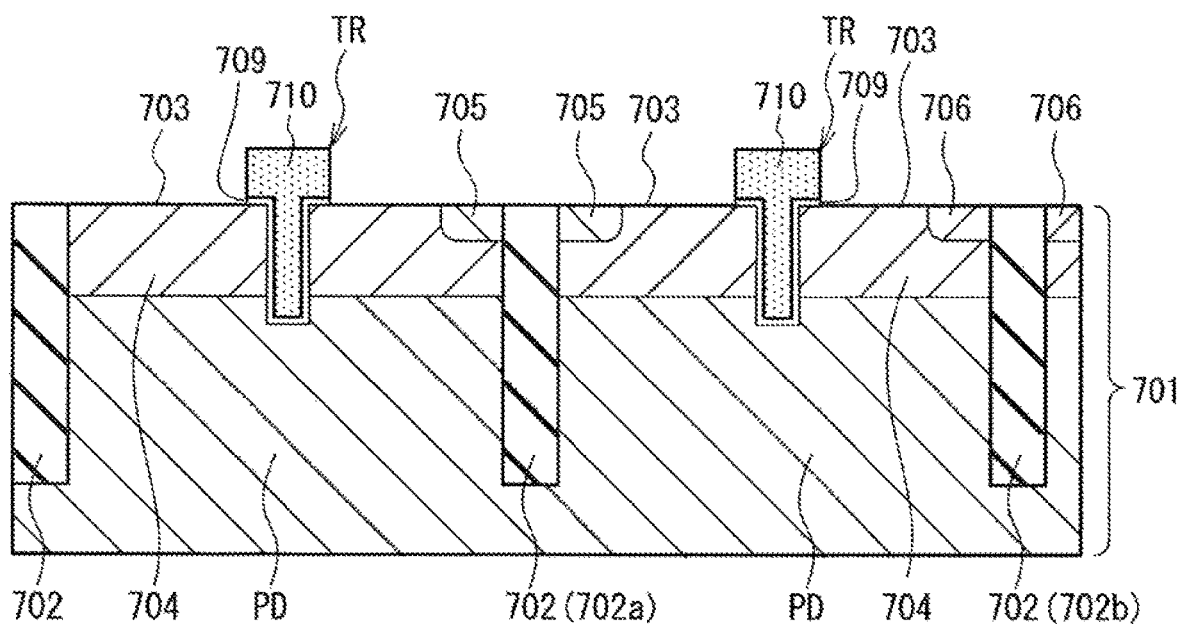
FIG. 92 is a step cross-sectional view of a method for manufacturing the solid-state imaging apparatus according to the eighth embodiment of the present technology.

First, as depicted in FIG. 92, an element isolation region 702, an island region 703, a well region 704, a photodiode PD, a transfer transistor TR, contact region 705 and 706, and the like are formed in the semiconductor layer 701.

Figure 93:
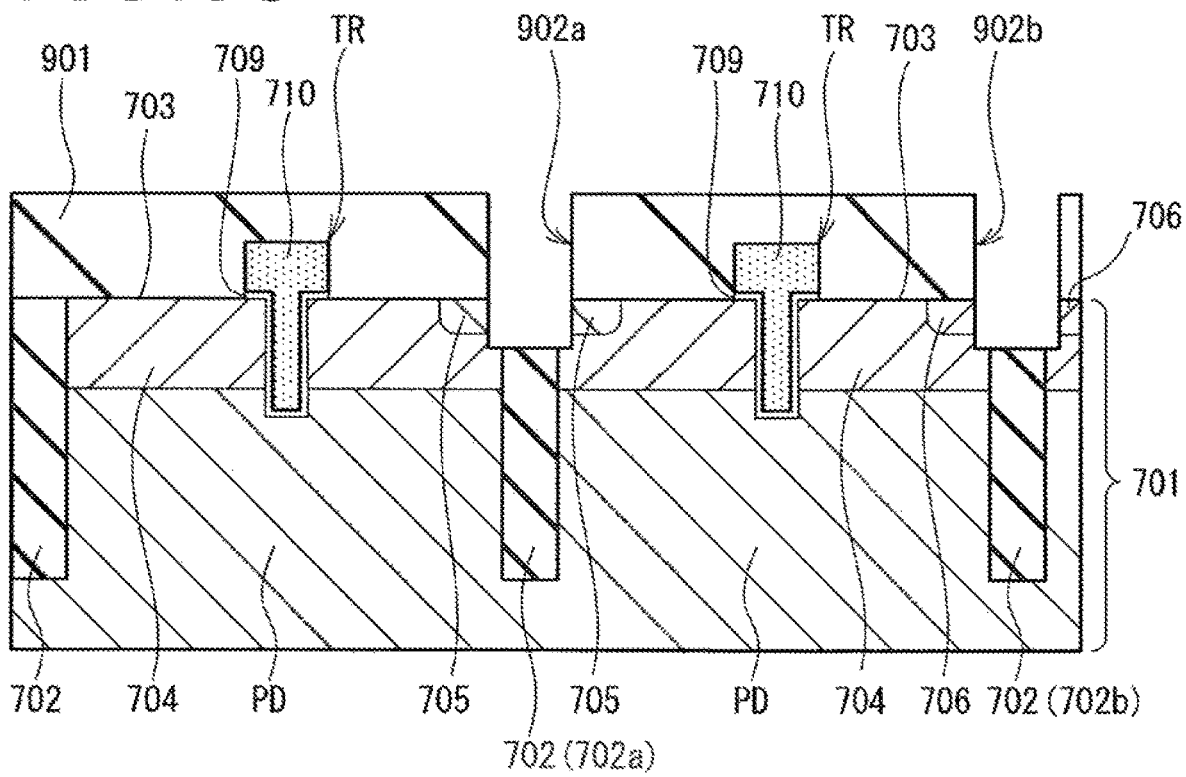
FIG. 93 is a step cross-sectional view of the method for manufacturing the solid-state imaging apparatus according to the eighth embodiment of the present technology, the step cross-sectional view being continued from FIG. 92.

Then, as depicted in FIG. 93, the interlayer insulating film 901 used as the insulating layer 721 is formed all over the major surface of the semiconductor layer 701 in such a manner as to cover the island region 703 and the gate electrode 710.

Then, as depicted in FIG. 93, recessed portions 902a and 902b extending from the upper surface of the interlayer insulating film 901 to the semiconductor layer 701 are formed at the first intersecting portion 702a and the second intersecting portion 702b of the element isolation region 702 in plan view. The recessed portion 902a is preferably formed to a depth at which the recessed portion 902a protrudes beyond the contact regions 705 toward the light incident side of the semiconductor layer 701, and the recessed portion 902b is preferably formed to a depth at which the recessed portion 902b protrudes beyond the contact regions 706 toward the light incident side of the semiconductor layer 701.

In this step, the side surfaces of the four contact regions 705 are exposed at the inner side wall surfaces of the recessed portion 902a. Additionally, the side surfaces of the four contact regions 706 are exposed at the inner side wall surfaces of the recessed portion 902b.

Figure 94:
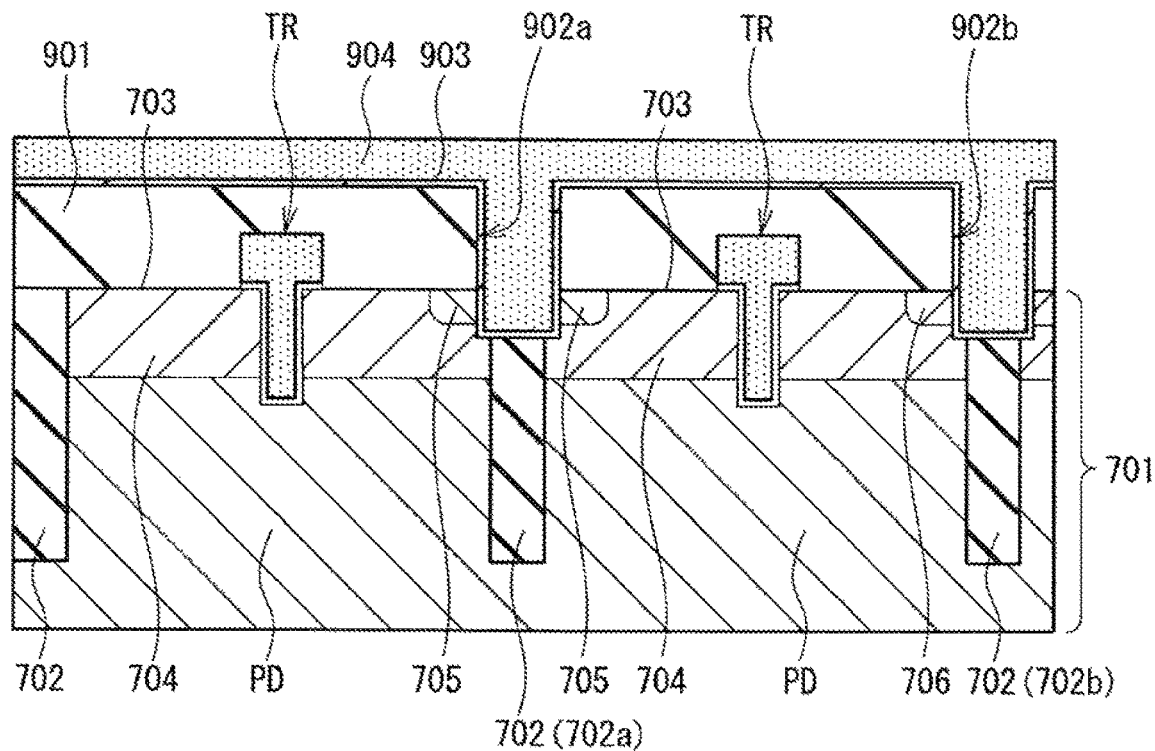
FIG. 94 is a step cross-sectional view of the method for manufacturing the solid-state imaging apparatus according to the eighth embodiment of the present technology, the step cross-sectional view being continued from FIG. 93.

Then, as depicted in FIG. 94, an insulating film 903 including a titanium oxide film (TiOx film) or a strontium titanate film ($SrTiO_x$ film) with a film thickness of approximately 10 to 20 nm is formed by the ALD method or sputtering method all over the surface of the interlayer insulating film 901 including the inner surfaces of the recessed portion 902a and the inner surfaces of the recessed portion 902b. The insulating film 903 is formed along the side wall surfaces and the bottom surface in the recessed portion 902a, and the side surfaces of the four contact regions 705 exposed at the side wall surfaces of the recessed portion 902a are covered with the insulating film 903. Additionally, the insulating film 903 is formed along the side wall surfaces and the bottom surface in the recessed portion 903b, and the side surfaces of the four contact regions 706 exposed at the side wall surfaces of the recessed portion 903b are covered with the insulating film 903.

Then, as depicted in FIG. 94, a polycrystal silicon film 904 with a film thickness at which the polycrystal silicon film 904 can be embedded into, for example, the recessed portion 902a and the recessed portion 902b as a pad material is formed by a CVD method at a low temperature of 550° C. all over the surface of the insulating film 903 including the inside of the recessed portion 902a and the inside of the recessed portion 902b. Into the polycrystal silicon film 904, impurities reducing the resistance value are introduced during or after film formation. In this embodiment, the polycrystal silicon film 904 is formed, for example, to a thickness of approximately 100 nm.

Figure 95:
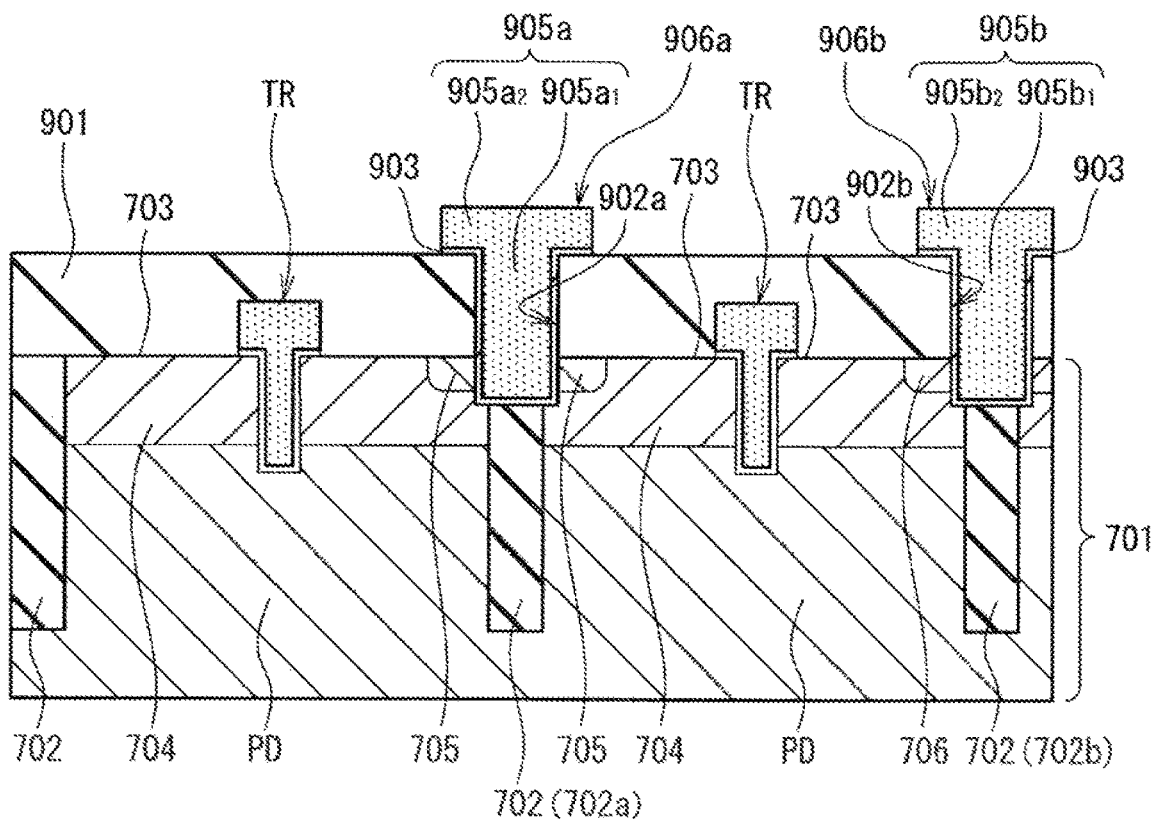
FIG. 95 is a step cross-sectional view of the method for manufacturing the solid-state imaging apparatus according to the eighth embodiment of the present technology, the step cross-sectional view being continued from FIG. 94.

Then, the polycrystal silicon film 904 and the insulating film 903 are sequentially patterned in this order, and as depicted in FIG. 95, a conductive pad 905a is formed at the first intersecting portion 702a of the element isolation region 702 in plan view, and a conductive pad 905b is formed at the second intersecting portion 702b of the element isolation region 702 in plan view. The conductive pad 905a includes the body portion $905a_1$ connected via the insulating film 903 to the side surfaces of the four contact regions 705 in the recessed portion 902a provided on the major surface side of the semiconductor layer 701, and the head portion $905a_2$ that is formed integrally with the body portion $905a_1$ and that has a larger width than that of the body portion $905a_1$. Additionally, the conductive pad 905b includes the body portion $905b_1$ connected via the insulating film 903 to the side surfaces of the four contact regions 706 in the recessed portion 902b provided on the major surface side of the semiconductor layer 701, and the head portion $905b_2$ that is formed integrally with the body portion $905b_1$ and that has a larger width than that of the body portion $905b_1$. This step forms the MIS contact portion 906a including the conductive pad 905a, the insulating film 903, and the contact region 705. Additionally, the MIS contact portion 906b that includes the conductive pad 905b, the insulating film 903, and the contact region 706 is formed.

Figure 96:
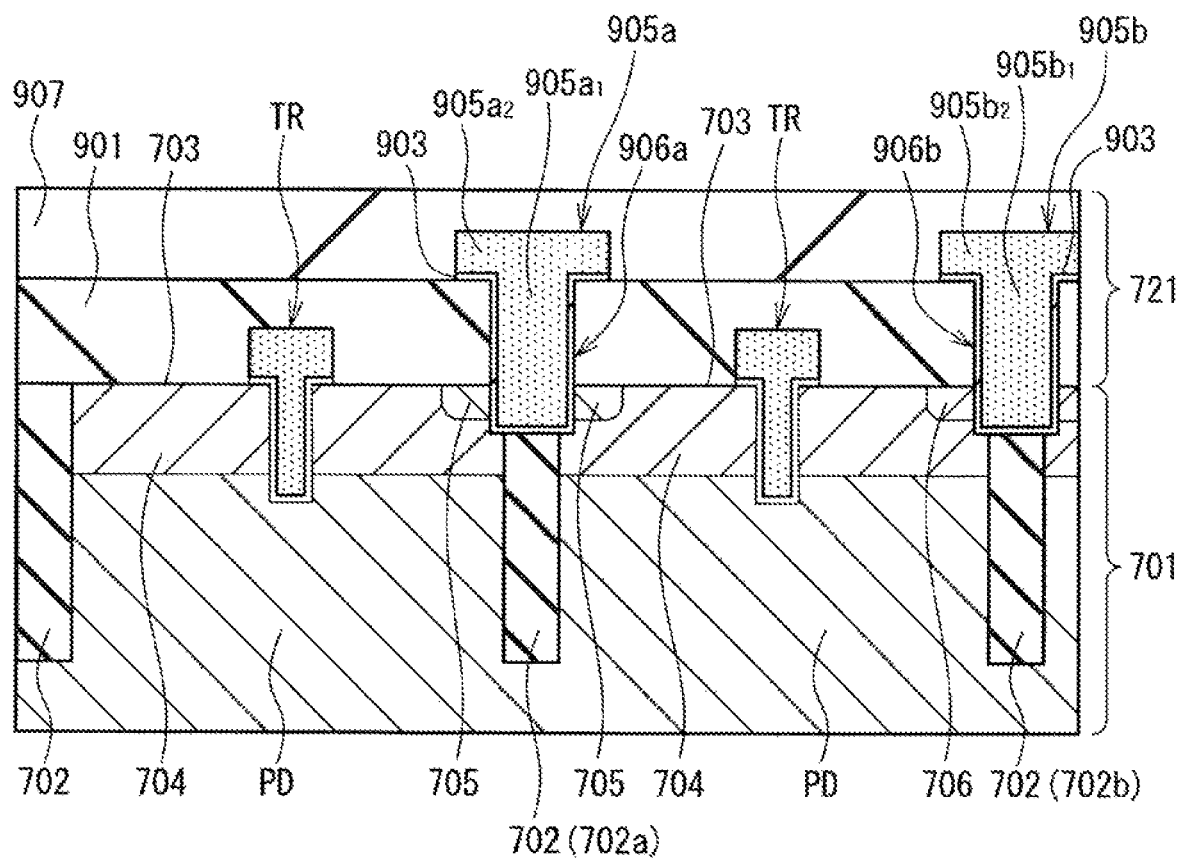
FIG. 96 is a step cross-sectional view of the method for manufacturing the solid-state imaging apparatus according to the eighth embodiment of the present technology, the step cross-sectional view being continued from FIG. 95.

Then, as depicted in FIG. 96, an interlayer insulating film 907 used as the insulating layer 721 is formed all over the surface of the interlayer insulating film 901 in such a manner as to cover the conductive pads 905a and 905b. This step builds, on the semiconductor layer 701, a substrate portion on which the method has been executed up to the step of forming the insulating layer 721.

Figure 97:
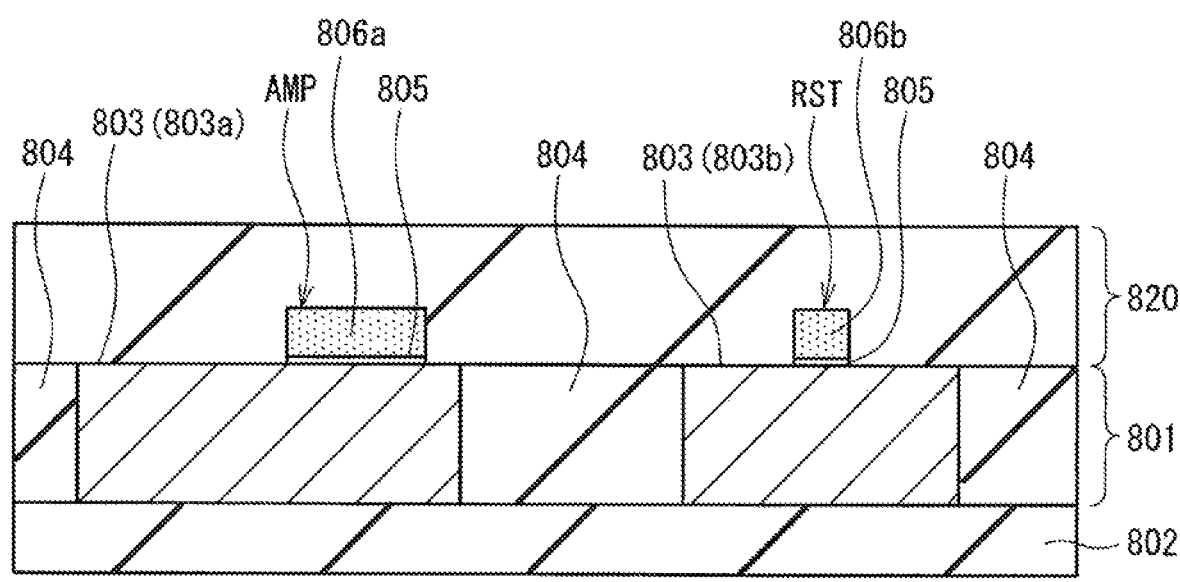
FIG. 97 is a step cross-sectional view of the method for manufacturing the solid-state imaging apparatus according to the eighth embodiment of the present technology, the step cross-sectional view being continued from FIG. 96.
Figure 98:
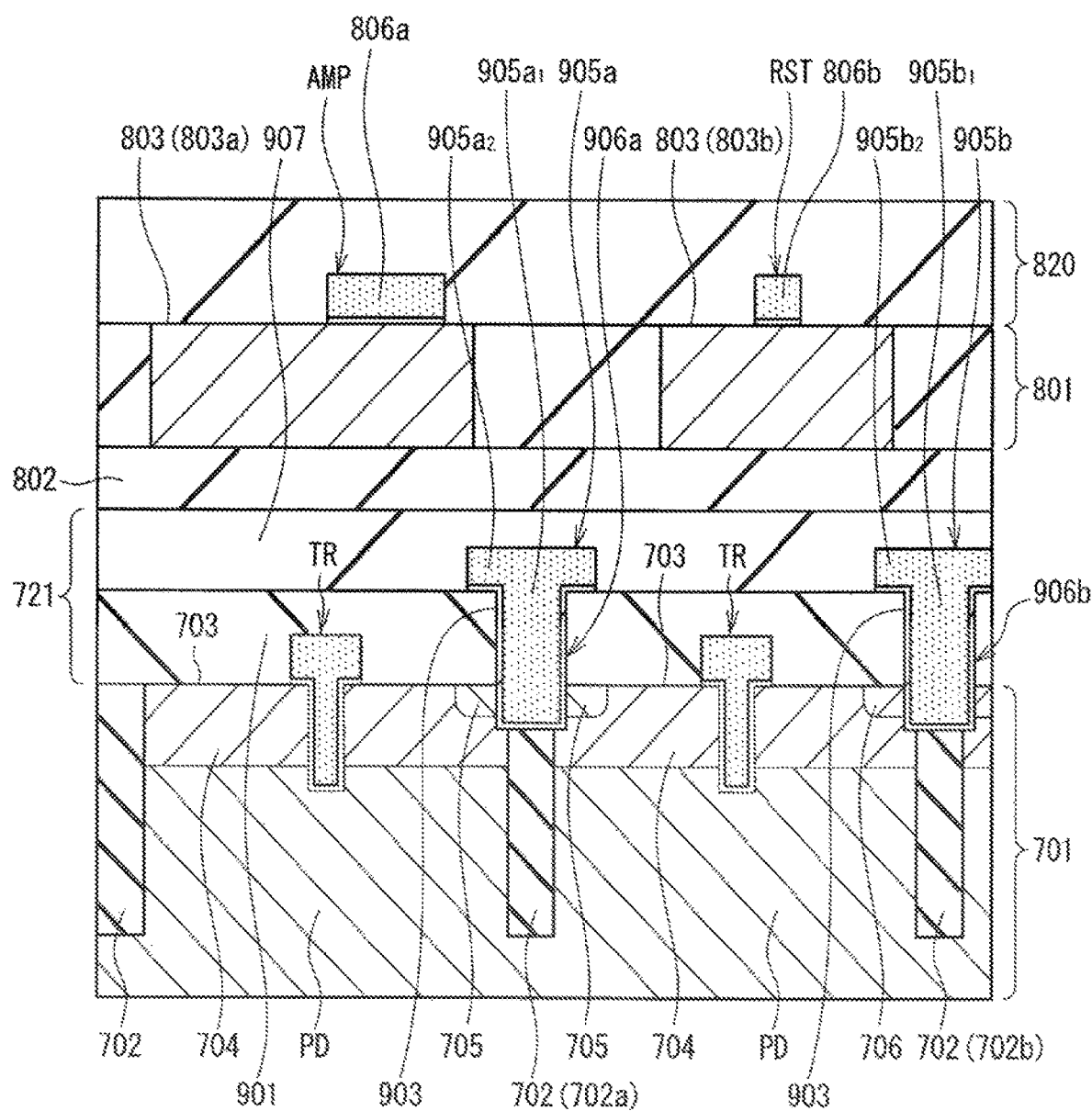
FIG. 98 is a step cross-sectional view of the method for manufacturing the solid-state imaging apparatus according to the eighth embodiment of the present technology, the step cross-sectional view being continued from FIG. 97.

Then, as depicted in FIG. 97, a substrate portion on which the method has been executed up to the step of forming the insulating layer 820 used as a second insulating layer covering the semiconductor layer 801 is prepared. Then, as depicted in FIG. 98, the insulating layer 721 on the major surface side of the semiconductor layer 701 is placed opposite to and in close contact with the insulating film 802 on the back surface side of the semiconductor layer 801, and thermal treatment is executed on the insulating layer 721 and the insulating film 802, which are thus laminated to each other.

Figure 99:
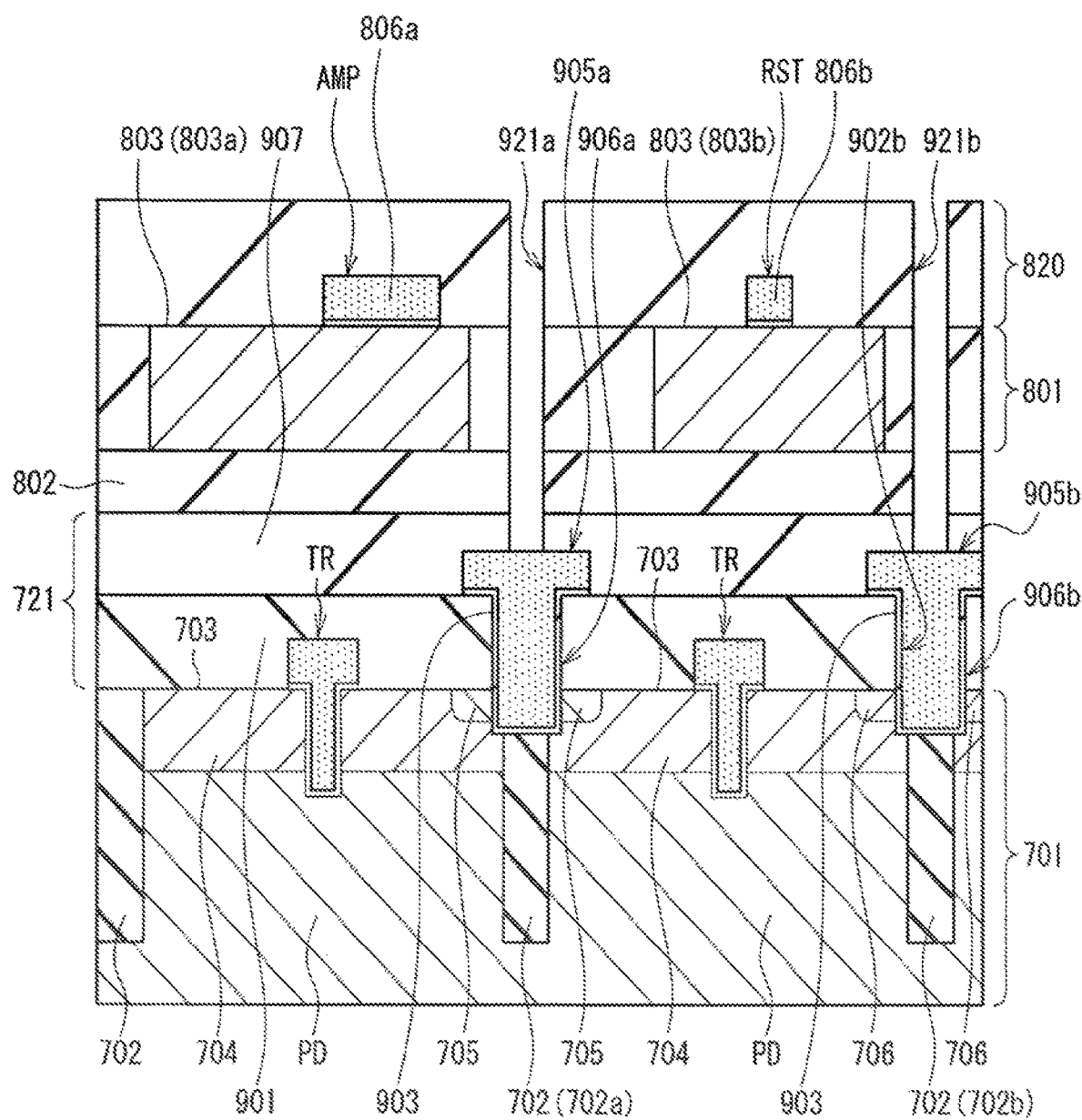
FIG. 99 is a step cross-sectional view of the method for manufacturing the solid-state imaging apparatus according to the eighth embodiment of the present technology, the step cross-sectional view being continued from FIG. 98.

Then, as depicted in FIG. 99, a connection hole 921a that extends from the front surface of the insulating layer 820 to the front surface of the conductive pad 905a is formed, and a connection hole 921b that extends from the front surface of the insulating layer 820 to the front surface of the conductive pad 905b is formed. The connection holes 921a and 921b are executed using the photolithography technology and the anisotropic dry etching technology, which are well known.

Figure 100:
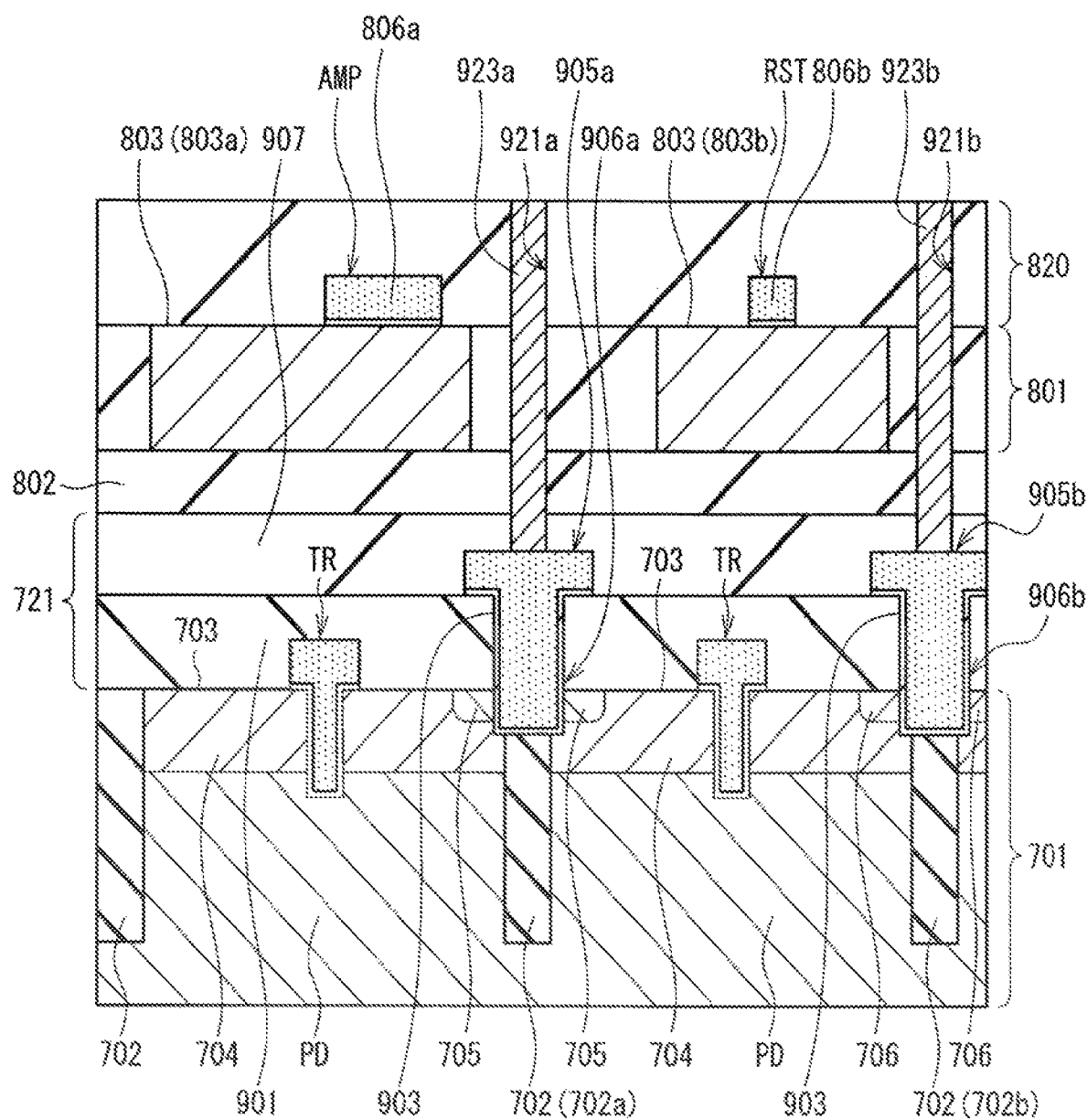
FIG. 100 is a step cross-sectional view of the method for manufacturing the solid-state imaging apparatus according to the eighth embodiment of the present technology, the step cross-sectional view being continued from FIG. 99.

Then, as depicted in FIG. 100, a method similar to the method of the first and second embodiments described above is used to embed a conductive material into the connection holes 921a and 921b to form conductive plugs 923a and 923b in the connection holes 921a and 921b. Then, a method similar to the method of the first and second embodiments described above is executed to form connection holes 825a to 825c, conductive plugs 826a to 826c, wires 827a to 827c, an insulating film 828, a wire 829, and the like. Then, after lamination of the third substrate portion 30, a planarization film 831, a color filter 832, a microlens 833, and the like are formed on the back surface of the semiconductor layer 701. This substantially completes the solid-state imaging apparatus 1F according to the eighth embodiment depicted in FIGS. 91A to 91C.

<Effects of Eighth Embodiment>

Now, main effects of the eighth embodiment will be described.

The solid-state imaging apparatus 1F according to the eighth embodiment of the present technology allows the MIS contact portion 906a to be formed by forming a thin insulating film 903 between the contact region 705 and the conductive pad 905a, and thus a floating diffusion shared contact structure with reduced resistance can be obtained. Additionally, the MIS contact portion 906b can be formed by forming a thin insulating film 903 between the contact region 706 and the conductive pad 905b, and thus a contact structure with reduced resistance can be obtained.

Additionally, in the solid-state imaging apparatus 1F according to the eighth embodiment, the conductive plug 923a and the contact regions 705 are electrically connected by the MIS contact portion 906a, thus enabling a reduction in the resistance value of the conductive path electrically connecting the gate electrode 806a of the amplifying transistor AMP provided in the second substrate portion 20 in the upper stage to the contact regions 705 provided in the first substrate portion 10 in the lower stage. The contact regions 705 share the floating diffusions FD, thus enabling an increase in the operating speed of the pixel unit PU.

Additionally, in the solid-state imaging apparatus 1F according to the eighth embodiment, the conductive plug 923b and the contact regions 706 are electrically connected by the MIS contact portion 906b, thus enabling a reduction in the resistance value of the conductive path electrically connecting the island regions 803b provided in the second substrate portion 20 in the upper stage to the contact regions 706 provided in the first substrate portion 10 in the lower stage.

Additionally, the MIS contact portion 906a is configured such that the conductive pad 905a is located across the contact regions 705 adjacent to one another via the element isolation regions 702 and connected via the insulating films 903 to side surfaces of the contact regions 705. In addition, the MIS contact portion 906b is configured such that conductive pad 905a is located across the contact regions 706 adjacent to one another via the element isolation regions 702 and connected via the insulating films 903 to side surfaces of the contact regions 706. Consequently, the solid-state imaging apparatus 1F according to the eighth embodiment enables a reduction in the distance between sharing pixels, allowing for miniaturization and increased sensitivity based on enlargement of pixel regions.

Additionally, the conductive pad 905a of the MIS contact portion 906a includes the body portion $905a_1$ connected via the insulating film 903 to the side surfaces of the four contact regions 705 in the recessed portion 902a provided on the major surface side of the semiconductor layer 701, and the head portion $905a_2$ that has a larger width than that of the body portion $905a_1$ and that is formed integrally with the body portion $905a_1$. Consequently, the solid-state imaging apparatus 1F according to the eighth embodiment enables a reduction in the distance between the sharing pixels and allows suppression of improper connection between the conductive plug 923a and the MIS contact portion 906a caused by mask misalignment.

Additionally, the conductive pad 905b of the MIS contact portion 906b includes the body portion $905b_1$ connected via the insulating film 903 to the side surfaces of the four contact regions 706 in the recessed portion 902b provided on the major surface side of the semiconductor layer 701, and the head portion $905b_2$ that has a larger width than that of the body portion $905b_1$ and that is formed integrally with the body portion $905b_1$. Consequently, the solid-state imaging apparatus 1F according to the eighth embodiment enables a reduction in the distance between the sharing pixels and allows suppression of improper connection between the conductive plug 923b and the MIS contact portion 906b caused by mask misalignment.

Additionally, the method for manufacturing the solid-state imaging apparatus 1F according to the eighth embodiment forms the conductive pad 905a connected via the insulating film 903 to the contact regions 705 in the recessed portion 902a provided between the adjacent contact regions 705, and forms the conductive pad 905b connected via the insulating film 903 to the contact regions 706 in the recessed portion 902b provided between the adjacent contact regions 706. Thus, the solid-state imaging apparatus 1F that allows for miniaturization and increased sensitivity based on enlargement of pixel regions can be provided.

In addition, the method for manufacturing the solid-state imaging apparatus 1F according to the eighth embodiment includes laminating the substrate portion with the second active elements already formed by high-temperature thermal treatment and the substrate portion with the MIS contact portions 906a and 906b formed in advance. Thus, the solid-state imaging apparatus 1F that includes the MIS contact portions 906a and 906b with low resistance maintained can be provided.

Modified Example of Eighth Embodiment

In the eighth embodiment described above, a case has been described in which the body portions $905a_1$ and $905b_1$ of the respective conductive pads 905a and 905b each have a square cross-sectional shape in plan view. However, the present technology is not limited to the cross-sectional shape in the eighth embodiment.

Figure 101:
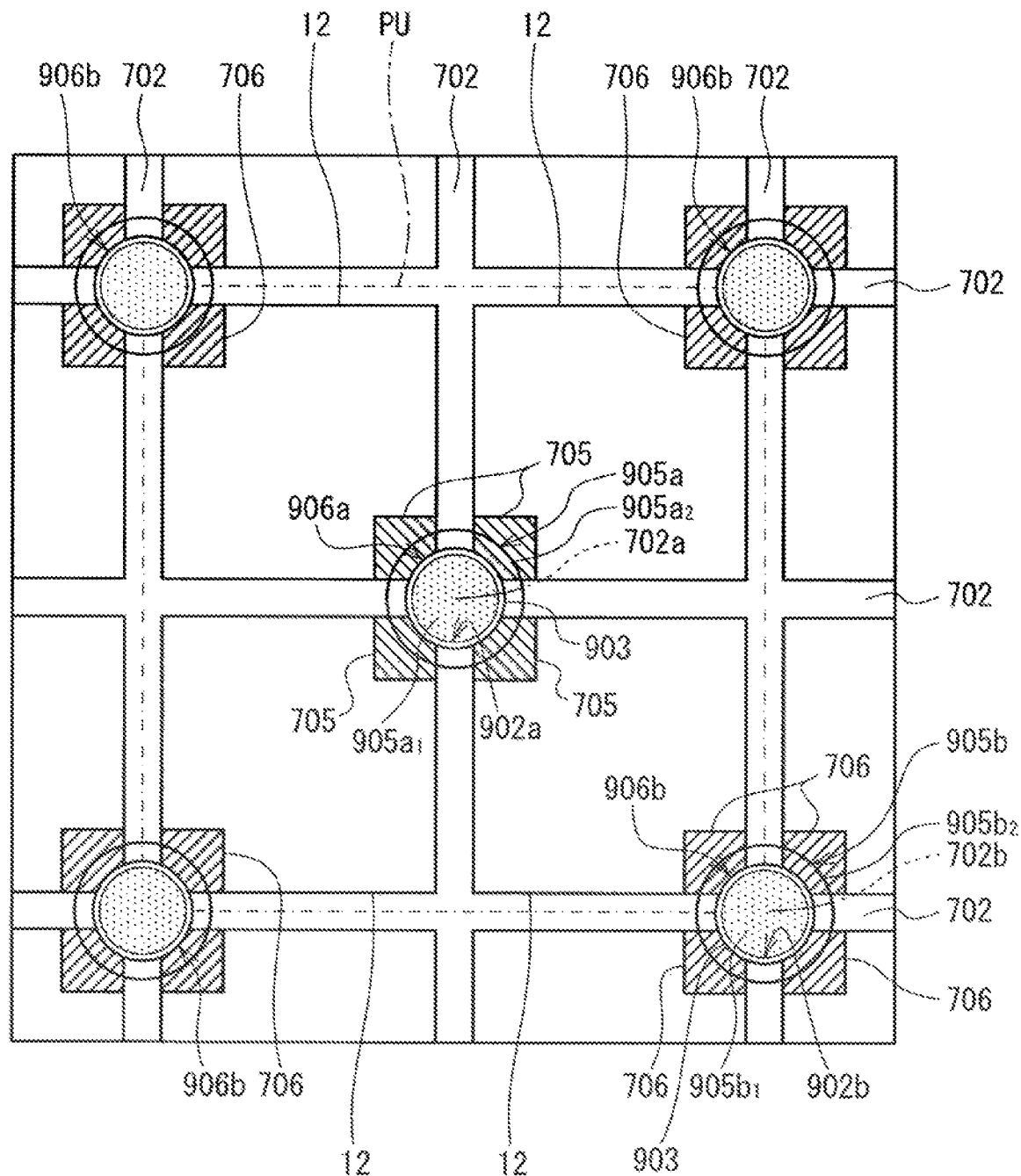
FIG. 101 is a diagram depicting a first modified example of the eighth embodiment.

For example, in a first modified example, as depicted in FIG. 101, the body portions $905a_1$ and $905b_1$ of the respective conductive pads 905a and 905b may each have a circular cross-sectional shape in plan view.

Figure 102:
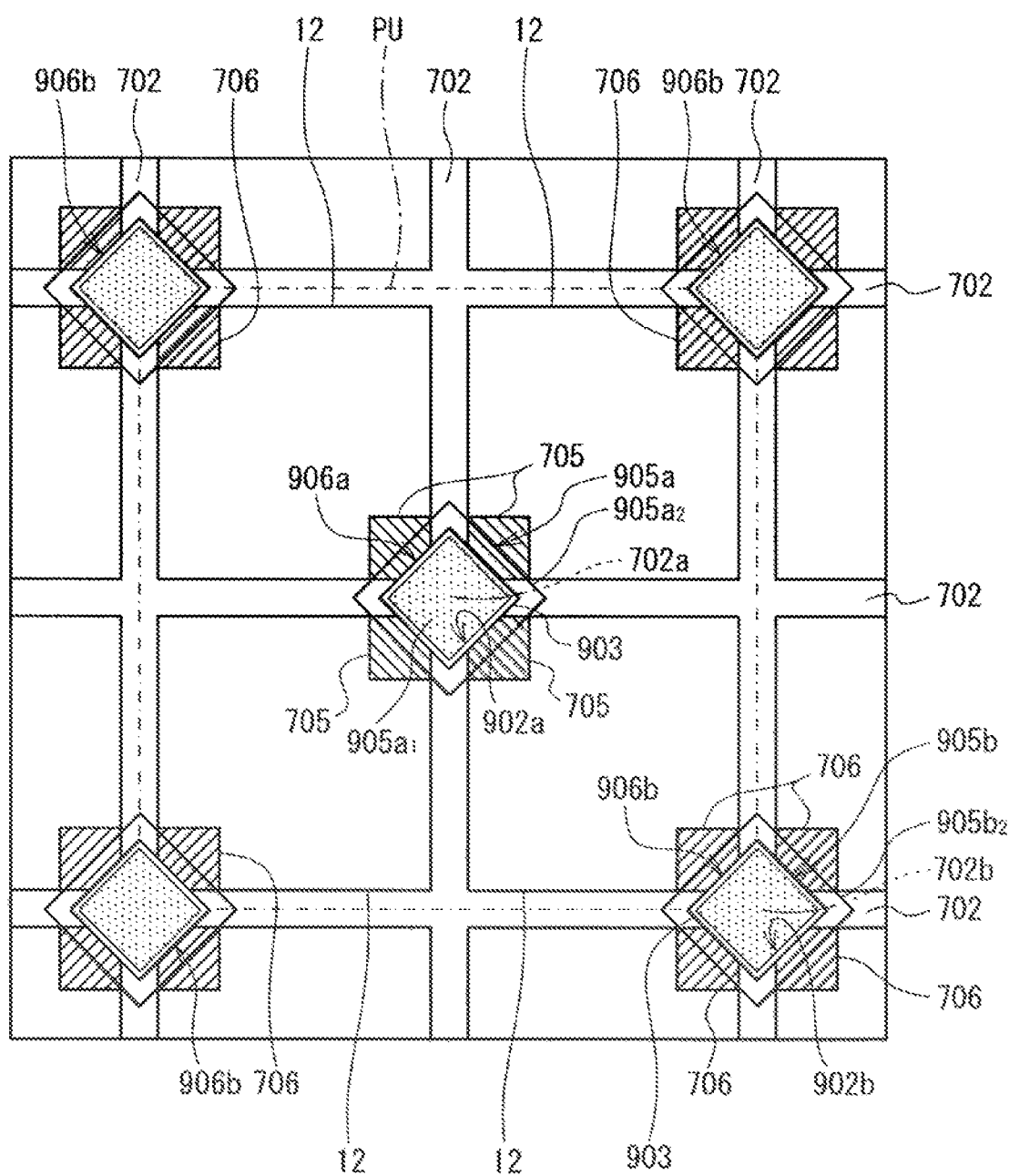
FIG. 102 is a diagram depicting a second modified example of the eighth embodiment.

Additionally, in a second modified example, as depicted in FIG. 102, the body portions $905a_1$ and $905b_1$ of the respective conductive pads 905a and 905b may each have a square cross-sectional shape in plan view, with diagonal lines located on the element isolation regions 702.

In addition, in a third modified example, although not illustrated, the body portions $905a_1$ and $905b_1$ of the respective conductive pads 905a and 905b may each have a rhombic cross-sectional shape in plan view, with diagonal lines located on the element isolation regions 702.

The circular shape in the first modified example, the square shape in the second modified example, and the rhombic shape in the third modified example are characterized by reliable contact, easy scaling, and easy enlargement of pixel portions. Additionally, the circular shape in the first modified example, the square shape in the second modified example, and the rhombic shape in the third modified example increase tolerance for variation in alignment in patterning of the recessed portions 902a and 902b.

Additionally, in the eighth embodiment described above, a case has been described in which the head portions $905a_2$ and $905b_2$ of the respective conductive pads 905a and 905b each have a square planar shape in plan view. However, the present technology is not limited to the cross-sectional shape in the eighth embodiment. For example, as depicted in FIG. 101, the head portions $905a_2$ and $905b_2$ of the respective conductive pads 905a and 905b may each have a circular planar shape in plan view. Additionally, as depicted in FIG. 102, the head portions $905a_2$ and $905b_2$ of the respective conductive pads 905a and 905b may each have a square cross-sectional shape in plan view, with diagonal lines located on the element isolation regions 702. In addition, although not illustrated, the head portions $905a_2$ and $905b_2$ of the respective conductive pads 905a and 905b may each have a rhombic cross-sectional shape in plan view.

Additionally, the cross-sectional shapes of the body portion $905a_1$ and $905b_1$ of the respective conductive pads 905a and 905b in plan view may be combined with the planar shapes of the head portions $905a_2$ and $905b_2$ in plan view for the same shape or for different shapes.

Note that in the solid-state imaging apparatus 1F according to the eighth embodiment described above, the second substrate portion 20 may include the semiconductor substrates 21 and 21A stacked on each other (may include a plurality of semiconductor substrates stacked on one another) as is the case with the second substrate 20 depicted in FIG. 104 for a tenth embodiment described below.

Ninth Embodiment

A solid-state imaging apparatus 1G according to a ninth embodiment of the present technology is basically configured similarly to the solid-state imaging apparatus $1B_2$ according to the eighth embodiment described above but differs from the solid-state imaging apparatus $1B_2$ in the configuration of the first insulating layer and the recessed portion.

Figure 103:
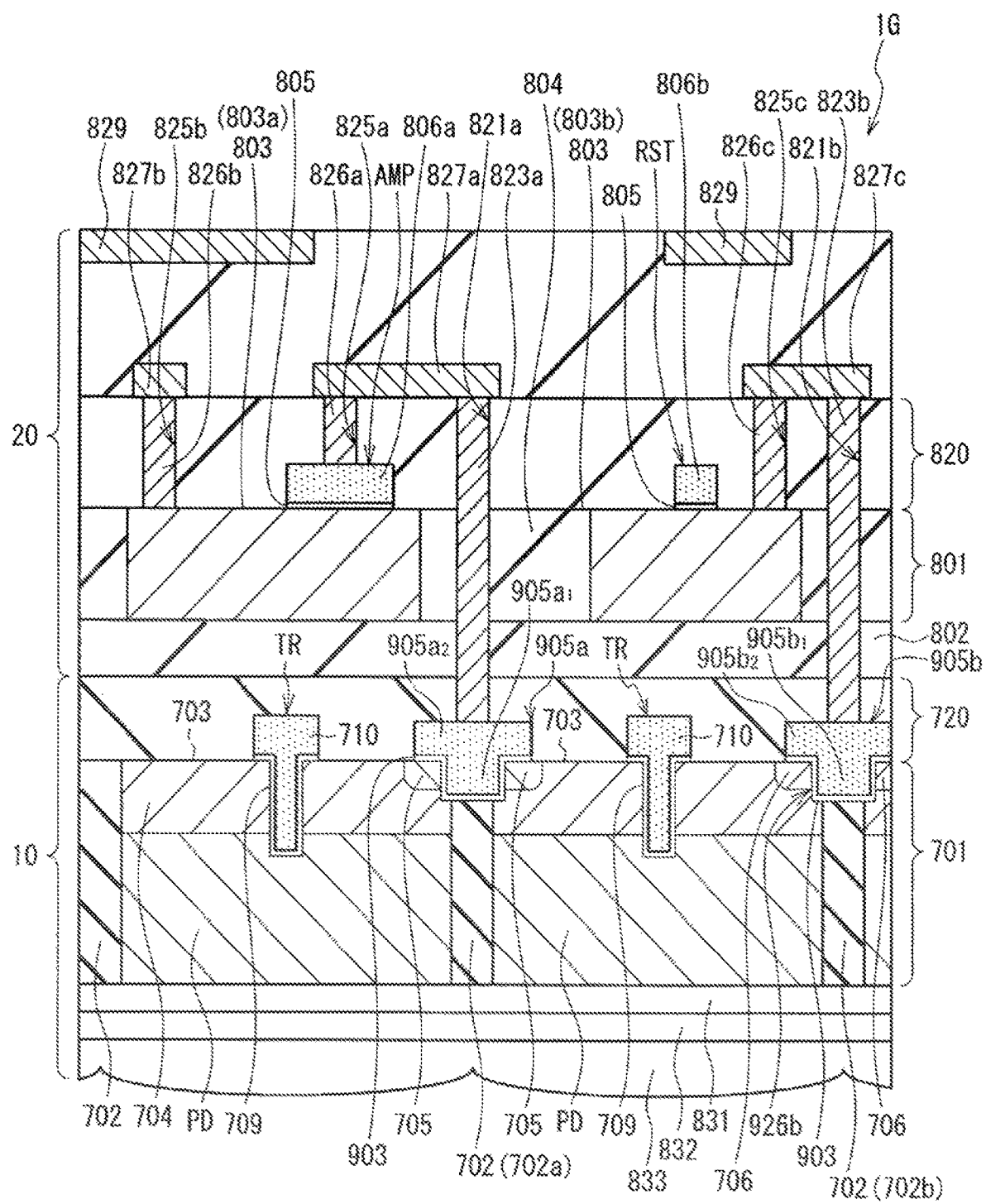
FIG. 103 is a cross-sectional view of a main part of a pixel unit of a solid-state imaging apparatus according to a ninth embodiment of the present technology.

Specifically, as depicted in FIG. 103, the solid-state imaging apparatus 1F according to the ninth embodiment includes recessed portions 932a and 932b and an insulating layer 720 used as the first insulating layer 720 instead of the recessed portions 902a and 902b and the insulating layer 721 used as the first insulating layer 721 in the eight embodiment depicted in FIG. 91A. The remaining part of the configuration is substantially similar to the corresponding part of the configuration of the eighth embodiment described above.

At the first intersecting portion 702a between the element isolation regions 702, the recessed portion 932a extends from the major surface side to the light incident surface side of the semiconductor layer 701. The body portion 905$a_1$ of the conductive pad 905$a$ is embedded in the recessed portion 902$a$. The head portion 905$a_2$ of the conductive pad 905$a$ protrudes from the recessed portion 902$a$. The insulating film 903 is provided in such a manner as to cover side surfaces and a bottom surface in the recessed portion 932$a$. Specifically, the conductive pad 905$a$ of the ninth embodiment includes the body portion 905$a_1$ connected via the insulating film 903 to the side surfaces of the respective four contact regions 705 in the recessed portion 932$a$ provided on the major surface side of the semiconductor layer 701, and the head portion 905$a_2$ that has a larger width than that of the body portion 905$a_1$ and that is formed integrally with the body portion 905$a_1$.

At the second intersecting portion 702$b$ between the element isolation regions 702, the recessed portion 932$b$ extends from the major surface side to the light incident surface side of the semiconductor layer 701. The body portion 905$b_1$ of the conductive pad 905$b$ is embedded in the recessed portion 902$b$. The head portion 905$b_2$ of the conductive pad 905$b$ protrudes from the recessed portion 932$b$. The insulating film 903 is provided in such a manner as to cover side surfaces and a bottom surface in the recessed portion 932$a$. Specifically, the conductive pad 905$b$ of the ninth embodiment includes the body portion 905$b_1$ connected via the insulating film 903 to the side surfaces of the respective four contact regions 706 in the recessed portion 932$b$ provided on the major surface side of the semiconductor layer 701, and the head portion 905$b_2$ that has a larger width than that of the body portion 905$b_1$ and that is formed integrally with the body portion 905$b_1$.

The insulating layer 720 is similar to the insulating layer 720 of the first embodiment described above. The insulating layer 720 is provided on the semiconductor layer 701 in such a manner as to cover the surfaces of the island regions 703 and the surfaces of the conductive pads 935$a$ and 935$b$.

The solid-state imaging apparatus 1G configured as described above also produces effects similar to the effects of the eighth embodiment described above.

Note that, in the solid-state imaging apparatus 1F according to the eighth embodiment described above, the second substrate portion 20 may include the semiconductor substrates 21 and 21A stacked on each other (may include a plurality of semiconductor substrates stacked on one another) as is the case with the second substrate portion 20 depicted in FIG. 104 for the tenth embodiment described below.

Tenth Embodiment

Figure 104:
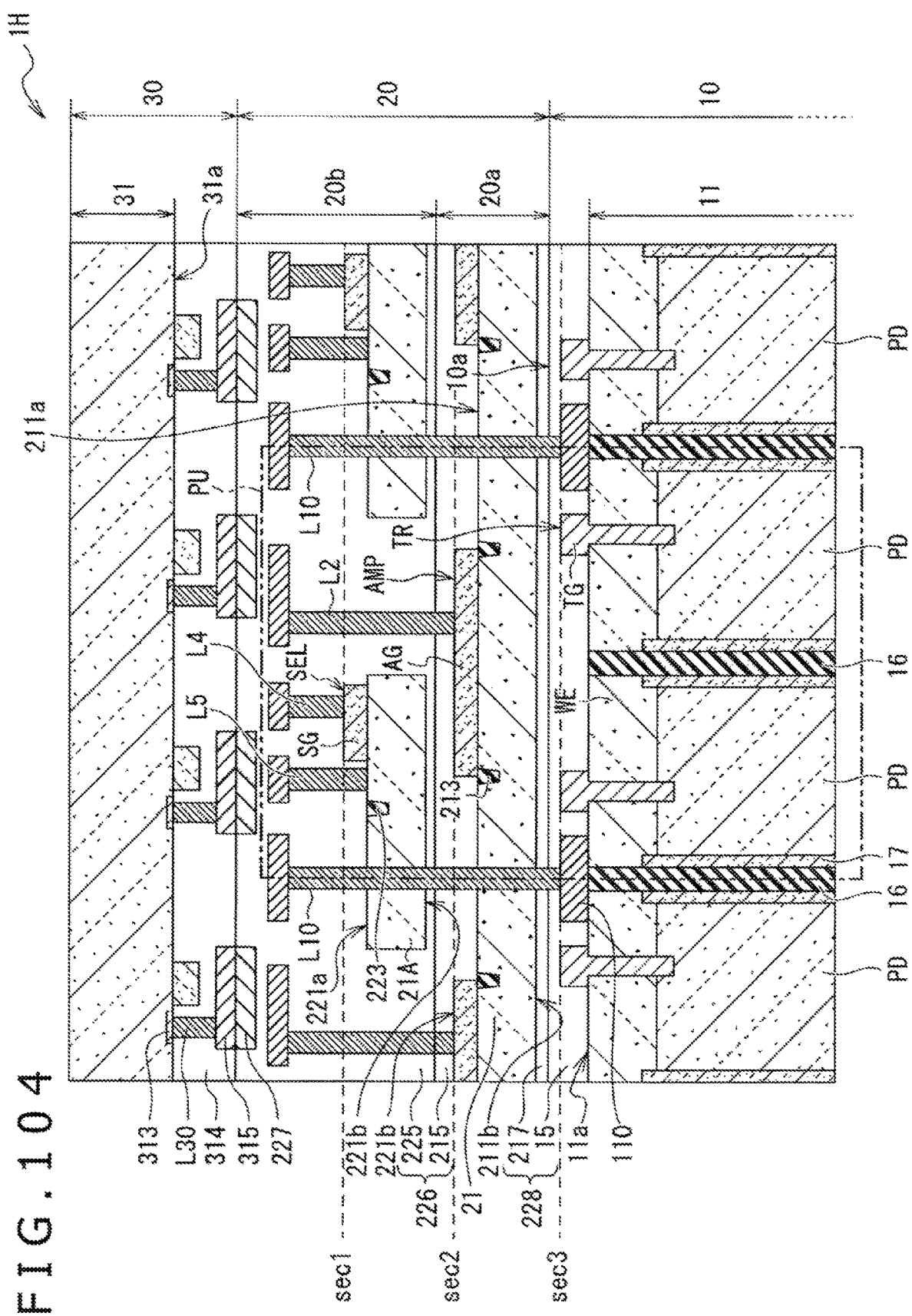
FIG. 104 is a thick-wise cross-sectional view depicting a configuration example of an imaging apparatus according to a tenth embodiment of the present technology.
Figure 105:
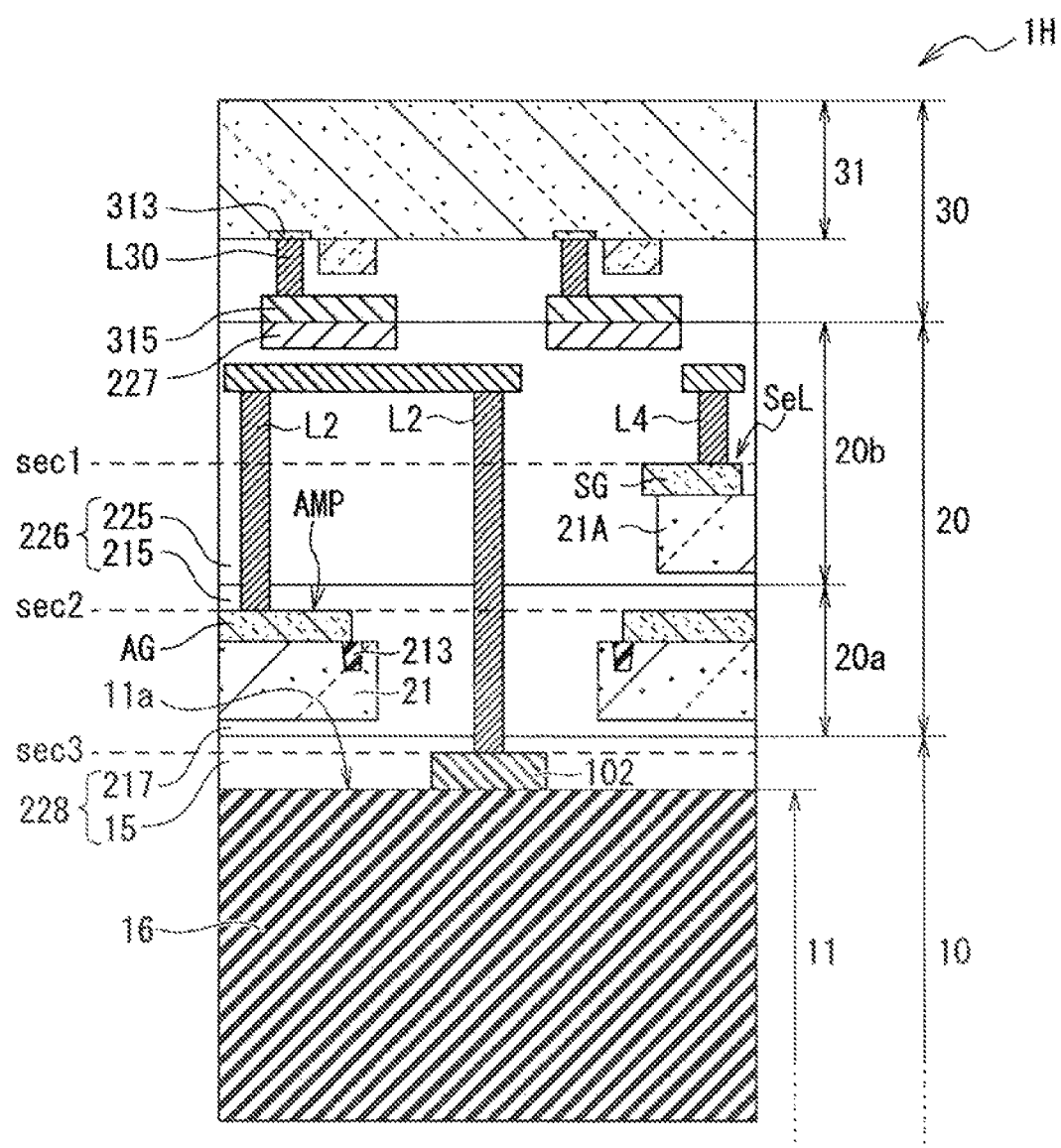
FIG. 105 is a thick-wise cross-sectional view depicting a configuration example of the imaging apparatus according to the tenth embodiment of the present technology.
Figure 106:
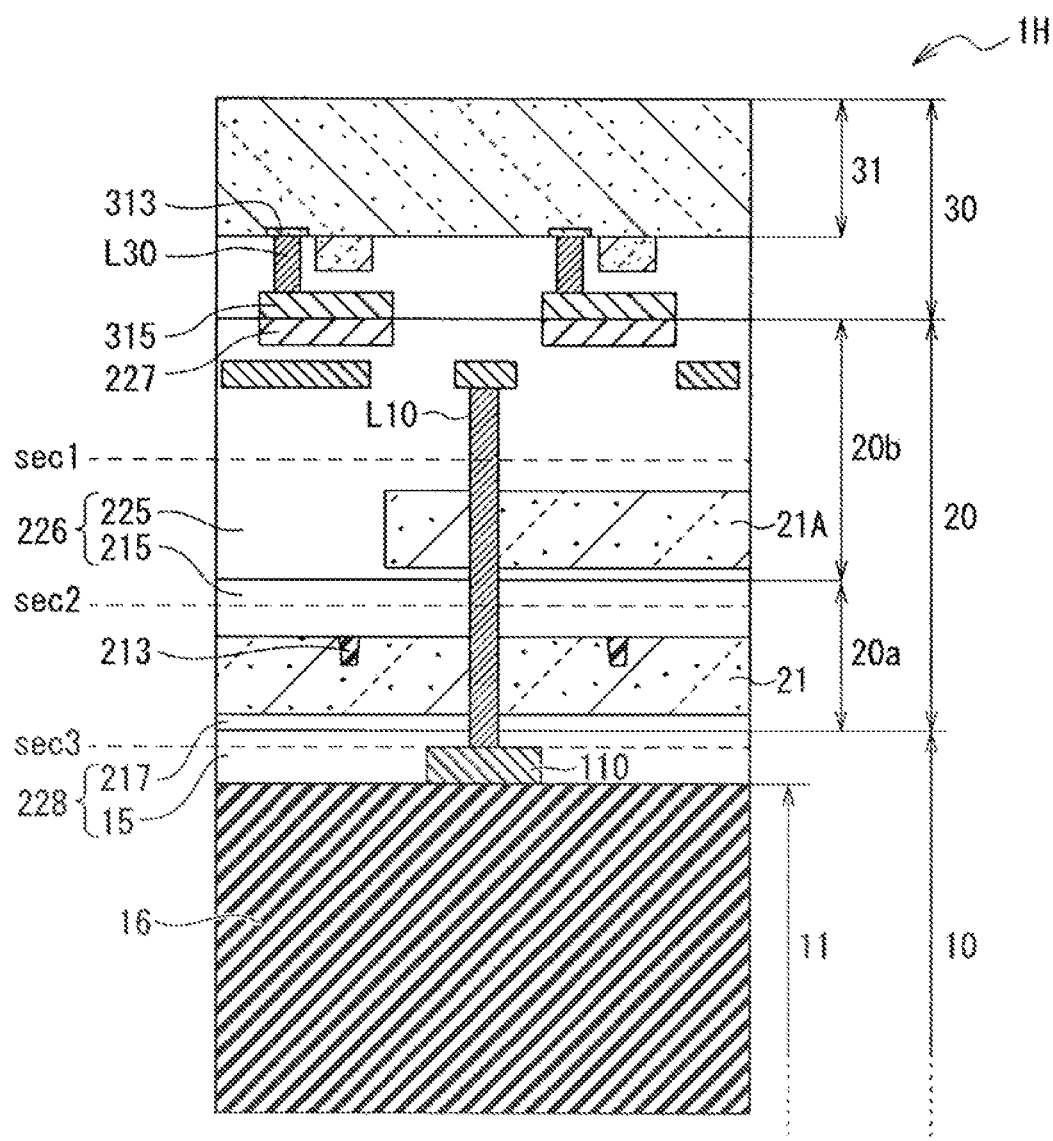
FIG. 106 is a thick-wise cross-sectional view depicting a configuration example of the imaging apparatus according to the tenth embodiment of the present technology.
Figure 107:
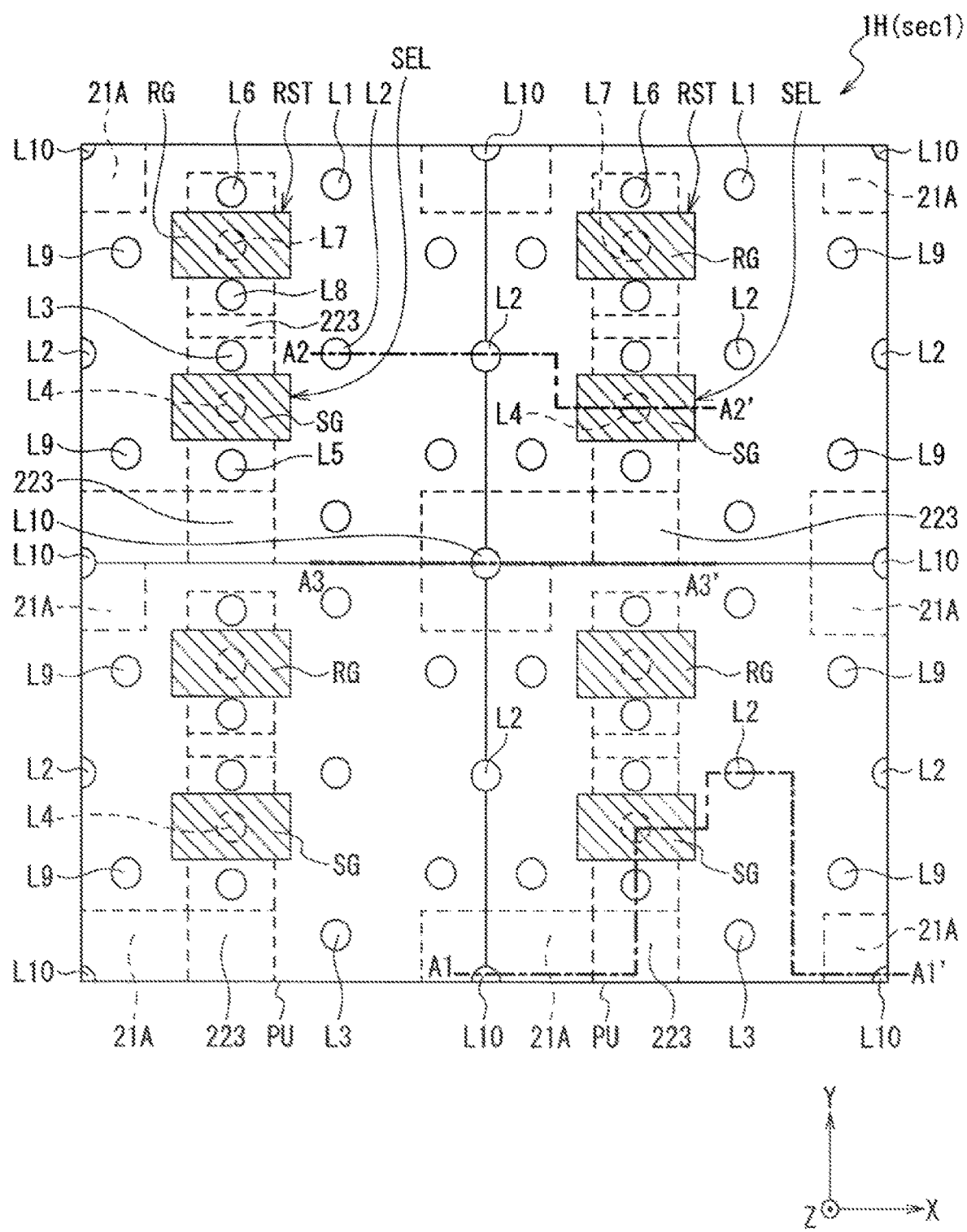
FIG. 107 is a horizontal cross-sectional view depicting a layout example of a plurality of pixel units according to the tenth embodiment of the present technology.
Figure 108:
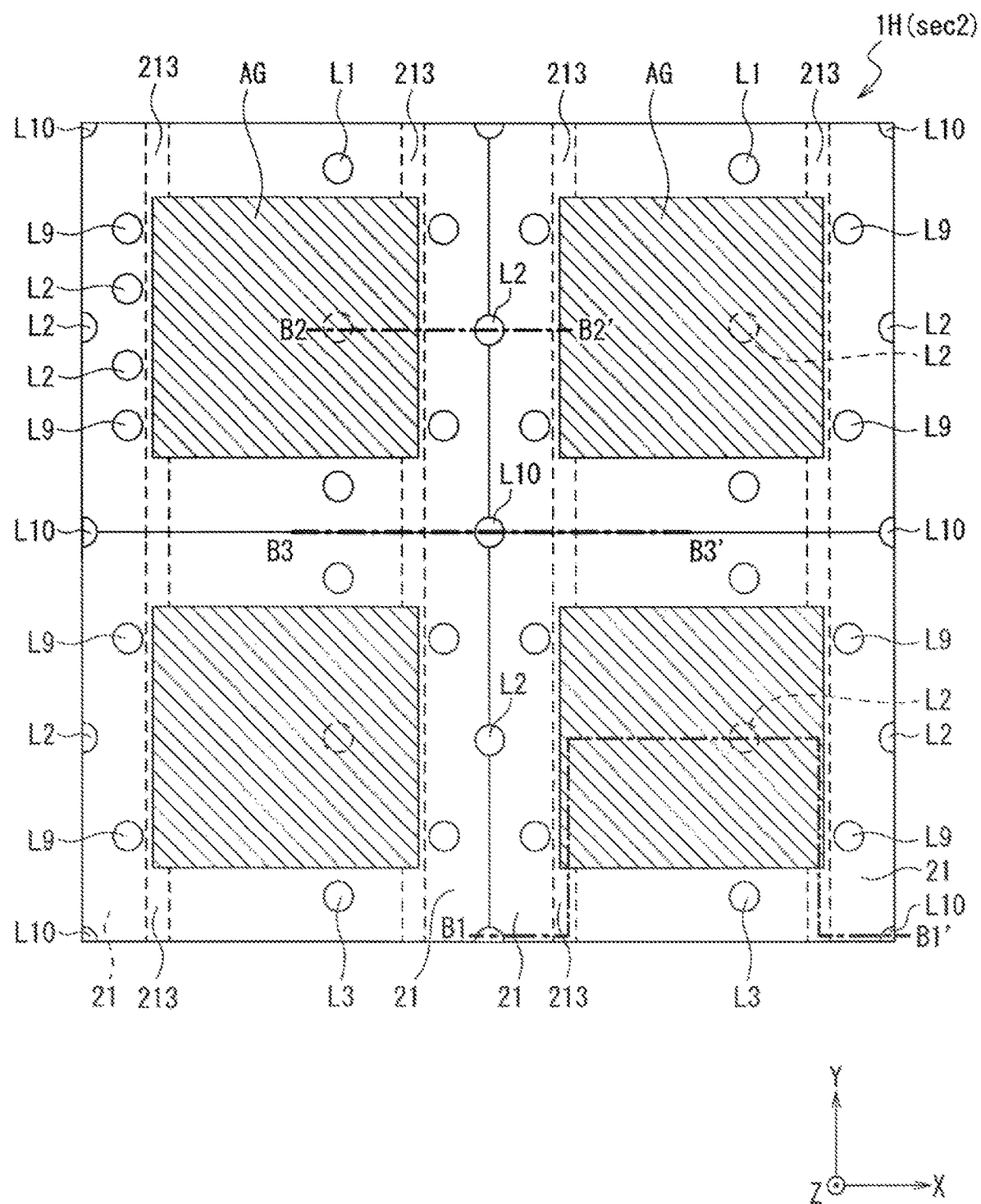
FIG. 108 is a horizontal cross-sectional view depicting a layout example of the plurality of pixel units according to the tenth embodiment of the present technology.
Figure 109:
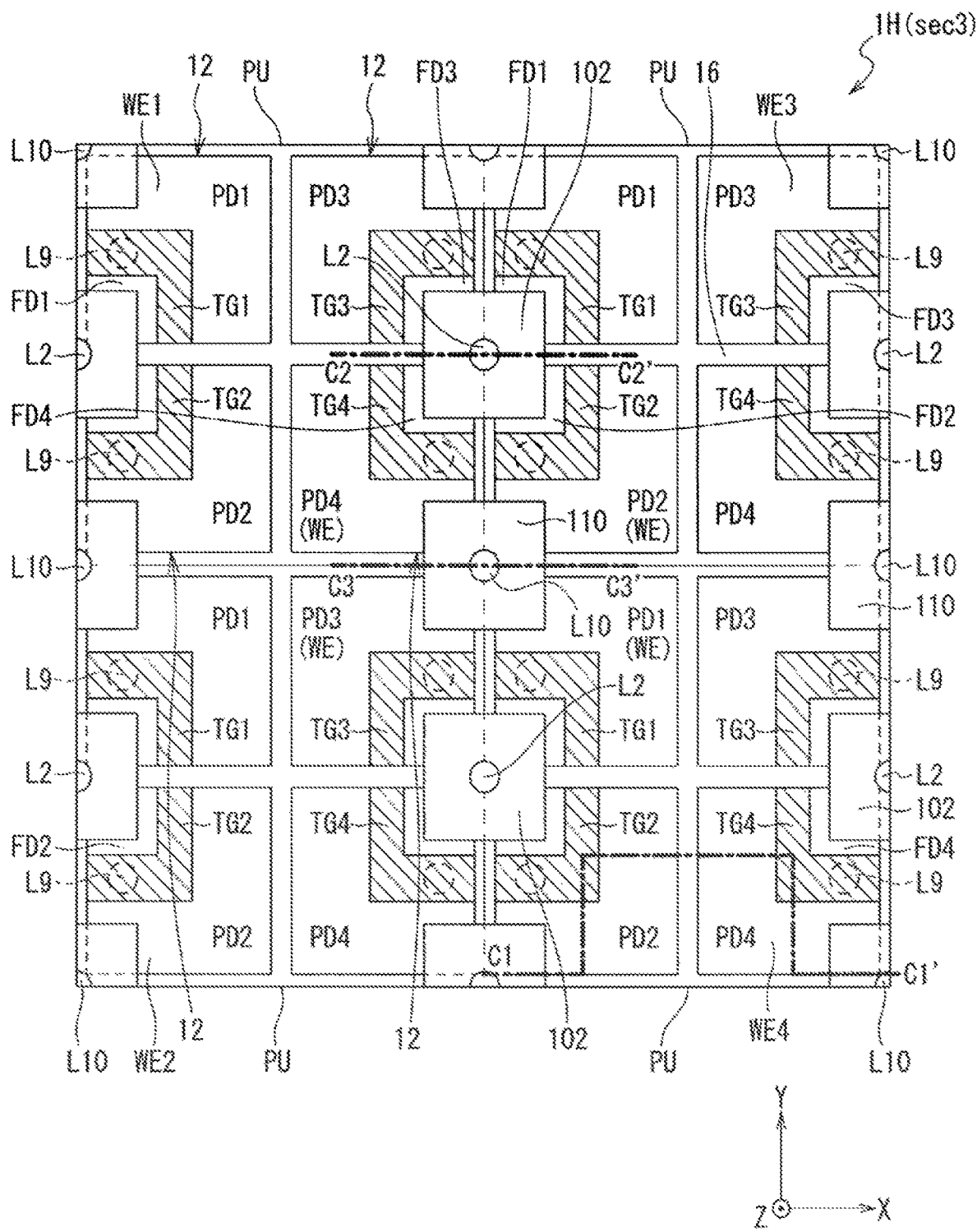
FIG. 109 is a horizontal cross-sectional view depicting a layout example of the plurality of pixel units according to the tenth embodiment of the present technology.

FIGS. 104 to 106 are thick-wise cross-sectional views of the solid-state imaging apparatus 1G according to the tenth embodiment of the present technology. FIGS. 107 to 109 are horizontal cross-sectional views depicting a layout example of a plurality of pixel units PU according to the tenth embodiment of the present technology. Note that the cross-sectional views depicted in FIGS. 104 to 106 are only schematic and are not intended to illustrate an actual structure correctly in a strict sense. In the cross-sectional views depicted in FIGS. 104 to 106, at positions sec1 to sec3, the positions of the transistors and impurity diffusion layers in the horizontal direction are intentionally changed in order to illustrate the configuration of the solid-state imaging apparatus 1H in the figures in an easy-to-understand manner.

Specifically, in the pixel unit PU of the solid-state imaging apparatus 1H depicted in FIG. 104, a cross section at a position sec1 is a cross section obtained by cutting FIG. 107 along line A1-A1', a cross section at a position sec2 is a cross section obtained by cutting FIG. 108 along line B1-B1', and a cross section at a position sec3 is a cross section obtained by cutting FIG. 109 along line C1-C1'. Similarly, in the solid-state imaging apparatus 1H depicted in FIG. 105, a cross section at the position sec1 is a cross section obtained by cutting FIG. 107 along line A2-A2', a cross section at the position sec2 is a cross section obtained by cutting FIG. 108 along line B2-B2', and a cross section at a position sec3 is a cross section obtained by cutting FIG. 109 along line C2-C2'. In the solid-state imaging apparatus 1H depicted in FIG. 106, a cross section at the position sec1 is a cross section obtained by cutting FIG. 107 along line A3-A3', a cross section at the position sec2 is a cross section obtained by cutting FIG. 108 along line B3-B3', and a cross section at a position sec3 is a cross section obtained by cutting FIG. 109 along line C3-C3'.

As depicted in FIG. 104, the second substrate portion 20 is stacked on a front surface side 10$a$ side of the first substrate portion 10. The photodiodes PD, the transfer transistors TR, and the floating diffusions FD are provided on the front surface side 10$a$ of the first substrate portion 10. The photodiode PD, the transfer transistor TR, and the floating diffusion FD are provided in each sensor pixel 12. The other surface of the first substrate portion 10 is used as a light incident surface. The imaging apparatus 1H is of a back-illuminated type and includes a color filter and a light receiving lens provided on the back surface of the imaging apparatus 1H. The color filter and the light receiving lens are provided in each sensor pixel 12.

The semiconductor substrate 11 of the first substrate portion 10 includes, for example, a silicon substrate. A well layer WE of a first conductivity type (for example, a p-type) is provided in and near a part of the front surface of the semiconductor substrate 11, and the photodiode PD of a second conductivity type (for example, an n-type) is provided in a region deeper than the well layer WE. The well layer WE is internally provided with a well contact layer of the p-type having a higher concentration than that of the p-type of the well layer WE, and the floating diffusion FD of the n-type.

The semiconductor substrate 11 is provided with an element isolation layer 16 that electrically isolates from each other the sensor pixels 12 adjacent to each other. The element isolation layer 16 has, for example, an STI (Shallow Trench Isolation) structure, and extends in the depth direction of the semiconductor substrate 11. In the semiconductor substrate 11, an impurity diffusion layer 17 is provided between the element isolation layer 16 and the photodiode PD. For example, the impurity diffusion layer 17 includes a p-type layer and an n-type layer that extend in the thickness direction of the semiconductor substrate 11. The p-type layer is located on the element isolation layer 16 side, and the n-type layer is located on the photodiode PD side. An insulating film 15 is provided on a front surface 11$a$ side of the semiconductor substrate 11.

The substrate portion 20 includes a lower substrate 20$a$ and an upper substrate 20$b$. The lower substrate 20$a$ includes a first semiconductor substrate 21. The first semiconductor substrate 21 is, for example, a silicon substrate including monocrystal silicon. The amplifying transistor AMP and the element isolation layer 213 enclosing the amplifying transistor AMP are provided in one surface 211$a$ side of the first semiconductor substrate 21. The element isolation layer 213 electrically isolates one amplifying transistor AMP from the other amplifying transistor AMP, the amplifying transistors AMP being of the pixel units PU adjacent to each other. The lower substrate 20a includes an insulating film 215 covering the front surface 211a of the first semiconductor substrate 21. The insulating film 215 covers the amplifying transistor AMP and the element isolation layer 213. Additionally, the lower substrate 20a includes an insulating film 217 covering the other surface 211b of the first semiconductor substrate 21. The insulating film 15 of the first substrate portion 10 and the insulating film 217 of the lower substrate 20a are joined to each other to constitute an interlayer insulating film 228.

The upper substrate 20b includes a second semiconductor substrate 21A. The second semiconductor substrate 21A is a silicon substrate including, for example, monocrystal silicon. The reset transistor RST and the select transistor SEL and an element isolation layer 223 are provided on one surface 221a side of the second semiconductor substrate 21A. For example, the element isolation layer 223 is provided between the reset transistor RST and the select transistor SEL and between the select transistor SEL and the well layer in the second semiconductor substrate 21A. The upper substrate 20b includes an insulating film 225 covering the front surface 221a, a back surface 221b, and side surfaces of the second semiconductor substrate 21A. The insulating film 215 of the lower substrate 20a and the insulating film 225 of the upper substrate 20b are joined to each other to constitute an interlayer insulating film 226.

The imaging apparatus 1H includes a plurality of wires L1 to L10 provided in the interlayer insulating films 226 and 228 and electrically connected to at least one of the first substrate portion 10 or the second substrate portion 20. The wire L1 electrically connects the drain of the amplifying transistor AMP to the power supply line VDD. The wire L2 electrically connects the four floating diffusions FD included in one pixel unit PU to a gate electrode AG of the amplifying transistor AMP. The wire L3 electrically connects the source of the amplifying transistor AMP to the drain of the select transistor SEL. The wire L4 electrically connects a gate electrode SG of the select transistor SEL to the pixel driving line 23 (see FIG. 1).

The wire L5 electrically connects the source of the select transistor SEL to the vertical signal line 24. The wire L6 electrically connects the drain of the reset transistor RST to the power supply line VDD. The wire L7 electrically connects a gate electrode RG (see FIG. 4A described below) of the reset transistor RST to the pixel driving line 23. The wire L8 electrically connects the source of the reset transistor RST to the wire L2. The wire L9 (an example of a first wire) electrically connects the gate electrode TG of the transfer transistor TR to the pixel driving line 23 (see FIG. 1). The wire L10 electrically connects the well contact layer to the reference potential line supplying the reference potential (for example, ground potential: 0 V).

A portion of each of the wires L1 to L10 that extends in the thickness direction of the stack includes tungsten (W), and a portion of the wire that extends in a direction (for example, the horizontal direction) orthogonal to the thickness direction of the stack includes, as a main component, copper (Cu) or a CU alloy including Cu as a main component. However, in the embodiments of the present technology, the material constituting the wires L1 to L10 is not limited to the above-described examples, and any other material may be used to form the wires. The second substrate portion 20 includes a plurality of pad electrodes 227 connected to any wires (for example, the wires L1, L4 to L7, L9, and L10) of the wires L1 to L10 described above.

The third substrate portion 30 is disposed opposite to a surface of the second substrate portion 20 that faces the first substrate portion 10. The third substrate portion 30 includes a semiconductor substrate 31, an insulating film 304 covering a front surface 301a side of the semiconductor substrate 31, a plurality of wires L30 provided on the front surface 301a side of the semiconductor substrate 31, and a pad electrode 305 connected to each of the plurality of wires L30. The semiconductor substrate 31 is, for example, a silicon substrate including monocrystal silicon.

The wire L30 is provided in the contact hole. A portion of the wire L30 that extends in the thickness direction of the third substrate portion 30 includes titanium (Ti) or cobalt (Co), and a portion of the wire L30 that extends in a direction (for example, the horizontal direction) orthogonal to the thickness direction of the third substrate portion 30 includes, as a main component, copper (Cu) or a CU alloy including Cu as a main component. Silicide 39 (for example, titanium silicide (TiSi) or cobalt silicide (CoSi2)) is formed at a connection portion between the wire L30 and the semiconductor substrate 31.

The plurality of pad electrodes 305 include, for example, Cu or a CU alloy. In the thickness direction of the imaging apparatus 1, the pad electrode 305 of the third substrate portion 30 faces the pad electrode 227 of the second substrate portion 20 and is electrically connected to the pad electrode 227. For example, the pad electrodes 305 and 227, facing each other, are subjected to Cu—Cu bonding and integrated with each other. This electrically connects the second substrate portion 20 and the third substrate portion 30, and increases lamination strength between the second substrate portion 20 and the third substrate portion 30.

In the tenth embodiment of the present technology, one floating diffusion contact may be disposed for every plurality of sensor pixels 12. For example, four adjacent sensor pixels 12 may share one floating diffusion contact. Similarly, one well contact may be disposed for every plurality of sensor pixels 12. For example, four adjacent sensor pixels 12 may share one well contact. Additionally, one wire L2 (floating diffusion contact) electrically connected to the floating diffusions FD and one wire L10 (well contact) electrically connected to the well layer WE may be disposed in each of the plurality of sensor pixels 12.

As depicted in FIGS. 105 and 109, in the imaging apparatus 1H, a common pad electrode 102 (an example of a "first common pad electrode" of the present technology) disposed across the plurality of sensor pixels 12, and one wire L2 provided on the common pad electrode 102 are shared. For example, in the imaging apparatus 1H, a region is present in which the floating diffusions FD1 to FD4 of the four sensor pixels 12 are adjacent to one another via the element isolation layers 16 in plan view. The region is provided with the common pad electrode 102. The common pad electrode 102 is disposed across the four floating diffusions FD1 to FD4 and electrically connected to each of the four floating diffusions FD1 to FD4. The common pad electrode 102 includes, for example, a polysilicon film doped with n-type impurities or p-type impurities.

One wire L2 (that is, the floating diffusion contact) is provided in a central portion of the common pad electrode 102. As depicted in FIGS. 105 and 107 to 109, the wire L2 provided on the central portion of the common pad electrode 102 extends from the first substrate portion 10 to the upper substrate 20b of the second substrate portion 20 by penetrating the lower substrate 20a of the second substrate portion 20, and is connected to the gate electrode AG of the amplifying transistor AMP via a wire provided in the upper substrate 20b, or the like.

Additionally, as depicted in FIGS. 104 and 109, in the imaging apparatus 1H, a common pad electrode 110 (an example of a "second common pad electrode" of the present technology) disposed across the plurality of sensor pixels 12, and one wire L10 provided on the common pad electrode 110 are shared. For example, in the imaging apparatus 1H, a region in which the well layers WE of the four sensor pixels 12 are adjacent to one another via the element isolation layers 16 in plan view is present. The region is provided with the common pad electrode 110. The common pad electrode 110 is disposed across the well layers WE of the four sensor pixels 12 and electrically connected to each of the well layers WE of the four sensor pixels 12. In one example, the common pad electrode 110 is disposed between one and the other of the common pad electrodes 102 arranged in a Y-axis direction. In the Y-axis direction, the common pad electrodes 102 and 110 are alternately arranged. The common pad electrode 110 includes, for example, a polysilicon film doped with n-type impurities or p-type impurities.

One wire L10 (that is, the well contact) is provided in a central portion of the common pad electrode 110. As depicted in FIGS. 104 and 106 to 109, the wire L10 provided on the central portion of the common pad electrode 110 extends from the first substrate portion 10 to the upper substrate 20b of the second substrate portion 20 by penetrating the lower substrate 20a of the second substrate portion 20, and is connected, via a wire provided in the upper substrate 20b, and the like, to the reference potential line supplying the reference potential (for example, the ground potential: 0 V).

The wire L10 provided on the central portion of the common pad electrode 110 is electrically connected to an upper surface of the common pad electrode 110, an inner side surface of a through-hole provided in the lower substrate 20a, and an inner side surface of a through-hole provided in the upper substrate 20b. This connects the well layer WE of the semiconductor substrate 11 of the first substrate portion 10, the well layer of the lower substrate 20a of the second substrate portion 20, and the well layer WE of the upper substrate 20b of the second substrate portion 20, to the reference potential (for example, the ground potential: 0 V).

The imaging apparatus 1H according to the tenth embodiment of the present technology includes the first substrate portion 10 provided with the sensor pixels 12 performing photoelectric conversion, and the second substrate portion 20 disposed on the front surface 12a side of the first substrate portion 10 and including a readout circuit 22 outputting a pixel signal based on charge output from the sensor pixel 12. The second substrate portion 20 includes the first semiconductor substrate 21 provided with the amplifying transistor AMP included in the readout circuit 22, and the second semiconductor substrate 21A disposed on the front surface 211a side of the first semiconductor substrate 21 and provided with the select transistor SEL and the reset transistor RST and included in the readout circuit 22.

This enables an increase in the area of transistor arrangement regions compared to a case where all transistors included in the readout circuit 22 are disposed on one semiconductor substrate. Thus, the degree of freedom of layout of the readout circuit 22 is improved. This enables the gate area of the amplifying transistor AMP to be maximized in each pixel unit PU, allowing favorable noise properties to be obtained. Maximizing the area of the amplifying transistor AMP enables a reduction in random noise generated in the imaging apparatus 1.

Additionally, the solid-state imaging apparatus 1H further includes the common pad electrodes 102 and 110 provided on the front surface 11a side of the semiconductor substrate 11 constituting the first substrate portion 10, the common pad electrodes 102 and 110 being disposed across a plurality of (for example, four) the sensor pixels 12 adjacent to one another. The common pad electrode 102 is electrically connected to the floating diffusions FD of the four sensor pixels 12. The common pad electrode 110 is electrically connected to the well layers WE of the four sensor pixels 12. This allows the common wire L2 to be connected to the floating diffusions FD for every four sensor pixels 12. The common wire L10 can be connected to the well layers WE for every four sensor pixels 12. This enables a reduction in the number of wires L2 and L10, allowing for a reduction in the area of the sensor pixel 12 and in the size of the imaging apparatus 1H.

Figure 110:
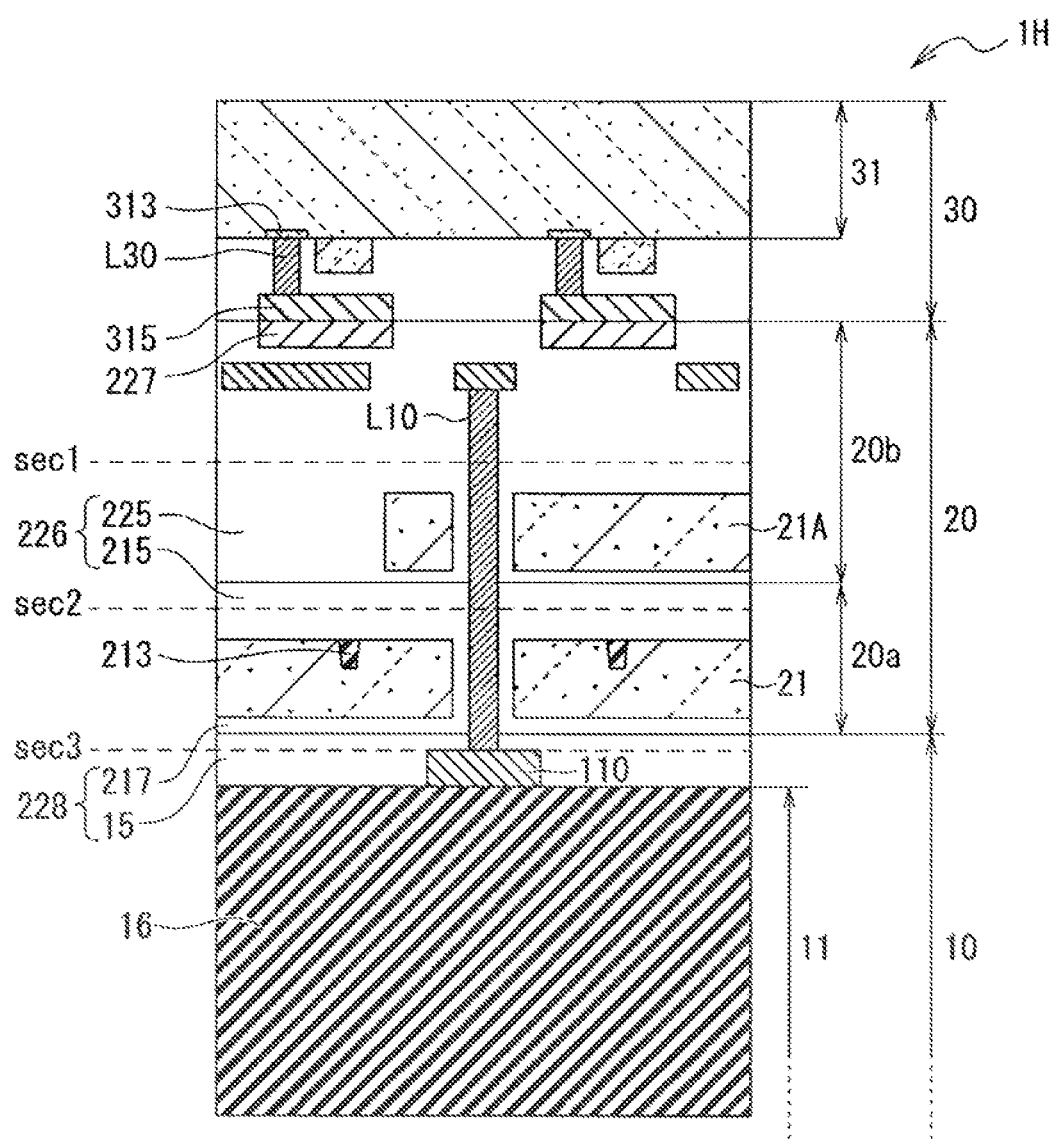
FIG. 110 is a thick-wise cross-sectional view depicting a modified example of the imaging apparatus according to the tenth embodiment of the present technology.

Note that, as depicted in FIG. 110, the wire 10L may penetrate the through-hole provided in each of the semiconductor substrates 21 and 21A while being insulated and isolated from each of the semiconductor substrates 21 and 21A.

In the solid-state imaging apparatus 1A according to the first embodiment described above, a case in which the second substrate portion 20 has a single layer structure including one semiconductor layer as depicted in FIG. 4 has been described. However, also in the solid-state imaging apparatus 1A according to the first embodiment described above, the second substrate portion 20 may have a two layer structure including the two semiconductor substrates 21 and 21A as is the case with the solid-state imaging apparatus 1H according to the tenth embodiment described above. In this case, as is the case with the solid-state imaging apparatus 1H according to the tenth embodiment described above, at least one of a plurality of transistors such as the amplifying transistor AMP, the reset transistor RST, and the select transistor SEL which can constitute the readout circuit 22 may be provided in the semiconductor layer 801, whereas the remaining transistors may be provided in a new semiconductor layer differing from the semiconductor layers 101 and 801 and corresponding to the semiconductor substrate 21A in FIG. 104. The new semiconductor layer corresponding to the semiconductor substrate 21A in FIG. 104 will be described with reference to FIG. 4. For example, the new semiconductor layer is stacked between a wiring layer including wires 227a, 227b, and 227c and the insulating film 228 via an interlayer insulating film. The new semiconductor layer is stacked opposite to the semiconductor layer 201 side of the insulating layer 820, allowing a desired transistor to be formed. As an example, the amplifying transistor AMP can be formed in the semiconductor layer 801, whereas the reset transistor RST and/or the select transistor SEL can be formed in the new semiconductor layer (semiconductor substrate 21A in FIG. 104).

Additionally, a plurality of new semiconductor substrates may be provided, and may each be provided with a transistor in the desired readout circuit 22. As an example, the amplifying transistor AMP can be formed on the semiconductor substrate 21. Further, by stacking an insulating layer, a connection portion, and a connection wire on the semiconductor substrate 21, and further stacking the semiconductor substrate 21A, the reset transistor RST can be formed on the semiconductor substrate 21A. By stacking an insulating layer, a connection portion, and a connection wire on the semiconductor substrate 21A, and further stacking the semiconductor substrate 21B, the select transistor SEL can be formed on the semiconductor substrate 21B. The transistors formed on the semiconductor substrates 21, 21A, and 21B may be any of the transistors constituting the readout circuit 22.

Note that, also in the solid-state imaging apparatuses 1B1, 1B2, 1C, 1D, 1E, 1F, and 1G according to the second to ninth embodiments described above, the second substrate portion 20 may have a two layer structure including the two semiconductor substrates 21 and 21A or may have a structure with three or more layers (may have a configuration in which a plurality of semiconductor substrates are stacked).

Thus, a configuration with a plurality of semiconductor substrates provided in the second substrate portion 20 enables a reduction in the area of a part of the semiconductor substrate 21 occupied by one readout circuit 22. By enabling a reduction in the area of each readout circuit 22 and miniaturization of each transistor, the area of a chip can be reduced. Additionally, the area of any desired transistor can be increased, the transistor being included in the amplifying transistor, the reset transistor, and the select transistor that can constitute the readout circuit 22. In particular, an increased area of the amplifying transistor can be expected to reduce noise.

Thus, also in the solid-state imaging apparatuses according to the first to ninth embodiments described above, a plurality of semiconductor substrates can be provided in the second substrate portion 20. In a case where second substrate portion 20 is provided with a plurality of semiconductor substrates, each of the plurality of semiconductor substrates in the second substrate portion 20 may be a compound semiconductor substrate. A material for the compound semiconductor substrate includes, for example, gallium nitride (GaN), gallium arsenide (GaAs), silicon carbide (SiC), indium phosphide (InP), aluminum gallium arsenide (AlGaAs), and the like.

As described above, the present technology has been described in conjunction with the first to tenth embodiments. It should not be recognized that the discussions and drawings constituting a part of the disclosure limit the present technology. A person skilled in the art will clearly recognize various alternative embodiments, examples, and operational technologies from the disclosure.

Note that the present technology can take the following configurations.

(1)

A semiconductor apparatus including:
 a first semiconductor layer including a plurality of element formation regions disposed adjacent to one another via element isolation regions, each of the plurality of element formation regions being provided with a first active element;
 contact regions each provided on a side of the element isolation region of a front layer portion of each of the plurality of element formation regions;
 conductive pads connected to the contact regions of the respective plurality of element formation regions, the conductive pad extending across the element isolation region;
 a first insulating layer covering the first semiconductor layer and the conductive pads;
 a second semiconductor layer disposed on the first insulating layer and provided with a second active element;
 a second insulating layer covering the second semiconductor layer; and
 conductive plugs each embedded in a connection hole extending from the second insulating layer to the conductive pad, the conductive plug including a material that is identical to a material of the conductive pad and is formed integrally with the conductive pad.

(2)

The semiconductor apparatus according to (1) described above, in which
 the conductive pad is larger in area in plan view than the conductive plug.

(3)

The semiconductor apparatus according to (1) or (2) described above, in which
 the conductive pad and the conductive plug each include a metal material with a high melting point.

(4)

The semiconductor apparatus according to any one of (1) to (3) described above, in which
 the first active element includes a photodiode and a transfer transistor including a source region electrically connected to a cathode region of the photodiode and a drain region electrically connected to the conductive plug, and
 the second active element includes an amplifying transistor including a gate electrode electrically connected to the conductive plug.

(5)

A method for manufacturing a semiconductor apparatus, the method including the steps of:
 forming, in a first semiconductor layer, a plurality of element formation regions delimited by element isolation regions;
 forming contact regions each on a side of the element isolation region of a front layer portion of each of the plurality of element formation regions adjacent to one another via the element isolation regions;
 forming pad cores, via an etching stopper film, on the contact regions of the respective plurality of element formation regions, the pad core extending across the element isolation regions;
 forming a first active element in each of the plurality of element formation regions;
 forming a first insulating layer covering the first semiconductor layer and the pad cores;
 disposing a second semiconductor layer on the first insulating layer;
 executing a step including thermal treatment to form a second active element in the second semiconductor layer;
 forming a second insulating layer covering the second semiconductor layer;
 forming connection holes each extending from the second insulating layer to the pad core;
 removing the pad core and the etching stopper film through the connection hole to form a space portion communicating with the connection hole; and
 embedding a conductive material into the space portion and the connection hole to form a conductive pad connected to the contact regions and a conductive plug integrated with the conductive pad.

(6)

The method for manufacturing a semiconductor apparatus, the method according to (5) described above, in which
 the pad core includes a non-doped polycrystal silicon film.

(7)

The method for manufacturing a semiconductor apparatus, the method according to (5) or (6) described above, in which
the step of forming the second active element includes
a step of executing thermal treatment to form, on a front surface of the second semiconductor layer, a gate insulating film including a thermal oxide film, and
a step of executing thermal treatment to form a source region and a drain region in a front layer portion of the second semiconductor layer.

(8)

A semiconductor apparatus including:
a first semiconductor layer including a plurality of element formation regions disposed adjacent to one another via element isolation regions and each provided with a first active element;
contact regions each provided on a side of the element isolation region of a front layer portion of each of the plurality of element formation regions;
conductive pads connected to the contact regions of the respective plurality of element formation regions, the conductive pad extending across the element isolation regions;
a first insulating layer covering the first semiconductor layer and the conductive pads;
a second semiconductor layer disposed on the first insulating layer and provided with a second active element;
a second insulating layer covering the second semiconductor layer;
conductive plugs each embedded in a connection hole extending from the second insulating layer to the conductive pad; and
an insulating film provided between the conductive pad and the contact region, in which
the conductive pad, the insulating film, and the contact region constitute an MIS contact portion.

(9)

The semiconductor apparatus according to (8), in which the insulating film includes an amorphous film.

(10)

The semiconductor apparatus according to (8) or (9) described above, in which
the insulating film includes a titanium oxide ($TiO_2$) film or a strontium titanate (SrTiOx) film.

(11)

The semiconductor apparatus according to (8) or (9), in which
the second semiconductor layer includes a compound semiconductor layer.

(12)

The semiconductor apparatus according to any one of (8) to (11) described above, in which
the first active element includes a photodiode and a transfer transistor including a source region electrically connected to a cathode region of the photodiode and a drain region electrically connected to the conductive plug, and
the second active element includes an amplifying transistor including a gate electrode electrically connected to the conductive plug.

(13)

A method for manufacturing a semiconductor apparatus, the method including the steps of:
forming, in a first semiconductor layer, a plurality of element formation regions delimited by element isolation regions;
forming a first active element in each of the plurality of element formation regions;
forming contact regions each on a side of the element isolation region of a front layer portion of each of the plurality of element formation regions adjacent to one another via the element isolation regions;
forming conductive pads, via an insulating film, on the contact regions of the respective plurality of element formation regions, the conductive pad being located across the element isolation regions;
forming a first insulating layer covering the first semiconductor layer and the conductive pads;
disposing a compound semiconductor layer on the first insulating layer;
executing a step including thermal treatment to form a second active element in the second semiconductor layer;
forming a second insulating layer covering the compound semiconductor layer; and
forming conductive plugs each in a connection hole extending from the second insulating layer to the conductive pad.

(14)

The method for manufacturing a semiconductor apparatus, the method according to (13) described above, in which
the step of forming the second active element includes
a step of executing thermal treatment to form, on a front surface of the second semiconductor layer, a gate insulating film including a thermal oxide film, and
a step of executing thermal treatment to form a source region and a drain region in a front layer portion of the second semiconductor layer.

(15)

A method for manufacturing a semiconductor apparatus, the method including the steps of:
forming, in a first semiconductor layer, a plurality of element formation regions delimited by element isolation regions;
forming a first active element in each of the plurality of element formation regions;
forming contact regions each on a side of the element isolation region of a front layer portion of each of the plurality of element formation regions adjacent to one another via the element isolation regions;
forming conductive pads, via an insulating film, on the contact regions of the respective plurality of element formation regions, the conductive pad being located across the element isolation regions;
forming a first insulating layer covering the first semiconductor layer and the conductive pads;
disposing, on the first insulating layer, a second semiconductor layer provided with a second active element;
forming a second insulating layer covering the second semiconductor layer; and
forming conductive plugs each in a connection hole extending from the second insulating layer to the conductive pad.

(16)

A semiconductor apparatus including:
a first semiconductor layer provided with a first active element;
a first insulating layer covering the first semiconductor layer;
a second semiconductor layer that is disposed on the first insulating layer and includes a second active element provided in each of a plurality of element formation regions delimited by element isolation regions;

a second insulating layer covering the second semiconductor layer; and conductive plugs each embedded, via an insulating film, in a through-hole penetrating the second insulating layer from the second insulating layer, in which the element isolation region includes a separation groove separating the element formation regions from one another like islands, insulating films provided on side walls of the separation groove, and a conductive material embedded into inside of the insulating films in the separation groove.

(17)

The semiconductor apparatus according to (16) described above, in which the first active element includes a photodiode and a transfer transistor including a source region electrically connected to a cathode region of the photodiode and a drain region electrically connected to the conductive plug, and the second active element includes an amplifying transistor including a gate electrode electrically connected to the conductive plug.

(18)

A method for manufacturing a semiconductor apparatus, the method including the steps of:

forming a first insulating layer covering a first semiconductor layer provided with a first active element;

disposing a second semiconductor layer on the first insulating layer;

forming a second active element in each of element formation regions of the second semiconductor layer with element isolation regions of the second semiconductor layer being left;

forming a second insulating layer on the second semiconductor layer;

forming connection holes each penetrating the second insulating layer, the second semiconductor layer, and the first insulating layer, and forming separation grooves in the element isolation regions of the second semiconductor layer, the separation groove separating the element formation regions of the second semiconductor layer from each other into island regions;

forming insulating films covering side surfaces of the element formation regions in the connection holes and in the separation grooves; and embedding a conductive material into inside of the insulating films in the connection hole to form a conductive plug inside the insulating films in the connection hole, and embedding the conductive material into inside of the insulating films in the separation groove.

(19)

A semiconductor apparatus including:

a first semiconductor layer provided with a first active element;

a first insulating layer covering the first semiconductor layer;

a second semiconductor layer disposed on the first insulating layer and provided with a second active element;

side walls provided on side walls of the first semiconductor layer;

a first insulating layer covering the first semiconductor layer and the side walls;

a second semiconductor layer disposed on the first insulating layer and provided with a second active elements; and conductive plugs that are each embedded in a through-hole and penetrate the second insulating layer and the first insulating layer, in which the side wall includes an insulating material having higher etching selectivity than that of the second insulating layer, and the conductive plug is formed along the side walls.

(20)

The semiconductor apparatus according to (19) described above, in which a low-permittivity film is provided between the second semiconductor layer and the side wall, the low-permittivity film having a lower permittivity than that of the side wall.

(21)

The semiconductor apparatus according to (19) or (20) described above, in which the second insulating layer includes a silicon oxide film, and the side wall includes at least any one film included in an SiN film, an SiBN film, and an SiBCN film that have etching selectivity with respect to the silicon oxide film.

(22)

The semiconductor apparatus according to (21) described above, in which the low-permittivity film includes an insulating film having a less nitrogen content than that of the side wall.

(23)

The semiconductor apparatus according to any one of (19) to (22) described above, in which the conductive plug penetrates the second semiconductor layer.

(24)

The semiconductor apparatus according to any one of (19) to (23) described above, in which the first active element includes a photodiode and a transfer transistor including a source region electrically connected to a cathode region of the photodiode and a drain region electrically connected to the conductive plug, and the second active element includes an amplifying transistor including a gate electrode electrically connected to the conductive plug.

(25)

A method for manufacturing a semiconductor apparatus, the method including the steps of:

forming a first insulating layer covering a first semiconductor layer provided with a first active element;

forming, on the first insulating layer, a second semiconductor layer provided with a second active element;

forming side walls on side walls of the second semiconductor layer;

forming a second insulating layer covering the second semiconductor layer and the side walls;

forming connection holes each extending from the second insulating layer along the side walls in such a manner as to penetrate the first insulating layer; and forming conductive plugs each in the connection hole, in which the side wall includes an insulating film having higher etching selectivity than that of the second insulating layer.

(26)

A semiconductor apparatus including:
- a first semiconductor layer including a plurality of element formation regions disposed adjacent to one another via isolation regions and each provided with a first active element;
- contact regions each provided on a side of the isolation region of a front layer portion of each of the plurality of element formation regions, the contact regions being adjacent to one another;
- conductive pads each located across the contact regions adjacent to one another and connected to the contact regions via an insulating film;
- a first insulating layer covering the first semiconductor layer and the conductive pads;
- a second semiconductor layer disposed on the first insulating layer and provided with a second active element;
- a second insulating layer covering the second semiconductor layer; and
- conductive plugs each embedded in a connection hole extending from the second insulating layer to the conductive pad, in which
- the conductive pad, the insulating film, and the contact regions constitute an MIS contact portion.

(27)

The semiconductor apparatus according to (26) described above, in which
the insulating film is an amorphous film.

(28)

The semiconductor apparatus according to (26) or (27) described above, in which
the insulating film is a titanium oxide film or a strontium titanate film.

(29)

The semiconductor apparatus according to any one of (26) to (28) described above, in which
the conductive pad includes a body portion connected, via the insulating film, to each of the contact regions adjacent to one another in a groove extending from a major surface of the first semiconductor layer in a depth direction, and a head portion that has a larger width than that of the body portion and is formed integrally with the body portion.

(30)

The semiconductor apparatus according to (26) to (29) described above, in which
the first active element includes a photodiode and a transfer transistor including a source region electrically connected to a cathode region of the photodiode and a drain region electrically connected to the conductive plug, and
the second active element includes an amplifying transistor including a gate electrode electrically connected to the conductive plug.

(31)

A method for manufacturing a semiconductor apparatus, the method including the steps of:
- forming, in a first semiconductor layer, a plurality of element formation regions delimited by isolation regions;
- forming contact regions adjacent to one another on a side of the isolation region of a front layer portion of each of the plurality of element formation regions; and
- forming conductive pads connected, via an insulating film, to each of the contact regions adjacent to one another in a groove portion provided between the contact regions.

REFERENCE SIGNS LIST

1: Solid-state imaging apparatus (semiconductor apparatus)
10: First substrate portion (first floor portion)
12: Sensor pixel
20: Second substrate portion (second floor portion)
22: Readout circuit
23: Pixel driving line
24: Pixel signal line
30: Third substrate portion (third time portion)
32: Logic circuit
33: Vertical driving circuit
34: Column signal processing circuit
35: Horizontal driving circuit
36: System control circuit
701: Semiconductor layer (first semiconductor layer)
702: Element isolation region
703: Island region (element formation region)
704: Well region
705, 706: Contact region
707: Etching stopper film
708: Pad core
709: Gate insulating film
710: Gate electrode
720: Insulating layer (first insulating layer)
801: Semiconductor layer (second semiconductor layer)
802: Insulating film
803a, 803b: Island region (element formation region)
804: Insulating film
805: Gate insulating film
806: Gate electrode
820: Insulating layer (second insulating layer)
821a, 821b: Connection hole
822a, 822b: Space portion
823a, 823b: Conductive plug
824a, 824b: Conductive pad
825a, 825b, 825c: Connection hole
826a, 826b, 826c: Conductive plug
827a, 827b, 827c: Wire
828: Insulating film
829: Wire
831: Planarization film
832: Color filter
833: Microlens
840a, 840b: MIS contact portion
841: Insulating film
842a, 842b: Conductive pad
850: Compound semiconductor layer (second semiconductor layer)
853, 853a, 853b: Island region
855: Gate insulating film
856a: Gate electrode
901: Interlayer insulating film
902a, 902b: Recessed portion
903: Insulating film
904: Polycrystal silicon film
905a, 905b: Conductive pad
$905a_1$, $905b_1$: Body portion
$905a_2$, $905b_2$: Head portion
906a, 906b: MIS contact portion
907: Interlayer insulating film
921a, 921b: Connection hole 923a, 923b: Conductive plug
932a, 932b: Recessed portion
AMP: Amplifying transistor (first active element)
FD: Floating diffusion
PD: Photodiode
PU: Pixel unit
RST: Reset transistor (second active element)
SEL: Select transistor (second active element)
TR: Transfer transistor (first active element)

What is claimed is:

1. A semiconductor apparatus, comprising:
a first semiconductor layer including a plurality of element formation regions disposed adjacent to one another via element isolation regions, each of the plurality of element formation regions being provided with a first active element;
contact regions each provided on a side of the element isolation region of a front layer portion of each of the plurality of element formation regions;
conductive pads connected to the contact regions of the respective plurality of element formation regions, the conductive pads extending across the element isolation region;
a first insulating layer covering the first semiconductor layer and the conductive pads;
a second semiconductor layer disposed on the first insulating layer and provided with a second active element;
a second insulating layer covering the second semiconductor layer; and
conductive plugs each embedded in a connection hole extending from the second insulating layer to a corresponding conductive pad, wherein each conductive plug includes a material that is identical to a material of the corresponding conductive pad, wherein each conductive plug is formed integrally with the corresponding conductive pad, and
wherein each conductive pad is larger in area in plan view than the corresponding conductive plug.

2. The semiconductor apparatus according to claim 1, wherein
the conductive pad and the conductive plug each include a metal material with a high melting point.

3. The semiconductor apparatus according to claim 1, wherein
the first active element includes a photodiode and a transfer transistor including a source region electrically connected to a cathode region of the photodiode and a drain region electrically connected to the conductive plug, and
the second active element includes an amplifying transistor including a gate electrode electrically connected to the conductive plug.

4. A method for manufacturing a semiconductor apparatus, the method comprising:
forming, in a first semiconductor layer, a plurality of element formation regions delimited by element isolation regions;
forming contact regions each on a side of the element isolation region of a front layer portion of each of the plurality of element formation regions adjacent to one another via the element isolation regions;
forming pad cores, via an etching stopper film, on the contact regions of the respective plurality of element formation regions, the pad cores extending across the element isolation regions;
forming a first active element in each of the plurality of element formation regions;
forming a first insulating layer covering the first semiconductor layer and the pad cores;
disposing a second semiconductor layer on the first insulating layer;
executing a step including thermal treatment to form a second active element in the second semiconductor layer;
forming a second insulating layer covering the second semiconductor layer;
forming connection holes each extending from the second insulating layer to the pad cores;
for each of the connection holes, removing the pad core and the etching stopper film through the connection hole to form a space portion communicating with the connection hole; and
embedding a conductive material into the space portions and the connection holes to form a conductive pad connected to the contact regions and a conductive plug integrated with the conductive pad,
wherein the conductive pads are larger in area in plan view than the conductive plugs.

5. The method for manufacturing a semiconductor apparatus, the method according to claim 4, wherein
the pad core includes a non-doped polycrystal silicon film.

6. The method for manufacturing a semiconductor apparatus, the method according to claim 5, wherein
the step of forming the second active element includes
a step of executing thermal treatment to form, on a front surface of the second semiconductor layer, a gate insulating film including a thermal oxide film, and
a step of executing thermal treatment to form a source region and a drain region in a front layer portion of the second semiconductor layer.

* * * * *